US012486297B2

(12) United States Patent
Lee et al.

(10) Patent No.: US 12,486,297 B2
(45) Date of Patent: Dec. 2, 2025

(54) ORGANOMETALLIC COMPOUND AND LIGHT-EMITTING DEVICE INCLUDING THE SAME

(71) Applicant: Samsung Display Co., Ltd., Yongin-si (KR)

(72) Inventors: Eunyoung Lee, Yongin-si (KR); Soobyung Ko, Yongin-si (KR); Haejin Kim, Yongin-si (KR); Eunsoo Ahn, Yongin-si (KR); Hyunjung Lee, Yongin-si (KR); Mina Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 835 days.

(21) Appl. No.: 17/657,252

(22) Filed: Mar. 30, 2022

(65) Prior Publication Data

US 2022/0332740 A1 Oct. 20, 2022

(30) Foreign Application Priority Data

Apr. 2, 2021 (KR) ........................ 10-2021-0043500

(51) Int. Cl.
*H01L 51/50* (2006.01)
*C07F 15/00* (2006.01)
(Continued)

(52) U.S. Cl.
CPC ....... *C07F 15/0086* (2013.01); *H10K 85/346* (2023.02); *H10K 50/11* (2023.02); *H10K 2101/10* (2023.02)

(58) Field of Classification Search
None
See application file for complete search history.

(56) References Cited

U.S. PATENT DOCUMENTS 7,381,479 B2 6/2008 Lamansky et al.
7,393,599 B2 7/2008 Thompson et al.
(Continued)

FOREIGN PATENT DOCUMENTS

CN 104370974 A 2/2015
JP 2007-045742 A 2/2007
(Continued)

*Primary Examiner* — Gregory D Clark
(74) *Attorney, Agent, or Firm* — Womble Bond Dickinson (US) LLP

(57) ABSTRACT

A light-emitting device includes a first compound being an organometallic compound represented by Formula 1. The light-emitting device may further include a second compound including at least one π electron-deficient nitrogen-containing $C_1$-$C_{60}$ cyclic group, a third compound including a group represented by Formula 3, a fourth compound configured to emit delayed fluorescence, or any combination thereof, wherein the first compound, the second compound, the third compound, and the fourth compound are different (Continued)

from each other. The light-emitting device may be included in an electronic apparatus:

Formula 1

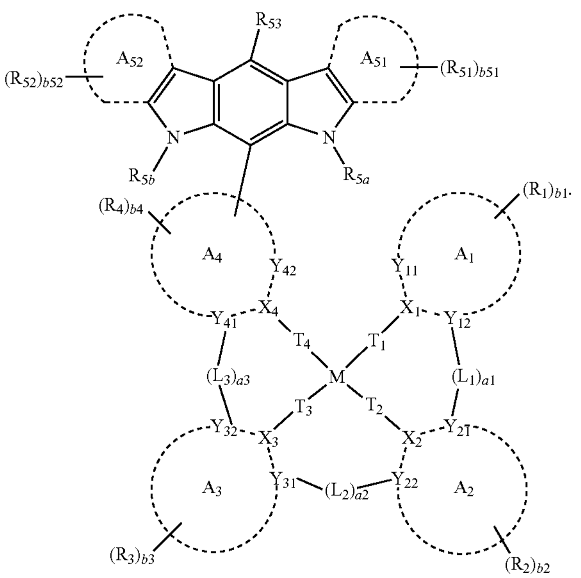

20 Claims, 3 Drawing Sheets

(51) Int. Cl.

| | |
|---|---|
| ***H10K 85/30*** | (2023.01) |
| *H10K 50/11* | (2023.01) |
| *H10K 101/10* | (2023.01) |

(56) References Cited

U.S. PATENT DOCUMENTS

| | | | |
|---|---|---|---|
| 7,585,573 B2 | 9/2009 | Lee et al. | |
| 7,776,458 B2 | 8/2010 | Ragini et al. | |
| 8,106,199 B2 | 1/2012 | Jabbour et al. | |
| 8,389,725 B2 | 3/2013 | Li et al. | |
| 8,669,364 B2 | 3/2014 | Li et al. | |
| 8,680,760 B2 | 3/2014 | Cheng et al. | |
| 8,816,080 B2 | 8/2014 | Li et al. | |
| 8,846,940 B2 | 9/2014 | Li et al. | |
| 8,946,417 B2 | 2/2015 | Jian et al. | |
| 9,051,344 B2 | 6/2015 | Lin et al. | |
| 9,076,974 B2 | 7/2015 | Li et al. | |
| 9,203,039 B2 | 12/2015 | Li et al. | |
| 9,221,857 B2 | 12/2015 | Li et al. | |
| 9,224,963 B2 | 12/2015 | Li et al. | |
| 9,238,668 B2 | 1/2016 | Li et al. | |
| 9,312,502 B2 | 4/2016 | Li et al. | |
| 9,324,957 B2 | 4/2016 | Li et al. | |
| 9,382,273 B2 | 7/2016 | Li et al. | |
| 9,425,415 B2 | 8/2016 | Li et al. | |
| 9,698,359 B2 | 7/2017 | Li et al. | |
| 9,899,614 B2 | 2/2018 | Li et al. | |
| 10,170,710 B2 | 1/2019 | Yamada et al. | |
| 10,403,833 B2 | 9/2019 | Anémian et al. | |
| 2005/0287394 A1 | 12/2005 | Yang et al. | |
| 2008/0018221 A1 | 1/2008 | Egen et al. | |
| 2014/0309428 A1 | 10/2014 | Egen et al. | |
| 2014/0371825 A1 | 12/2014 | Anemian et al. | |
| 2017/0317298 A1* | 11/2017 | Anémian | H05B 33/14 |
| 2018/0226593 A1 | 8/2018 | Li et al. | |
| 2018/0305385 A1 | 10/2018 | Chen et al. | |
| 2018/0375036 A1 | 12/2018 | Chen et al. | |
| 2020/0321537 A1 | 10/2020 | Jeon et al. | |
| 2021/0050530 A1 | 2/2021 | Wu et al. | |
| 2022/0162246 A1* | 5/2022 | Chen et al. | C07F 15/0086 |

FOREIGN PATENT DOCUMENTS

| | | |
|---|---|---|
| KR | 10-0730115 B1 | 6/2007 |
| KR | 10-2014-0117546 A | 10/2014 |
| KR | 10-2020-0115134 A | 10/2020 |
| WO | WO 2012-121936 A2 | 9/2012 |

* cited by examiner

ORGANOMETALLIC COMPOUND AND LIGHT-EMITTING DEVICE INCLUDING THE SAME

CROSS-REFERENCE TO RELATED APPLICATION

This application claims priority to and the benefit of Korean Patent Application No. 10-2021-0043500, filed on Apr. 2, 2021, in the Korean Intellectual Property Office, the entire content of which is incorporated herein by reference.

BACKGROUND

1. Field

One or more aspects of embodiments of the present disclosure relate to an organometallic compound, a light-emitting device including the organometallic compound, and an electronic apparatus including the light-emitting device.

2. Description of the Related Art

Among light-emitting devices, organic light-emitting devices are self-emissive devices that have wide viewing angles, high contrast ratios, short response times, and excellent characteristics in terms of luminance, driving voltage, and/or response speed, compared to devices in the art.

The organic light-emitting devices may have a structure in which a first electrode is located on a substrate, and a hole transport region, an emission layer, an electron transport region, and a second electrode are sequentially stacked on the first electrode. Holes provided from the first electrode move toward the emission layer through the hole transport region, and electrons provided from the second electrode move toward the emission layer through the electron transport region. Carriers, such as holes and electrons, recombine in the emission layer to produce excitons. These excitons transition from an excited state to a ground state to thereby generate light.

SUMMARY

One or more aspects of embodiments of the present disclosure are directed toward an organometallic compound having a low driving voltage, excellent luminescence efficiency, long lifespan, and excellent color purity, and a light-emitting device including the same.

Additional aspects will be set forth in part in the description which follows and, in part, will be apparent from the description, or may be learned by practice of the presented embodiments of the disclosure.

According to one or more embodiments, provided is an organometallic compound represented by Formula 1.

Formula 1

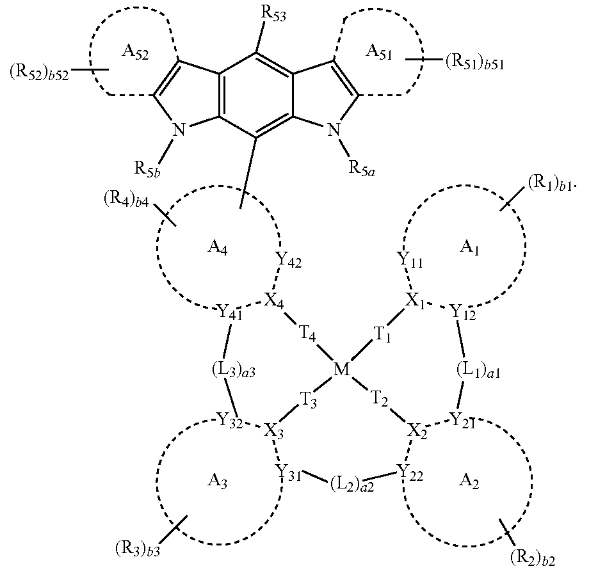

In Formula 1,

M may be platinum (Pt), palladium (Pd), nickel (Ni), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm), $X_1$ to $X_4$, $Y_{11}$, $Y_{12}$, $Y_{21}$, $Y_{22}$, $Y_{31}$, $Y_{32}$, $Y_{41}$, and $Y_{42}$ may each independently be C or N, $A_1$ to $A_4$, $A_{51}$, and $A_{52}$ may each independently be a $C_3$-$C_{60}$ carbocyclic group or a $C_1$-$C_{60}$ heterocyclic group, $T_1$ to $T_4$ may each independently be a single bond, *—O—*', *—S—*', *—C($Z_{11}$)($Z_{12}$)—*', *—C($Z_{11}$)=*', *=C($Z_{11}$)—*', *—C($Z_{11}$)=C($Z_{12}$)—*', *—C(=O)—*', *—C(=S)—*', *—C≡C*', *—B($Z_{11}$)—*', *—N($Z_{11}$)—*', *—P($Z_{11}$)—*', *—Si($Z_{11}$)($Z_{12}$)—*', or *—Ge($Z_{11}$)($Z_{12}$)—*', $L_1$ to $L_3$ may each independently be a single bond, a double bond, *—N($Z_{21}$)—*', *—B($Z_{21}$)—*', *—P($Z_{21}$)—*', *—C($Z_{21}$)($Z_{22}$)—*', *—Si($Z_{21}$)($Z_{22}$)—*', *—Ge($Z_{21}$)($Z_{22}$)—*', *—S—*', *—Se—*', *—O—*', *—C(=O)—*', *—S(=O)—*'. *—S(=O)$_2$—*'. *—C($Z_{21}$)=*', *=C($Z_{21}$)—*', *—C($Z_{21}$)=C($Z_{22}$)—*', *—C(=S)—*', or *—C≡C—*', and *' each indicate a binding site to a neighboring atom, a1 to a3 may each independently be an integer from 0 to 3, $R_1$ to $R_4$, $R_{51}$ to $R_{53}$, $R_{5a}$, $R_{5b}$, $Z_{11}$, $Z_{12}$, $Z_{21}$, and $Z_{22}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$P(Q_1)(Q_2)$, —C(=O)($Q_1$), —S(=O)($Q_1$), —S(=O)$_2$($Q_1$), —P(=O)($Q_1$)($Q_2$), or —P(=S)($Q_1$)($Q_2$), $R_{5a}$ and $R_{5b}$ may not both simultaneously be a benzene group unsubstituted or substituted with at least one $R_{10a}$, b1 to b4, b51, and b52 may each independently be an integer from 0 to 10, when b1 is 2 or more, two $R_1$(s) of two or more $R_1$(s) may optionally be bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, when b2 is 2 or more, two $R_2$(s) of two or more $R_2$(s) may optionally be bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, when b3 is 2 or more, two $R_3$(s) of two or more $R_3$(s) may optionally be bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, when b4 is 2 or more, two $R_4$(s) of two or more $R_4$(s) may optionally be bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, when b51 is 2 or more, two $R_{51}$(s) of two or more $R_{51}$(s) may optionally be bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, when b52 is 2 or more, two $R_{52}$(s) of two or more $R_{52}$(s) may optionally be bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and $R_{10a}$ may be deuterium, —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$P(Q_{11})(Q_{12})$, —C(=O)($Q_{11}$), —S(=O)($Q_{11}$), —S(=O)$_2$($Q_{11}$), —P(=O)($Q_{11}$)($Q_{12}$), —P(=S)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$P(Q_{21})(Q_{22})$, —C(=O)($Q_{21}$), —S(=O)($Q_{21}$), —S(=O)$_2$($Q_{21}$), —P(=O)($Q_{21}$)($Q_{22}$), —P(=S)($Q_{21}$)($Q_{22}$), or any combination thereof, or —$Si(Q_{31})(Q_{32})(Q_{33})$, —$N(Q_{31})(Q_{32})$, —$B(Q_{31})(Q_{32})$, —$P(Q_{31})(Q_{32})$, —C(=O)($Q_{31}$), —S(=O)($Q_{31}$), —S(=O)$_2$($Q_{31}$), —P(=O)($Q_{31}$)($Q_{32}$), or —P(=S)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_6$ alkoxy group, or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_6$ alkoxy group, a phenyl group, a biphenyl group, or any combination thereof.

According to other one or more embodiments, provided is a light-emitting device including the organometallic compound represented by Formula 1.

According to other one or more embodiments, provided is an electronic apparatus including the light-emitting device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
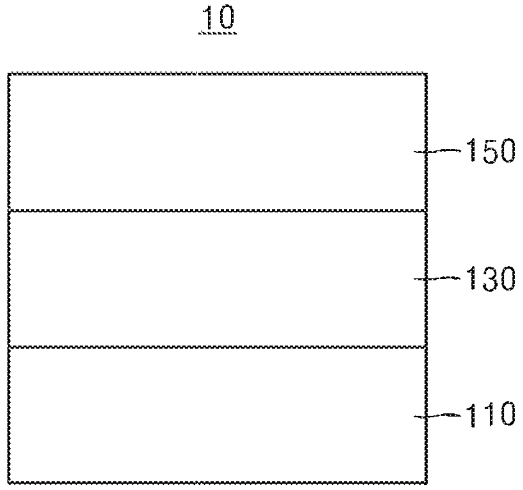
FIG. 1 is a schematic cross-sectional view of a light-emitting device according to one or more embodiments.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. As used herein, expressions such as "at least one of", "one of", and "selected from", when preceding a list of elements, modify the entire list of elements and do not modify the individual elements of the list. Throughout the disclosure, the expression "at least one of a, b or c" indicates only a, only b, only c, both a and b, both a and c, both b and c, all of a, b, and c, or variations thereof. Further, the use of "may" when describing embodiments of the present disclosure refers to "one or more embodiments of the present disclosure".

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively.

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

According to one or more embodiments, an organometallic compound may be represented by Formula 1 below:

Formula 1

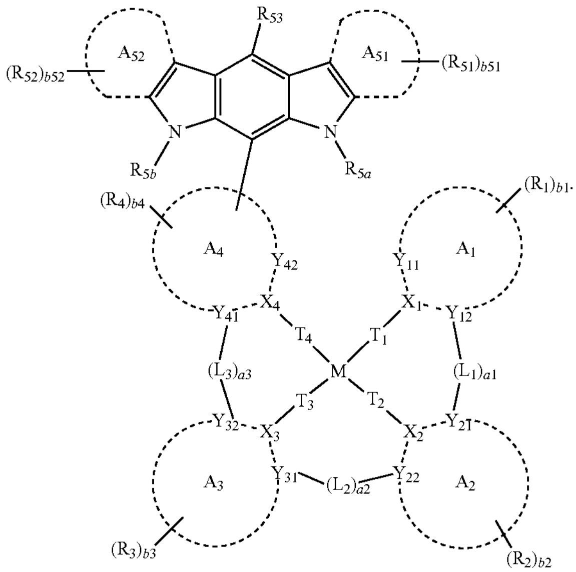

M in Formula 1 may be platinum (Pt), palladium (Pd), nickel (Ni), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm).

In one or more embodiments, M in Formula 1 may be platinum (Pt), palladium (Pd), nickel (Ni), copper (Cu), silver (Ag), or gold (Au), but embodiments of the disclosure are not limited thereto.

In one or more embodiments, M in Formula 1 may be platinum (Pt), or palladium (Pd) but embodiments of the disclosure are not limited thereto.

In Formula 1, $X_1$ to $X_4$, $Y_{11}$, $Y_{12}$, $Y_{21}$, $Y_{22}$, $Y_{31}$, $Y_{32}$, $Y_{41}$, and $Y_{42}$ may each independently be C or N.

In one or more embodiments, in Formula 1, $X_1$ may be N, and $X_2$ to $X_4$ may each be C.

In one or more embodiments, in Formula 1, $X_4$ may be C, and C may be carbon of a carbene moiety.

In one or more embodiments, in Formula 1, a bond between $X_1$ and $T_1$, a bond between $X_2$ and $T_2$, and a bond between $X_3$ and $T_3$ may each be a covalent bond, and a bond between $X_4$ and $T_4$ may be a coordinate bond.

In one or more embodiments, in Formula 1, $Y_{21}$, $Y_{41}$, and $Y_{42}$ may each be N.

In Formula 1, $A_1$ to $A_4$, $A_{51}$, and $A_{52}$ may each independently be a $C_3$-$C_{60}$ carbocyclic group or a $C_1$-$C_{60}$ heterocyclic group.

In one or more embodiments, in Formula 1, $A_1$ may be an $X_1$-containing 6-membered ring, $A_2$ may be an $X_2$-containing 6-membered ring or an $X_2$-containing 6-membered ring condensed with at least one 5-membered ring, $A_3$ may be an $X_3$-containing 6-membered ring, and $A_4$ may be an $X_4$-containing 5-membered ring or an $X_4$-containing 5-membered ring condensed with at least one 6-membered ring.

In one or more embodiments, in Formula 1, the $X_1$-containing 6-membered ring of $A_1$, the $X_2$-containing 6-membered ring and the $X_2$-containing 6-membered ring condensed with the at least one 5-membered ring of $A_2$, and the $X_3$-containing 6-membered ring of $A_3$ may each independently be a benzene group, a pyridine group, or a pyrimidine group, and the $X_4$-containing 5-membered ring and the $X_4$-containing 5-membered ring condensed with the at least one 6-membered ring of $A_4$ may each independently be a pyrrole group, a pyrazole group, an imidazole group, a triazole group, a furan group, an oxazole group, an isooxazole group, a thiazole group, an isothiazole group, an oxadiazole group, or a thiadiazole group.

In one or more embodiments, a group represented by

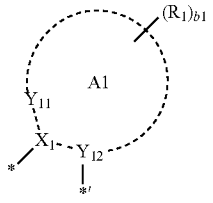

in Formula 1 may be one of groups represented by Formulae A1(1) to A1(15):

A1(1)

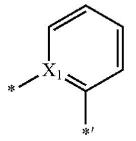

A1(2)

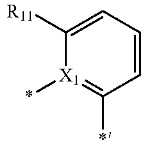

-continued

A1(3)

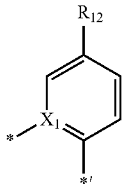

A1(4)

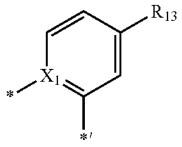

A1(5)

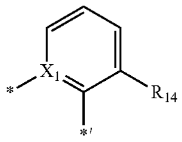

A1(6)

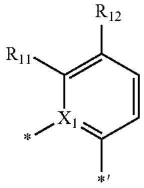

A1(7)

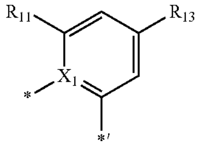

A1(8)

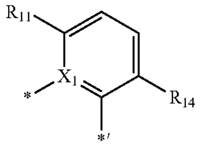

A1(9)

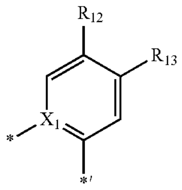

A1(10)

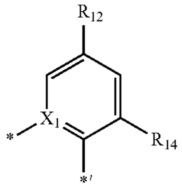

A1(11)

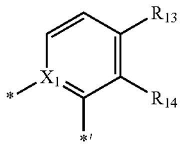

-continued

A1(12)

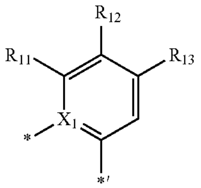

A1(13)

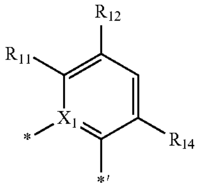

A1(14)

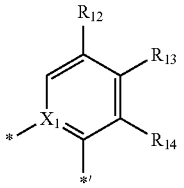

A1(15)

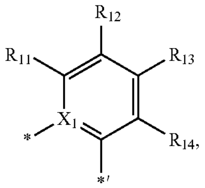

wherein, in Formulae A1(1) to A1(15), $X_1$ is the same as described in the present specification, $R_{11}$ to $R_{14}$ are each the same as described in connection with $R_1$ in the present specification, $R_{11}$ to $R_{14}$ may not each be hydrogen, and

* and *' each indicate a binding site to a neighboring atom.

In one or more embodiments, a group represented by

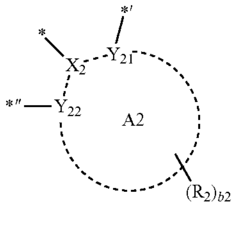

in Formula 1 may be one of groups represented by Formulae A2(1) to A2(7):

A2(1)

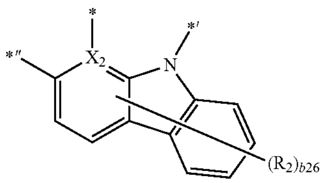

-continued
A2(2)
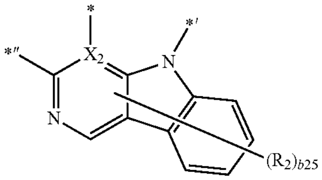
A2(3)
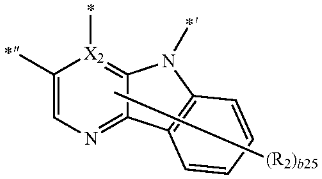
A2(4)
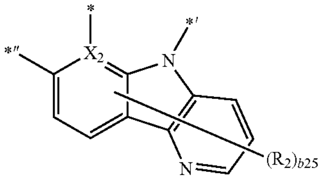
A2(5)
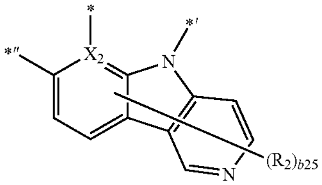
A2(6)
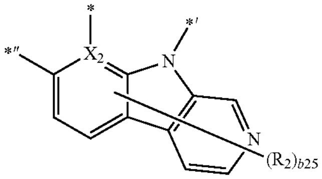
A2(7)
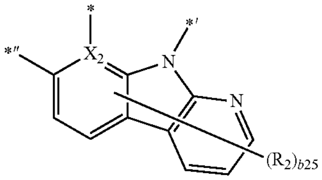
wherein, in Formulae A2(1) to A2(7),
$X_2$ and $R_2$ are each the same as described in the present specification,
b26 may be an integer from 0 to 6,
b25 may be an integer from 0 to 5, and
*, *', and *" each indicate a binding site to a neighboring atom.
In one or more embodiments, a group represented by
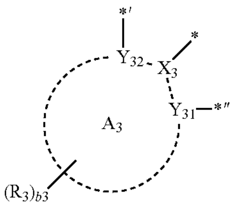
in Formula 1 may be one of groups represented by Formulae A3(1) to A3(8):
A3(1)
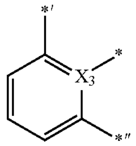
A3(2)
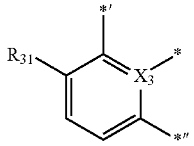
A3(3)
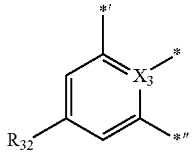
A3(4)
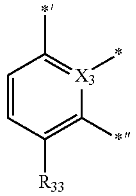
A3(5)
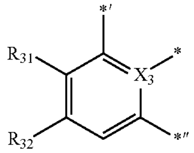
A3(6)
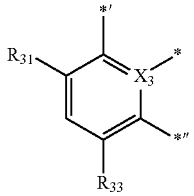
A3(7)
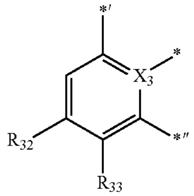
A3(8)
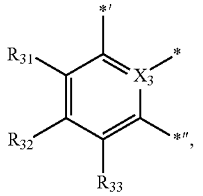

wherein, in Formulae A3(1) to A3(8), $X_3$ is the same as described in the present specification, $R_{31}$ to $R_{33}$ are each the same as described in connection with $R_3$ in the present specification, $R_{31}$ to $R_{33}$ may each not be hydrogen, and

*, *', and *" each indicate a binding site to a neighboring atom.

In one or more embodiments, a group represented by

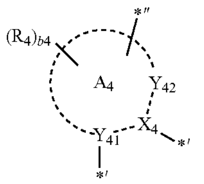

in Formula 1 may be one of groups represented by Formulae A4(1) to A4(8):

A4(1)

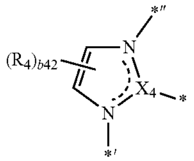

A4(2)

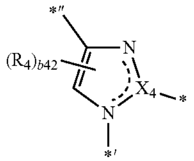

A4(3)

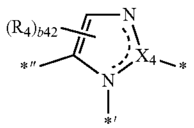

A4(4)

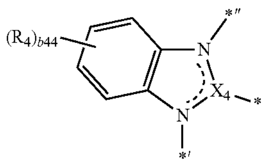

A4(5)

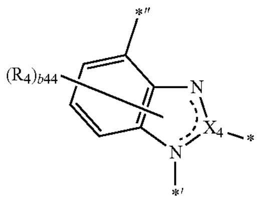

A4(6)

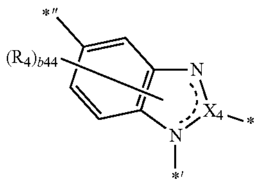

-continued

A4(7)

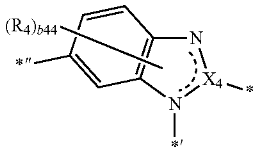

A4(8)

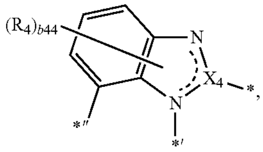

wherein, in Formulae A4(1) to A4(8), $X_4$ and $R_4$ are each the same as described in the present specification, b42 may be an integer from 0 to 2, b44 may be an integer from 0 to 4, and

*, *', and *" each indicate a binding site to a neighboring atom.

In one or more embodiments, $A_{51}$ and $A_{52}$ in Formula 1 may each independently be a benzene group or a naphthalene group.

$T_1$ to $T_4$ in Formula 1 may each independently be a single bond, *—O—*', *—S*', *—C($Z_{11}$)($Z_{12}$)—*', *—C($Z_{11}$)=*', *=C($Z_{11}$)—*', *—C($Z_{11}$)=C($Z_{12}$)—*', *—C(=O)—*', *—C(=S)—*', *—C≡C—*' *—B($Z_{11}$)—*', *—N($Z_{11}$)—*', *—P($Z_{11}$)*', *—Si($Z_{11}$)($Z_{12}$)—*', or *—Ge($Z_{11}$)($Z_{12}$)—*'. $Z_{11}$ and $Z_{12}$ are each the same as described in the present specification.

In one or more embodiments, $T_1$ to $T_4$ in Formula 1 may each be a single bond.

$L_1$ to $L_3$ in Formula 1 may each independently be a single bond, a double bond, *—N($Z_{21}$)—*', *—B($Z_{21}$)—*', *—P($Z_{21}$)—*', *—C($Z_{21}$)($Z_{22}$)—*', *—Si($Z_{21}$)($Z_{22}$)—*', *—Ge($Z_{21}$)($Z_{22}$)—*', *—S—*', *—Se—*', *—O—*', *—C(=O)—*', *—S(=O)—*', *—S(=O)$_2$—*', *—C($Z_{21}$)=*', *C($Z_{21}$)—*', *—C($Z_{21}$)=C($Z_{22}$)—*', *—C(=S)—*', or *—C≡C—*'. $Z_{21}$ and $Z_{22}$ are each the same as described in the present specification.

In one or more embodiments, $L_1$ to $L_3$ in Formula 1 may each independently be a single bond, *—S—*', or *—O—*'.

a1 to a3 in Formula 1 may each independently be an integer from 0 to 3.

In one or more embodiments, a1 to a3 in Formula 1 may each independently be 0 or 1, but embodiments of the disclosure are not limited thereto.

In Formula 1, $R_1$ to $R_4$, $R_{51}$ to $R_{53}$, $R_{5a}$, $R_{5b}$, $Z_{11}$, $Z_{12}$, $Z_{21}$, and $Z_{22}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), or —P(=S)($Q_1$)($Q_2$), wherein $R_{5a}$ and $R_{5b}$ may not both simultaneously (e.g., at the same time) be a benzene group unsubstituted or substituted with at least one $R_{10a}$.

In one or more embodiments, in Formula 1, $R_1$ to $R_4$, $R_{51}$ to $R_{53}$, $R_{5a}$, $R_{5b}$, $Z_{11}$, $Z_{12}$, $Z_{21}$, and $Z_{22}$ may be each independently the same as described in connection with $R_{61}$ in the present specification, wherein $R_{5a}$ and $R_{5b}$ may not both simultaneously (e.g., at the same time) be a benzene group unsubstituted or substituted with at least one $R_{10a}$.

In one or more embodiments, $R_{5a}$ and $R_{5b}$ in Formula 1 may each independently be: hydrogen, deuterium, —F, —Cl, —Br, —I, a hydroxyl group, a cyano group, or a nitro group; or a $C_1$-$C_{20}$ alkyl group, a $C_2$-$C_{20}$ alkenyl group, a $C_2$-$C_{20}$ alkynyl group, or a $C_1$-$C_{20}$ alkoxy group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a phenyl group, a naphthyl group, —Si($Q_{31}$)($Q_{32}$)($Q_{33}$), —N($Q_{31}$)($Q_{32}$), —B($Q_{31}$)($Q_{32}$), or any combination thereof, and $Q_{31}$ and $Q_{33}$ are each the same as described in the present specification.

In one or more embodiments, $R_{5a}$ and $R_{5b}$ in Formula 1 may each independently be: deuterium or —F; or a $C_1$-$C_{20}$ alkyl group unsubstituted or substituted with deuterium, —F, —$CD_3$, —$CD_2H$, —$CDH_2$, —$CF_3$, —$CF_2H$, —$CFH_2$, a phenyl group, or any combination thereof.

In one or more embodiments, in Formula 1, $R_1$ to $R_4$, $R_{51}$, $R_{52}$, $Z_{11}$, $Z_{12}$, $Z_{21}$, and $Z_{22}$ may each independently be:

hydrogen, deuterium, —F, —Cl, —Br, —I, a hydroxyl group, a cyano group, or a nitro group;

a $C_1$-$C_{20}$ alkyl group, a $C_2$-$C_{20}$ alkenyl group, a $C_2$-$C_{20}$ alkynyl group, or a $C_1$-$C_{20}$ alkoxy group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, —Si($Q_{31}$)($Q_{32}$)($Q_{33}$), —N($Q_{31}$)($Q_{32}$), —B($Q_{31}$)($Q_{32}$), or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an isoindolyl group, an indolyl group, a carbazolyl group, a phenanthrolinyl group, a benzofuranyl group, a benzothiophenyl group, a dibenzofuranyl group, a dibenzothiophenyl group, a benzocarbazolyl group, or a dibenzocarbazolyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an isoindolyl group, an indolyl group, a carbazolyl group, a phenanthrolinyl group, a benzofuranyl group, a benzothiophenyl group, a dibenzofuranyl group, a dibenzothiophenyl group, a benzocarbazolyl group, a dibenzocarbazolyl group, —Si($Q_{31}$)($Q_{32}$)($Q_{33}$), —N($Q_{31}$)($Q_{32}$), —B($Q_{31}$)($Q_{32}$), or any combination thereof; or —Si($Q_1$)($Q_2$)($Q_3$), —N($Q_1$)($Q_2$), or —B($Q_1$)($Q_2$), and $Q_1$ to $Q_3$ and $Q_{31}$ to $Q_{33}$ are each the same as described in the present specification.

In Formula 1, b1 to b4, b51, and b52 may each independently be an integer from 0 to 10.

In one or more embodiments, in Formula 1, b1 to b4, b51, and b52 may each independently be an integer from 0 to 4.

In one or more embodiments, in Formula 1, when b1 is 2 or more, two $R_1$(s) of two or more $R_1$(s) may optionally be bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, when b2 is 2 or more, two $R_2$(s) of two or more $R_2$(s) may optionally be bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, when b3 is 2 or more, two $R_3$(s) of two or more $R_3$(s) may optionally be bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, when b4 is 2 or more, two $R_4$(s) of two or more $R_4$(s) may optionally be bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, when b51 is 2 or more, two $R_{51}$(s) of two or more $R_{51}$(s) may optionally be bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and when b52 is 2 or more, two $R_{52}$(s) of two or more $R_{52}$(s) may optionally be bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$.

* and *' in the present specification each indicate a binding site to a neighboring atom.

In one or more embodiments, Formula 1 may be a group represented by Formula 1-1 or Formula 1-2:

1-1

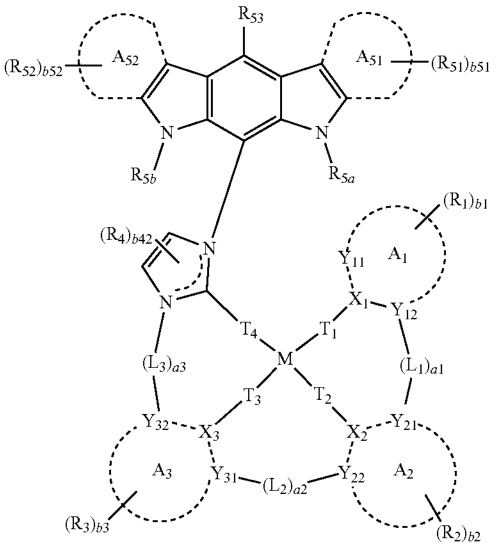

1-2

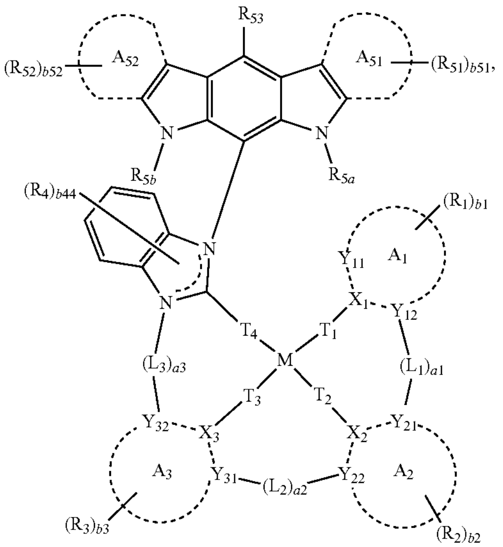

wherein, in Formulae 1-1 and 1-2,

M, $X_1$ to $X_3$, $Y_{11}$, $Y_{12}$, $Y_{21}$, $Y_{22}$, $Y_{31}$, $Y_{32}$, $A_1$ to $A_3$, $A_{51}$ and $A_{52}$, $T_1$ to $T_4$, $L_1$ to $L_3$, a1 to a3, $R_1$ to $R_4$, $R_{51}$ to $R_{53}$, $R_{5a}$, $R_{5b}$, b1 to b3, b51, and b52 are each the same as described in the present specification, b42 may be an integer from 0 to 2, and b44 may be an integer from 0 to 4.

In one or more embodiments, the organometallic compound represented by Formula 1 may be selected from Compounds 1 to 128:

1

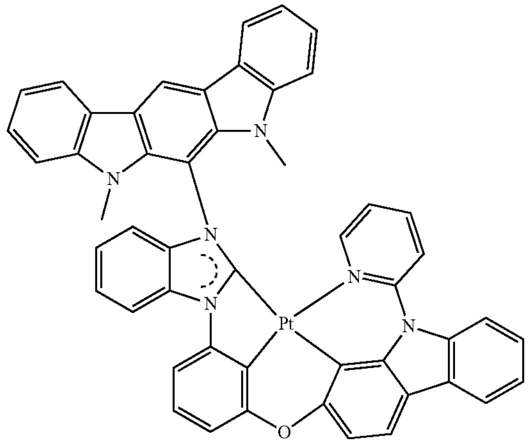

2

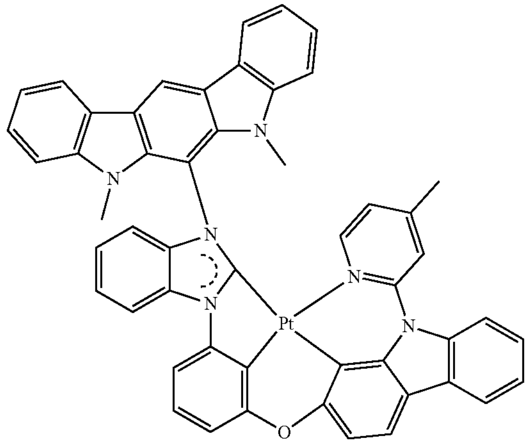

3

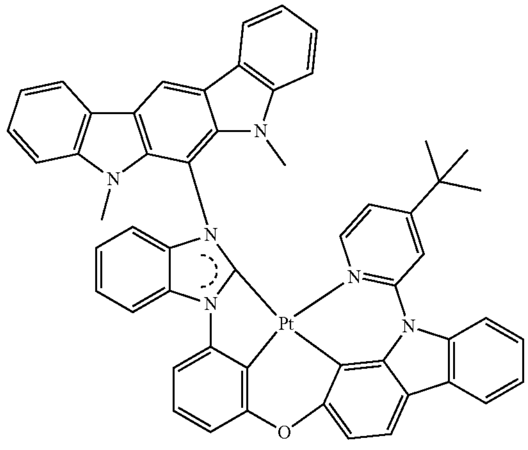

-continued
4
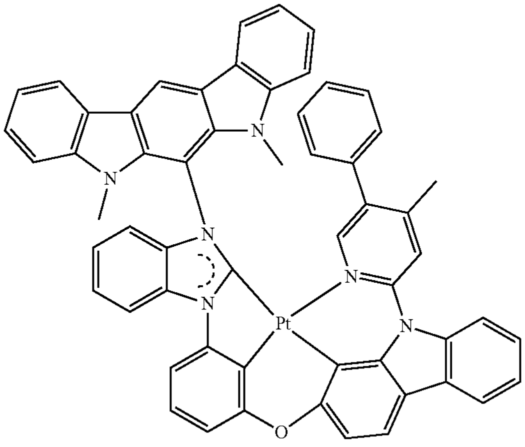
5
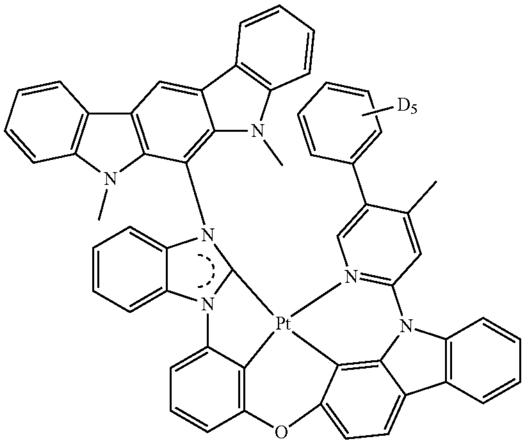
6
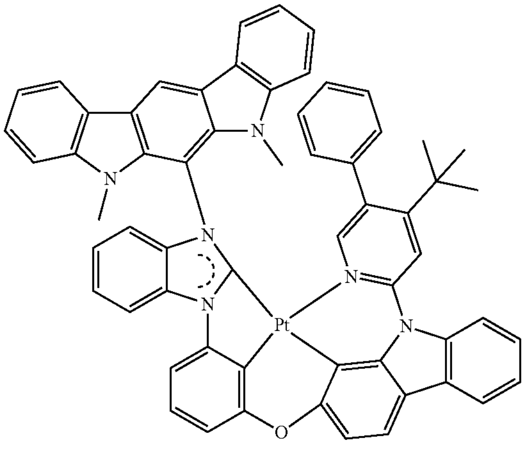
-continued
7
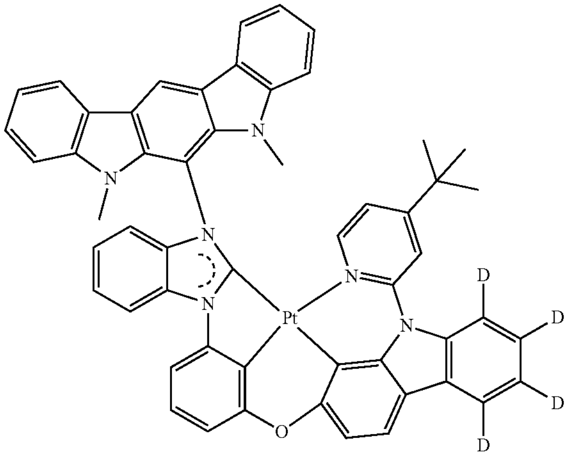
8
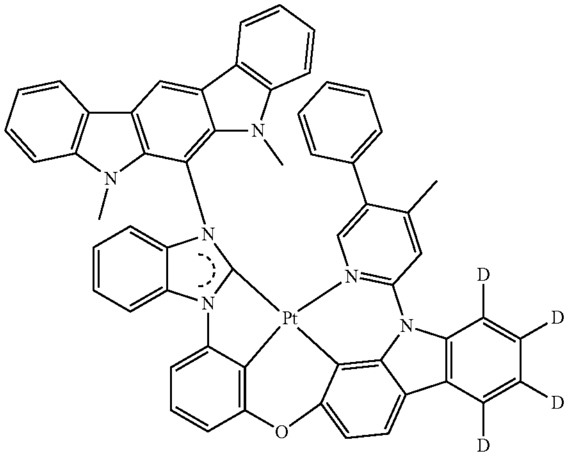
9
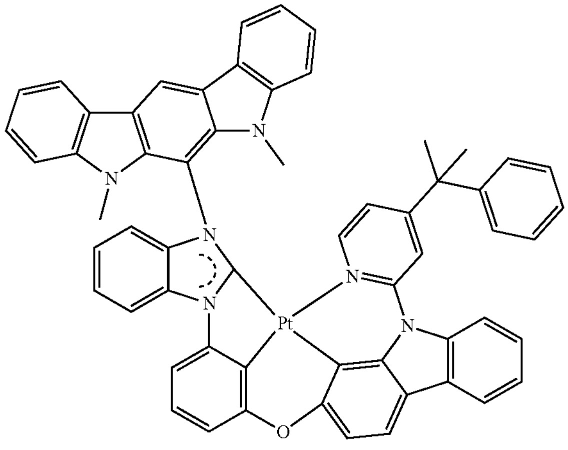

-continued
10
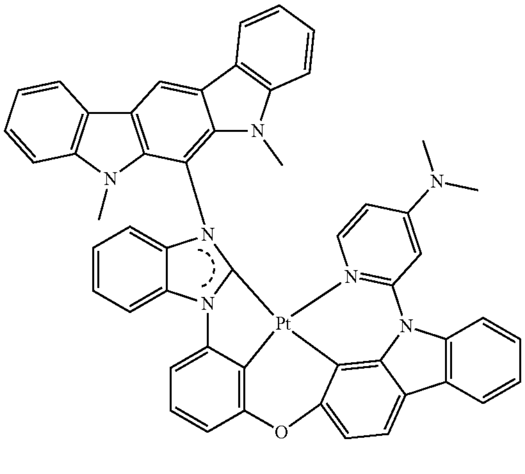
11
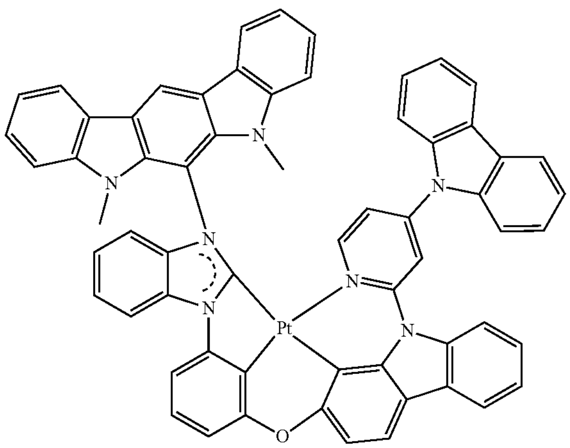
12
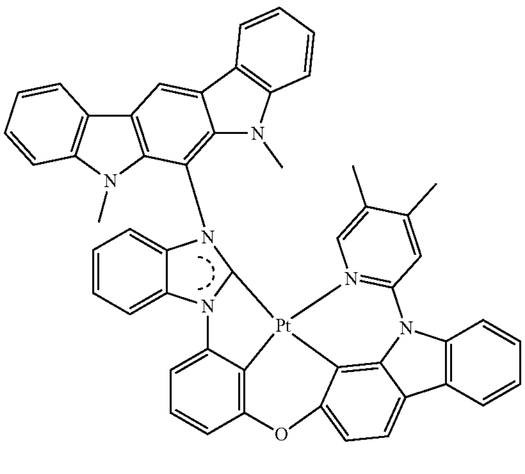
-continued
13
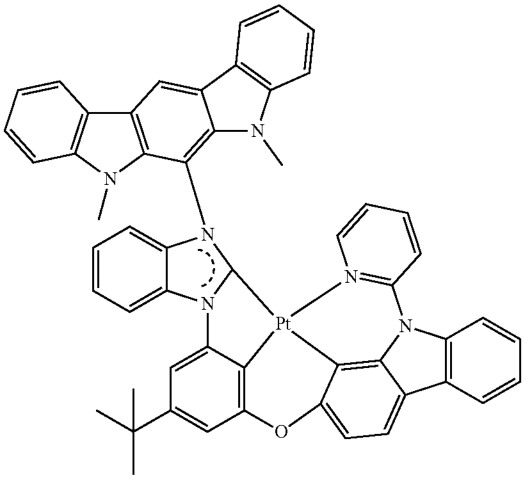
14
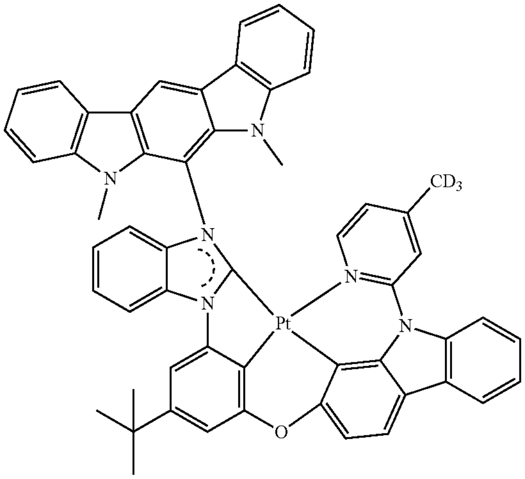
15
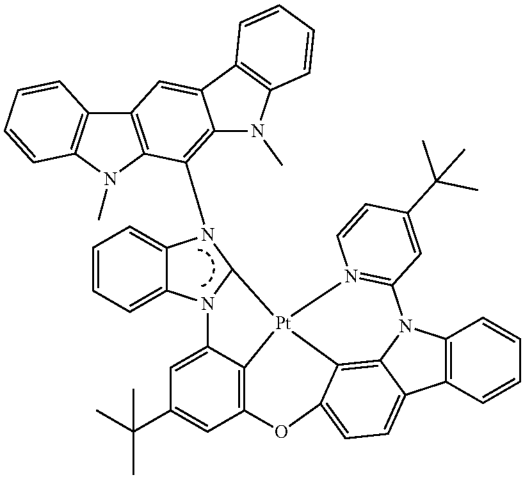

-continued
16
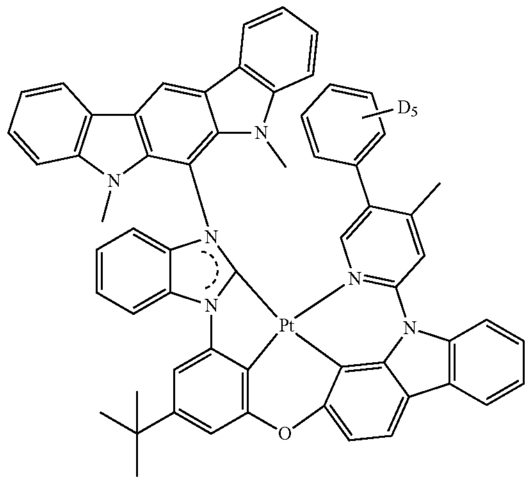
17
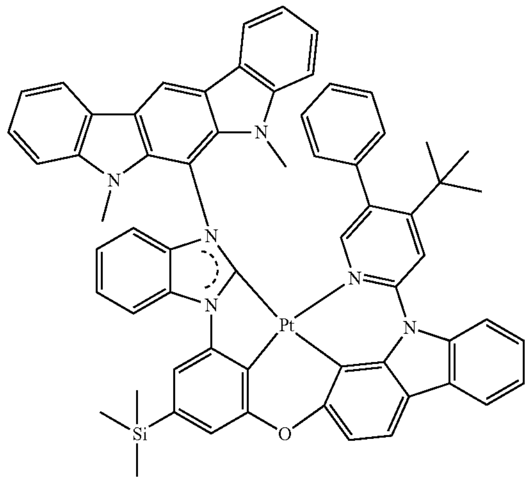
18
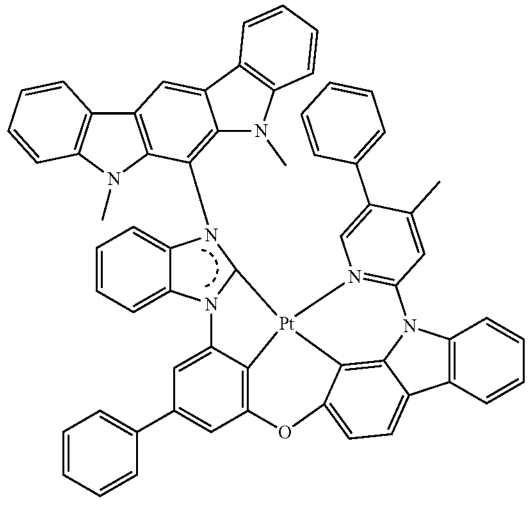
-continued
19
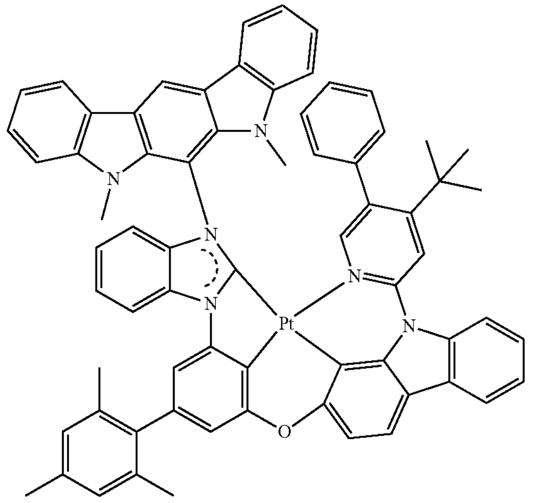
20
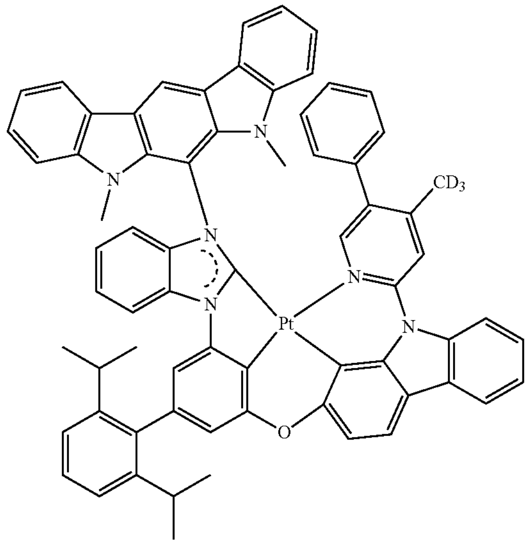
21
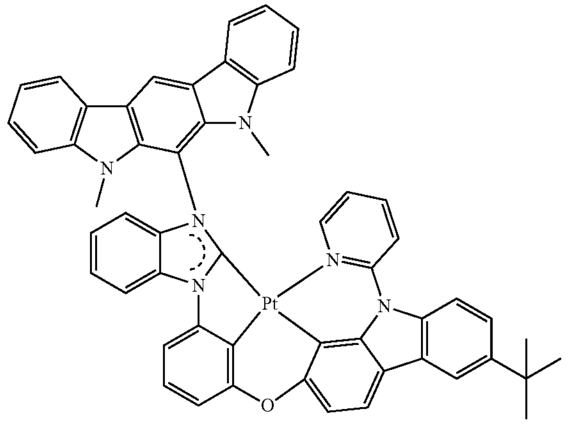

22
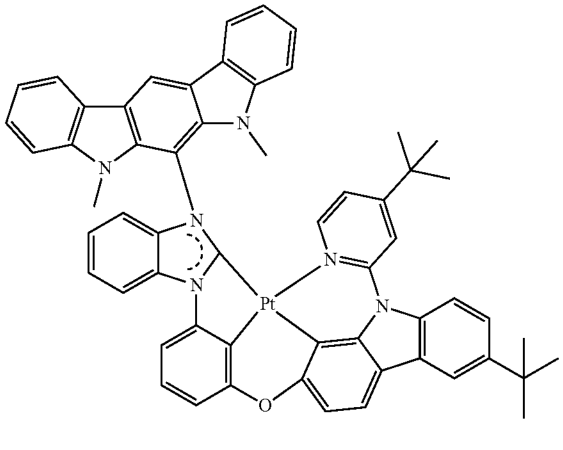
23
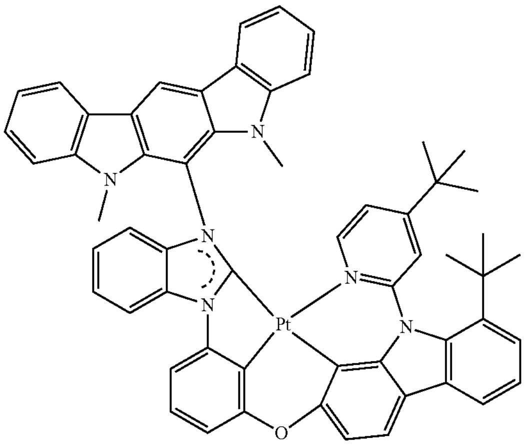
24
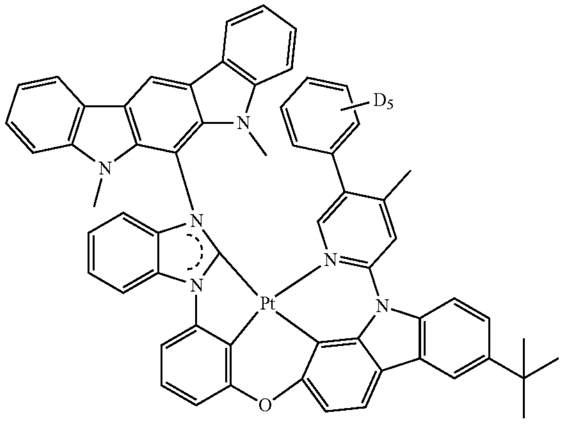
25
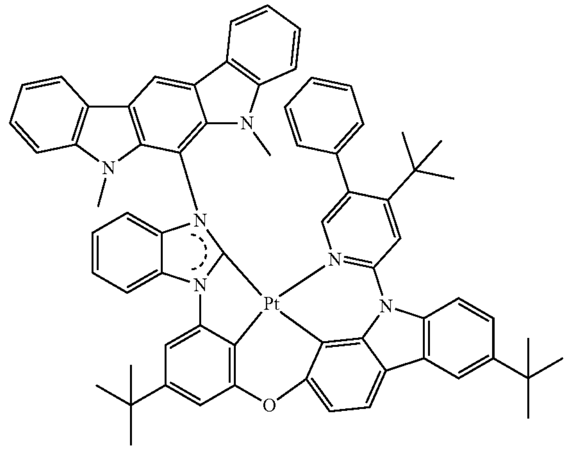
26
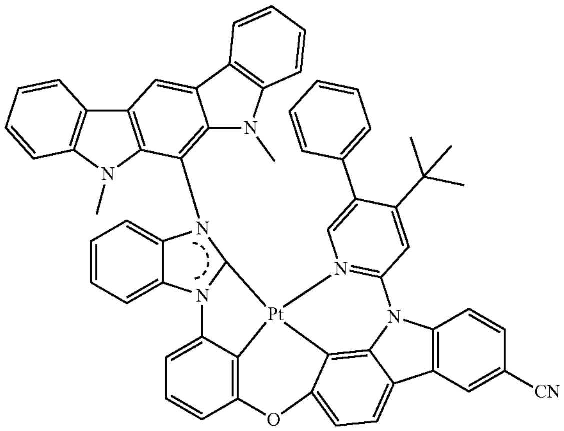
27
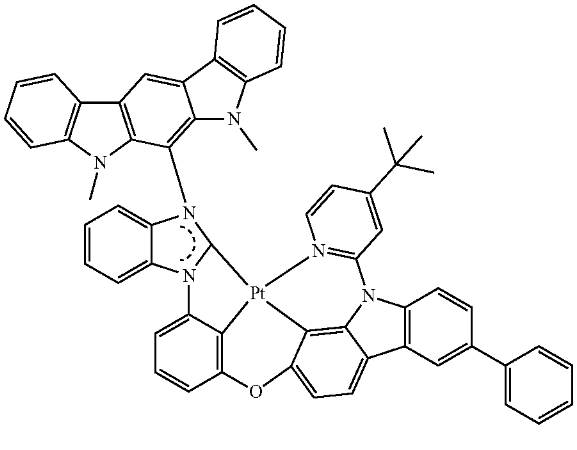

-continued
28
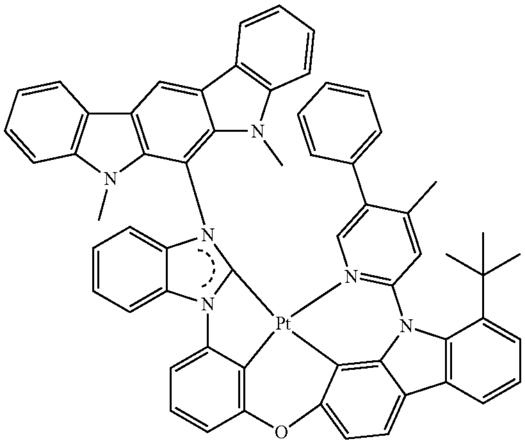
29
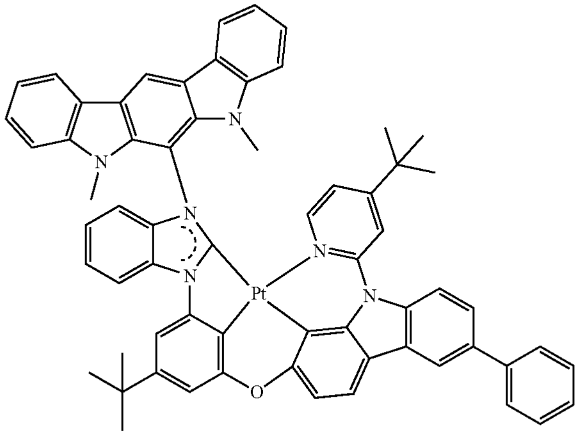
30
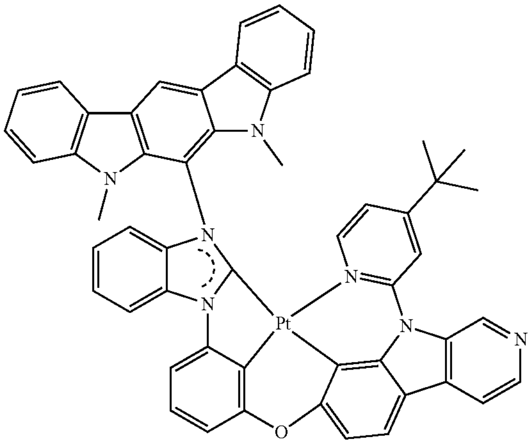
-continued
31
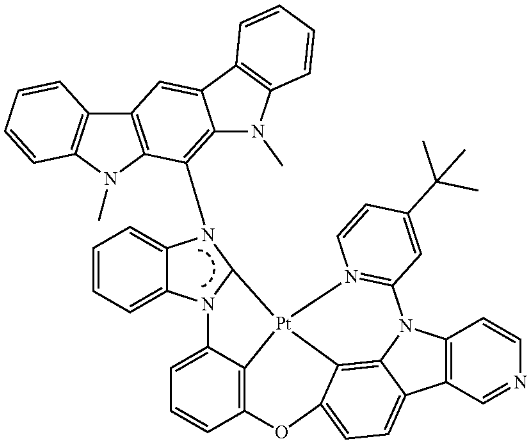
32
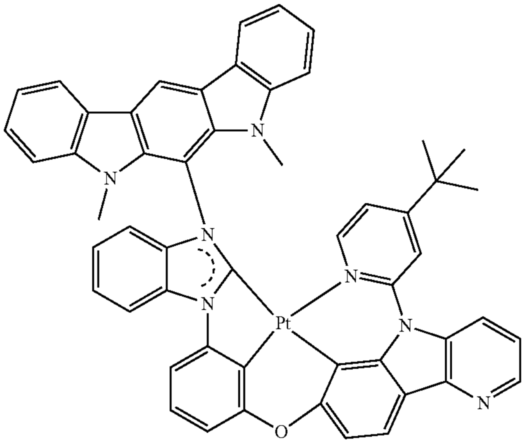
33
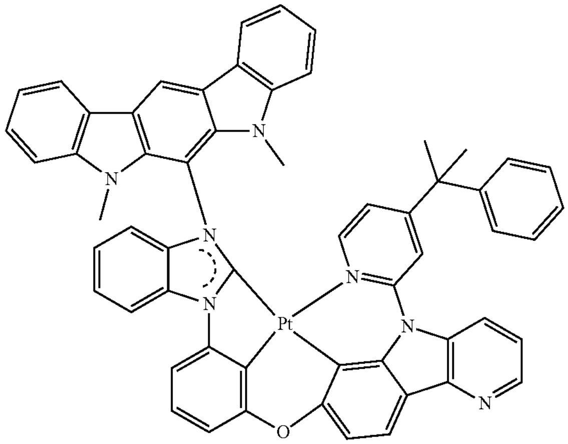

-continued
34
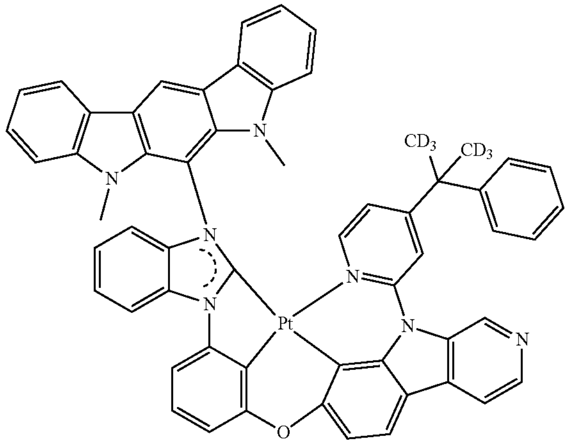
35
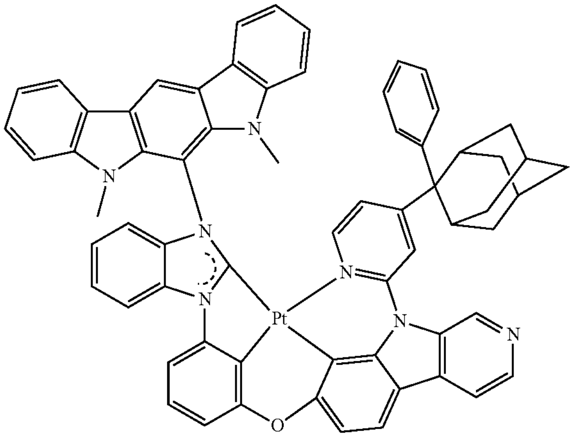
36
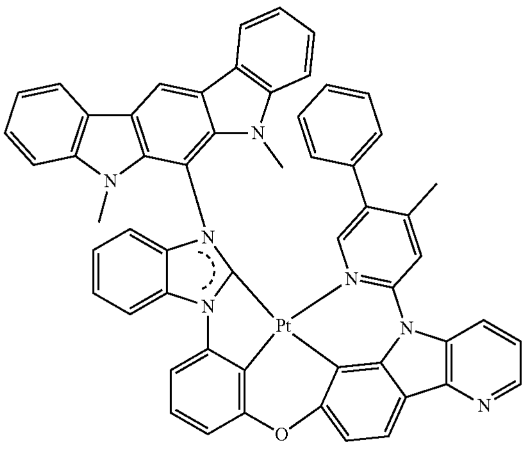
-continued
37
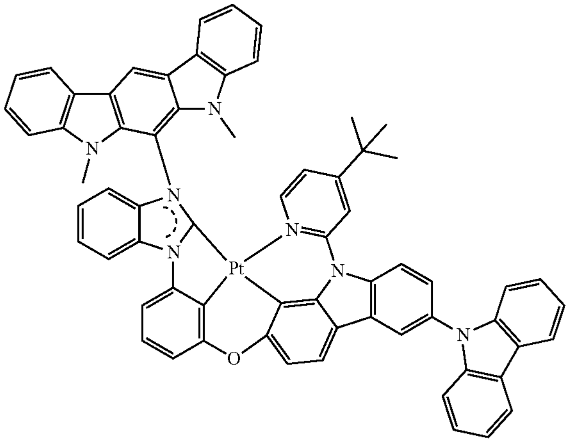
38
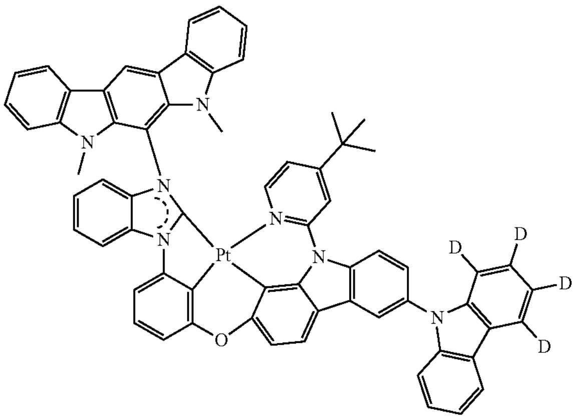
39
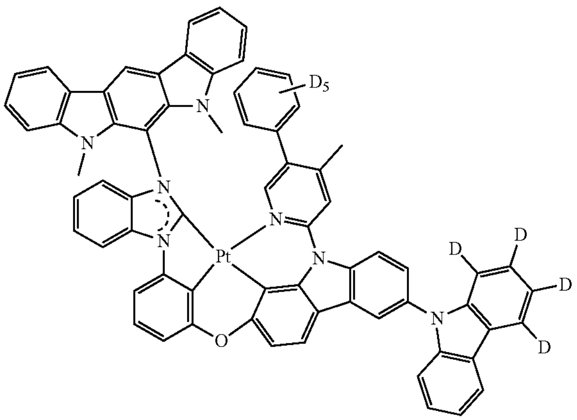

-continued
40
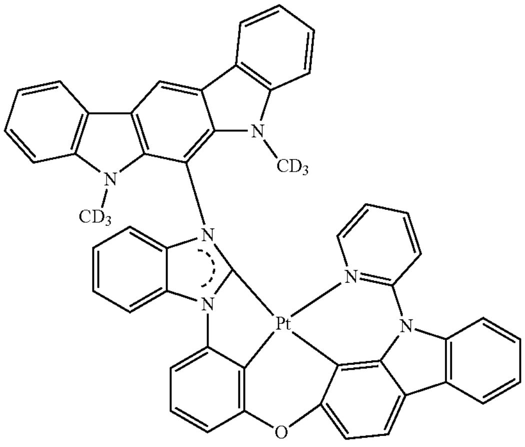
41
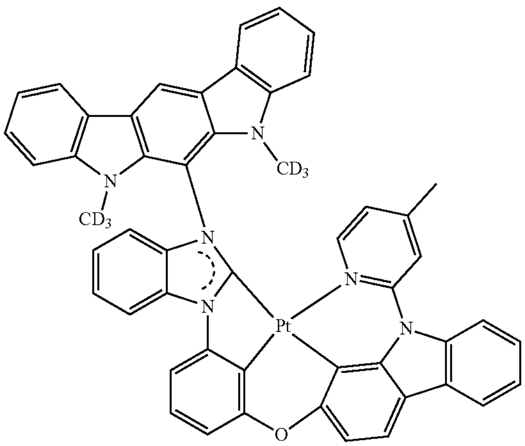
42
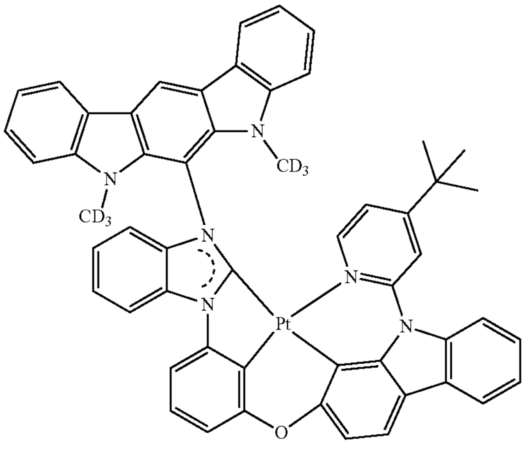
-continued
43
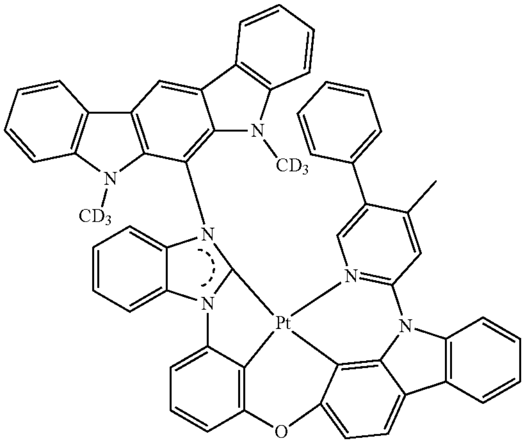
44
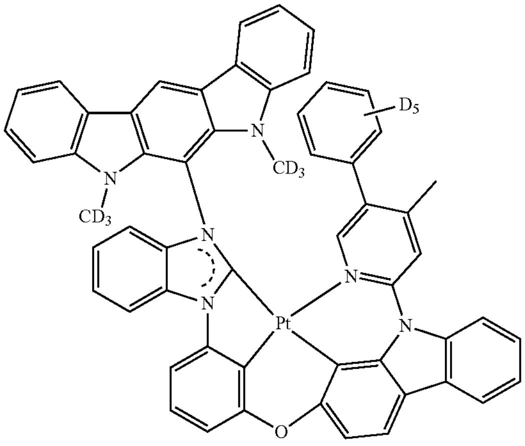
45
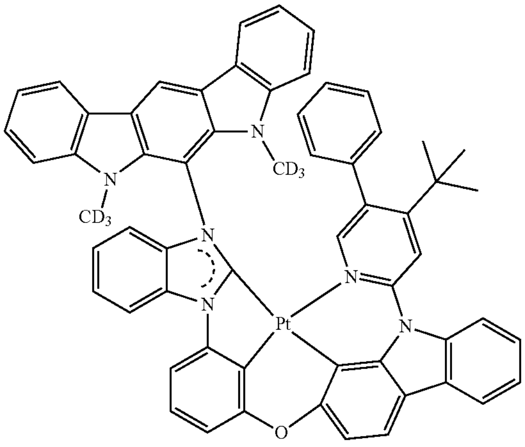

-continued
46
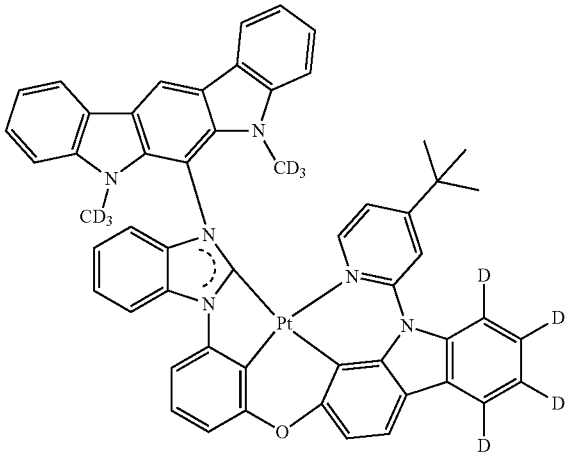
47
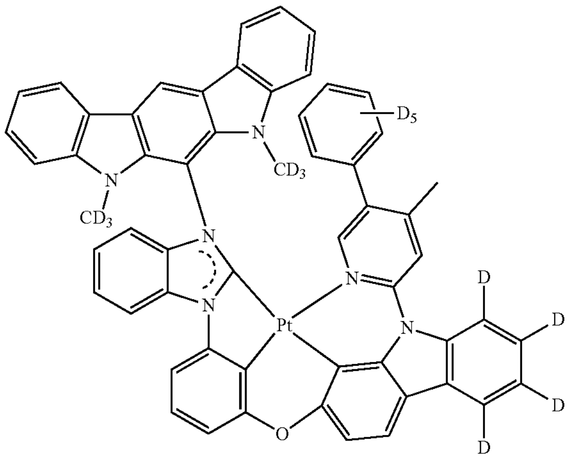
48
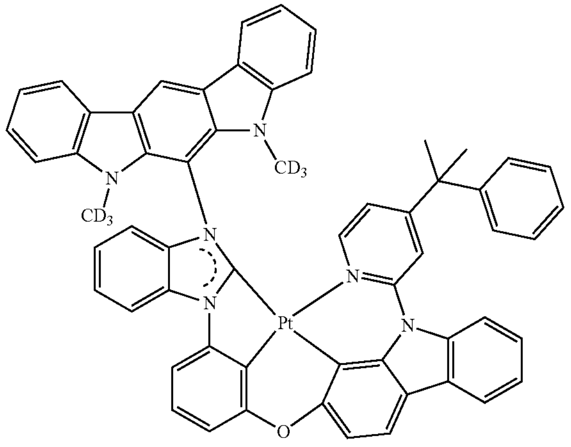
-continued
49
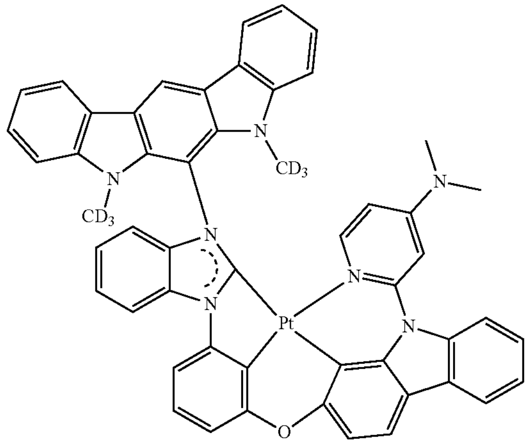
50
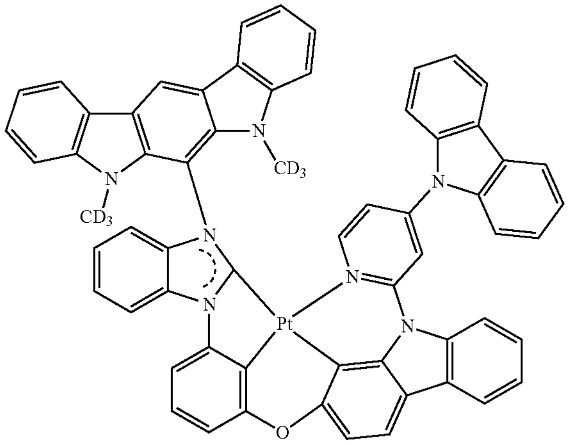
51
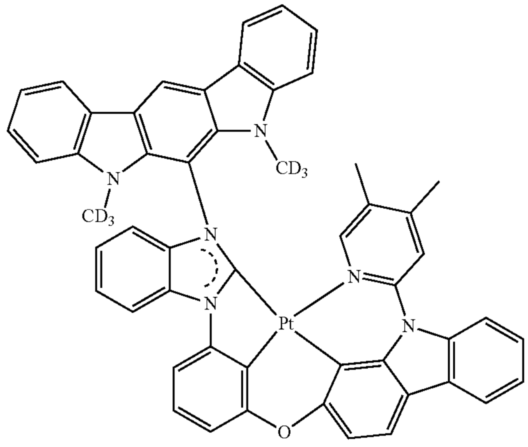

-continued
52
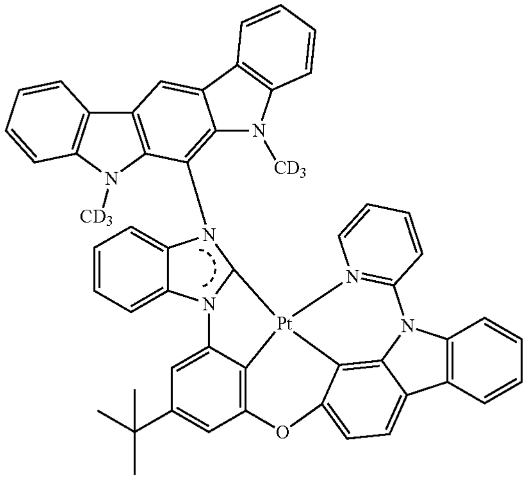
53
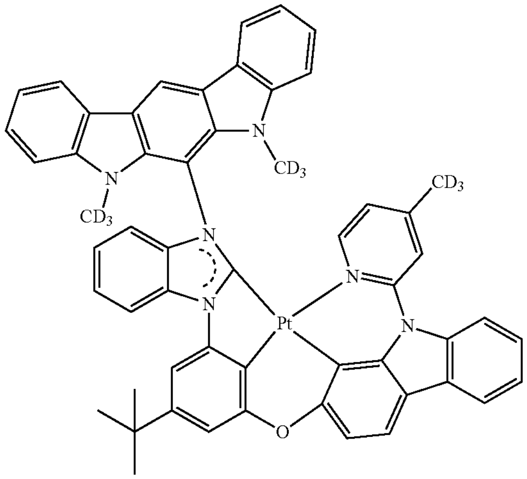
54
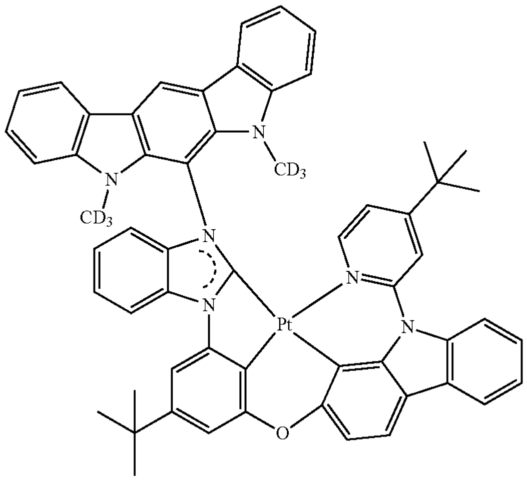
-continued
55
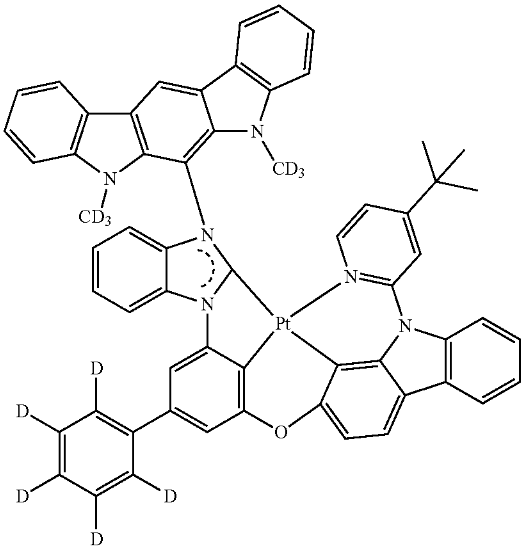
56
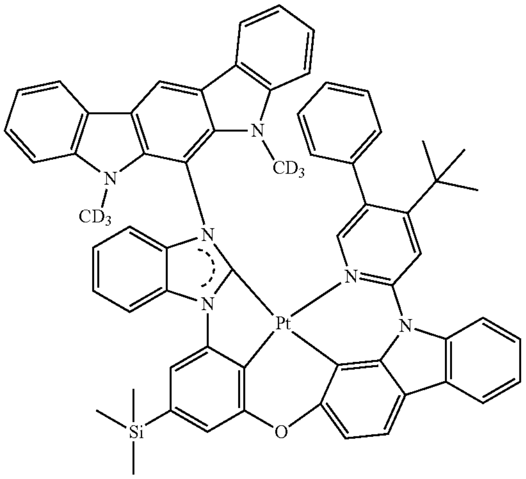
57
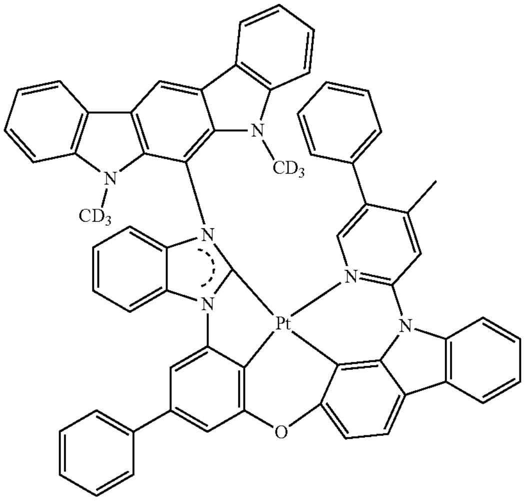

-continued
58
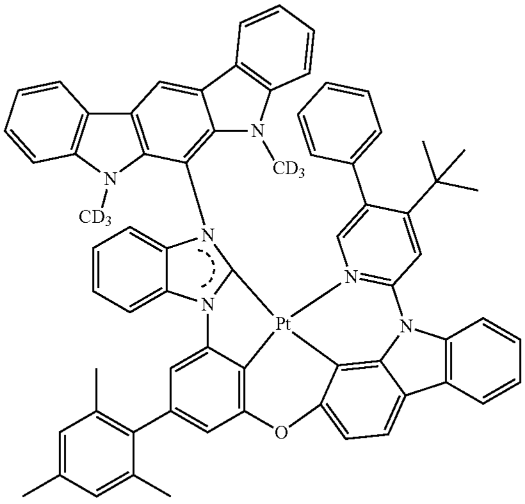
59
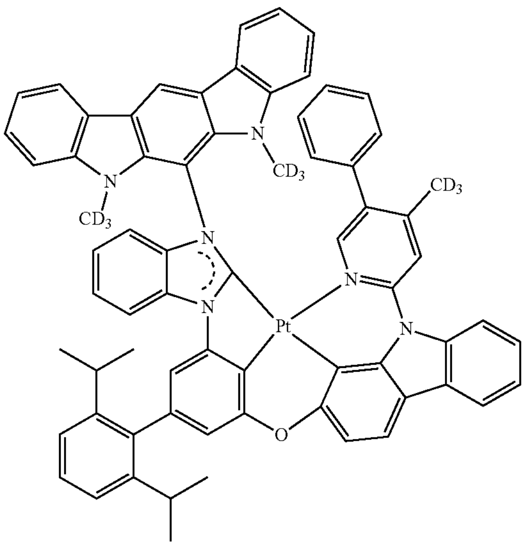
60
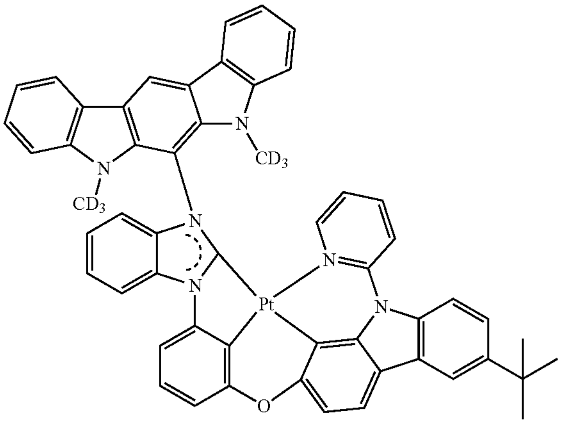
-continued
61
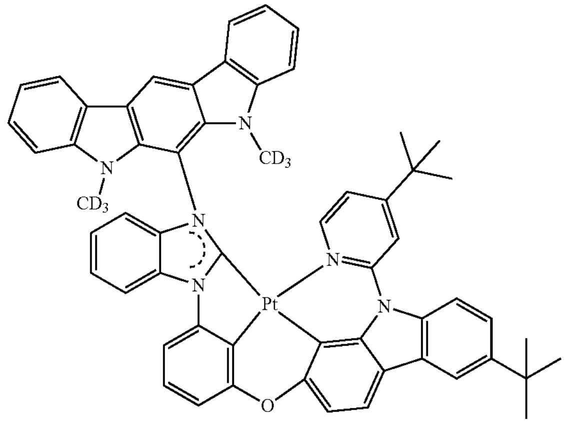
62
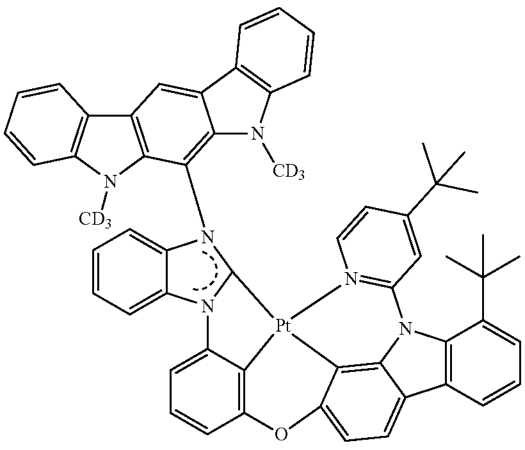
63
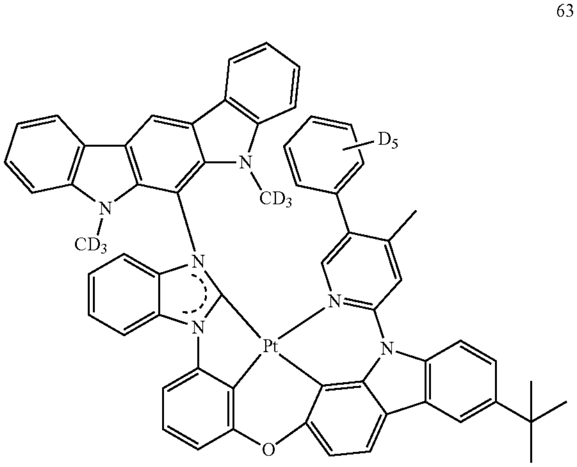

-continued
64
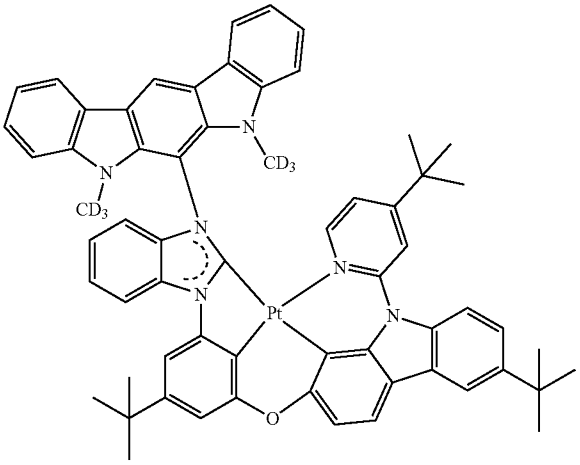
65
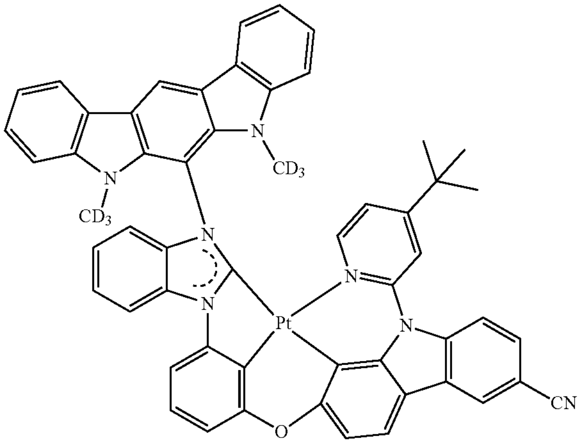
66
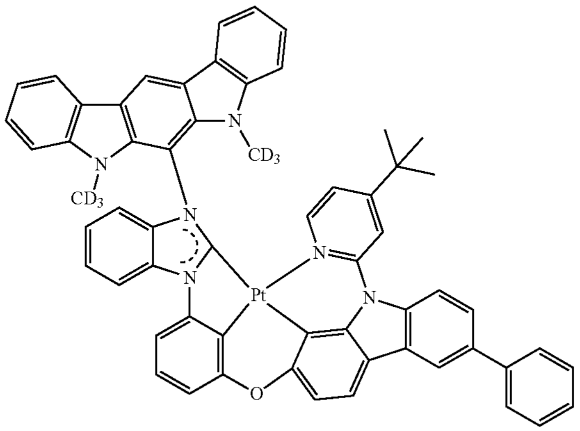
-continued
67
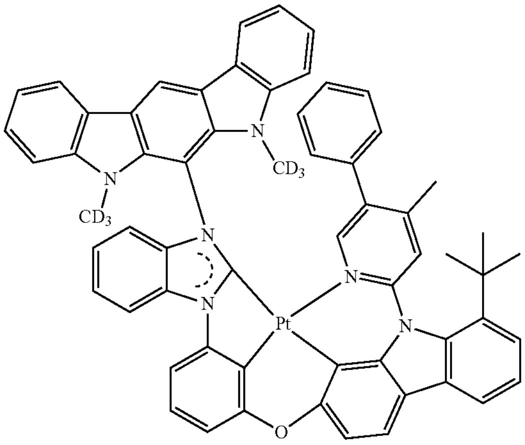
68
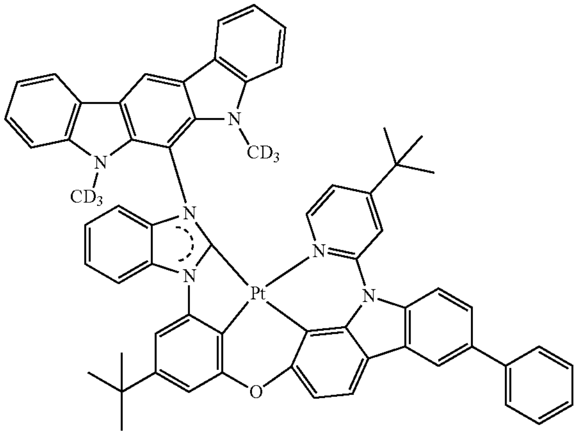
69
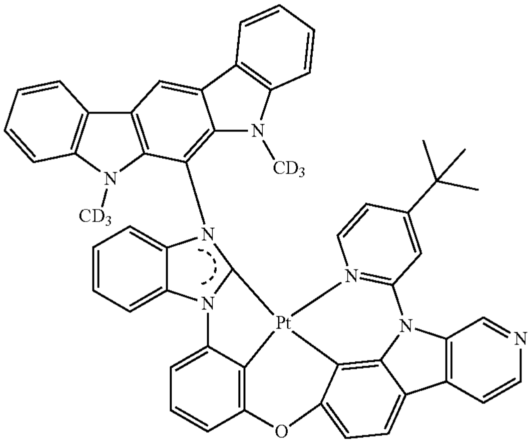

-continued
70
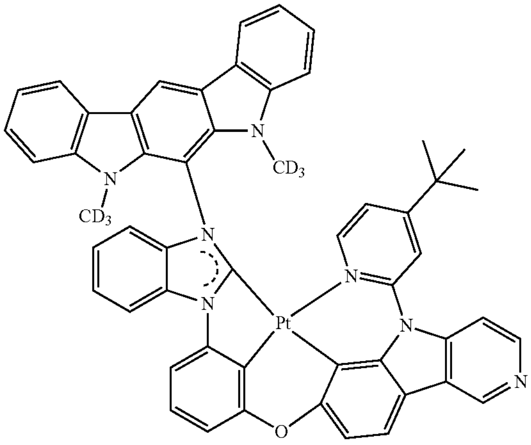
71
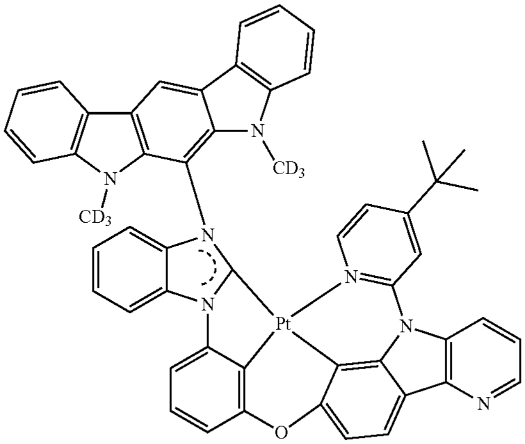
72
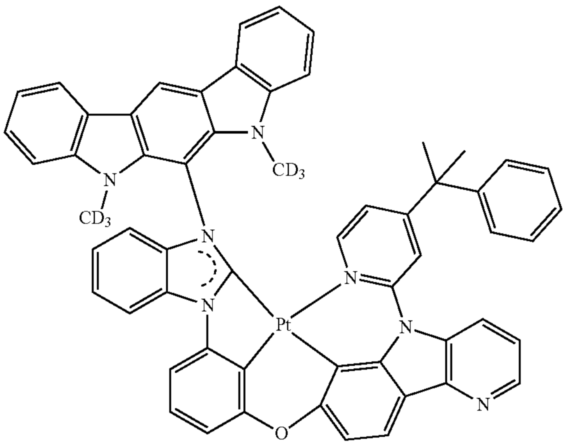
-continued
73
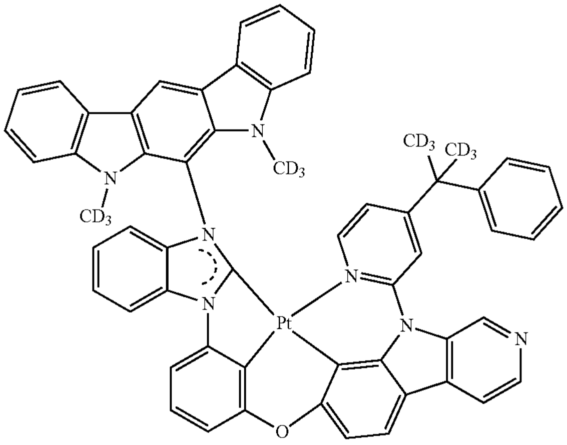
74
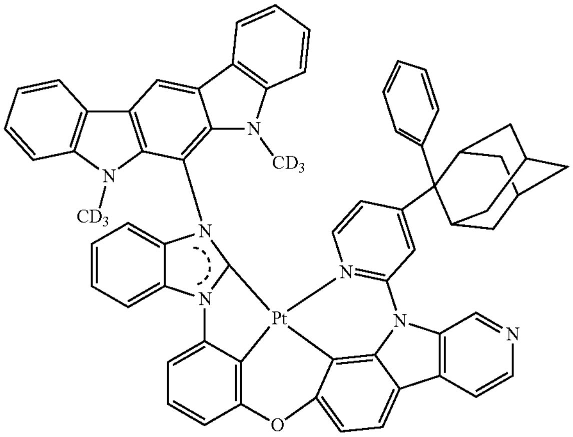
75
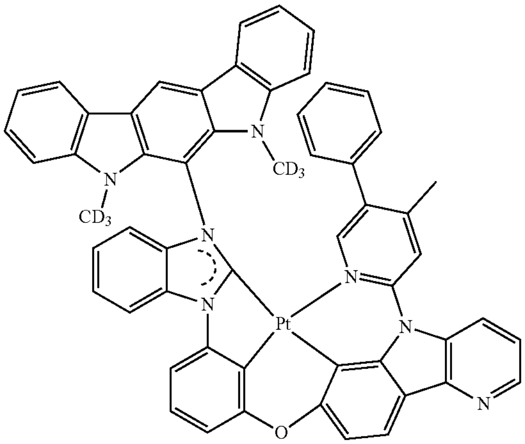

-continued
76
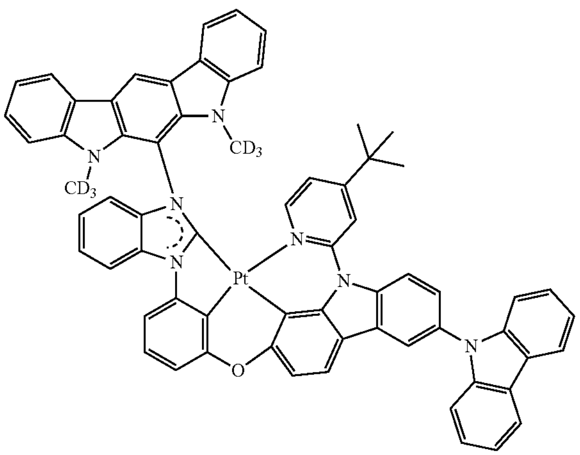
77
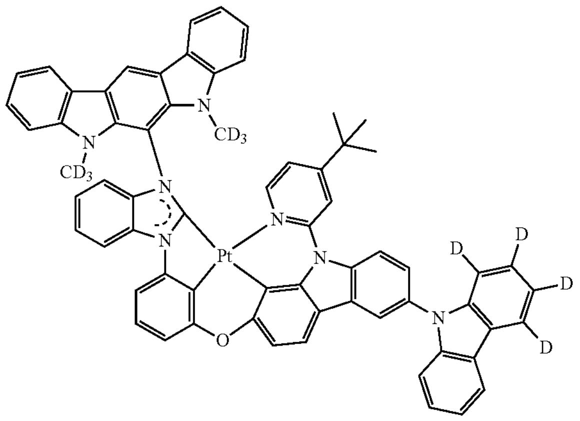
78
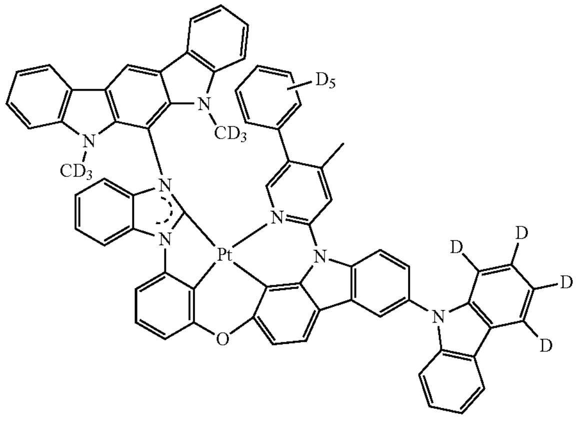
-continued
79
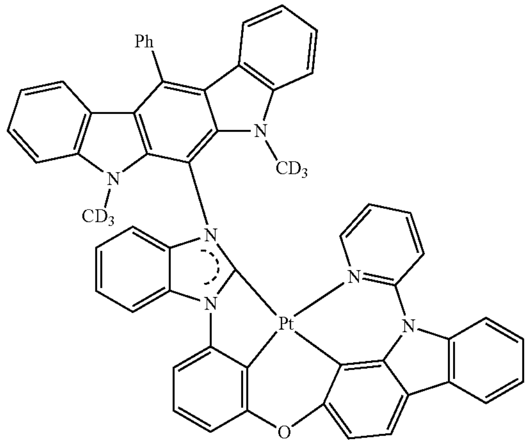
80
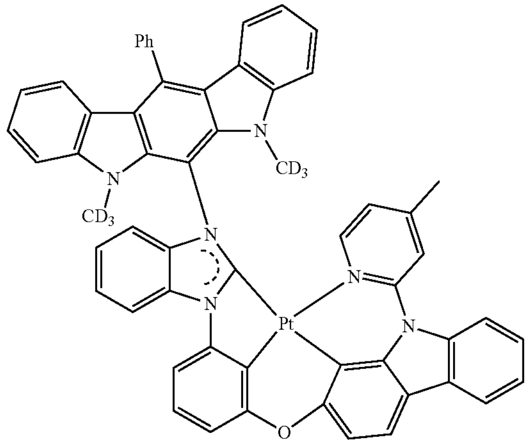
81
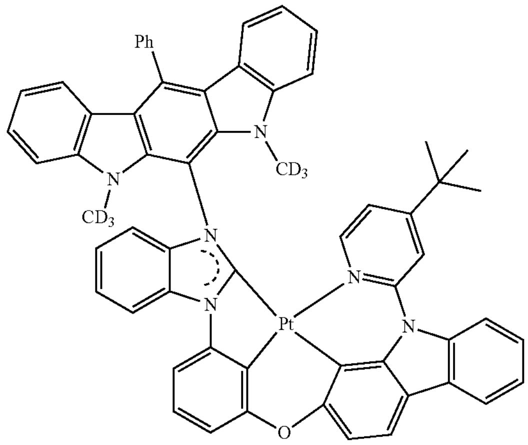

-continued
82
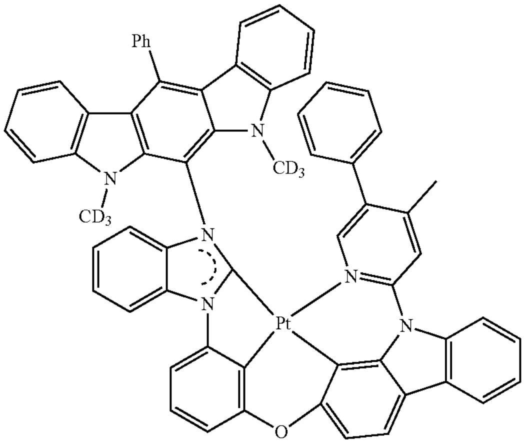
83
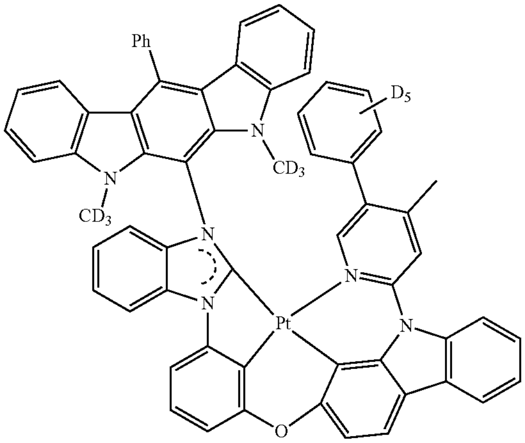
84
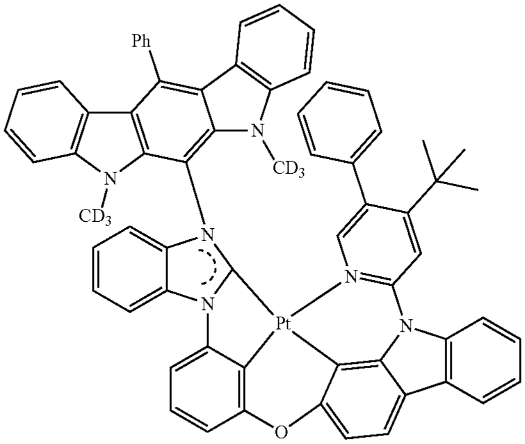
-continued
85
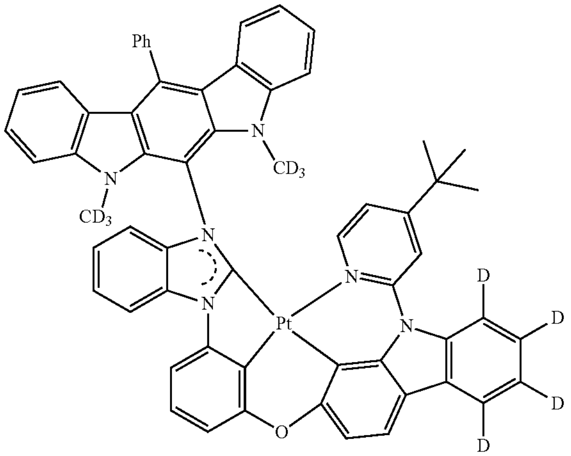
86
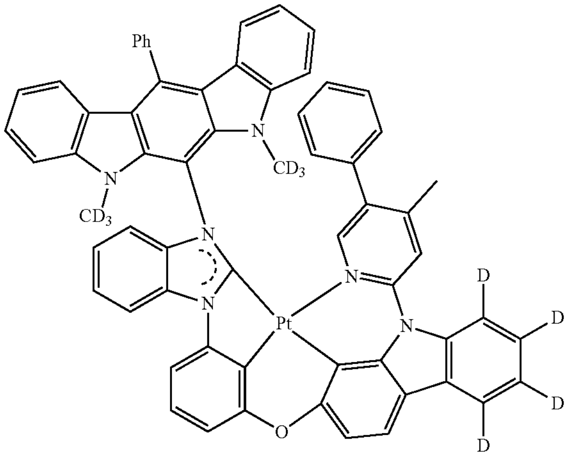
87
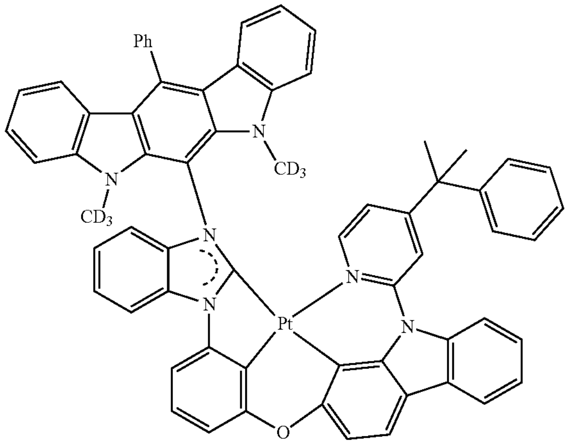

-continued
88
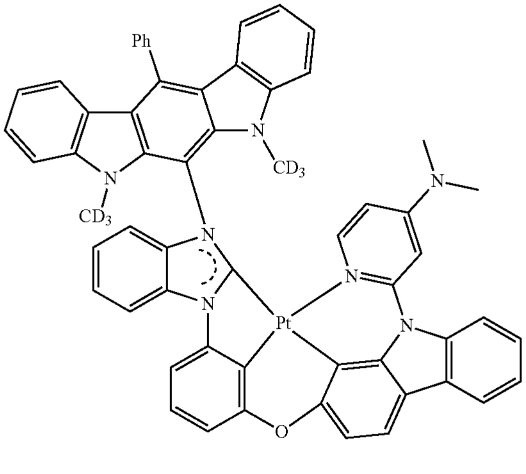
89
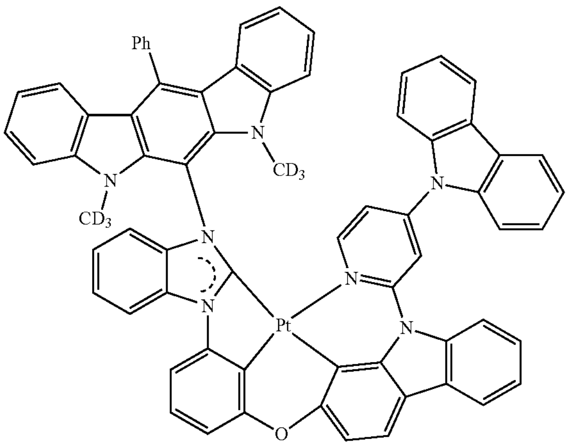
90
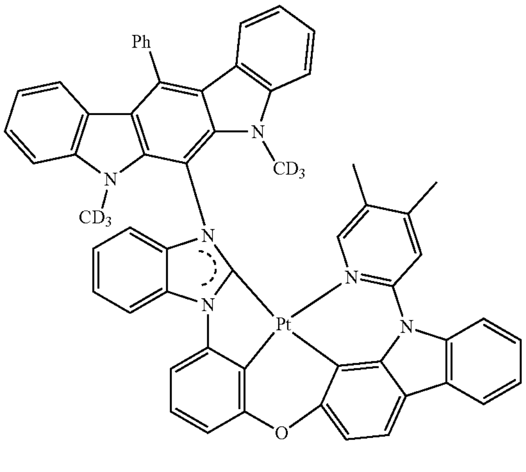
-continued
91
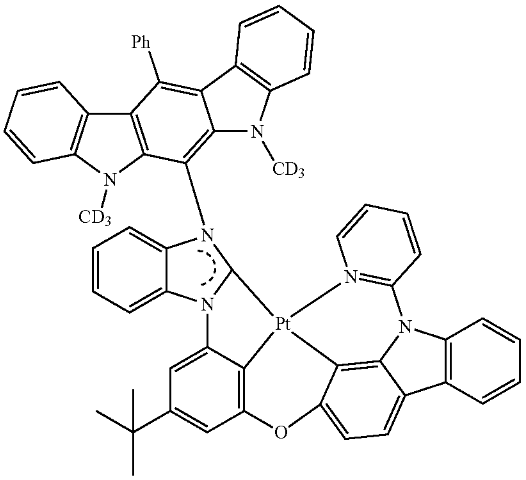
92
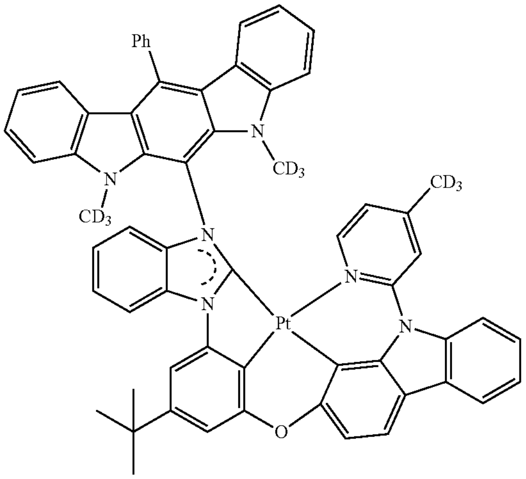
93
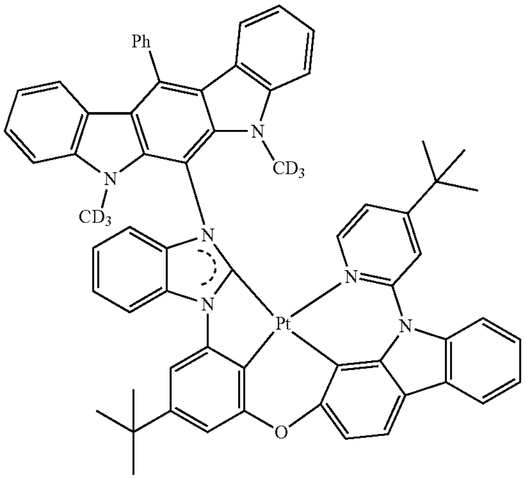

-continued
94
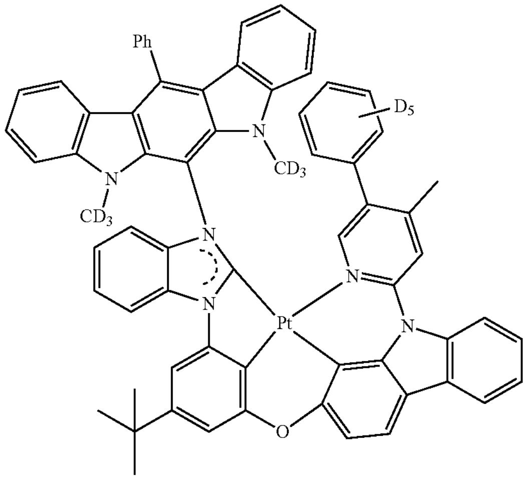
95
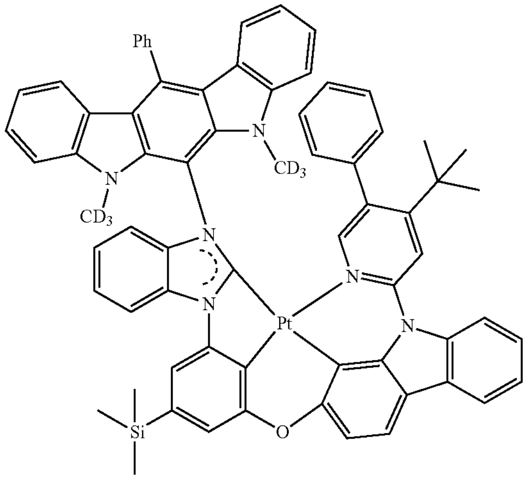
96
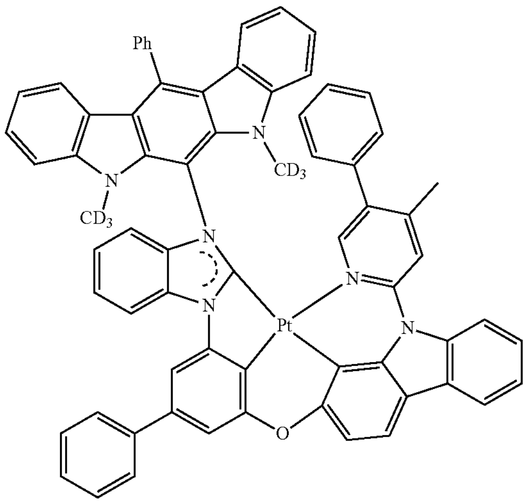
-continued
97
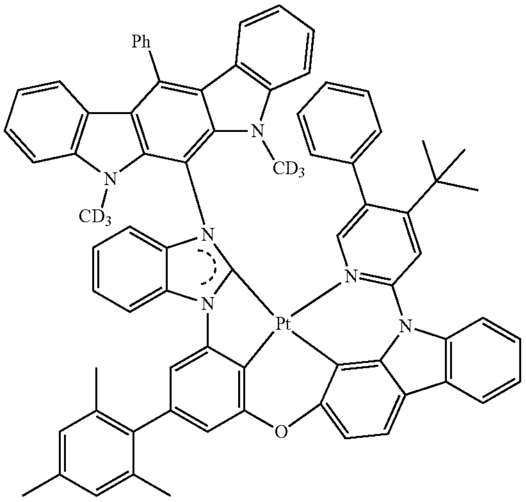
98
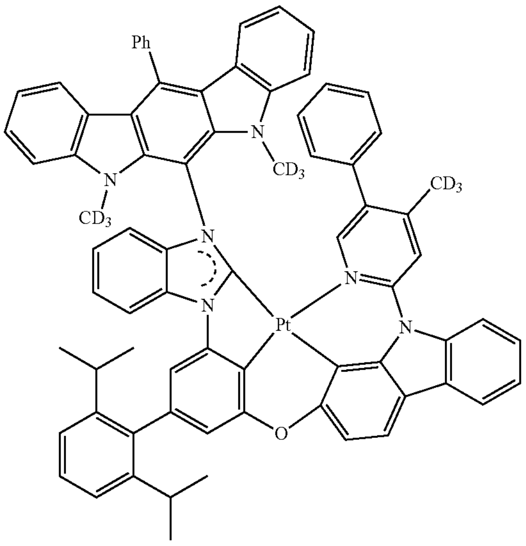
99
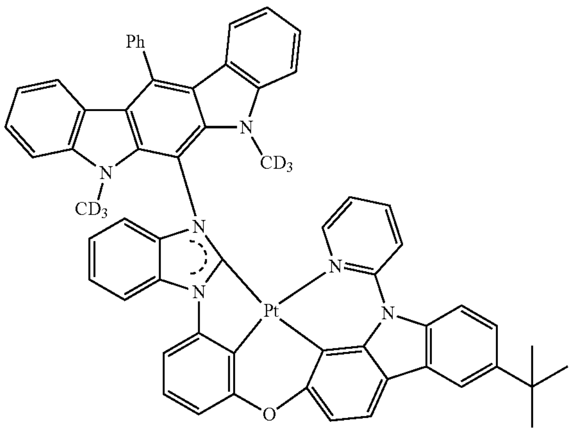

-continued
100
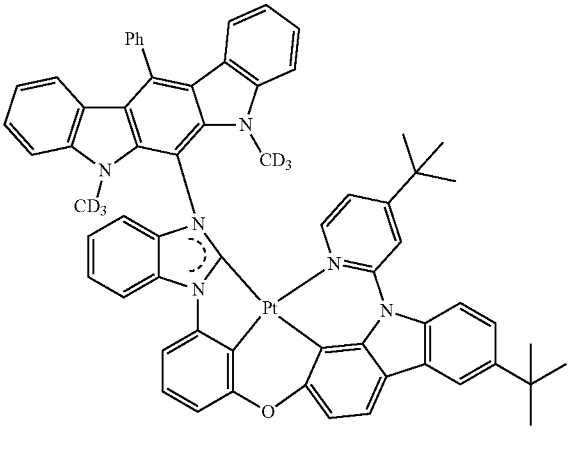
101
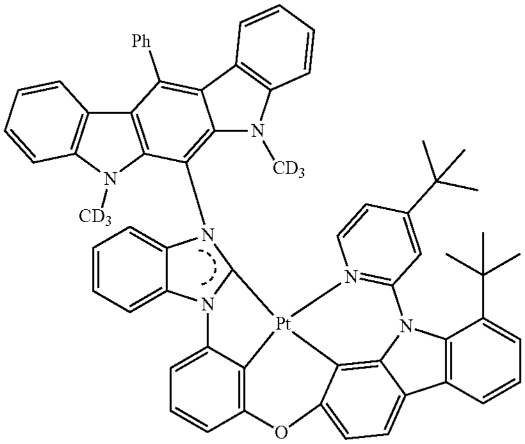
102
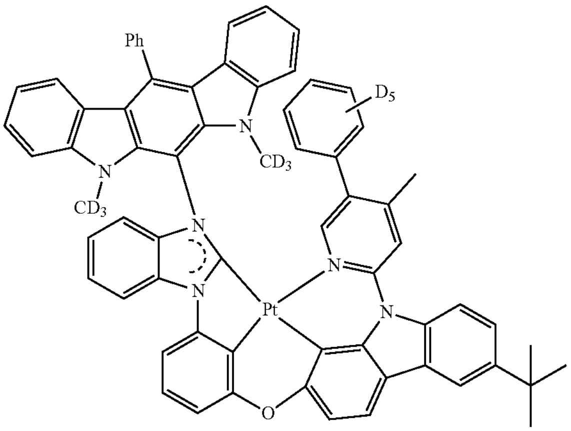
-continued
103
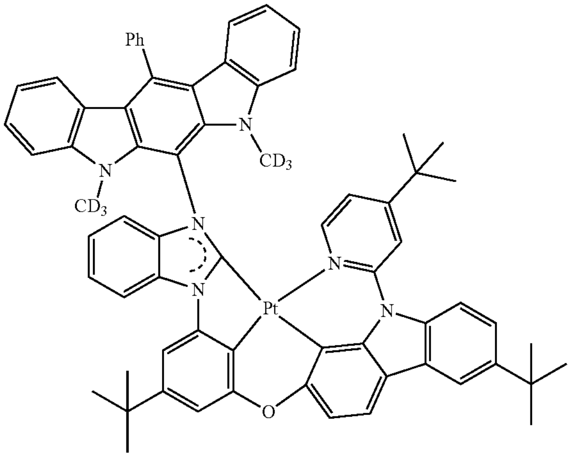
104
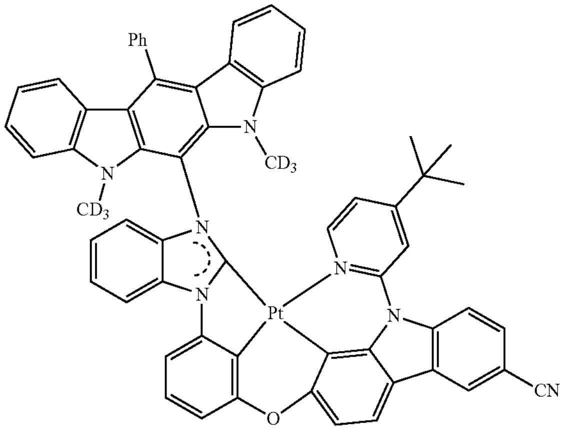
105
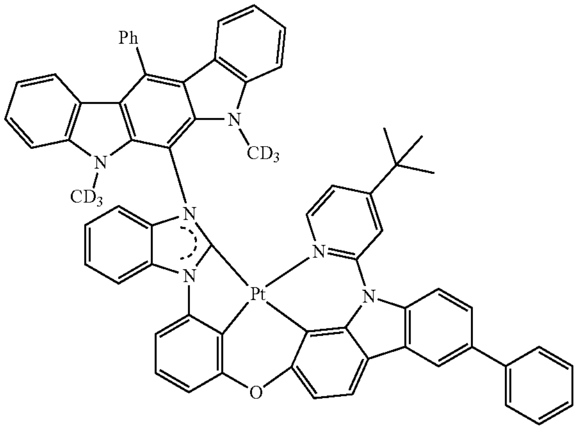

-continued
106
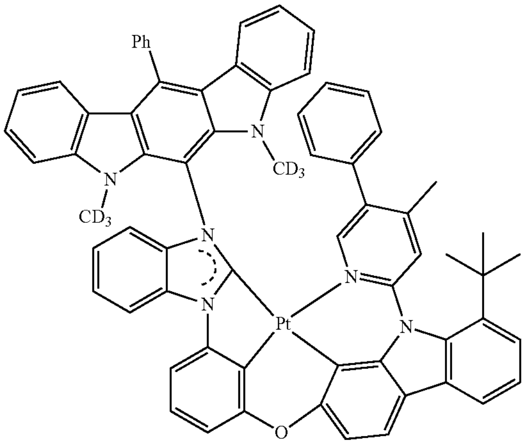
107
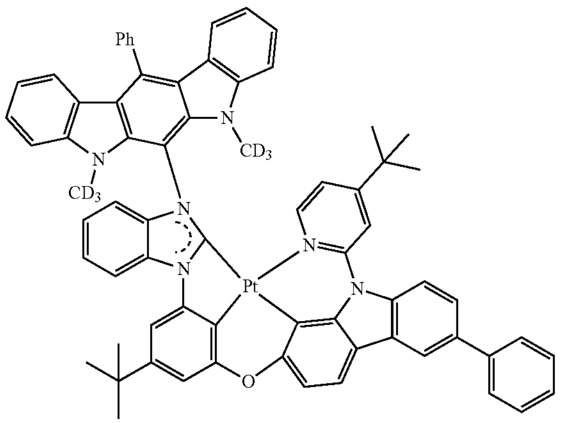
108
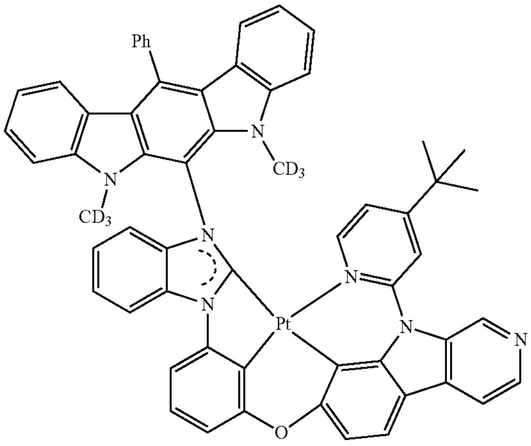
-continued
109
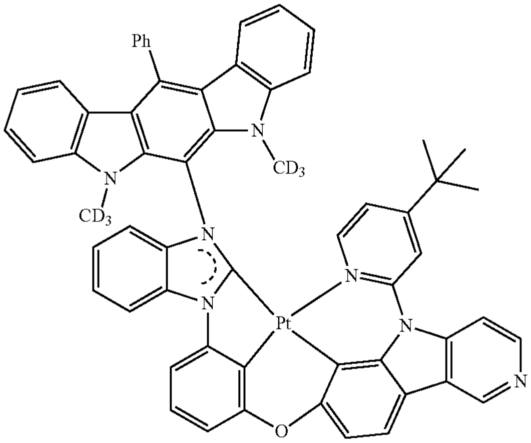
110
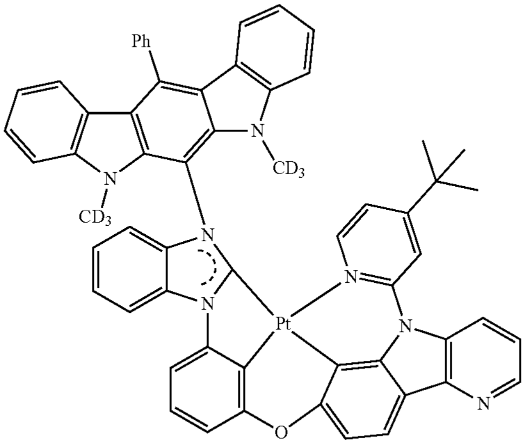
111
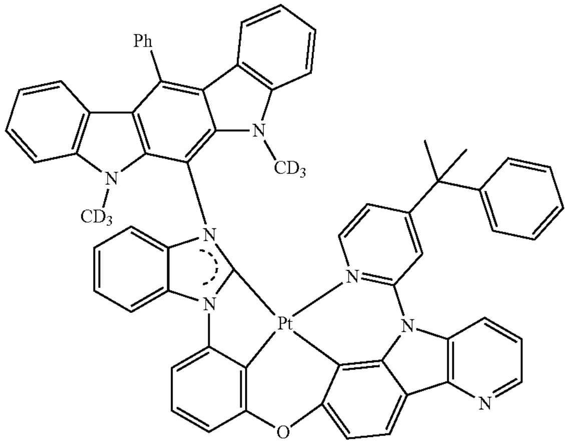

-continued
112
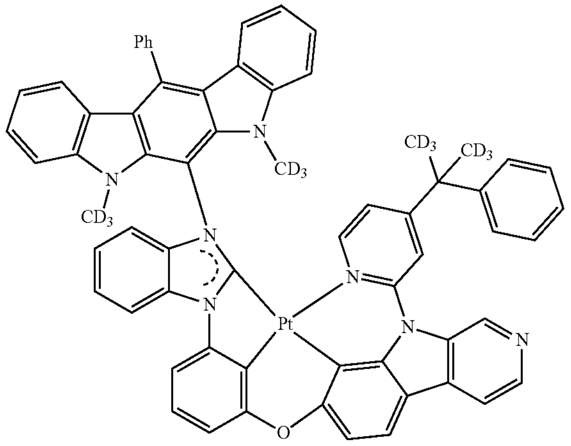
113
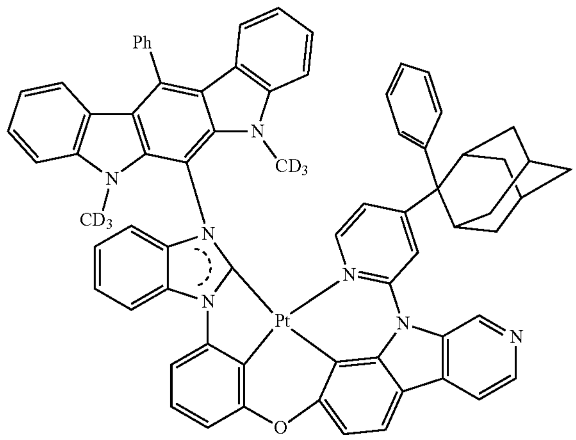
114
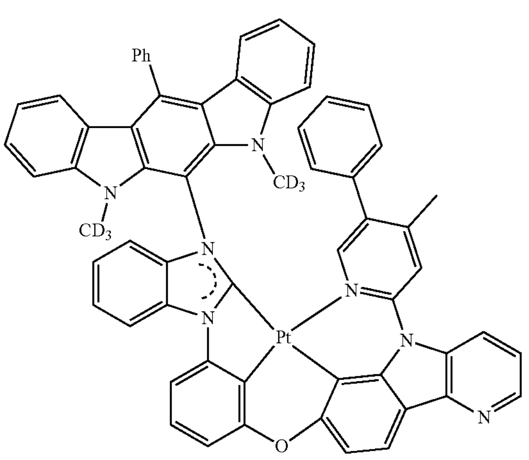
-continued
115
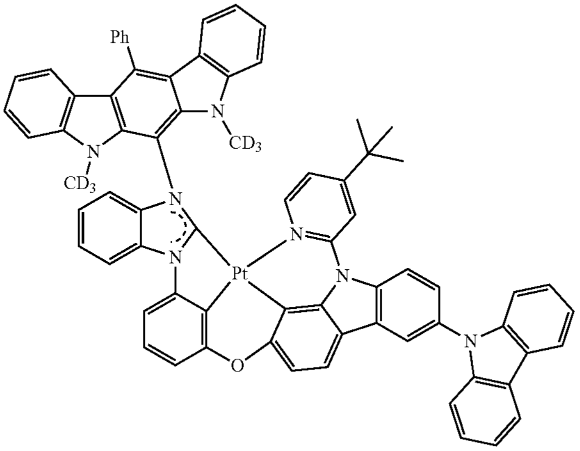
116
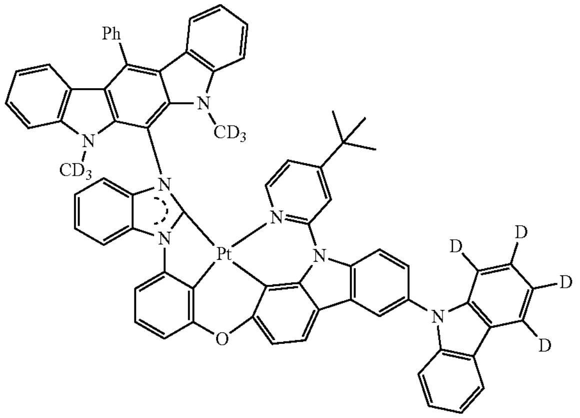
117
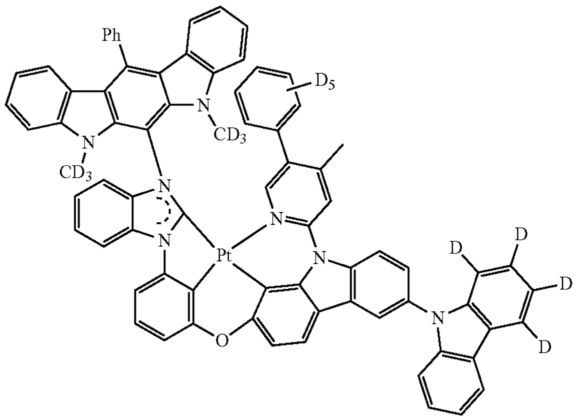

-continued
118
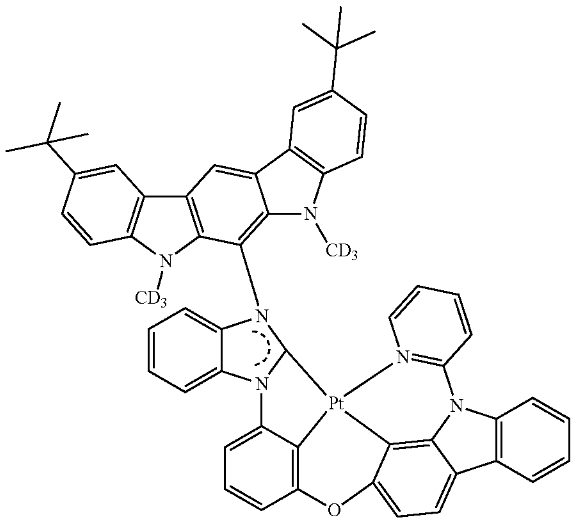
119
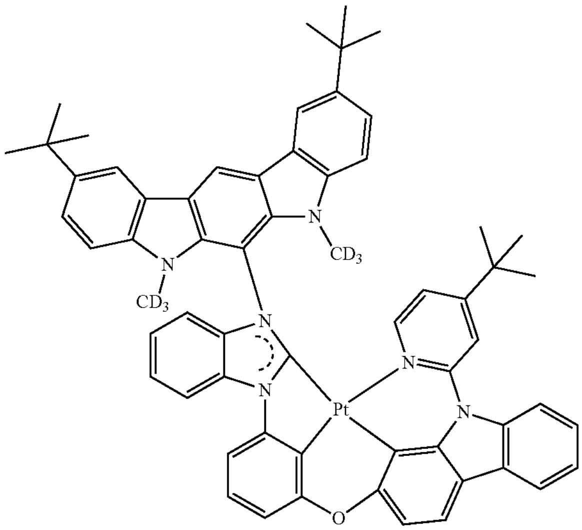
120
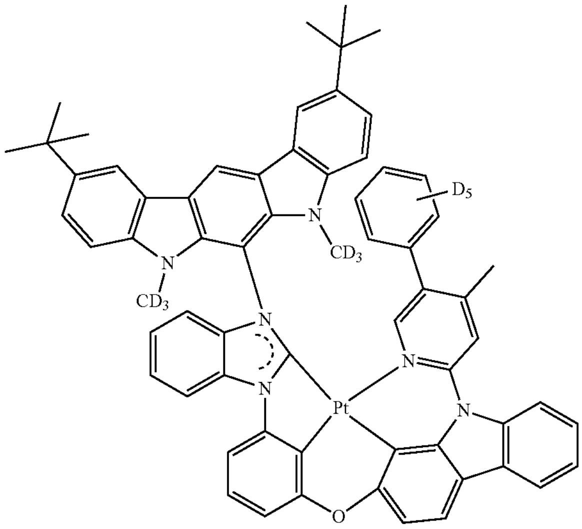
-continued
121
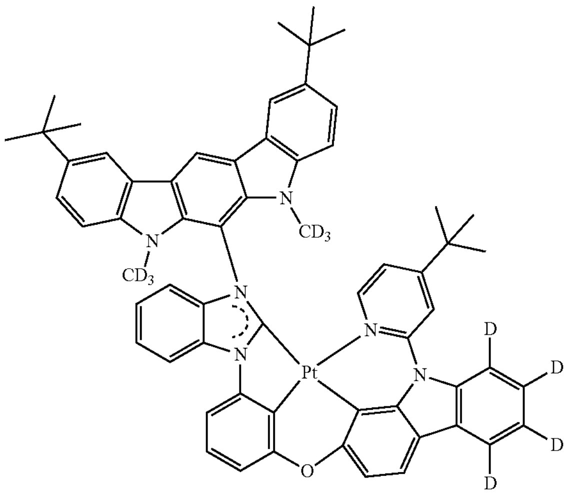
122
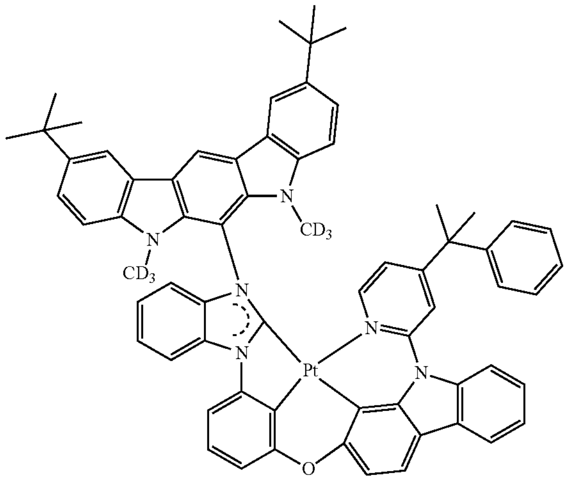
123
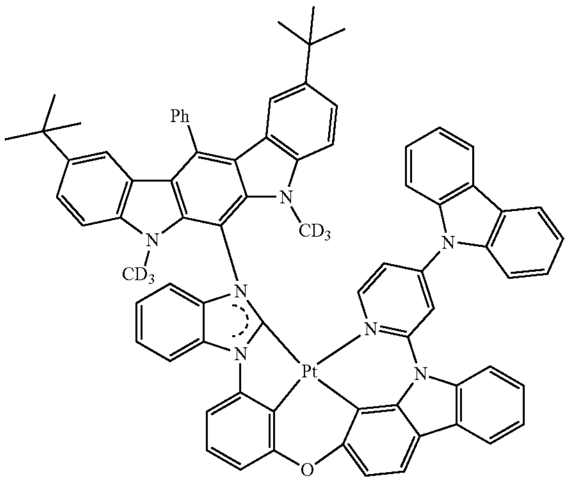

-continued
124
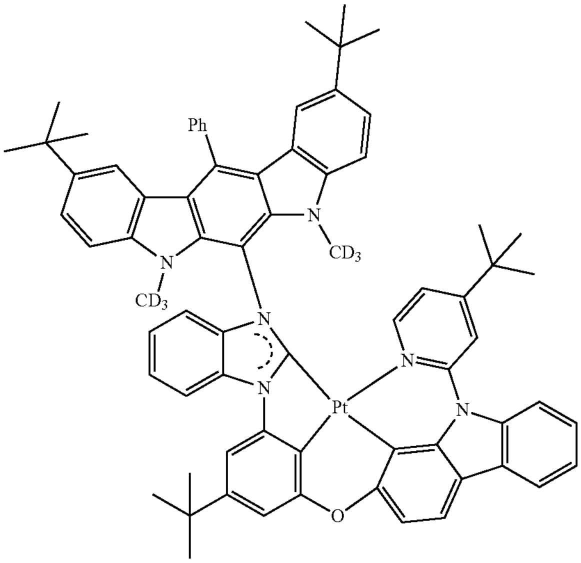
125
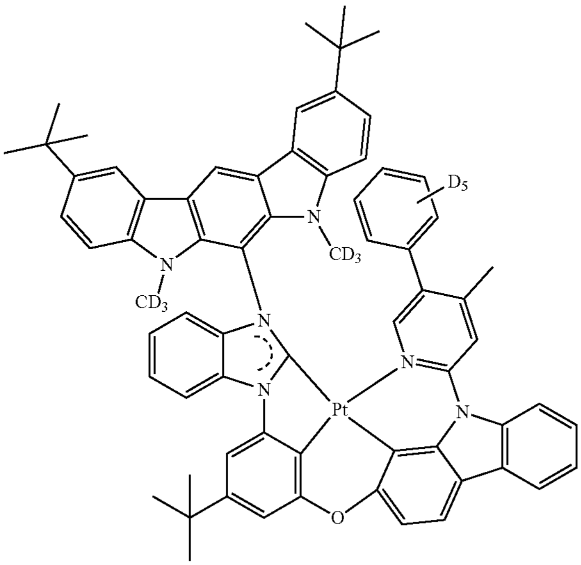
-continued
126
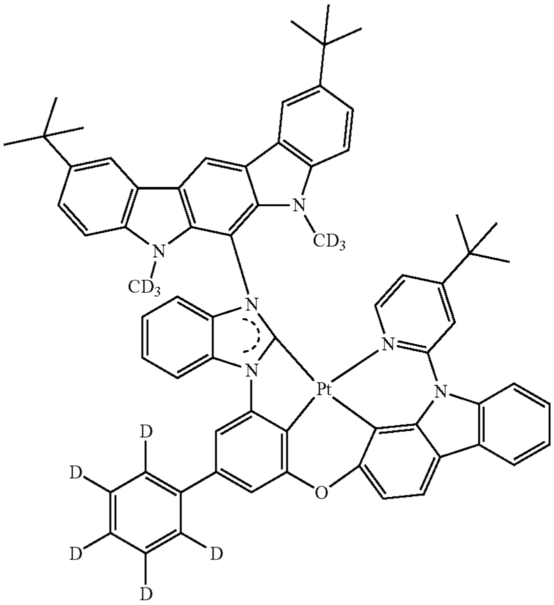
127
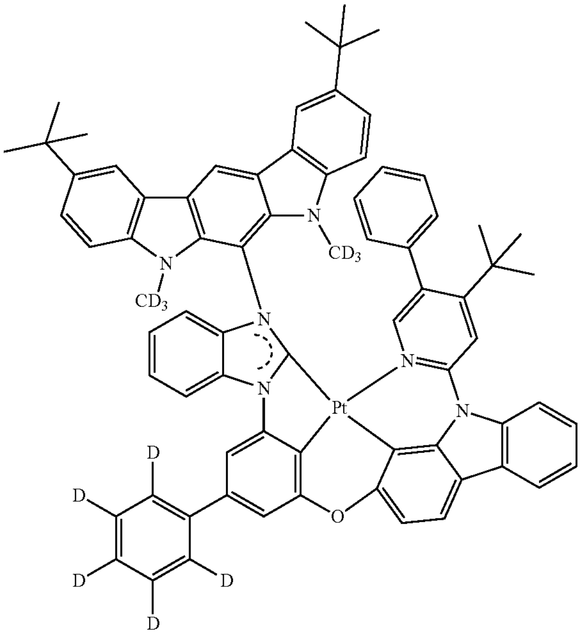

-continued

128

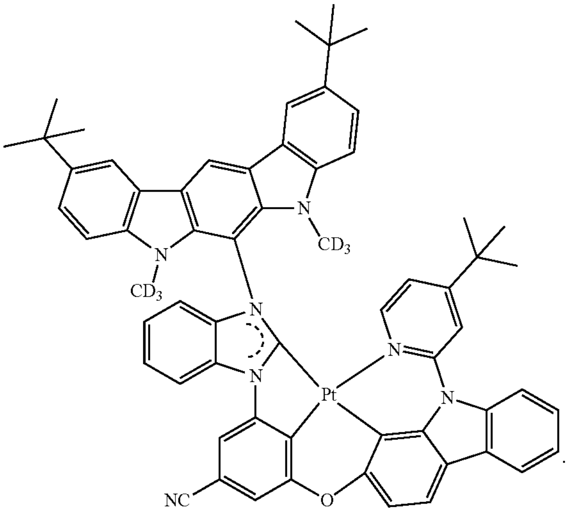

In one or more embodiments, the organometallic compound represented by Formula 1 may emit blue light having a maximum emission wavelength of about 430 nm or more and about 480 nm or less, about 430 nm or more and about 475 nm or less, about 440 nm or more and about 470 nm or less, about 450 nm or more and about 470 nm or less, or about 455 nm or more and about 470 nm or less.

In one or more embodiments, the organometallic compound represented by Formula 1 may have a color purity in which a bottom emission CIEx coordinate is from 0.12 to 0.15 or from 0.13 to 0.14, and a bottom emission CIEy coordinate is from 0.06 to 0.25, from 0.10 to 0.20, or from 0.13 to 0.20.

The organometallic compound represented by Formula 1 that has a structure in which $R_{5a}$ and $R_{5b}$ in Formula 1 are not both simultaneously (e.g., at the same time) a benzene group unsubstituted or substituted with at least one $R_{10a}$, has little (e.g., reduced) structural deformation, and has excellent (e.g., improved) energy transfer, and thus high luminescence efficiency and high color purity may be realized. Also, the organometallic compound represented by Formula 1 has a high $^3$MC and a low dipole moment, and thus may have a long lifespan effect. Thus, a light-emitting device including the organometallic compound represented by Formula 1 may have high color purity, high efficiency, low driving voltage, and long lifespan due to increased durability, and thus may be used to manufacture a high-quality electronic apparatus.

Synthesis methods of the organometallic compound represented by Formula 1 may be recognizable by one of ordinary skill in the art by referring to Synthesis Examples and/or Examples provided below.

According to one or more embodiments, at least one organometallic compound represented by Formula 1 may be used in a light-emitting device (for example, an organic light-emitting device). Thus, provided is a light-emitting device including: a first electrode;

a second electrode facing the first electrode; an interlayer located between the first electrode and the second electrode and including an emission layer; and the organometallic compound represented by Formula 1 according to the present specification.

In one or more embodiments, the first electrode of the light-emitting device may be an anode, the second electrode of the light-emitting device may be a cathode, the interlayer may further include a hole transport region between the first electrode and the emission layer and an electron transport region between the emission layer and the second electrode, the hole transport region may include a hole injection layer, a hole transport layer, an emission auxiliary layer, an electron blocking layer, or any combination thereof, and the electron transport region may include a buffer layer, a hole blocking layer, an electron control layer, an electron transport layer, an electron injection layer, or any combination thereof.

In one or more embodiments, the organometallic compound may be included between the first electrode and the second electrode of the light-emitting device. Thus, the organometallic compound may be included in the interlayer of the light-emitting device, for example, in the emission layer of the interlayer.

In one or more embodiments, the interlayer of the light-emitting device may include:

i) a first compound which is the organometallic compound represented by Formula 1; and ii) a second compound including at least one π electron-deficient nitrogen-containing $C_1$-$C_{60}$ cyclic group, a third compound including a group represented by Formula 3 below, a fourth compound which may emit delayed fluorescence, or any combination thereof, and the first compound, the second compound, the third compound, and the fourth compound may be different from each other:

Formula 3

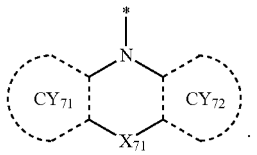

Ring CY71 and ring CY72 in Formula 3 may each independently be a π electron-rich $C_3$-$C_{60}$ cyclic group or a pyridine group, $X_{71}$ in Formula 3 may be a single bond or a linking group including O, S, N, B, C, Si, or any combination thereof,

* in Formula 3 indicates a binding site to a neighboring atom of the third compound, and the third compound may not include compounds below:

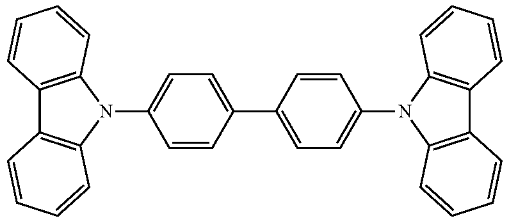

CBP

-continued

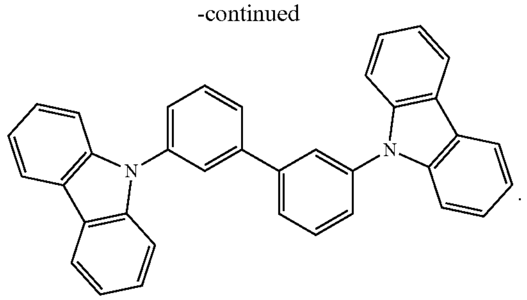

mCBP

In one or more embodiments, in the light-emitting device, the emission layer may include: i) the first compound; and ii) the second compound, the third compound, the fourth compound, or any combination thereof, and the emission layer may emit phosphorescent light or fluorescent light emitted from the first compound.

Description of Second Compound to Fourth Compound

The second compound may include a pyridine group, a pyrimidine group, a pyrazine group, a pyridazine group, a triazine group, or any combination thereof.

In one or more embodiments, the light-emitting device may further include at least one selected from the second compound and the third compound, in addition to the first compound.

In one or more embodiments, the light-emitting device may further include the fourth compound, in addition to the first compound.

In one or more embodiments, the light-emitting device may include all of the first compound to the fourth compound.

In one or more embodiments, the interlayer may include the second compound. The interlayer may further include the third compound, the fourth compound, or any combination thereof, in addition to the first compound and the second compound.

In one or more embodiments, the fourth compound may be a compound in which a difference between a triplet energy level (eV) and a singlet energy level (eV) of the fourth compound is about 0 eV or more and about 0.5 eV or less (or about 0 eV or more and about 0.3 eV or less).

In one or more embodiments, the fourth compound may be a compound including at least one cyclic group including boron (B) and nitrogen (N) as ring-forming atoms.

In one or more embodiments, the fourth compound may be a $C_8$-$C_{60}$ polycyclic group-containing compound in which two or more cyclic groups are condensed while sharing boron (B).

In one or more embodiments, the fourth compound may include a condensed cyclic group in which at least one third ring is condensed with at least one fourth ring, the third ring may be a cyclopentane group, a cyclohexane group, a cycloheptane group, a cyclooctane group, a cyclopentene group, a cyclohexene group, a cycloheptene group, a cyclooctene group, an adamantane group, a norbornene group, a norobornane group, a bicyclo[1.1.1]pentane group, a bicyclo[2.1.1]hexane group, a bicyclo[2.2.2]octane group, a benzene group, a pyridine group, a pyrimidine group, a pyridazine group, a pyrazine group, or a triazine group, and the fourth ring may be a 1,2-azaborinine group, a 1,3-azaborinine group, a 1,4-azaborinine group, a 1,2-dihydro-1,2-azaborinine group, a 1,4-oxaborinine group, a 1,4-thiaborinine group, or a 1,4-dihydroborinine group.

In one or more embodiments, the interlayer may include the fourth compound. The interlayer may further include the second compound, the third compound, or any combination thereof, in addition to the first compound and the fourth compound.

In one or more embodiments, the interlayer may include the third compound. In one or more embodiments, the third compound may not include a compound represented by CBP and mCBP described in the present specification.

The emission layer in the interlayer may include: i) the first compound; and ii) the second compound, the third compound, the fourth compound, or any combination thereof.

The emission layer may emit phosphorescent light or fluorescent light emitted from the first compound. In one or more embodiments, the phosphorescent light or fluorescent light emitted from the first compound may be blue light.

In one or more embodiments, the emission layer of the light-emitting device may include the first compound and the second compound, and the first compound and the second compound may form an exciplex.

In one or more embodiments, the emission layer of the light-emitting device may include the first compound, the second compound, and the third compound, and the first compound and the second compound may form an exciplex.

In one or more embodiments, the emission layer of the light-emitting device may include the first compound and the fourth compound, and the fourth compound may serve to improve color purity, luminescence efficiency, and lifespan characteristics of the light-emitting device.

In one or more embodiments, the second compound may include a compound represented by Formula 2:

Formula 2

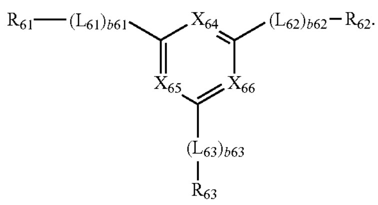

In Formula 2, $L_{61}$ to $L_{63}$ may each independently be a single bond, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, b61 to b63 may each independently be an integer from 1 to 5, $X_{64}$ may be N or $C(R_{64})$, $X_{65}$ may be N or $C(R_{65})$, $X_{66}$ may be N or $C(R_{66})$, and at least one of $X_{64}$ to $X_{66}$ may be N, $R_{61}$ to $R_{66}$ are each the same as described in the present specification, and $R_{10a}$ is the same as described in the present specification.

In one or more embodiments, the third compound may include a compound represented by Formula 3-1, a compound represented by Formula 3-2, a compound represented by Formula 3-3, a compound represented by Formula 3-4, a compound represented by Formula 3-5, or any combination thereof:

Formula 3-1

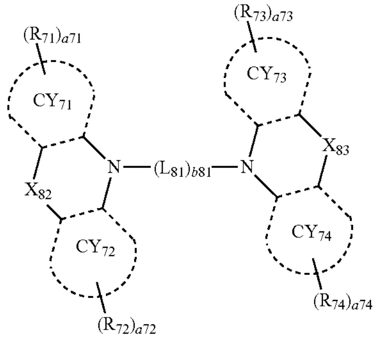

Formula 3-2

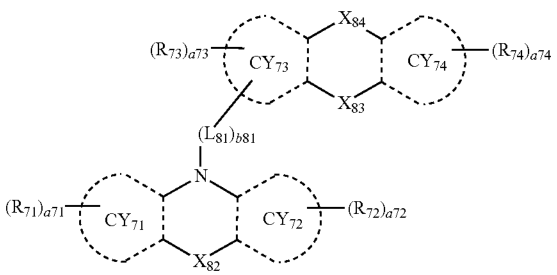

Formula 3-3

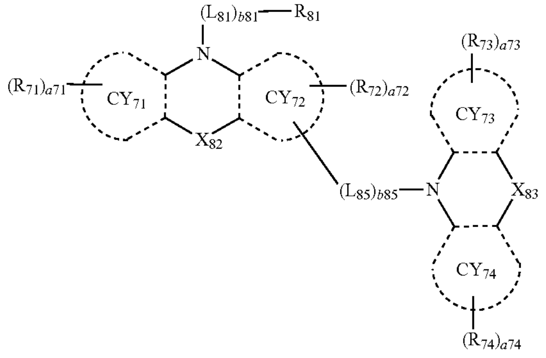

Formula 3-4

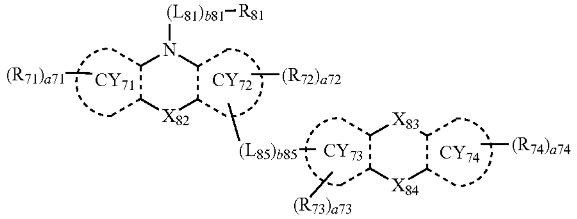

Formula 3-5

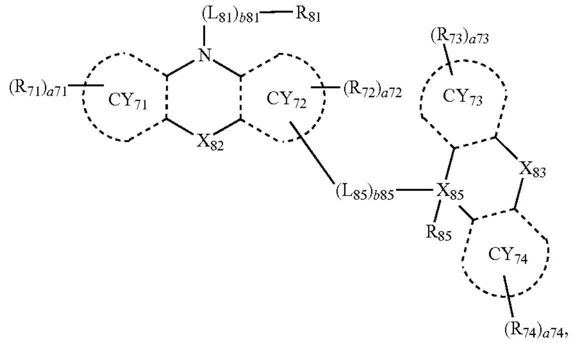

wherein, in Formulae 3-1 to 3-5, ring CY71 to ring CY74 may each independently be a π electron-rich $C_3$-$C_{60}$ cyclic group or a pyridine group, $X_{82}$ may be a single bond, O, S, N-[$(L_{82})_{b82}$-$R_{82}$], $C(R_{82a})(R_{82b})$, or $Si(R_{82a})(R_{82b})$, $X_{83}$ may be a single bond, O, S, N-[$(L_{83})_{b83}$-$R_{83}$], $C(R_{83a})(R_{83b})$, or $Si(R_{83a})(R_{83b})$, $X_{84}$ may be O, S, N-[$(L_{84})_{b84}$-$R_{84}$], $C(R_{84a})(R_{84b})$, or $Si(R_{84a})(R_{84b})$, $X_{85}$ may be C or Si, $L_{81}$ to $L_{85}$ may each independently be a single bond, *—$C(Q_4)(Q_5)$*' *—$Si(Q_4)(Q_5)$-*', a π electron-rich $C_3$-$C_{60}$ cyclic group unsubstituted or substituted with at least one $R_{10a}$, or a pyridine group unsubstituted or substituted with at least one $R_{10a}$, and $Q_4$ and $Q_5$ are each the same as described in connection with $Q_1$ in the present specification, b81 to b85 may each independently be an integer from 1 to 5, $R_{71}$ to $R_{74}$, $R_{81}$ to $R_{85}$, $R_{82a}$, $R_{82b}$, $R_{83a}$, $R_{83b}$, $R_{84a}$, and $R_{84b}$ are each the same as described in the present specification, a71 to a74 may each independently be an integer from 0 to 20, and $R_{10a}$ is the same as described in the present specification.

In one or more embodiments, the fourth compound may include a compound represented by Formula 502, a compound represented by Formula 503, or any combination thereof:

Formula 502

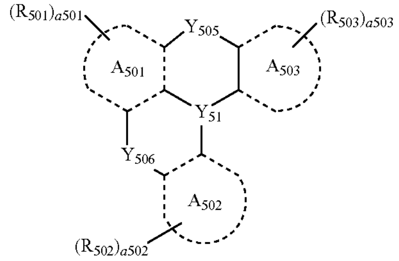

Formula 503

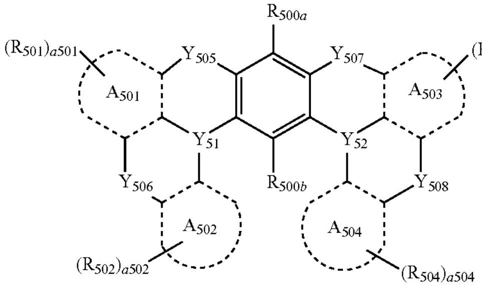

In Formulae 502 and 503, ring $A_{501}$ to ring $A_{504}$ may each independently be a $C_3$-$C_{60}$ carbocyclic group or a $C_1$-$C_{60}$ heterocyclic group, $Y_{505}$ may be O, S, $N(R_{505})$, $B(R_{505})$, $C(R_{505a})(R_{505b})$, or $Si(R_{505a})(R_{505b})$, $Y_{506}$ may be O, S, $N(R_{506})$, $B(R_{506})$, $C(R_{506a})(R_{506b})$, or $Si(R_{506a})(R_{506b})$, $Y_{507}$ may be O, S, $N(R_{507})$, $B(R_{507})$, $C(R_{507a})(R_{507b})$, or $Si(R_{507a})(R_{507b})$, $Y_{508}$ may be O, S, $N(R_{508})$, $B(R_{508})$, $C(R_{508a})(R_{508b})$, or $Si(R_{508a})(R_{508b})$, $Y_{51}$ and $Y_{52}$ may each independently be B, P(═O), or S(═O), $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ are each the same as described in the present specification, a501 to a504 may each independently be an integer from 0 to 20, and $R_{10a}$ is the same as described in the present specification.

Description of Formulae 2 to 4 b61 to b63 in Formula 2 indicate numbers of $L_{61}$ to $L_{63}$, respectively, and may each be an integer from 1 to 5. When b61 is 2 or more, two or more of $L_{61}$(s) may be identical to or different from each other, when b62 is 2 or more, two or more of $L_{62}$(s) may be identical to or different from each other, and when b63 is 2 or more, two or more of $L_{63}$(s) may be identical to or different from each other. In one or more embodiments, b61 to b63 may each independently be 1 or 2.

$L_{61}$ to $L_{63}$ in Formula 2 may each independently be:

a single bond; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a dibenzooxasiline group, a dibenzothiasiline group, a dibenzodihydroazasiline group, a dibenzodihydrodisiline group, a dibenzodihydrosiline group, a dibenzodioxine group, a dibenzooxathiine group, a dibenzooxazine group, a dibenzopyran group, a dibenzodithiine group, a dibenzothiazine group, a dibenzothiopyran group, a dibenzocyclohexadiene group, a dibenzodihydropyridine group, or a dibenzodihydropyrazine group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenyl fluorenyl group, a carbazolyl group, a phenylcarbazolyl group, a dibenzofuranyl group, a dibenzothiophenyl group, a dibenzosilolyl group, a dimethyl dibenzosilolyl group, a diphenyl dibenzosilolyl group, $—O(Q_{31})$, $—S(Q_{31})$, $—Si(Q_{31})(Q_{32})(Q_{33})$, $—N(Q_{31})(Q_{32})$, $—B(Q_{31})(Q_{32})$, $—P(Q_{31})(Q_{32})$, $—C(═O)(Q_{31})$, $—S(═O)_2(Q_{31})$, $—P(═O)(Q_{31})(Q_{32})$, or any combination thereof, wherein $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group.

In one or more embodiments, in Formula 2, a bond between $L_{61}$ and $R_{61}$, a bond between $L_{62}$ and $R_{62}$, a bond between $L_{63}$ and $R_{63}$, a bond between two or more $L_{61}$(s), a bond between two or more $L_{62}$(s), a bond between two or more $L_{63}$(s), a bond between $L_{61}$ and carbon between $X_{64}$ and $X_{65}$ in Formula 2, a bond between $L_{62}$ and carbon between $X_{64}$ and $X_{66}$ in Formula 2, and a bond between $L_{63}$ and carbon between $X_{65}$ and $X_{66}$ in Formula 2 may each be a "carbon-carbon single bond".

In Formula 2, $X_{64}$ may be N or $C(R_{64})$, $X_{65}$ may be N or $C(R_{65})$, $X_{65}$ may be N or $C(R_{66})$, and at least one of $X_{64}$ to $X_{65}$ may be N. $R_{64}$ to $R_{66}$ are each the same as described in the present specification. In one or more embodiments, two or three of $X_{64}$ to $X_{66}$ may be N.

$R_{61}$ to $R_{66}$, $R_{71}$ to $R_{74}$, $R_{81}$ to $R_{85}$, $R_{82a}$, $R_{82b}$, $R_{83a}$, $R_{83b}$, $R_{84a}$, $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ in the present specification may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—C(Q_1)(Q_2)(Q_3)$, $—Si(Q_1)(Q_2)(Q_3)$, $—N(Q_1)(Q_2)$, $—B(Q_1)(Q_2)$, $—C(═O)(Q_1)$, $—S(═O)_2(Q_1)$, or $—P(═O)(Q_1)(Q_2)$. $Q_1$ to $Q_3$ are each the same as described in the present specification.

In one or more embodiments, i) $R_{61}$ to $R_{66}$, $R_{71}$ to $R_{74}$, $R_{81}$ to $R_{85}$, $R_{82a}$, $R_{82b}$, $R_{83a}$, $R_{83b}$, $R_{84a}$, $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ in Formulae 2, 3-1 to 3-5, 502, and 503, ii) $R_{10a}$, and iii) $R_1$ to $R_4$, $R_{51}$ to $R_{53}$, $R_{5a}$, $R_{5b}$, $Z_{11}$, $Z_{12}$, $Z_{21}$, and $Z_{22}$ in Formula 1 may each independently be:

hydrogen, deuterium, —F, —Cl, —Br, —I, a hydroxyl group, a cyano group, a nitro group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, or a group represented by Formula 91, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, $—O(Q_{31})$, $—S(Q_{31})$, $—Si(Q_{31})(Q_{32})(Q_{33})$, $—N(Q_{31})(Q_{32})$, $—B(Q_{31})(Q_{32})$, $—P(Q_{31})(Q_{32})$, $—C(=O)(Q_{31})$, $—S(=O)_2(Q_{31})$, $—P(=O)(Q_{31})(Q_{32})$, or any combination thereof; or $—C(Q_1)(Q_2)(Q_3)$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, wherein $Q_1$ to $Q_3$ and $Q_{31}$ to $Q_{33}$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof:

Formula 91

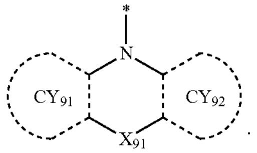

In Formula 91, ring $CY_{91}$ and ring $CY_{92}$ may each independently be a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $X_{91}$ may be a single bond, O, S, $N(R_{91})$, $B(R_{91})$, $C(R_{91a})(R_{91b})$, or $Si(R_{91a})(R_{91b})$, $R_{91}$, $R_{91a}$, and $R_{91b}$ are each the same as described in connection with $R_{82}$, $R_{82a}$, and $R_{82b}$ in the present specification, $R_{10a}$ is the same as described in the present specification, and

* indicates a binding site to an adjacent atom.

In one or more embodiments, in Formula 91, ring $CY_{91}$ and ring $CY_{92}$ may each independently be a benzene group, a pyridine group, a pyrimidine group, a pyrazine group, a pyridazine group, or a triazine group, each unsubstituted or substituted with at least one $R_{10a}$, $R_{91}$, $R_{91a}$, and $R_{91b}$ may each independently be:

hydrogen or a $C_1$-$C_{10}$ alkyl group; or a phenyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof.

In one or more embodiments, i) $R_{61}$ to $R_{66}$, $R_{71}$ to $R_{74}$, $R_{81}$ to $R_{85}$, $R_{82a}$, $R_{82b}$, $R_{83a}$, $R_{83b}$, $R_{84a}$ and $R_{84b}$, $R_{500a}$, $R_{500b}$, $R_{501}$ to $R_{508}$, $R_{505a}$, $R_{505b}$, $R_{506a}$, $R_{506b}$, $R_{507a}$, $R_{507b}$, $R_{508a}$, and $R_{508b}$ in Formulae 2, 3-1 to 3-5, 502, and 503, ii) $R_{10a}$, and iii) $R_1$ to $R_4$, $R_{51}$ to $R_{53}$, $R_{5a}$, $R_{5b}$, $Z_{11}$, $Z_{12}$, $Z_{21}$, and $Z_{22}$ in Formula 1 may each independently be hydrogen, deuterium, —F, a cyano group, a nitro group, $—CH_3$, $—CD_3$, $—CD_2H$, $—CDH_2$, $—CF_3$, $—CF_2H$, $—CFH_2$, a group represented by one of Formulae 9-1 to 9-19, a group represented by one of Formulae 10-1 to 10-249, $—C(Q_1)(Q_2)(Q_3)$, $—Si(Q_1)(Q_2)(Q_3)$, $—N(Q_1)(Q_2)$, or $—P(=O)(Q_1)(Q_2)$ (wherein $Q_1$ to $Q_3$ are each the same as described in the present specification):

9-1

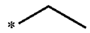

9-2

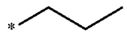

9-3

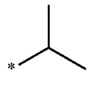

-continued
9-4
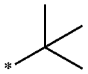
9-5
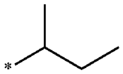
9-6
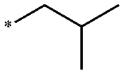
9-7
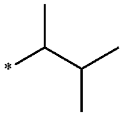
9-8
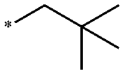
9-9
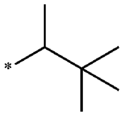
9-10
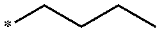
9-11
9-12
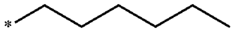
9-13
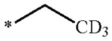
9-14
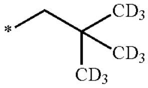
9-15
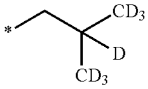
9-16
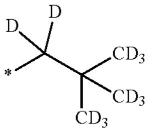
9-17
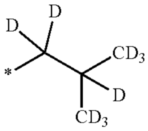
9-18
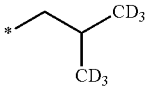
9-19
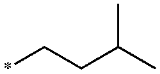
10-1
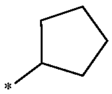
-continued
10-2
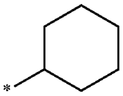
10-3
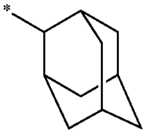
10-4
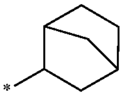
10-5
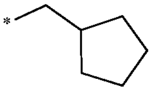
10-6
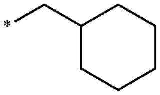
10-7
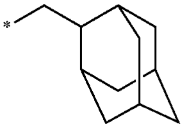
10-8
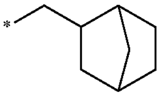
10-9
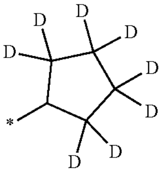
10-10
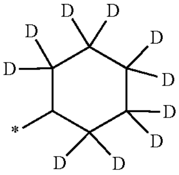
10-11
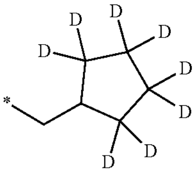
10-12
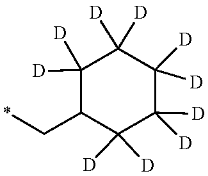

-continued
10-13
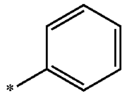
10-14
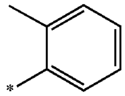
10-15
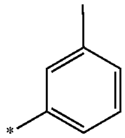
10-16
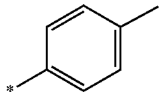
10-17
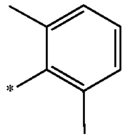
10-18
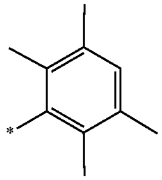
10-19
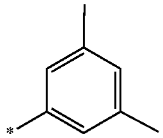
10-20
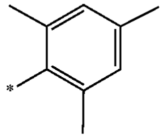
10-21
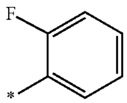
10-22
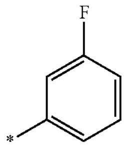
10-23
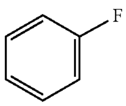
-continued
10-24
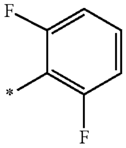
10-25
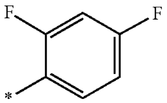
10-26
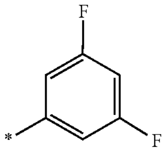
10-27
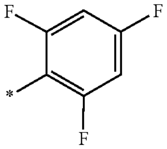
10-28
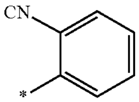
10-29
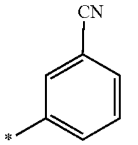
10-30
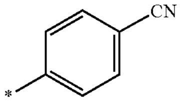
10-31
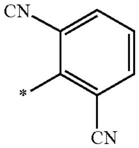
10-32
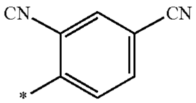
10-33
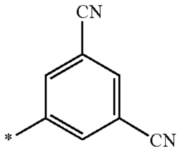
10-34
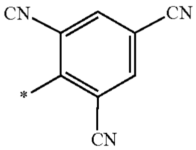

-continued
10-35
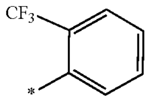
10-36
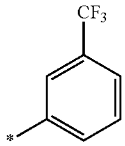
10-37
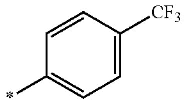
10-38
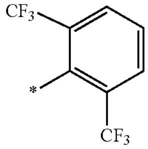
10-39
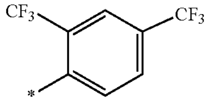
10-40
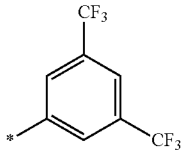
10-41
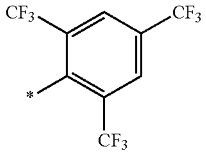
10-42
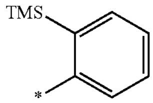
10-43
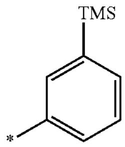
10-44
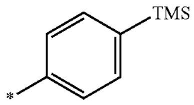
10-45
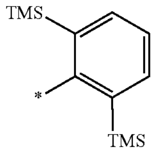
-continued
10-46
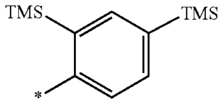
10-47
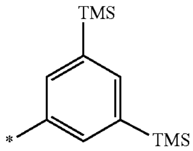
10-48
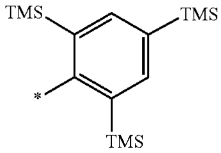
10-49
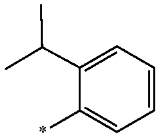
10-50
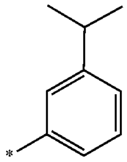
10-51
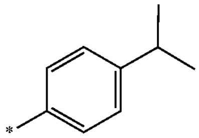
10-52
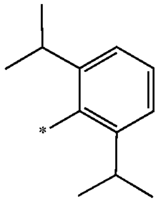
10-53
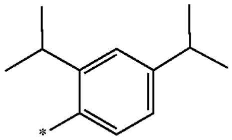
10-54
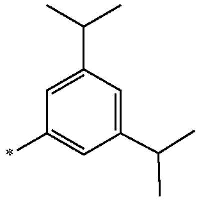

-continued
10-55
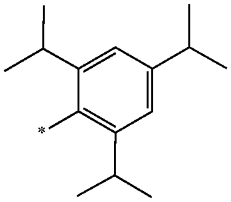
10-56
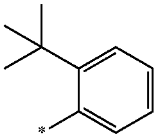
10-57
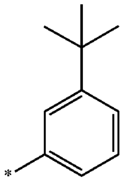
10-58
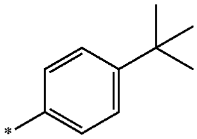
10-59
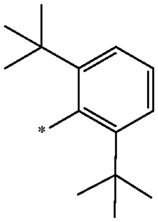
10-60
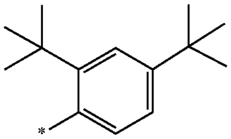
10-61
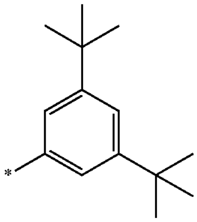
10-62
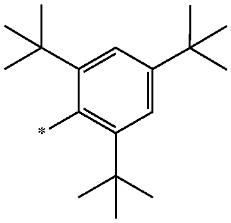
-continued
10-63
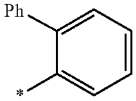
10-64
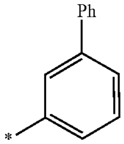
10-65
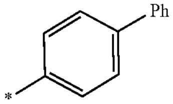
10-66
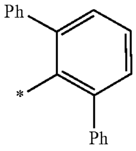
10-67
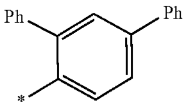
10-68
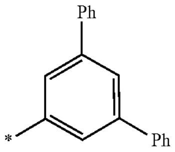
10-69
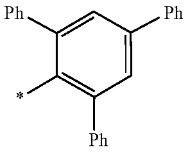
10-70
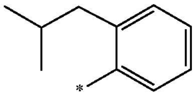
10-71
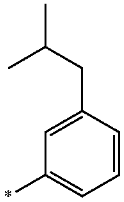
10-72
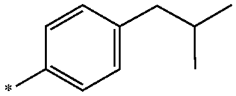
10-73
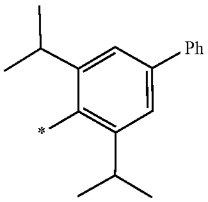

-continued
10-74
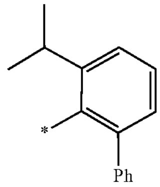
10-75
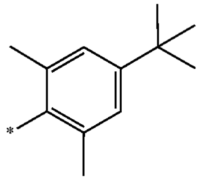
10-76
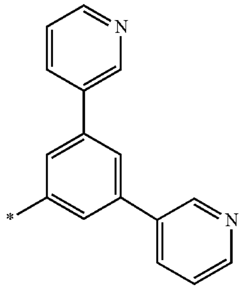
10-77
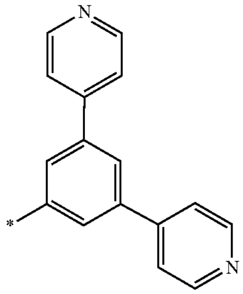
10-78
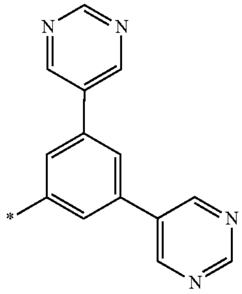
10-79
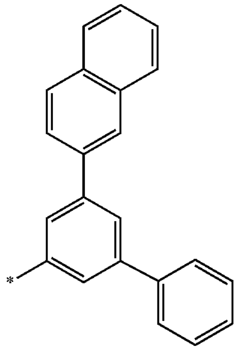
-continued
10-80
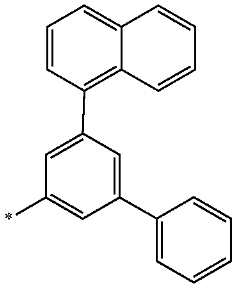
10-81
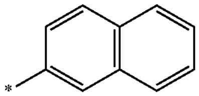
10-82
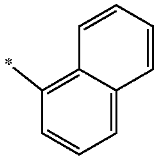
10-83
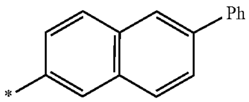
10-84
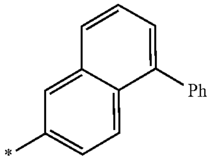
10-85
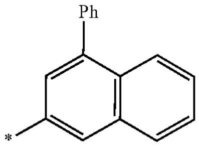
10-86
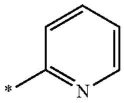
10-87
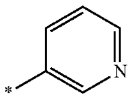
10-88
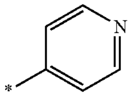
10-89
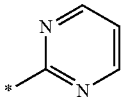
10-90
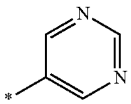

-continued
10-91
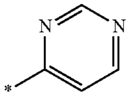
10-92
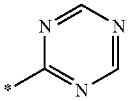
10-93
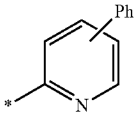
10-94
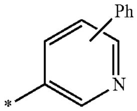
10-95
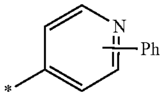
10-96
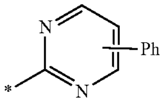
10-97
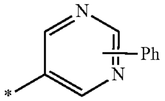
10-98
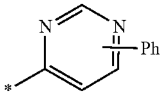
10-99
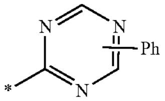
10-100
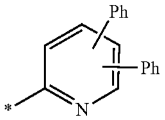
10-101
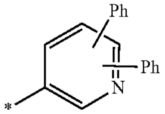
10-102
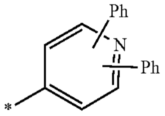
10-103
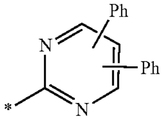
-continued
10-104
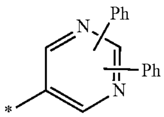
10-105
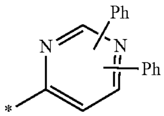
10-106
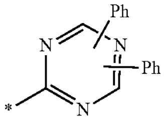
10-107
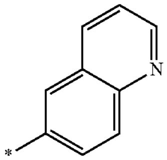
10-108
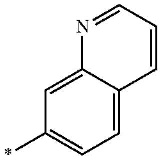
10-109
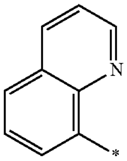
10-110
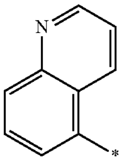
10-111
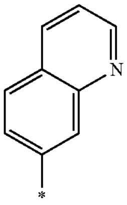
10-112
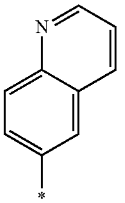

-continued
10-113
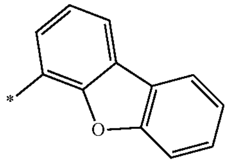
10-114
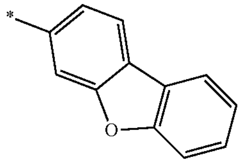
10-115
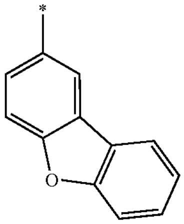
10-116
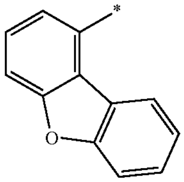
10-117
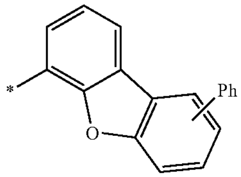
10-118
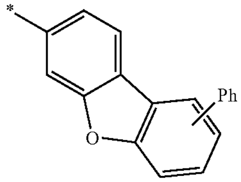
10-119
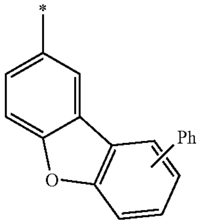
10-120
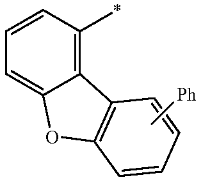
10-121
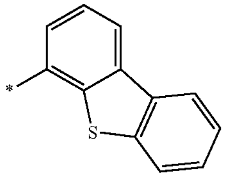
10-122
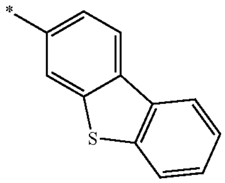
10-123
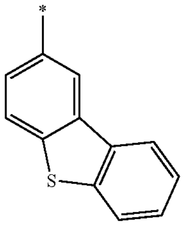
10-124
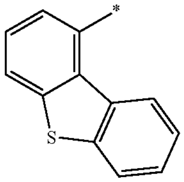
10-125
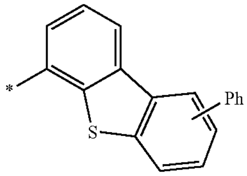
10-126
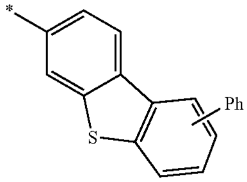
10-127
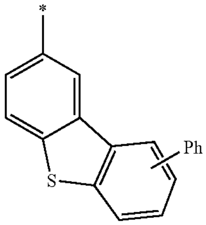
10-128
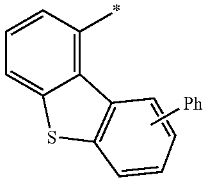

-continued
10-129
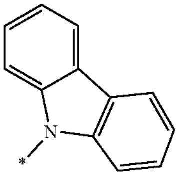
10-130
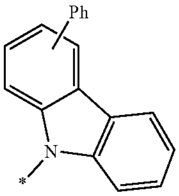
10-131
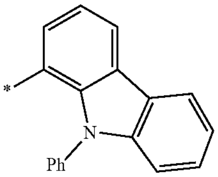
10-132
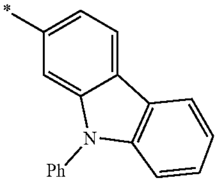
10-133
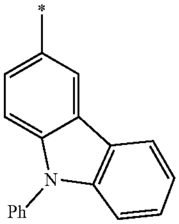
10-134
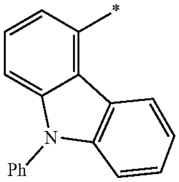
10-135
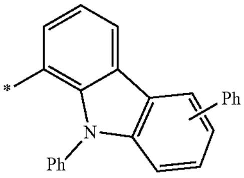
10-136
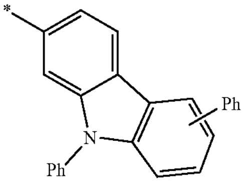
-continued
10-137
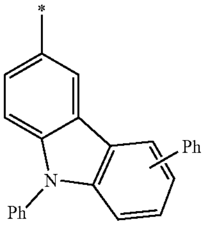
10-138
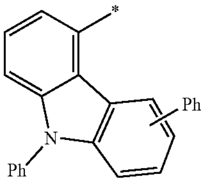
10-139
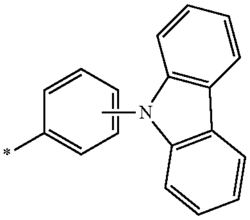
10-140
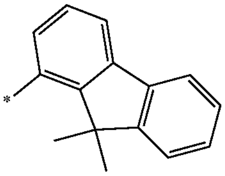
10-141
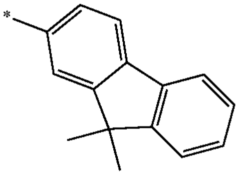
10-142
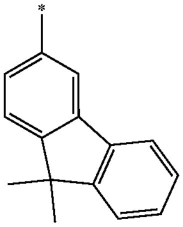
10-143
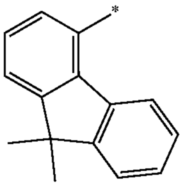

-continued
10-144
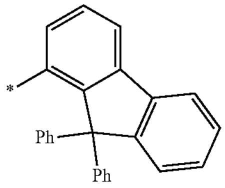
10-145
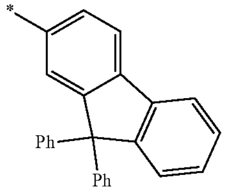
10-146
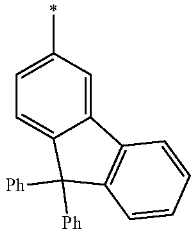
10-147
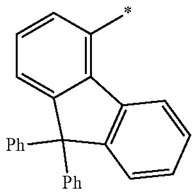
10-148
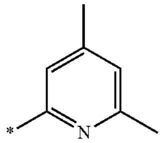
10-149
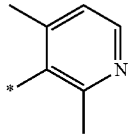
10-150
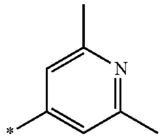
10-151
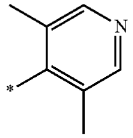
10-152
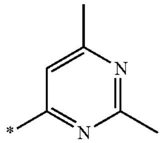
-continued
10-153
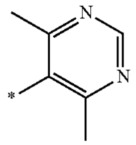
10-154
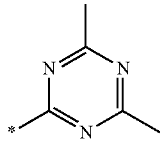
10-155
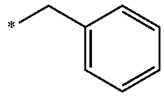
10-156
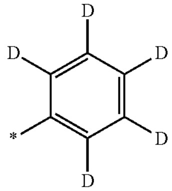
10-157
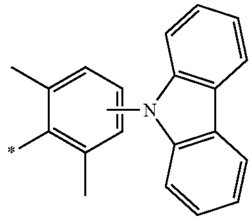
10-158
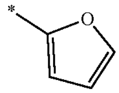
10-159
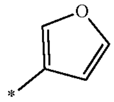
10-160
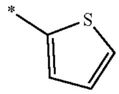
10-161
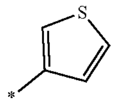
10-162
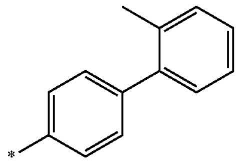

-continued
10-163
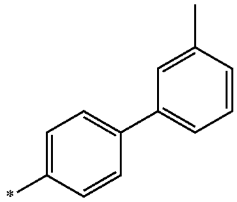
10-164
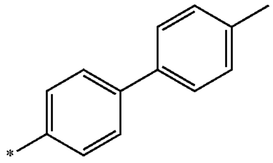
10-165
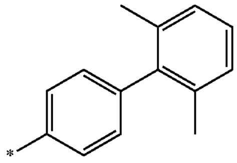
10-166
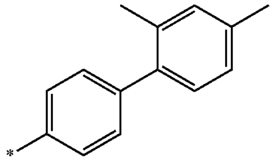
10-167
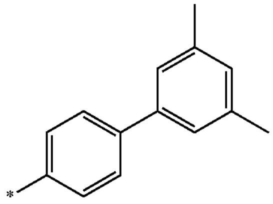
10-168
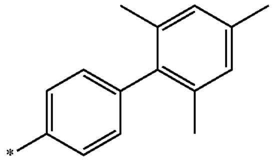
10-169
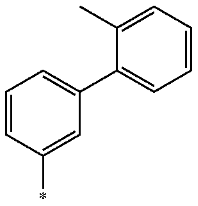
10-170
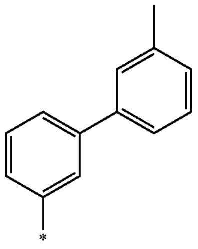
-continued
10-171
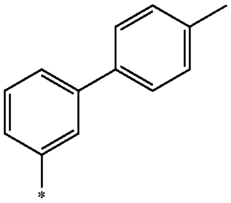
10-172
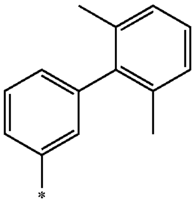
10-173
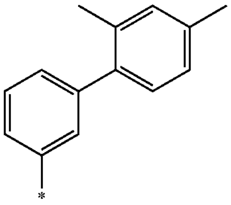
10-174
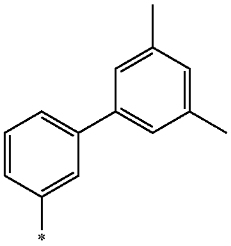
10-175
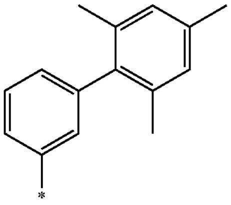
10-176
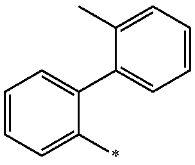
10-177
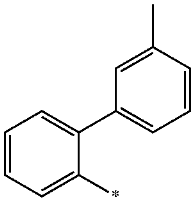

-continued
10-178
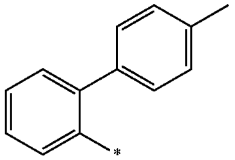
10-179
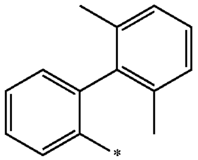
10-180
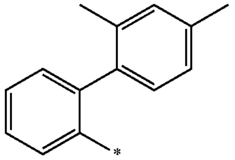
10-181
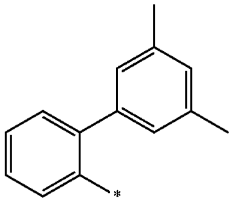
10-182
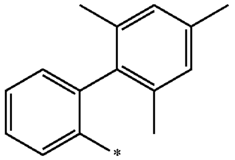
10-183
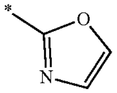
10-184
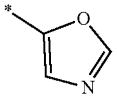
10-185
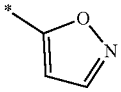
10-186
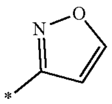
10-187
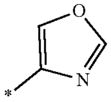
10-188
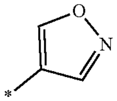
-continued
10-189
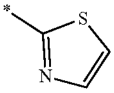
10-190
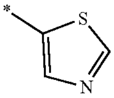
10-191
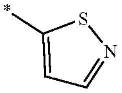
10-192
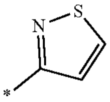
10-193
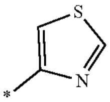
10-194
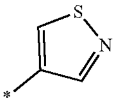
10-195
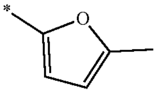
10-196
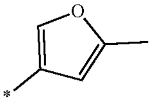
10-197
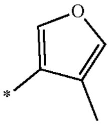
10-198
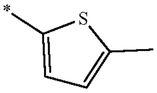
10-199
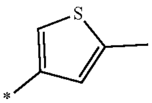
10-200
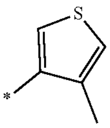
10-201
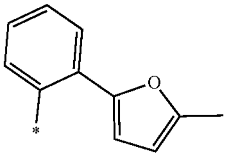

-continued
10-202
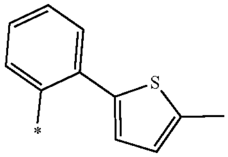
10-203
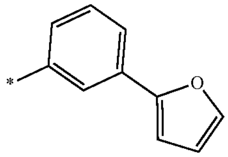
10-204
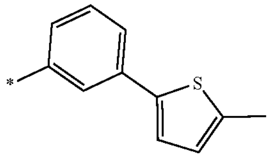
10-205
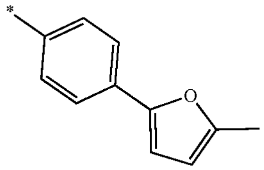
10-206
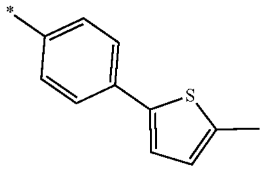
10-207
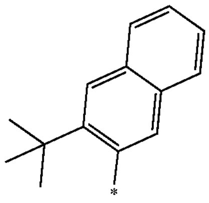
10-208
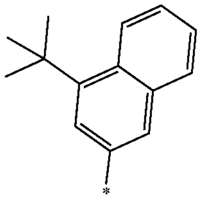
10-209
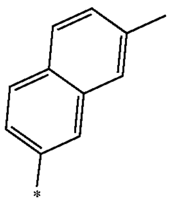
-continued
10-210
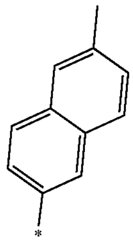
10-211
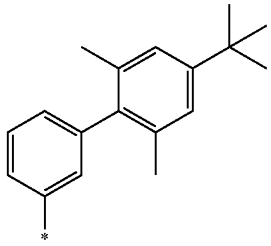
10-212
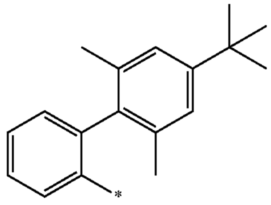
10-213
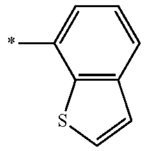
10-214
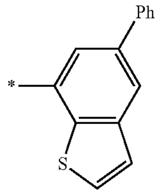
10-215
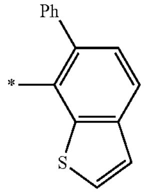
10-216
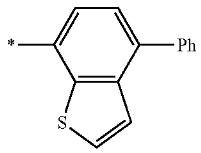

-continued
10-217
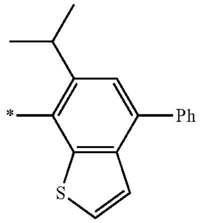
10-218
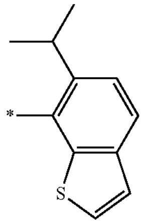
10-219
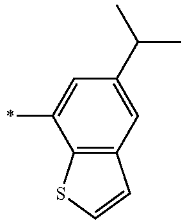
10-220
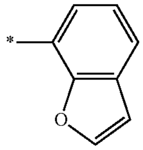
10-221
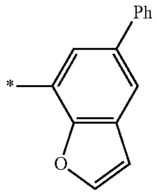
10-222
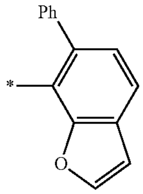
10-223
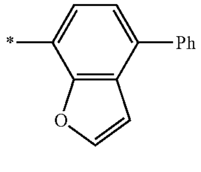
-continued
10-224
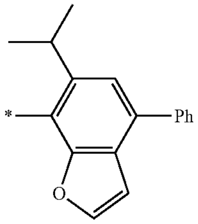
10-225
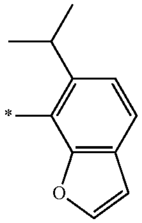
10-226
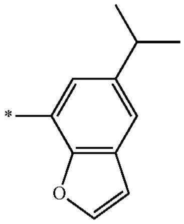
10-227
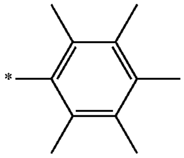
10-228
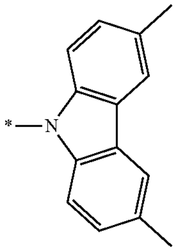
10-229
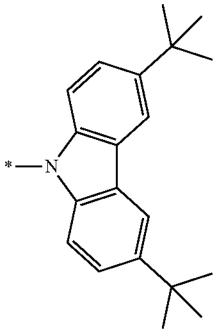

-continued
10-230
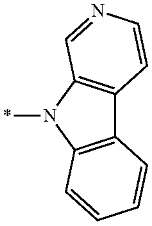
10-231
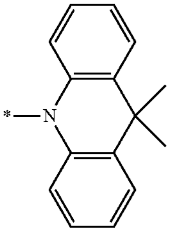
10-232
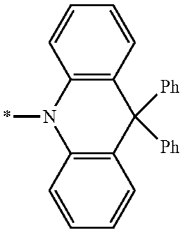
10-233
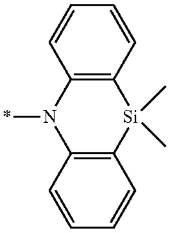
10-234
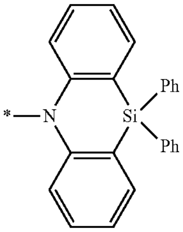
10-235
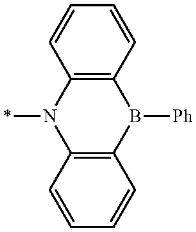
10-236
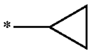
-continued
10-237
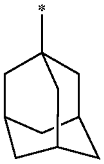
10-238
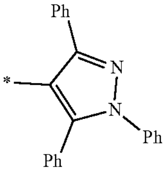
10-239
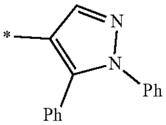
10-240
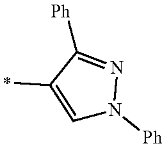
10-241
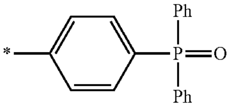
10-242
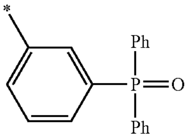
10-243
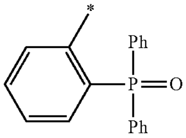
10-244
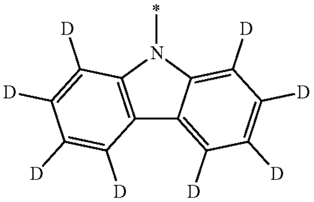
10-245
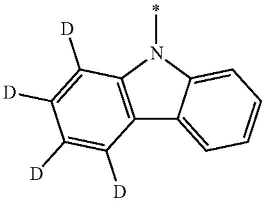

-continued 10-246
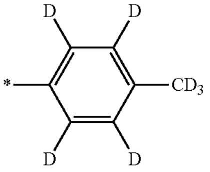

10-247
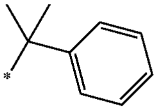

10-248
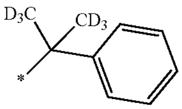

10-249
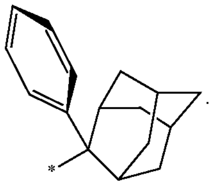

In Formulae 9-1 to 9-19 and 10-1 to 10-249, * indicates a binding site to a neighboring atom, Ph is a phenyl group, and TMS is a trimethylsilyl group.

a71 to a74 and a501 to a504 in Formulae 3-1 to 3-5, 502, and 503 indicate numbers of $R_{71}$ to $R_{74}$ and $R_{501}$ to $R_{504}$, respectively, and may each independently be an integer from 0 to 20. When a71 is 2 or more, two or more of $R_{71}$(s) may be identical to or different from each other, when a72 is 2 or more, two or more of $R_{72}$(s) may be identical to or different from each other, when a73 is 2 or more, two or more of $R_{73}$(s) may be identical to or different from each other, when a74 is 2 or more, two or more of $R_{74}$(s) may be identical to or different from each other, when a501 is 2 or more, two or more of $R_{501}$(s) may be identical to or different from each other, when a502 is 2 or more, two or more of $R_{502}$(s) may be identical to or different from each other, when a503 is 2 or more, two or more of $R_{503}$(s) may be identical to or different from each other, and when a504 is 2 or more, two or more of $R_{504}$(s) may be identical to or different from each other. a71 to a74 and a501 to a504 may each independently be an integer from 0 to 8.

In one or more embodiments, in Formula 2, a group represented by $*-(L_{61})_{b61}-R_{61}$ and a group represented by $*-(L_{62})_{b62}-R_{62}$ may each not be a phenyl group.

In one or more embodiments, in Formula 2, a group represented by $*-(L_{61})_{b61}-R_{61}$ and a group represented by $*-(L_{62})_{b62}-R_{62}$ may be identical to each other.

In one or more embodiments, in Formula 2, a group represented by $*-(L_{61})_{b61}-R_{61}$ and a group represented by $*-(L_{62})_{b62}-R_{62}$ may be different from each other.

In one or more embodiments, in Formula 2, b61 and b62 may each independently be 1, 2, or 3, and $L_{61}$ and $L_{62}$ may each independently be a benzene group, a pyridine group, a pyrimidine group, a pyridazine group, a pyrazine group, or a triazine group, each unsubstituted or substituted with at least one $R_{10a}$.

In one or more embodiments, $R_{61}$ and $R_{62}$ in Formula 2 may each independently be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$C(Q_1)(Q_2)(Q_3)$, or —$Si(Q_1)(Q_2)(Q_3)$, and $Q_1$ to $Q_3$ may each independently be a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In one or more embodiments, a group represented by $*-(L_{61})_{b61}-R_{61}$ in Formula 2 may be a group represented by one of Formulae CY51-1 to CY51-26, and/or a group represented by $*-(L_{62})_{b62}-R_{62}$ in Formula 2 may be a group represented by one of Formulae CY52-1 to CY52-26, and/or a group represented by $*-(L_{63})_{b63}-R_{63}$ in Formula 2 may be a group represented by one of Formulae CY53-1 to CY53-27, —$C(Q_1)(Q_2)(Q_3)$, or —$Si(Q_1)(Q_2)(Q_3)$:

CY51-1
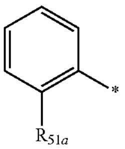

CY51-2
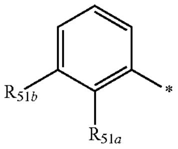

CY51-3
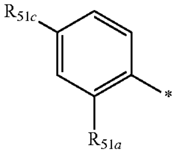

CY51-4
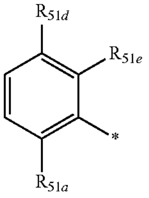

CY51-5
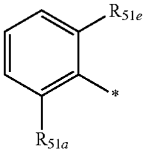

CY51-6
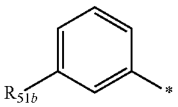

CY51-7
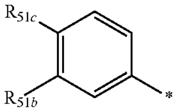

-continued
CY51-8
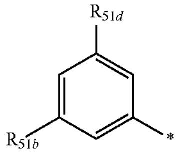
CY51-9
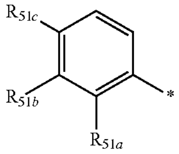
CY51-10
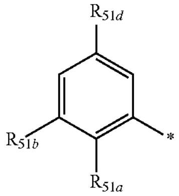
CY51-11
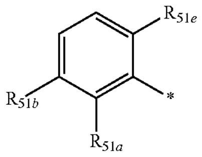
CY51-12
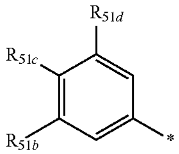
CY51-13
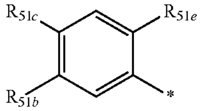
CY51-14
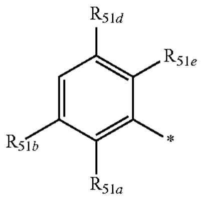
CY51-15
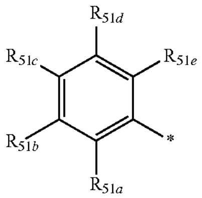
-continued
CY51-16
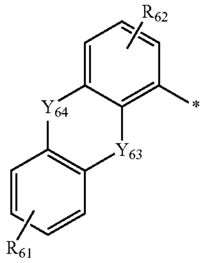
CY51-17
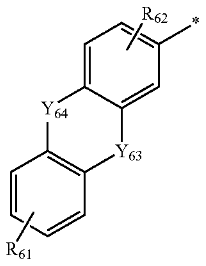
CY51-18
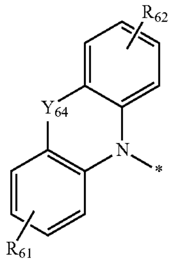
CY51-19
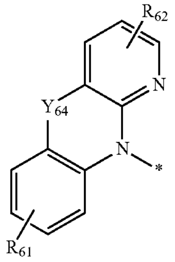
CY51-20
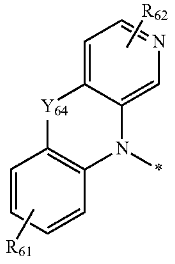
CY51-21
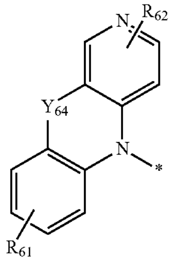

-continued
CY51-22
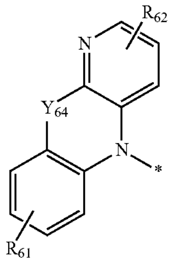
CY51-23
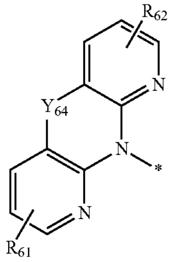
CY51-24
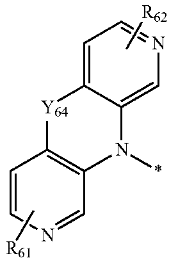
CY51-25
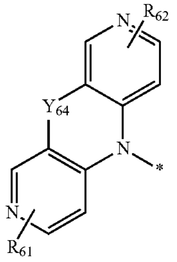
CY51-26
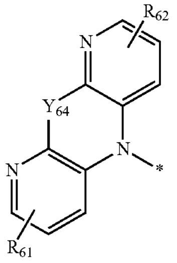
CY52-1
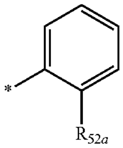
-continued
CY52-2
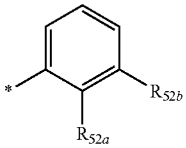
CY52-3
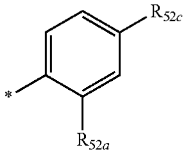
CY52-4
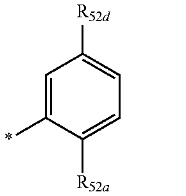
CY52-5
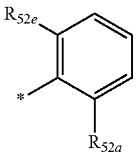
CY52-6
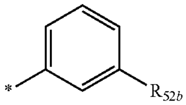
CY52-7
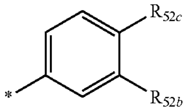
CY52-8
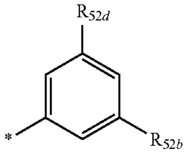
CY52-9
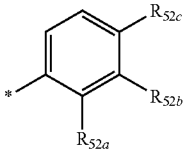
CY52-10
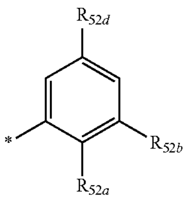

-continued
CY52-11
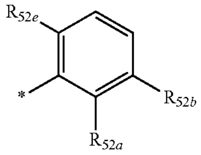
CY52-12
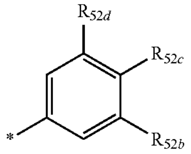
CY52-13
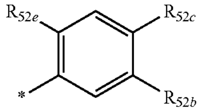
CY52-14
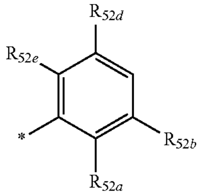
CY52-15
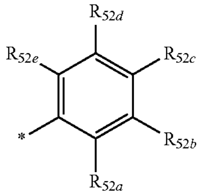
CY52-16
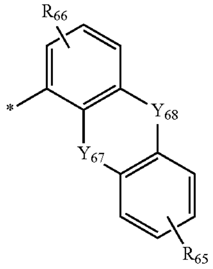
CY52-17
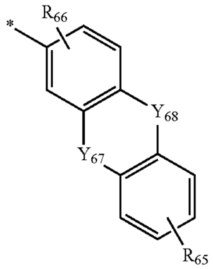
-continued
CY52-18
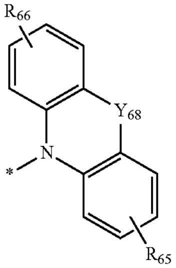
CY52-19
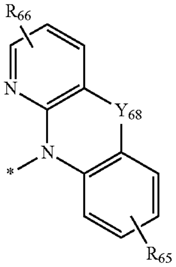
CY52-20
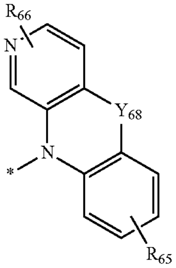
CY52-21
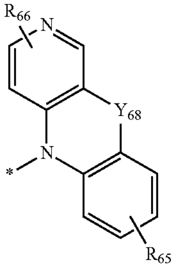
CY52-22
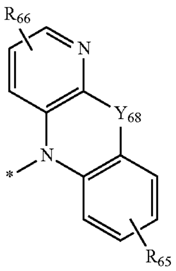

-continued
CY52-23
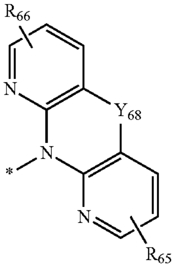
CY52-24
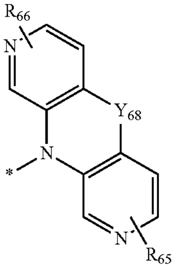
CY52-25
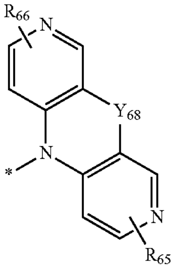
CY52-26
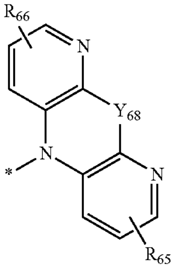
CY53-1
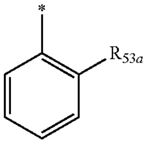
CY53-2
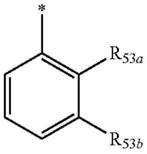
CY53-3
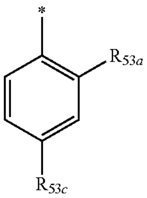
-continued
CY53-4
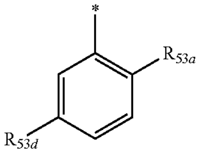
CY53-5
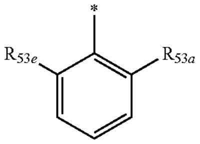
CY53-6
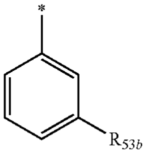
CY53-7
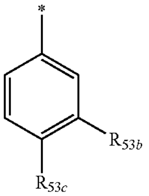
CY53-8
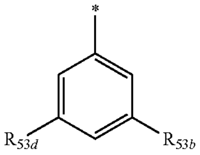
CY53-9
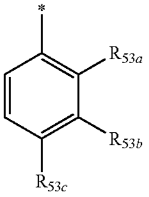
CY53-10
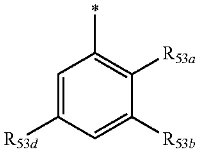
CY53-11
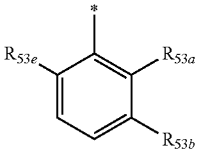
CY53-12
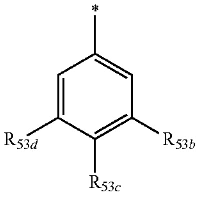

-continued
CY53-13
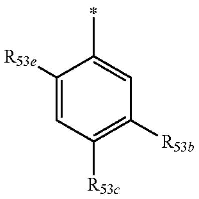
CY53-14
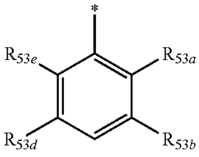
CY53-15
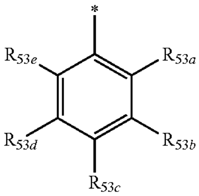
CY53-16
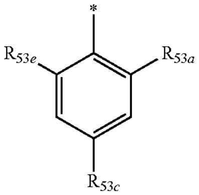
CY53-17
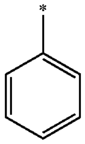
CY53-18
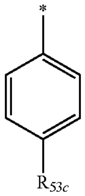
CY53-19
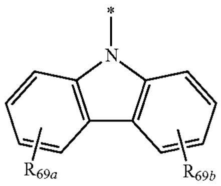
CY53-20
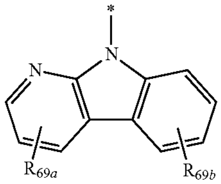
-continued
CY53-21
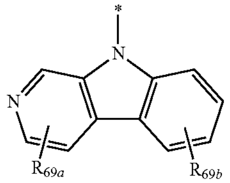
CY53-22
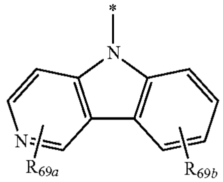
CY53-23
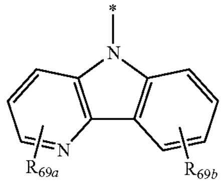
CY53-24
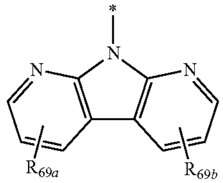
CY53-25
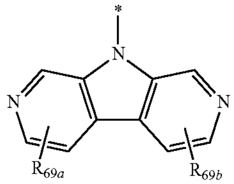
CY53-26
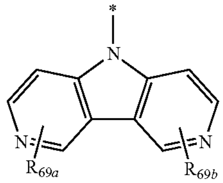
CY53-27
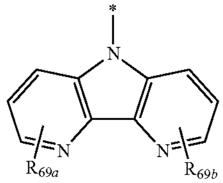
.
In Formulae CY51-1 to CY51-26, CY52-1 to CY52-26, and CY53-1 to CY53-27,
$Y_{63}$ may be a single bond, O, S, $N(R_{63})$, $B(R_{63})$, $C(R_{63a})(R_{63b})$, or $Si(R_{63a})(R_{63b})$,
$Y_{64}$ may be a single bond, O, S, $N(R_{64})$, $B(R_{64})$, $C(R_{64a})(R_{64b})$, or $Si(R_{64a})(R_{64b})$,
$Y_{67}$ may be a single bond, O, S, $N(R_{67})$, $B(R_{67})$, $C(R_{67a})(R_{67b})$, or $Si(R_{67a})(R_{67b})$,
$Y_{68}$ may be a single bond, O, S, $N(R_{68})$, $B(R_{68})$, $C(R_{68a})(R_{68b})$, or $Si(R_{68a})(R_{68b})$, $Y_{63}$ and $Y_{64}$ in Formulae CY51-16 and CY51-17 may not both simultaneously (e.g., at the same time) be a single bond, $Y_{67}$ and $Y_{68}$ in Formulae CY52-16 and CY52-17 may not both simultaneously (e.g., at the same time) be a single bond, $R_{51a}$ to $R_{51e}$, $R_{61}$ to $R_{64}$, $R_{63a}$, $R_{63b}$, $R_{64a}$, and $R_{64b}$ are each the same as described in connection with $R_{61}$ in the present specification, wherein each of $R_{51a}$ to $R_{51e}$ may not be hydrogen, $R_{52a}$ to $R_{52e}$, $R_{65}$ to $R_{68}$, $R_{67a}$, $R_{67b}$, $R_{68a}$, and $R_{68b}$ are each the same as described in connection with $R_{62}$ in the present specification, wherein each of $R_{52a}$ to $R_{52e}$ may not be hydrogen, $R_{53a}$ to $R_{53e}$, $R_{69a}$, and $R_{69b}$ are each the same as described in connection with $R_{63}$ in the present specification, wherein each of $R_{53a}$ to $R_{53e}$ may not be hydrogen, and

* indicates a binding site to a neighboring atom.

In one or more embodiments, $R_{51a}$ to $R_{51e}$ and $R_{52a}$ to $R_{52e}$ in Formulae CY51-1 to CY51-26 and CY52-1 to CY52-26 may each independently be:

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, an azafluorenyl group, an azadibenzosilolyl group, or a group represented by Formula 91, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{10}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or any combination thereof; or $—C(Q_1)(Q_2)(Q_3)$ or $—Si(Q_1)(Q_2)(Q_3)$, $Q_1$ to $Q_3$ may each independently be a phenyl group, a naphthyl group, a pyridinyl group, a pyrimidinyl group, a pyridazinyl group, a pyrazinyl group, or a triazinyl group, each unsubstituted or substituted with deuterium, a $C_1$-$C_{10}$ alkyl group, a phenyl group, a biphenyl group, a pyridinyl group, a pyrimidinyl group, a pyridazinyl group, a pyrazinyl group, a triazinyl group, or any combination thereof, in Formulae CY51-16 and CY51-17, i) $Y_{63}$ may be O or S, and $Y_{64}$ may be $Si(R_{64a})(R_{64b})$, or ii) $Y_{63}$ may be $Si(R_{63a})(R_{63b})$, and $Y_{64}$ may be O or S, and in Formulae CY52-16 and CY52-17, i) $Y_{67}$ may be O or S, and Yes may be $Si(R_{68a})(R_{68b})$, or ii) $Y_{67}$ may be $Si(R_{67a})(R_{67b})$, and Yes may be O or S.

In one or more embodiments, $L_{81}$ to $L_{85}$ in Formulae 3-1 to 3-5 may each independently be:

a single bond;

*$—C(Q_4)(Q_5)$-*' or *$—Si(Q_4)(Q_5)$-*'; or a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group, each unsubstituted or substituted with deuterium, —F, —Cl, —Br, —I, a hydroxyl group, a cyano group, a nitro group, a $C_1$-$C_{20}$ alkyl group, a $C_1$-$C_{20}$ alkoxy group, a phenyl group, a naphthyl group, a pyridinyl group, a pyrimidinyl group, a triazinyl group, a fluorenyl group, a dimethylfluorenyl group, a diphenyl fluorenyl group, a carbazolyl group, a phenylcarbazolyl group, a dibenzofuranyl group, a dibenzothiophenyl group, a dibenzosilolyl group, a dimethyl dibenzosilolyl group, a diphenyl dibenzosilolyl group, $—O(Q_{31})$, $—S(Q_{31})$, $—Si(Q_{31})(Q_{32})(Q_{33})$, $—N(Q_{31})(Q_{32})$, $—B(Q_{31})(Q_{32})$, $—P(Q_{31})(Q_{32})$, —C(═O)($Q_{31}$), —S(═O)$_2$($Q_{31}$), —P(═O)($Q_{31}$)($Q_{32}$), or any combination thereof, wherein $Q_4$, $Q_5$, and $Q_{31}$ to $Q_{33}$ may each independently be hydrogen, deuterium, a $C_1$-$C_{20}$ alkyl group, a $C_1$-$C_{20}$ alkoxy group, a phenyl group, a biphenyl group, a terphenyl group, a pyridinyl group, a pyrimidinyl group, a pyridazinyl group, a pyrazinyl group, or a triazinyl group.

In one or more embodiments, a group represented by

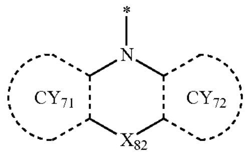

in Formulae 3-1 and 3-2 may be a group represented by one of Formulae CY71-1(1) to CY71-1(8), and/or a group represented by

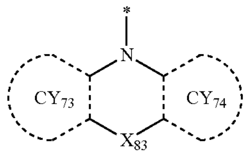

in Formulae 3-1 and 3-3 may be a group represented by one of Formulae CY71-2(1) to CY71-2(8), and/or a group represented by

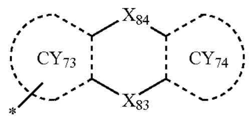

in Formulae 3-2 and 3-4 may be a group represented by one of Formulae CY71-3(1) to CY71-3(32), and/or a group represented by

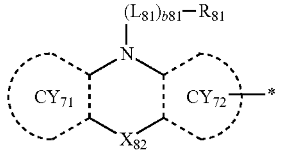

in Formulae 3-3 to 3-5 may be a group represented by one of Formulae CY71-4(1) to CY71-4(32), and/or a group represented by

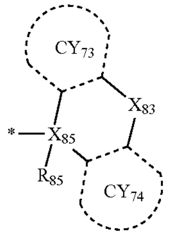

in Formula 3-5 may be a group represented by one of Formulae CY71-5(1) to CY71-5(8):

CY71-1(1)

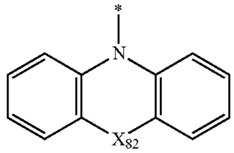

CY71-1(2)

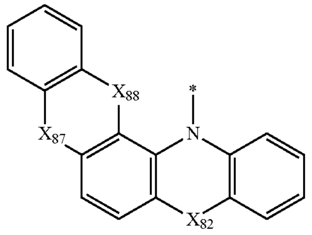

CY71-1(3)

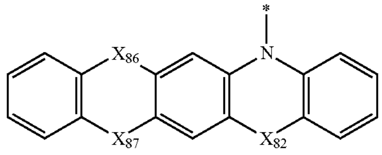

CY71-1(4)

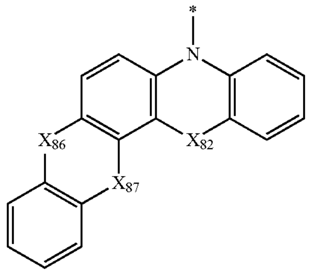

CY71-1(5)

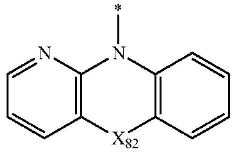

CY71-1(6)

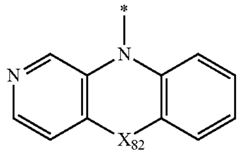

-continued
CY71-1(7)
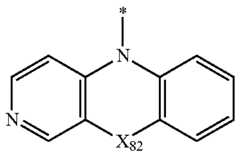
CY71-1(8)
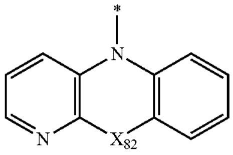
CY71-2(1)
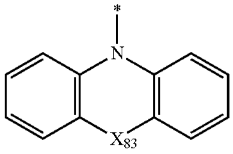
CY71-2(2)
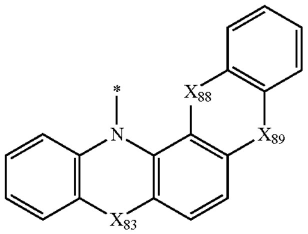
CY71-2(3)
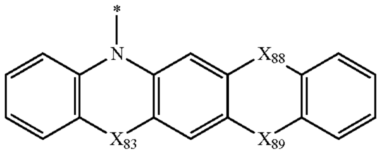
CY71-2(4)
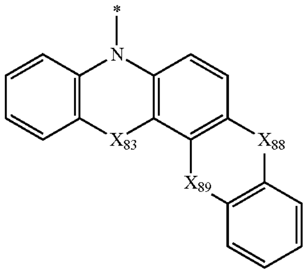
CY71-2(5)
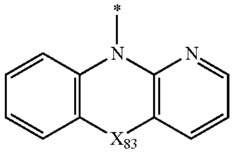
CY71-2(6)
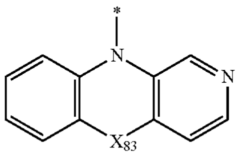
-continued
CY71-2(7)
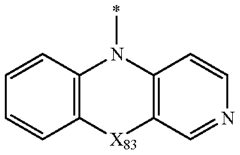
CY71-2(8)
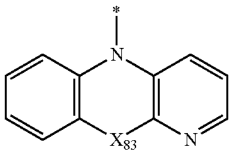
CY71-3(1)
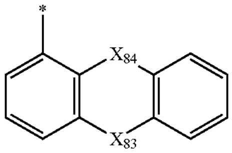
CY71-3-(2)
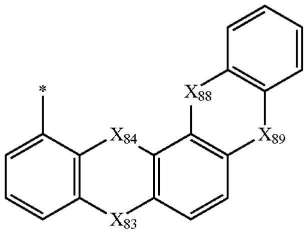
CY71-3(3)
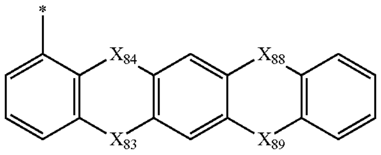
CY71-3(4)
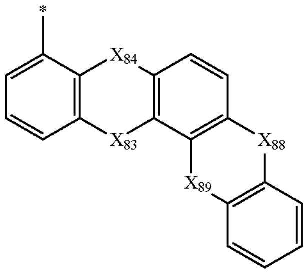
CY71-3(5)
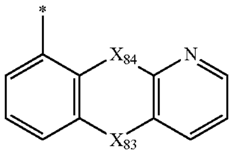
CY71-3(6)
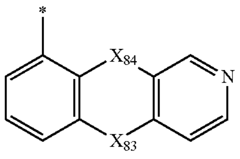

-continued
CY71-3(7)
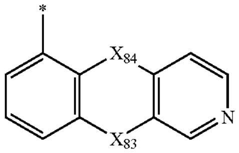
CY71-3(8)
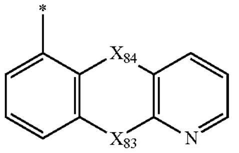
CY71-3(9)
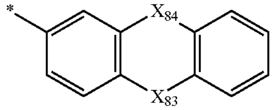
CY71-3-(10)
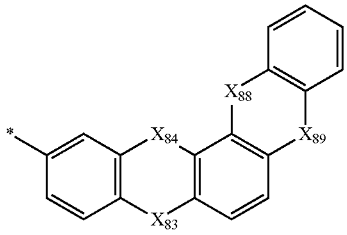
CY71-3(11)
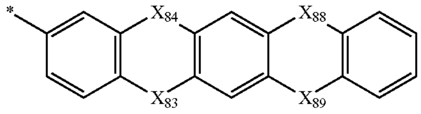
CY71-3(12)
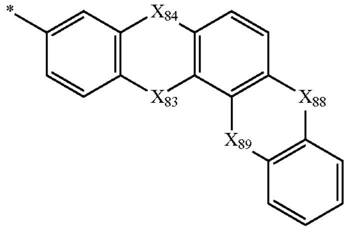
CY71-3(13)
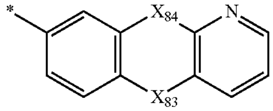
CY71-3(14)
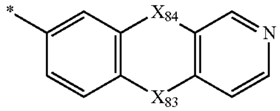
CY71-3(15)
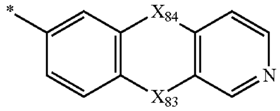
CY71-3(16)
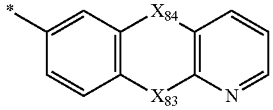
-continued
CY71-3(17)
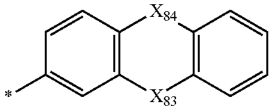
CY71-3(18)
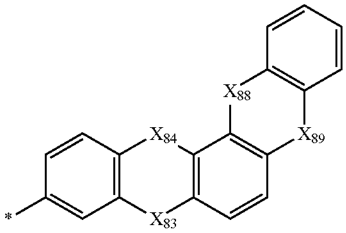
CY71-3(19)
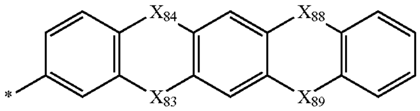
CY71-3(20)
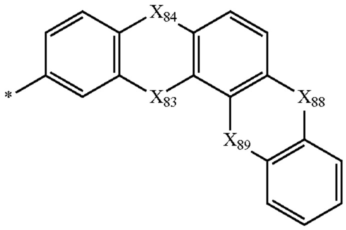
CY71-3(21)
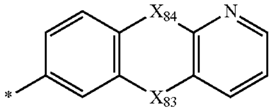
CY71-3(22)
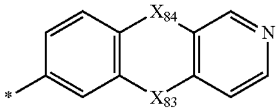
CY71-3(23)
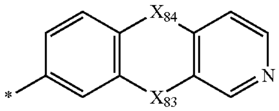
CY71-3(24)
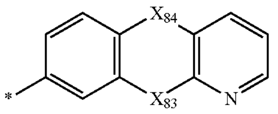
CY71-3(25)
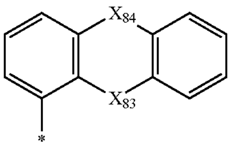

-continued
CY71-3(26)
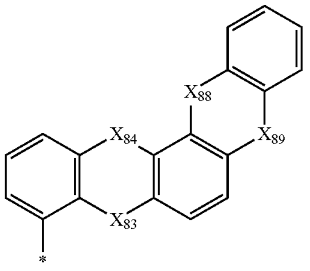
CY71-3(27)
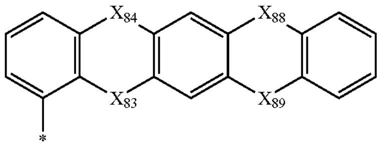
CY71-3(28)
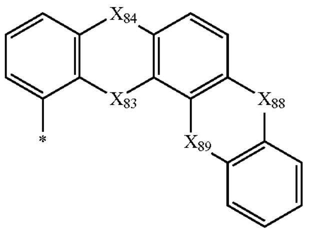
CY71-3(29)
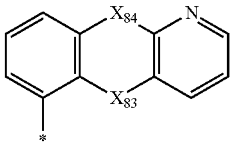
CY71-3(30)
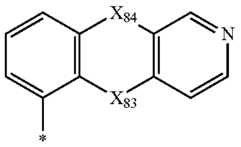
CY71-3(31)
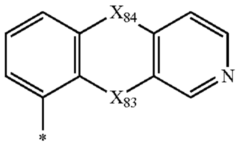
CY71-3(32)
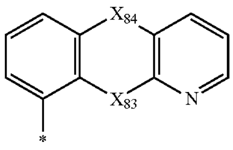
CY71-4(1)
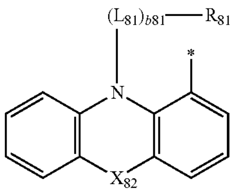
-continued
CY71-4(2)
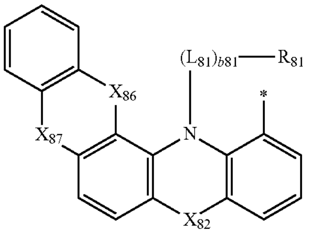
CY71-4(3)
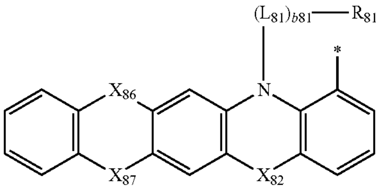
CY71-4(4)
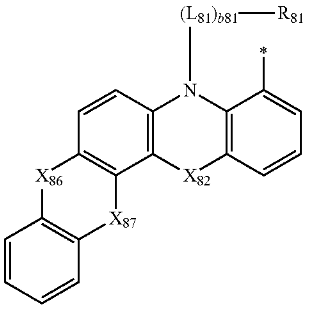
CY71-4(5)
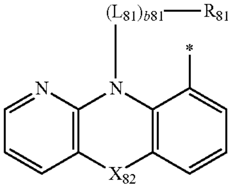
CY71-4(6)
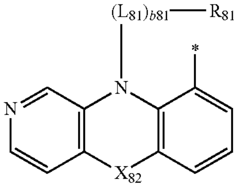
CY71-4(7)
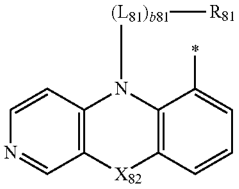
CY71-4(8)
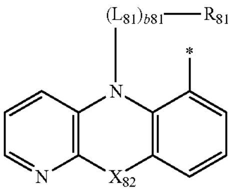

-continued
CY71-4(9)
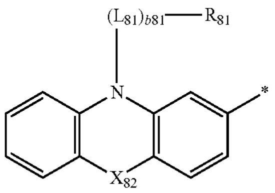
CY71-4(10)
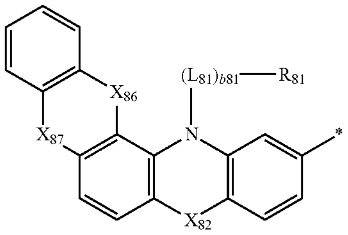
CY71-4(11)
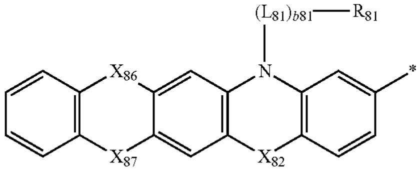
CY71-4(12)
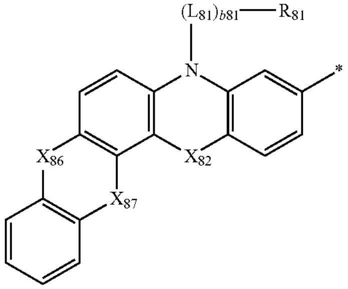
CY71-4(13)
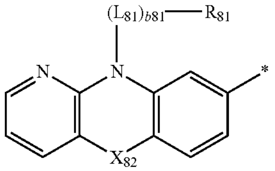
CY71-4(14)
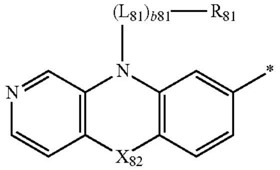
CY71-4(15)
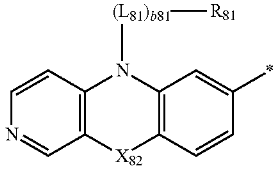
-continued
CY71-4(16)
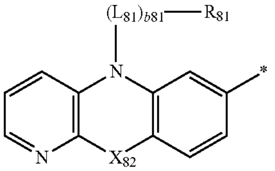
CY71-4(17)
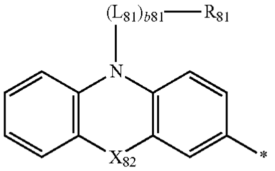
CY71-4(18)
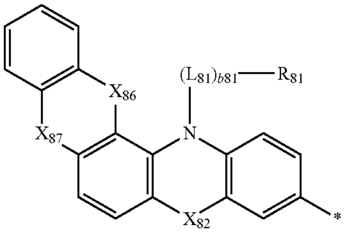
CY71-4(19)
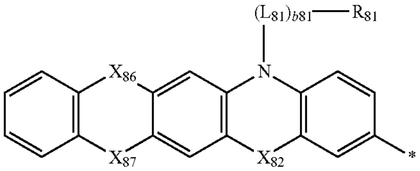
CY71-4(20)
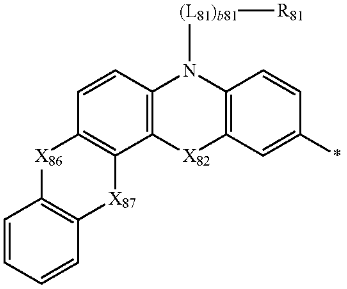
CY71-4(21)
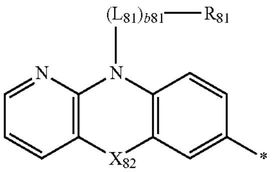
CY71-4(22)
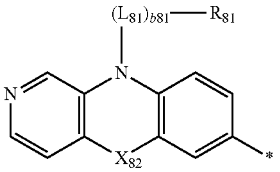
CY71-4(23)
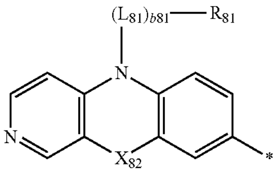

-continued
CY71-4(24)
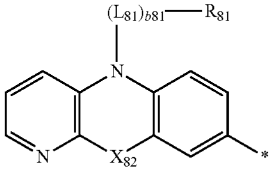
CY71-4(25)
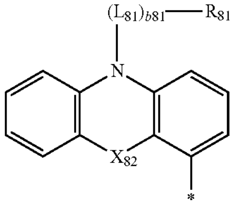
CY71-4(26)
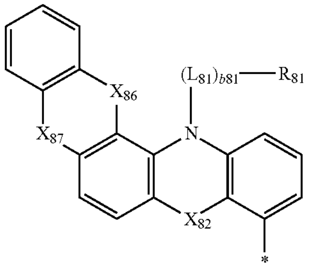
CY71-4(27)
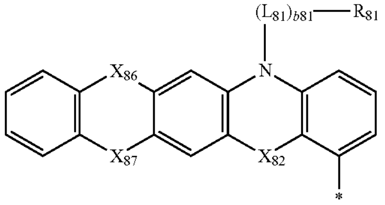
CY71-4(28)
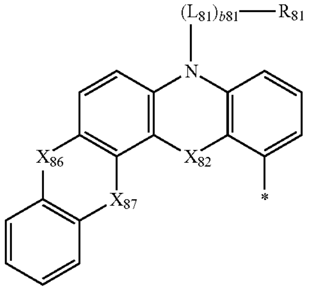
CY71-4(29)
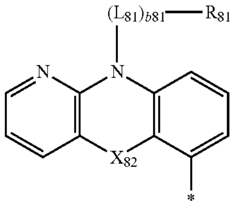
CY71-4(30)
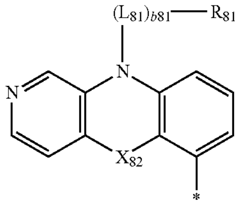
-continued
CY71-4(31)
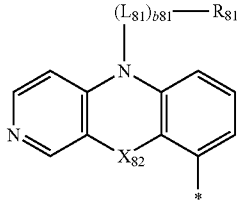
CY71-4(32)
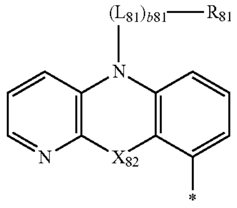
CY71-5(1)
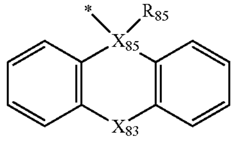
CY71-5(2)
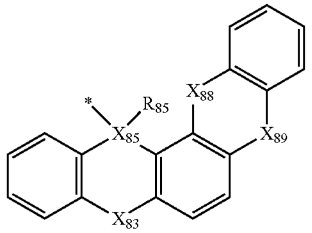
CY71-5(3)
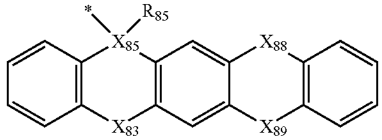
CY71-5(4)
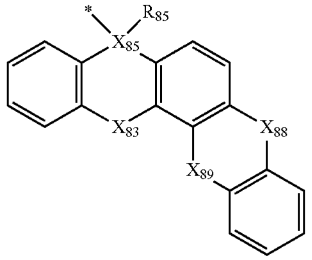
CY71-5(5)
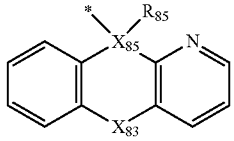
CY71-5(6)
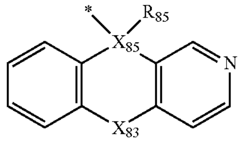

-continued

CY71-5(7)

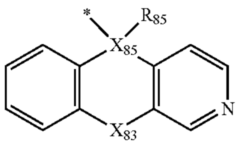

CY71-5(8)

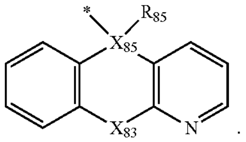

In Formulae CY71-1(1) to CY71-1(8), CY71-2(1) to CY71-2(8), CY71-3(1) to CY71-3(32), CY71-4(1) to CY71-4(32), and CY71-5(1) to CY71-5(8), $X_{81}$ to $X_{85}$, $L_{81}$, b81, $R_{81}$, and $R_{85}$ are each the same as described in the present specification, $X_{86}$ may be a single bond, O, S, N($R_{86}$), B($R_{86}$), C($R_{86a}$)($R_{86b}$), or Si($R_{86a}$)($R_{86b}$), $X_{87}$ may be a single bond, O, S, N($R_{87}$), B($R_{87}$), C($R_{87a}$)($R_{87b}$), or Si($R_{87a}$)($R_{87b}$), $X_{86}$ and $X_{87}$ in Formulae CY71-1(1) to CY71-1(8) and CY71-4(1) to CY71-4(32) may not both simultaneously (e.g., at the same time) be a single bond, $X_{86}$ may be a single bond, O, S, N($R_{88}$), B($R_{88}$), C($R_{88a}$)($R_{88b}$), or Si($R_{89a}$)($R_{89b}$), $X_{89}$ may be a single bond, O, S, N($R_{89}$), B($R_{89}$), C($R_{89a}$)($R_{89b}$), or Si($R_{89a}$)($R_{89b}$), $X_{88}$ and $X_{89}$ in Formulae CY71-2(1) to CY71-2(8), CY71-3(1) to CY71-3(32), and CY71-5(1) to CY71-5(8) may not both simultaneously (e.g., at the same time) be a single bond, and $R_{86}$ to $R_{89}$, $R_{86a}$, $R_{86b}$, $R_{87a}$, $R_{87b}$, $R_{88a}$, $R_{88b}$, $R_{89a}$, and $R_{89b}$ are each the same as described in connection with $R_{81}$ in the present specification.

Examples of Second Compound to Fourth Compound

In one or more embodiments, the second compound may include at least one of Compounds ETH1 to ETH84:

ETH1

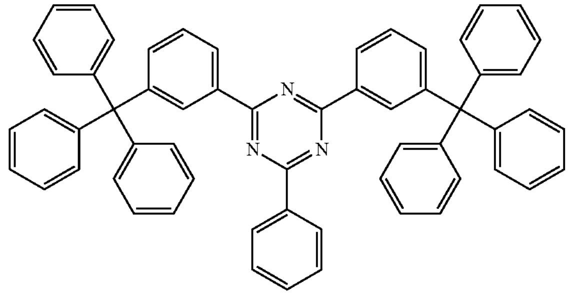

-continued

ETH2

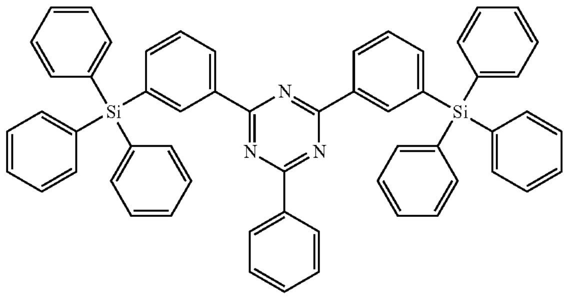

ETH3

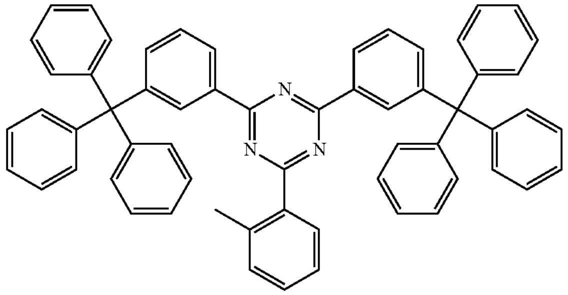

ETH4

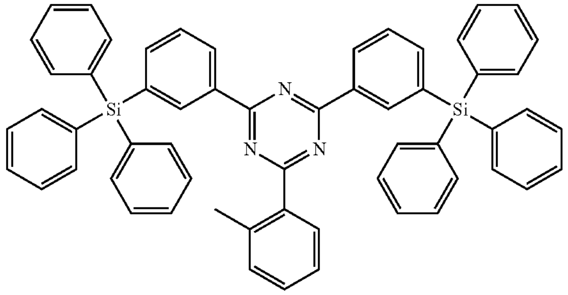

ETH5

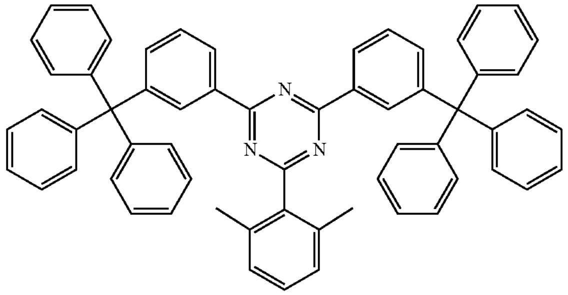

ETH6

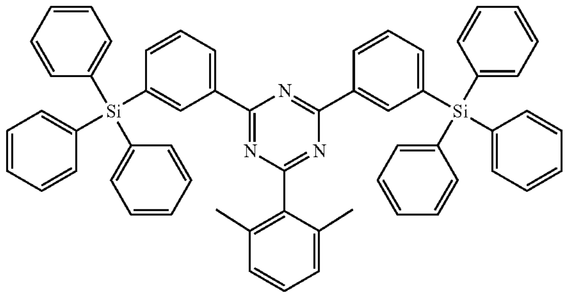

-continued
ETH7
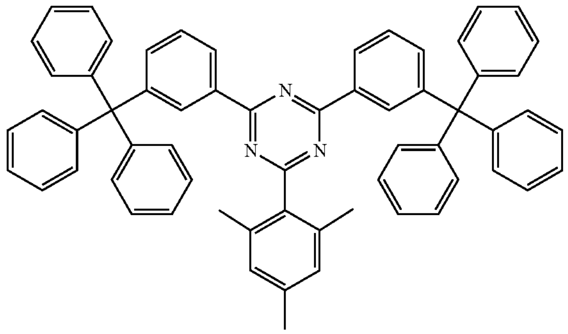
ETH8
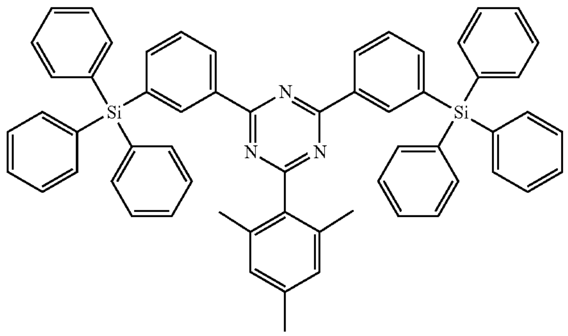
ETH9
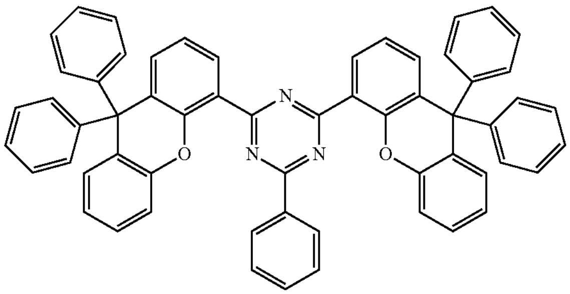
ETH10
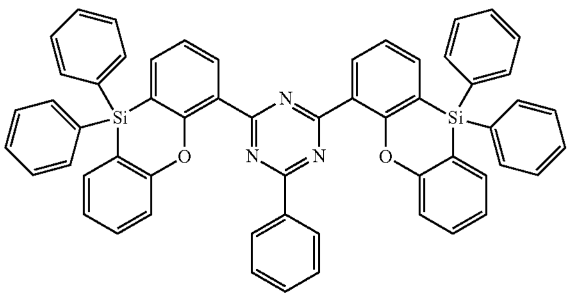
-continued
ETH11
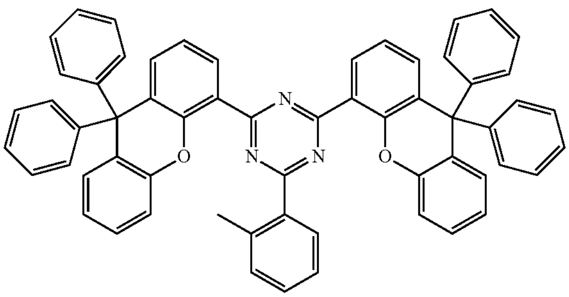
ETH12
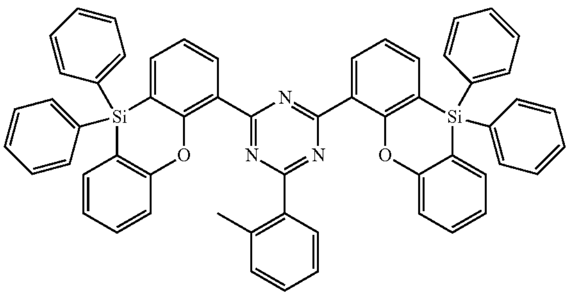
ETH13
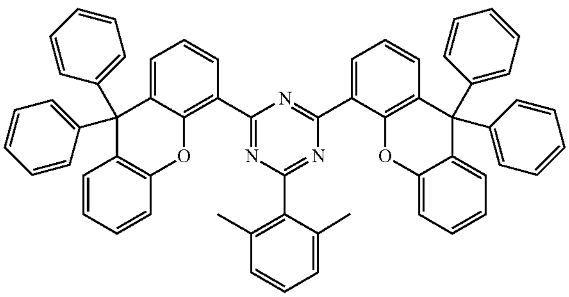
ETH14
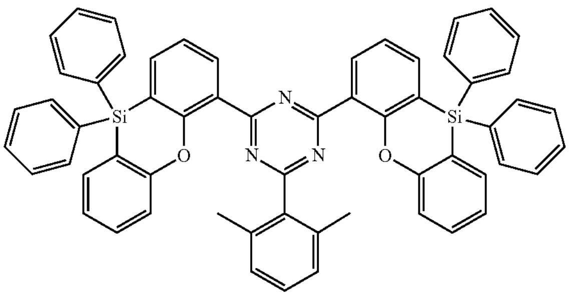
ETH15
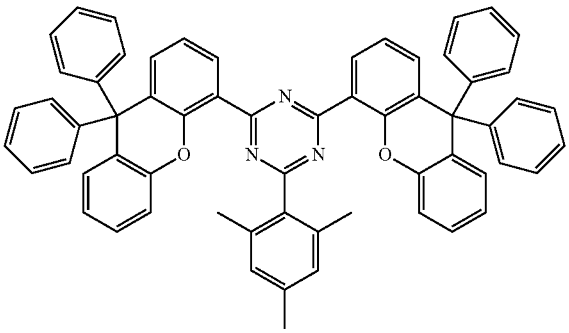

-continued
ETH16
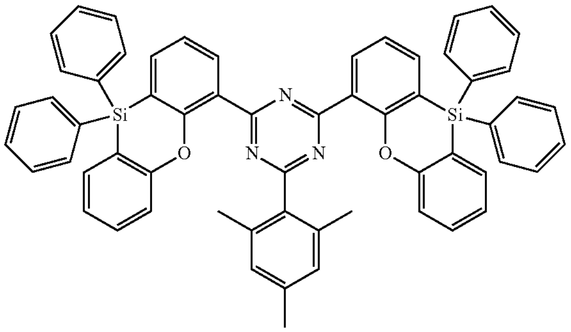
ETH17
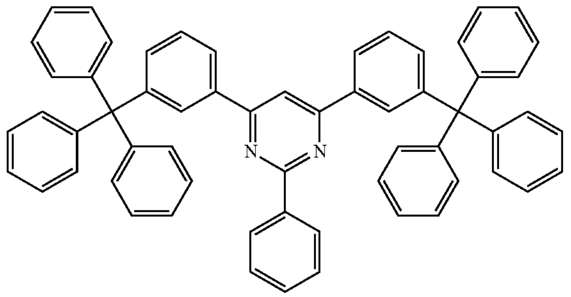
ETH18
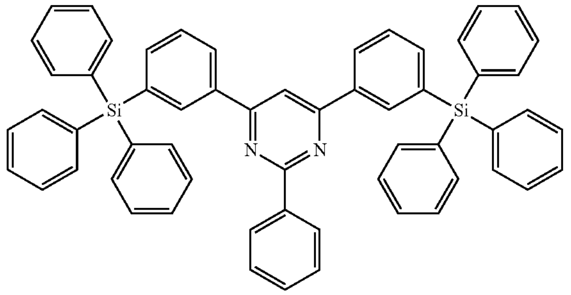
ETH19
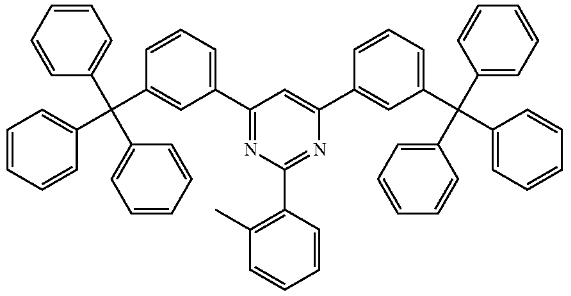
ETH20
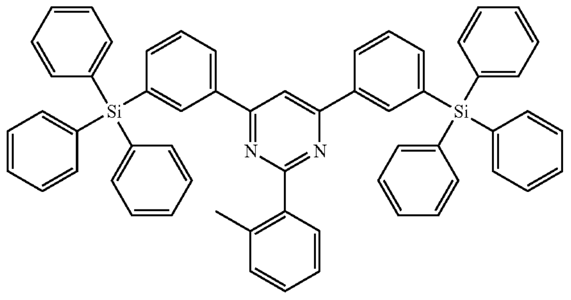
-continued
ETH21
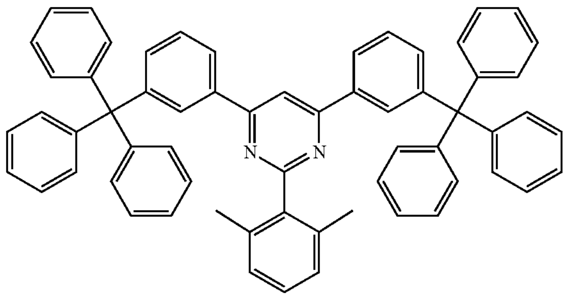
ETH22
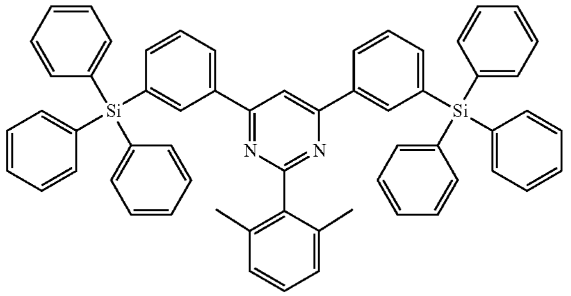
ETH23
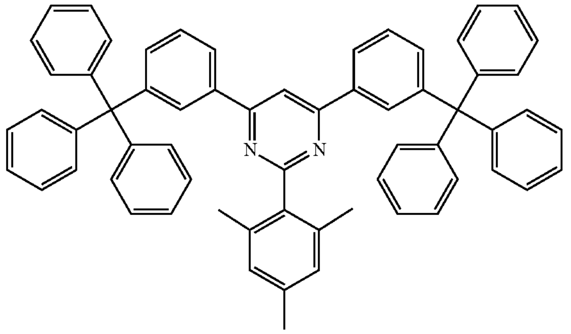
ETH24
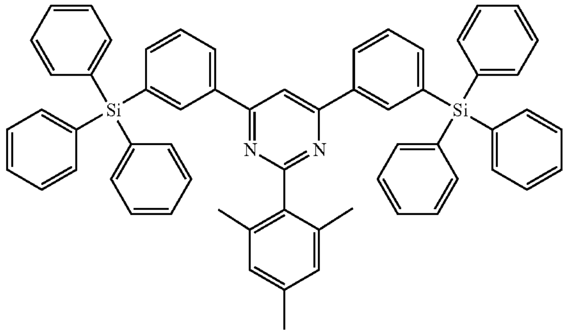

-continued
ETH25
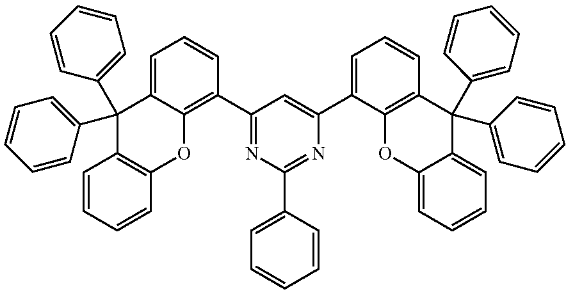
ETH26
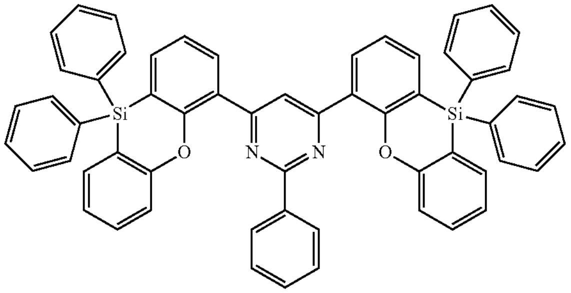
ETH27
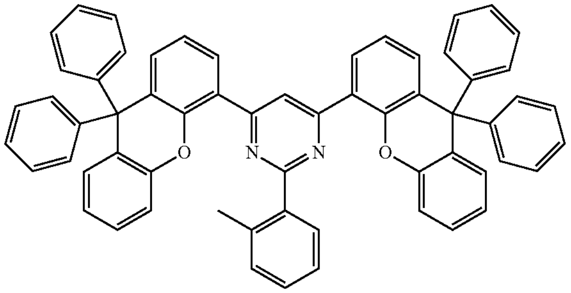
ETH28
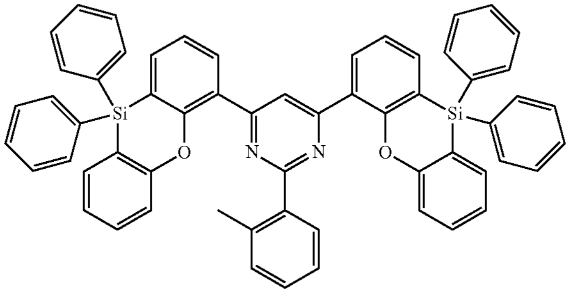
ETH29
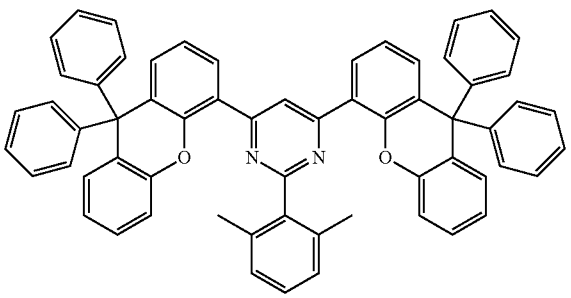
-continued
ETH30
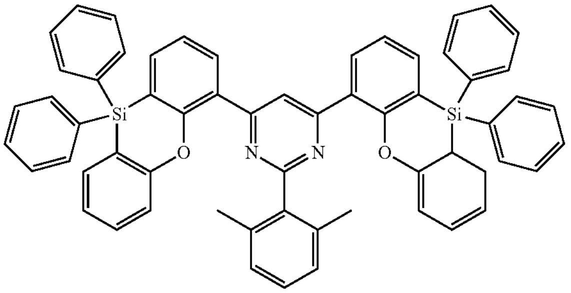
ETH31
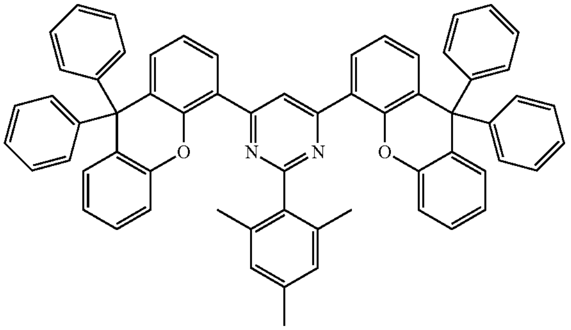
ETH32
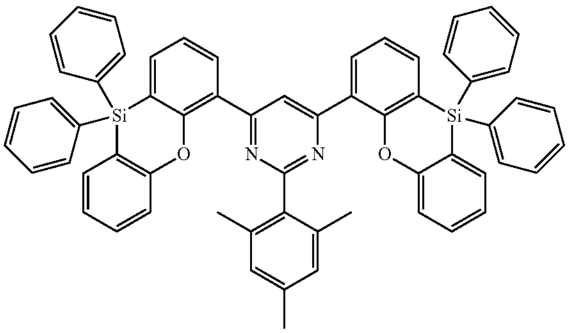
ETH33
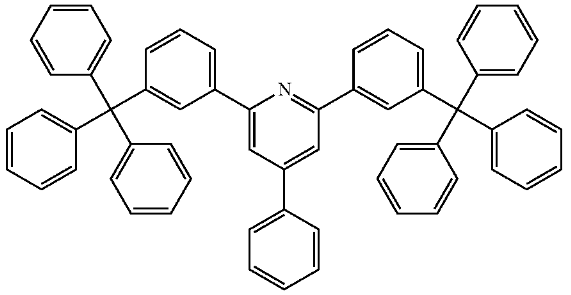

-continued
ETH34
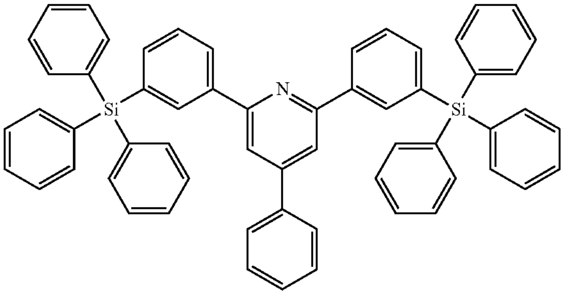
ETH35
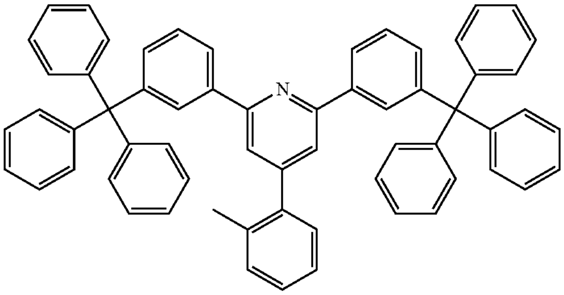
ETH36
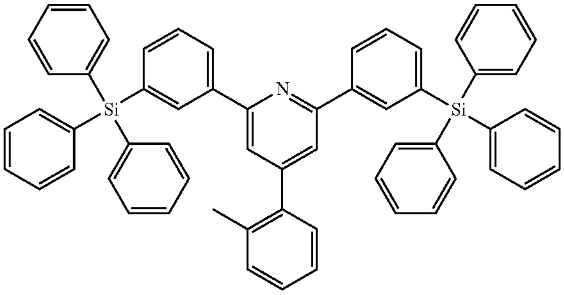
ETH37
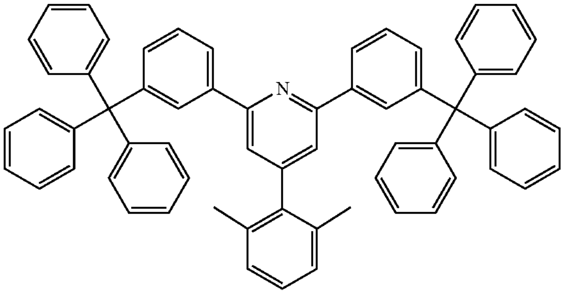
ETH38
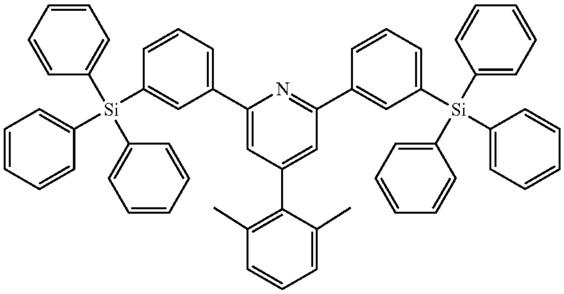
-continued
ETH39
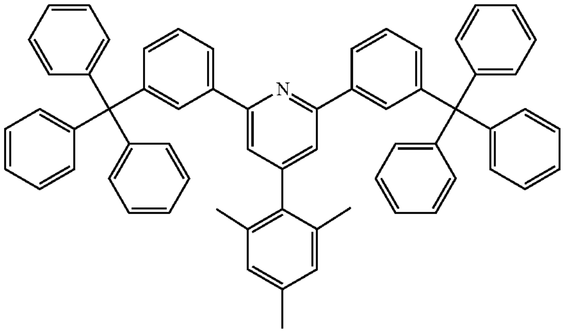
ETH40
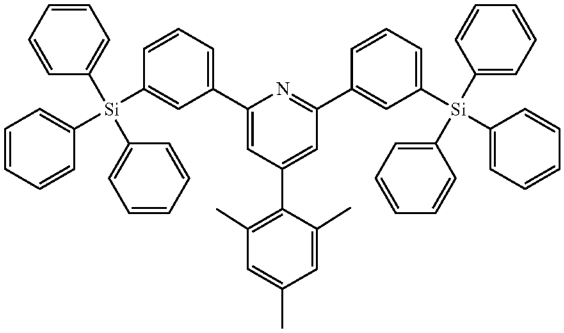
ETH41
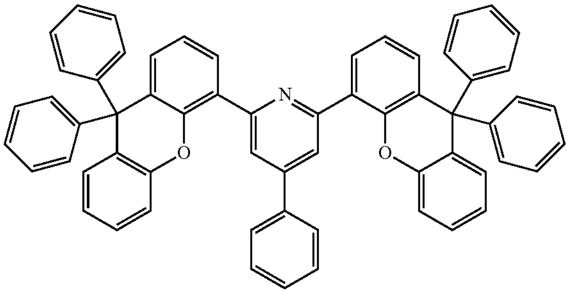
ETH42
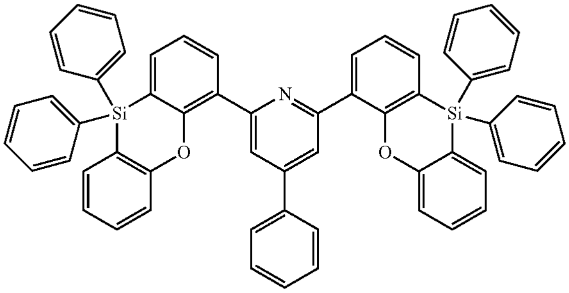

-continued
ETH43
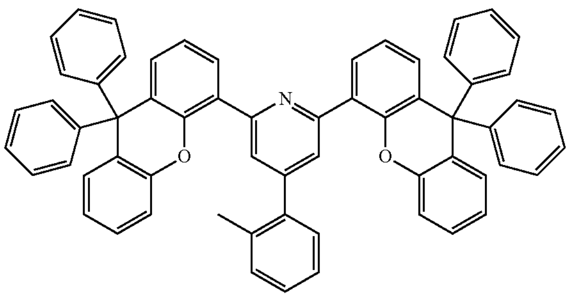
ETH44
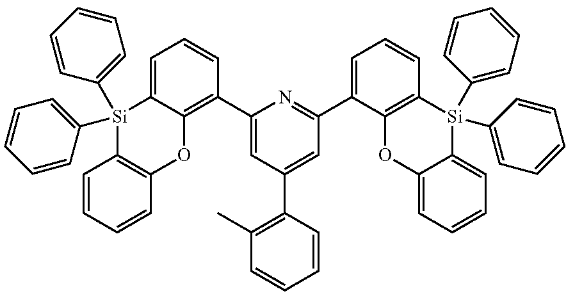
ETH45
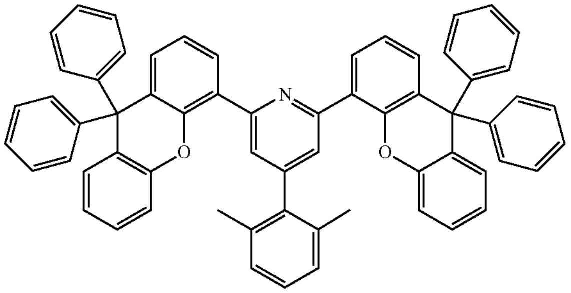
ETH46
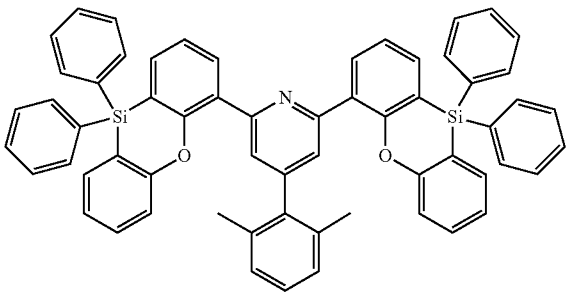
ETH47
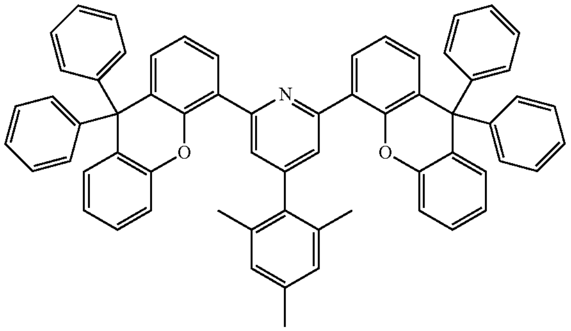
-continued
ETH48
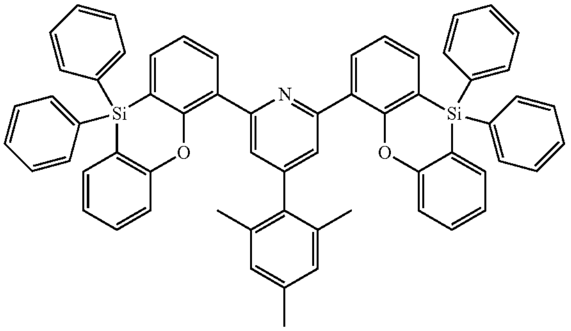
ETH49
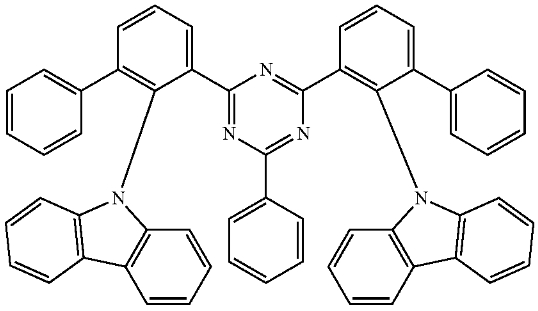
ETH50
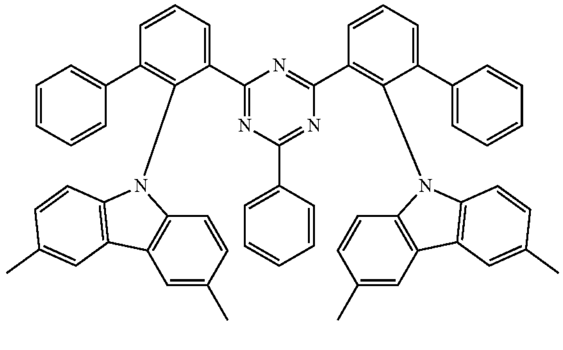
ETH51
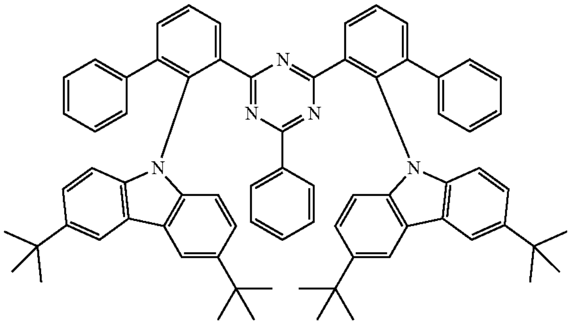

-continued
ETH52
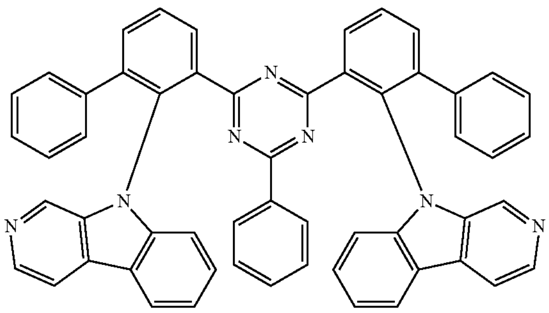
ETH53
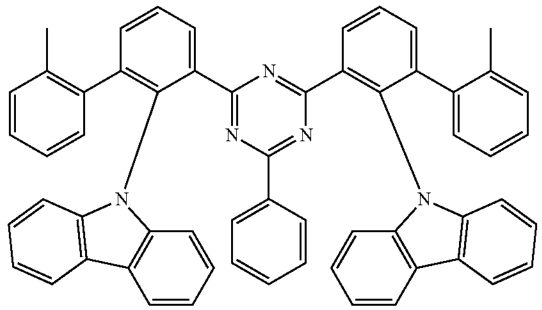
ETH54
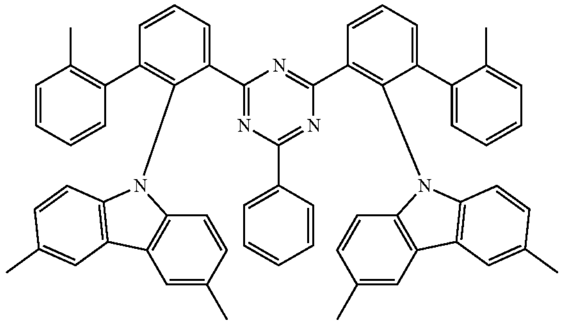
ETH55
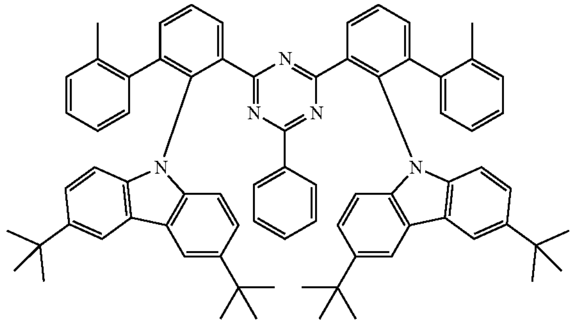
-continued
ETH56
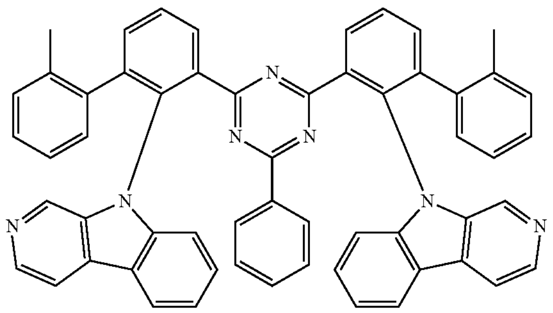
ETH57
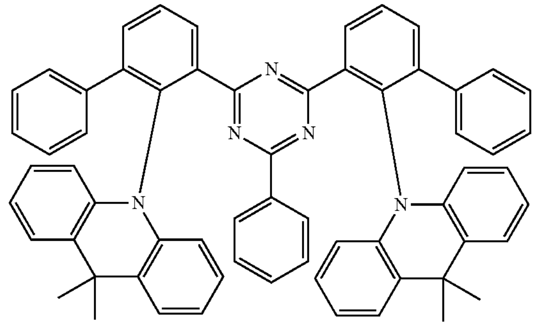
ETH58
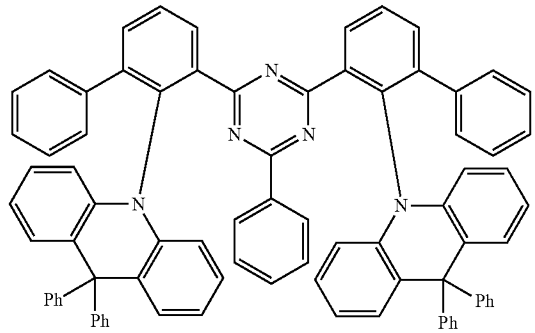
ETH59
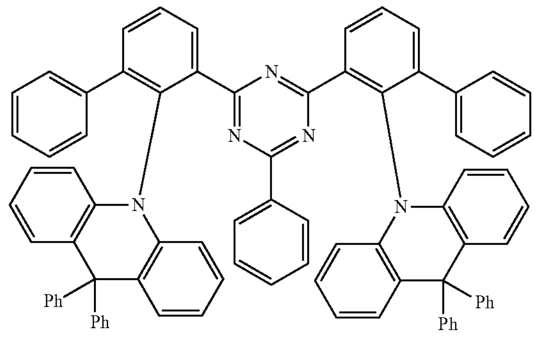

-continued
ETH60
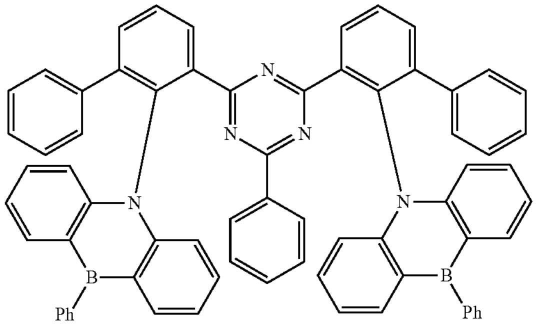
ETH61
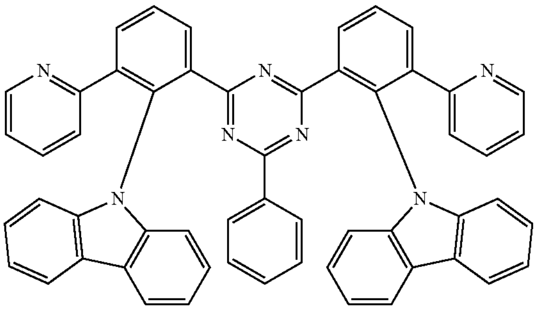
ETH62
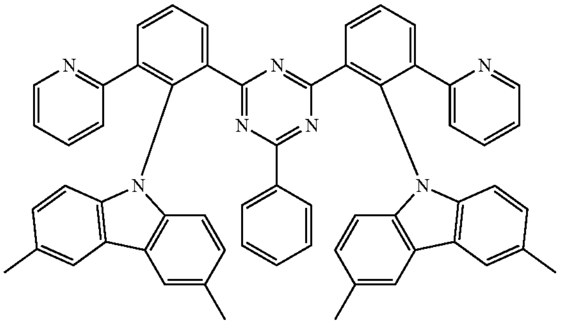
ETH63
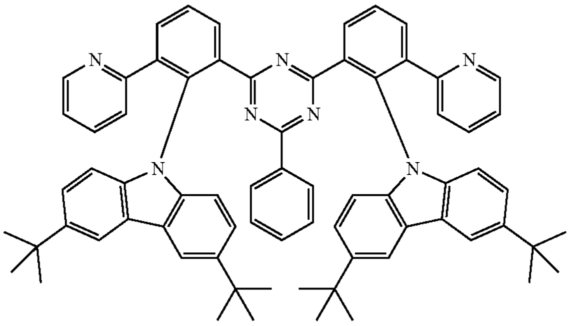
-continued
ETH64
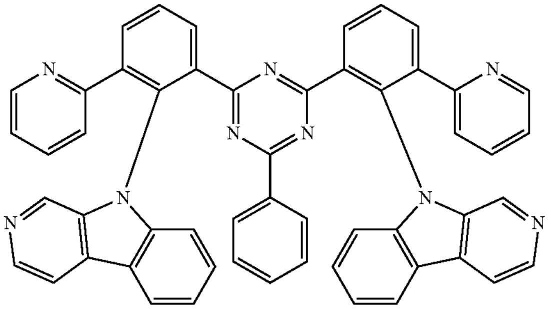
ETH65
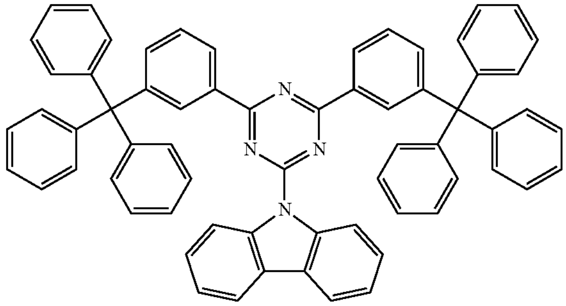
ETH66
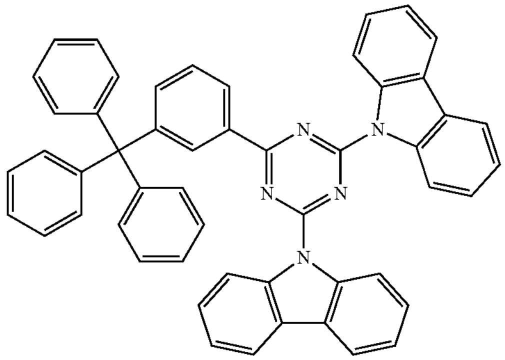
ETH67
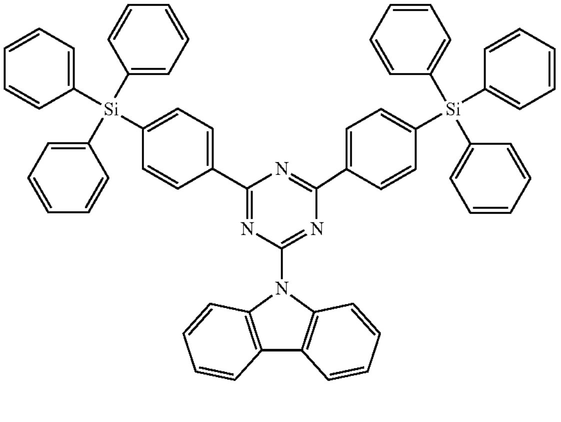

-continued
ETH68
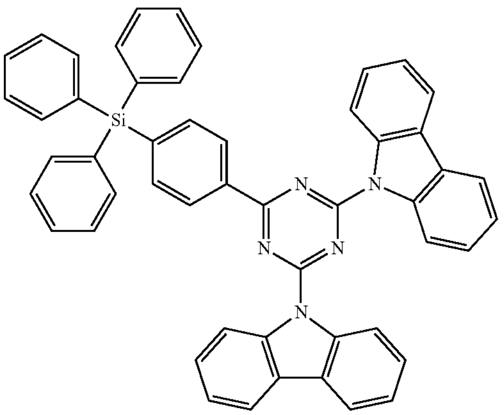
ETH69
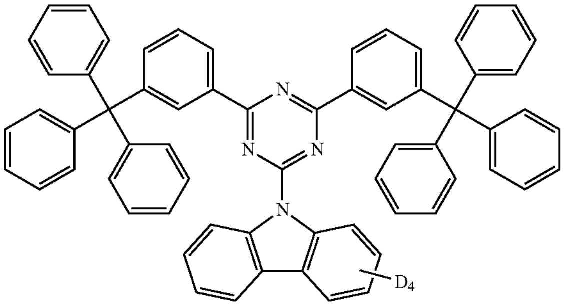
ETH70
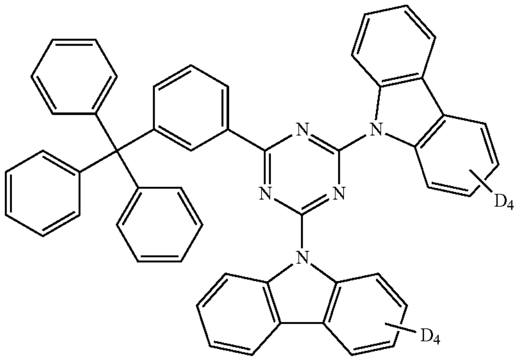
ETH71
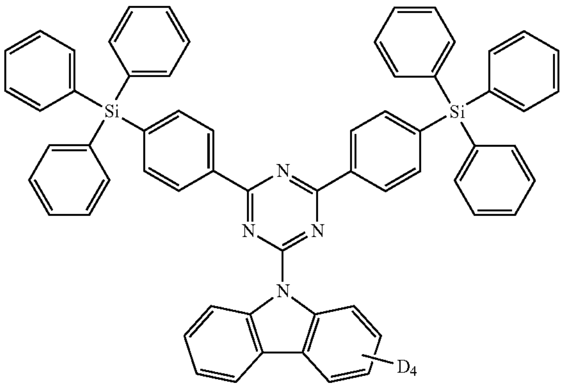
-continued
ETH72
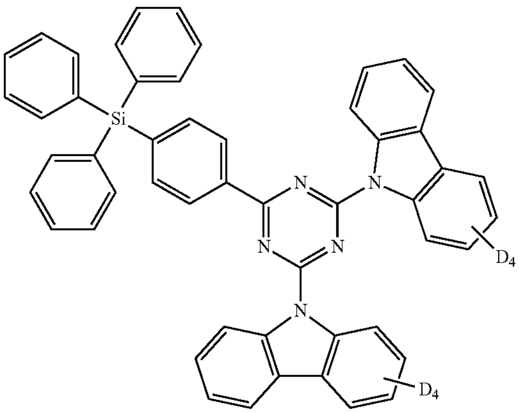
ETH73
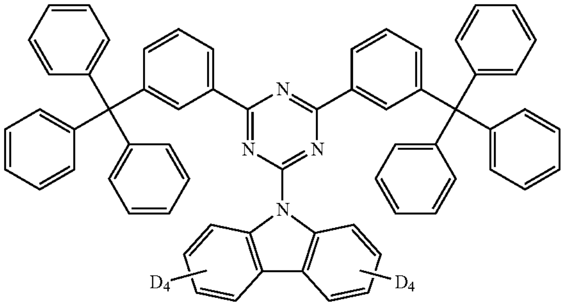
ETH74
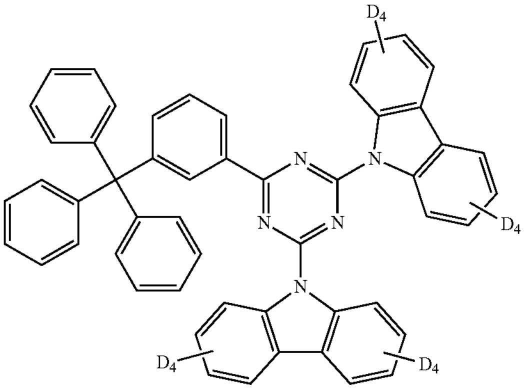
ETH75
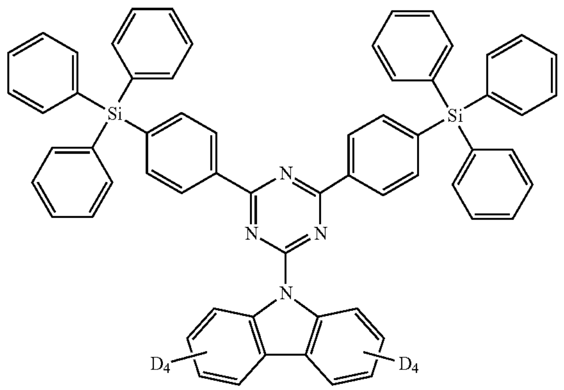

-continued
ETH76
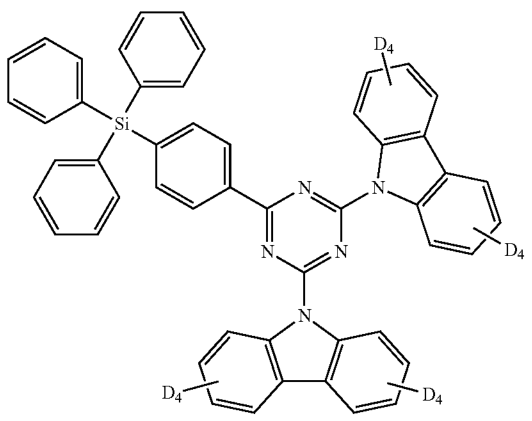
ETH77
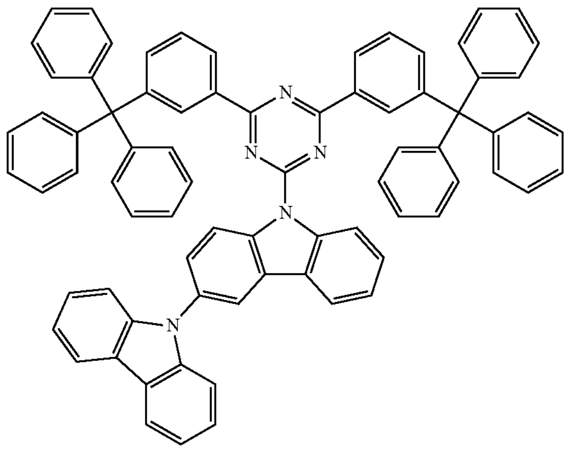
ETH78
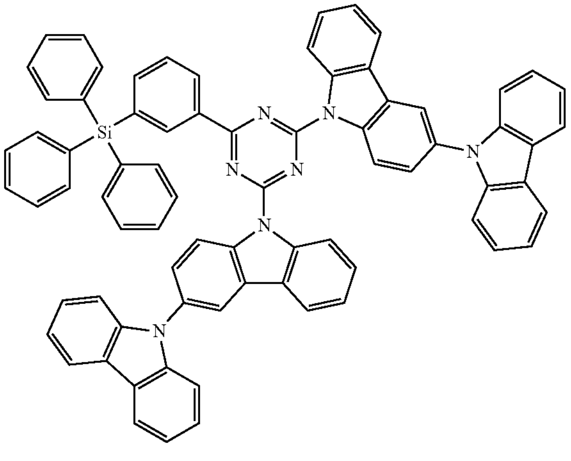
-continued
ETH79
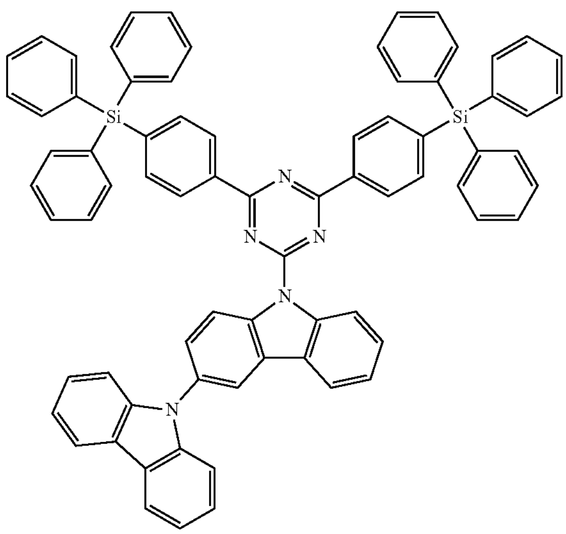
ETH80
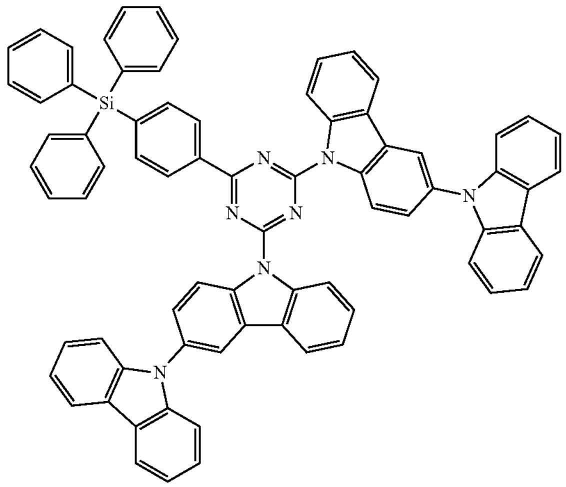
ETH81
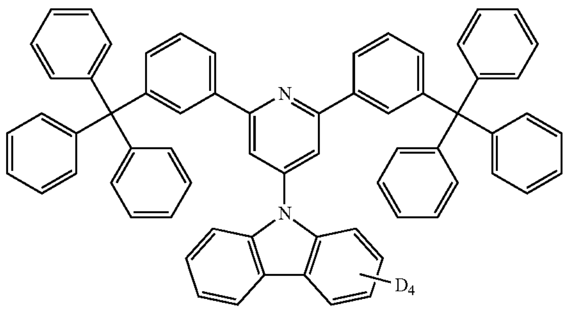

-continued
ETH82
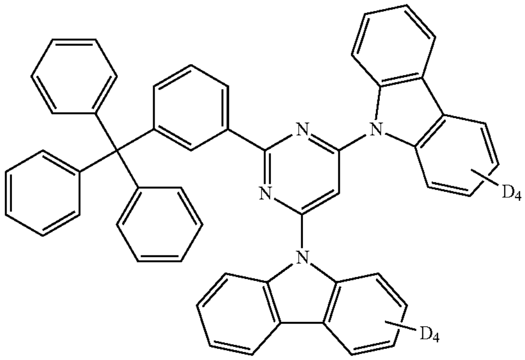
ETH83
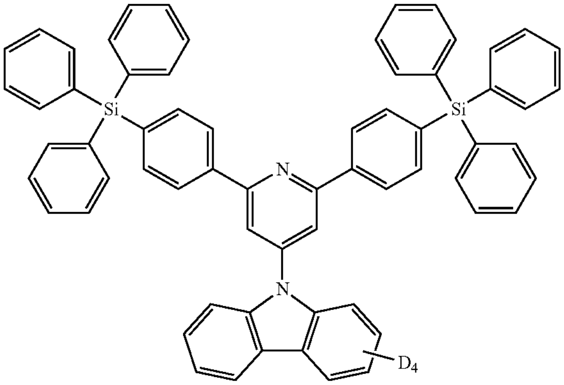
ETH84
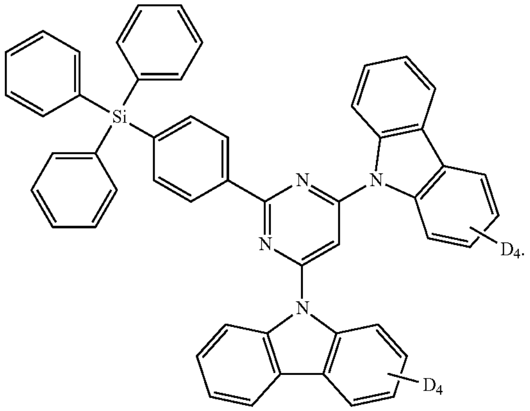
In one or more embodiments, the third compound may include at least one of Compounds HTH1 to HTH52:
HTH1
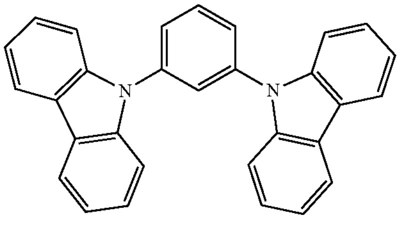
-continued
HTH2
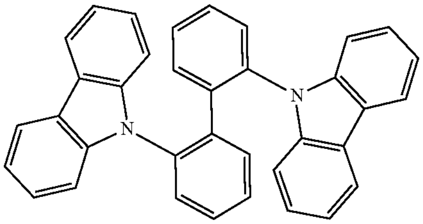
HTH3
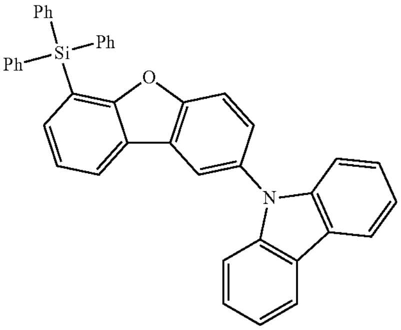
HTH4
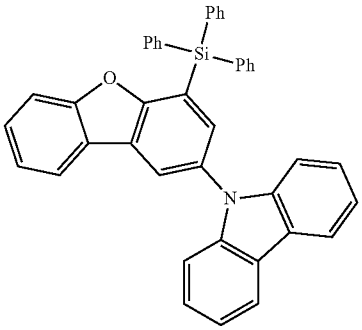
HTH5
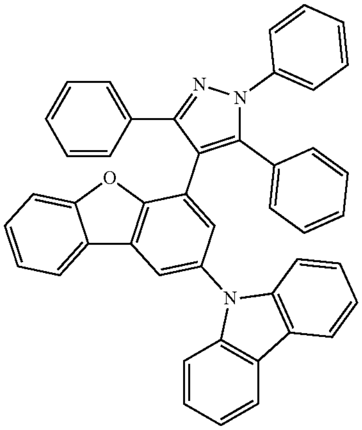

-continued
HTH6
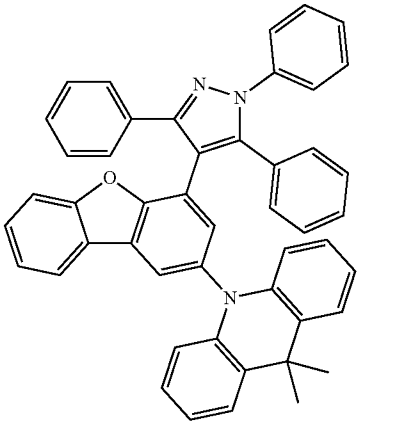
HTH7
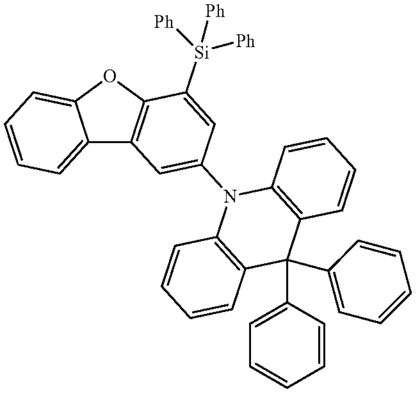
HTH8
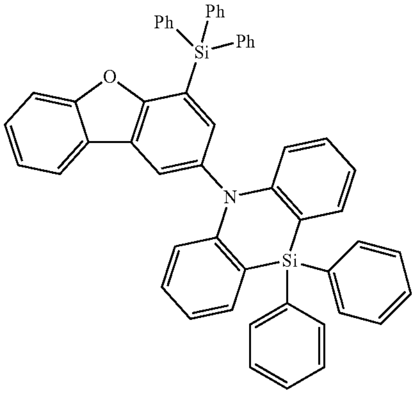
HTH9
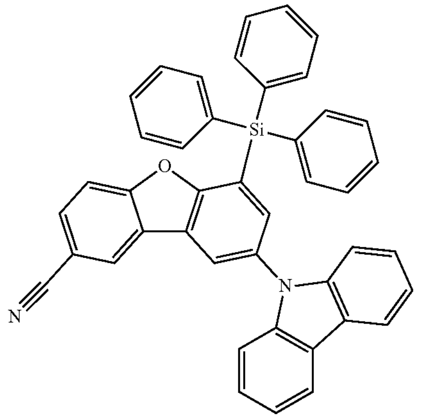
-continued
HTH10
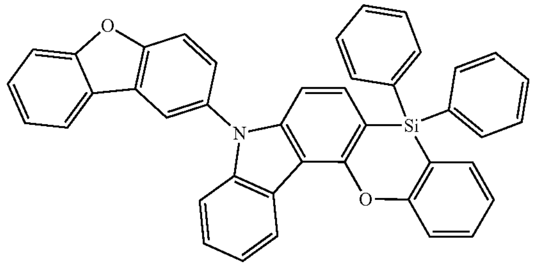
HTH11
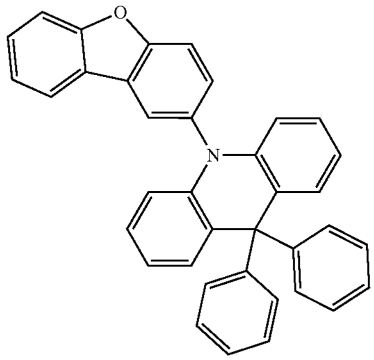
HTH12
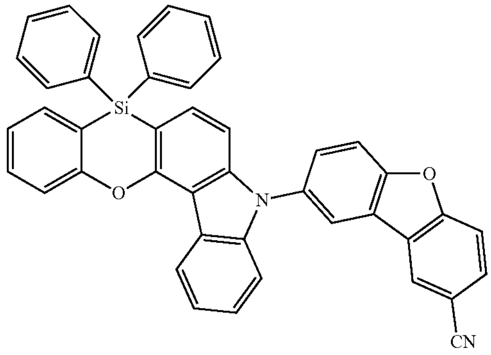
HTH13
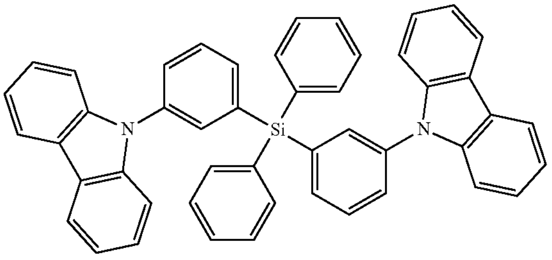

HTH14
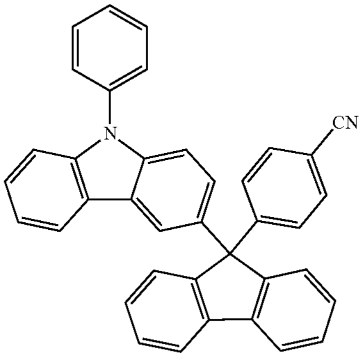
HTH15
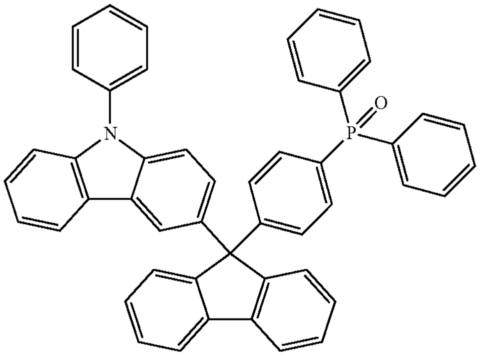
HTH16
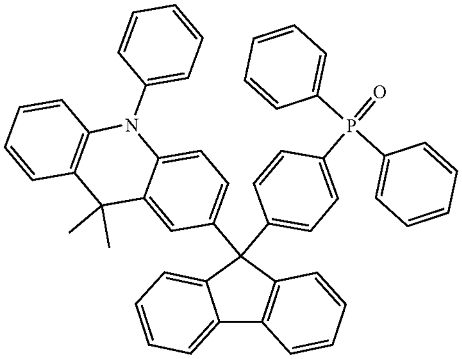
HTH17
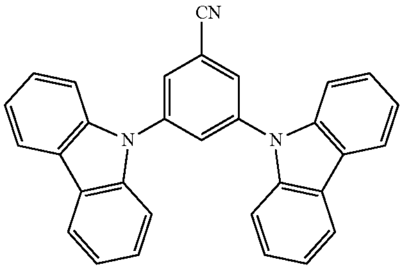
HTH18
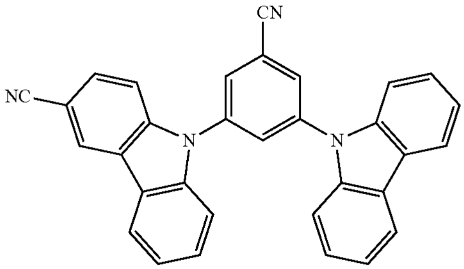
HTH19
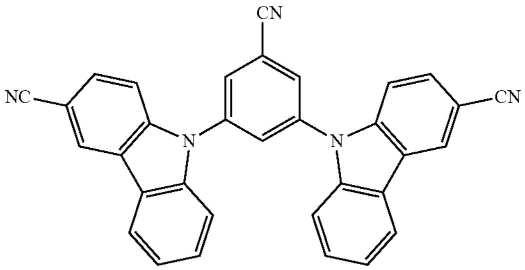
HTH20
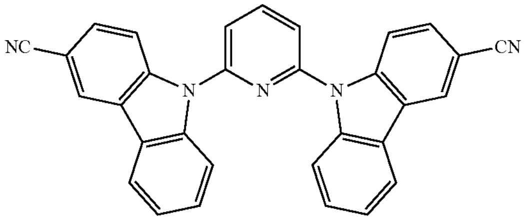
HTH21
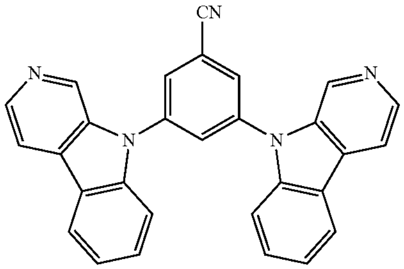
HTH22
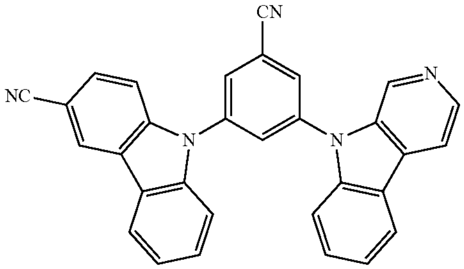

-continued
HTH23
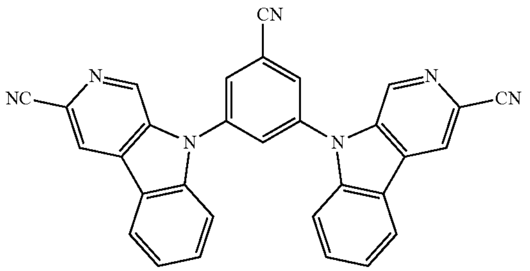
HTH24
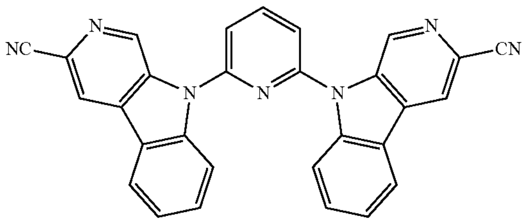
HTH25
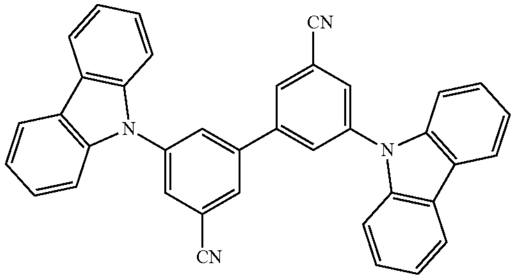
HTH26
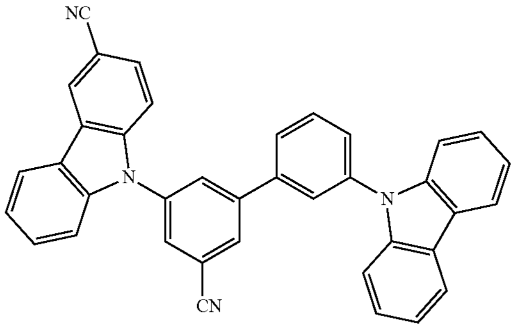
HTH27
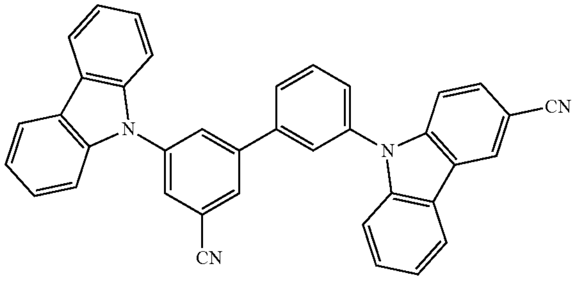
-continued
HTH28
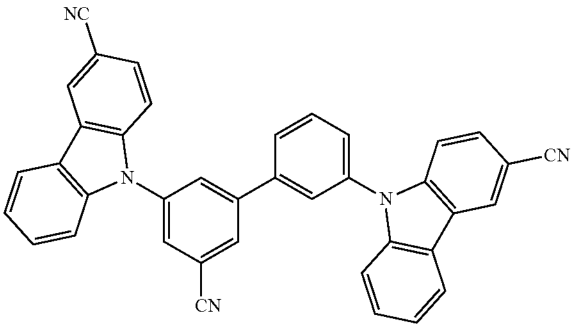
HTH29
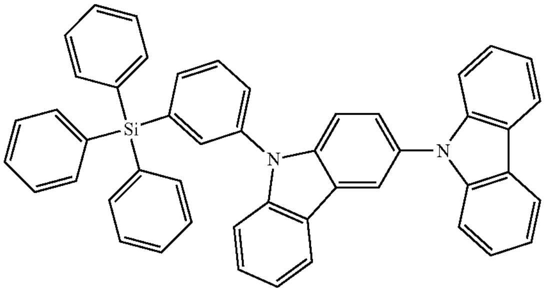
HTH30
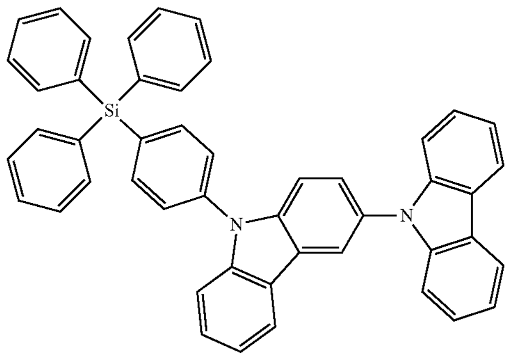
HTH31
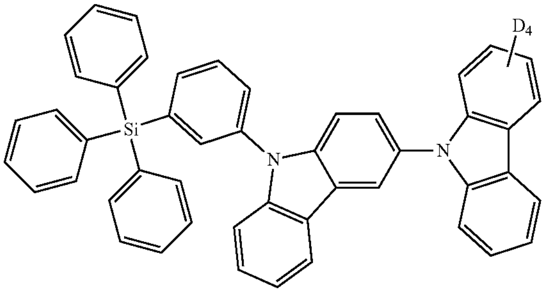

-continued
HTH32
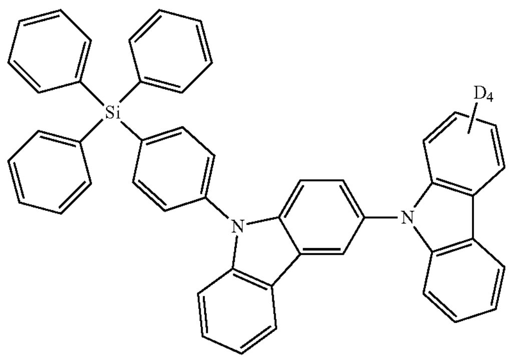
HTH33
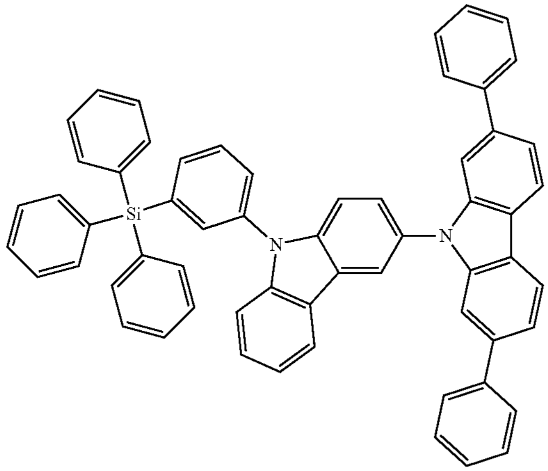
HTH34
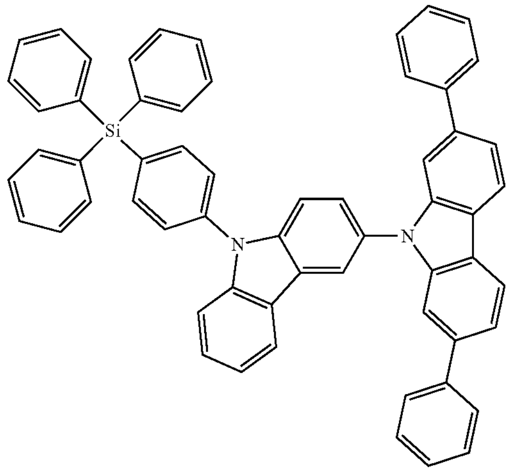
-continued
HTH35
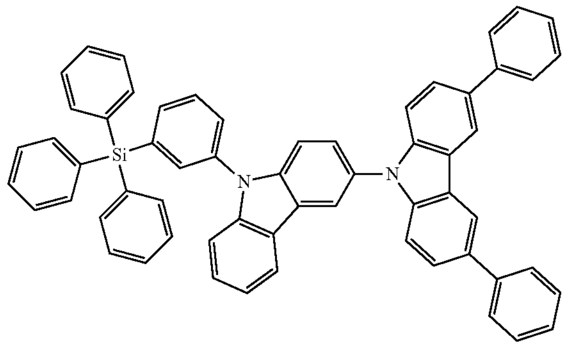
HTH36
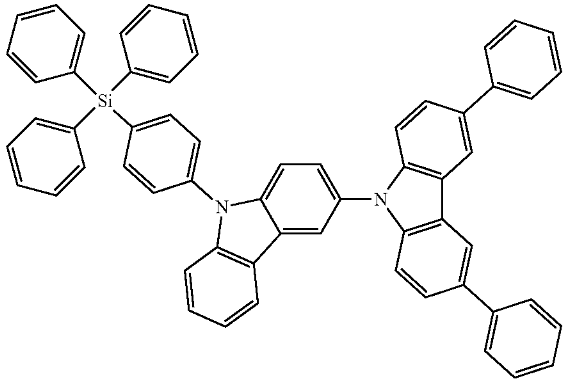
HTH37
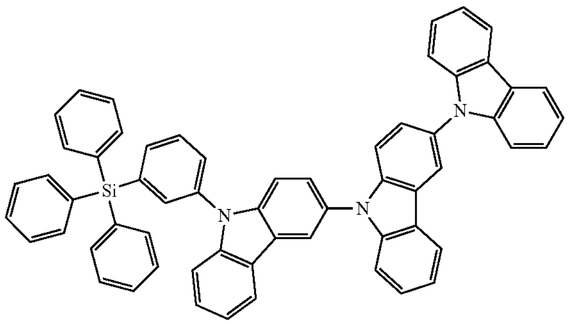
HTH38
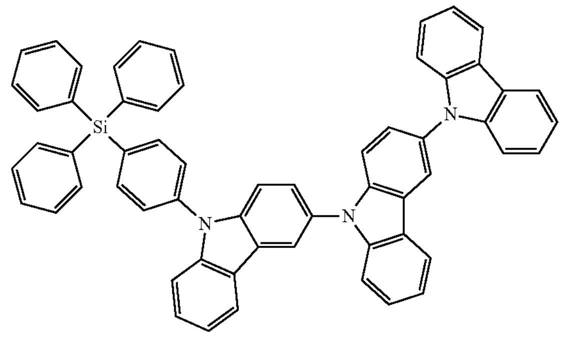

-continued
HTH39
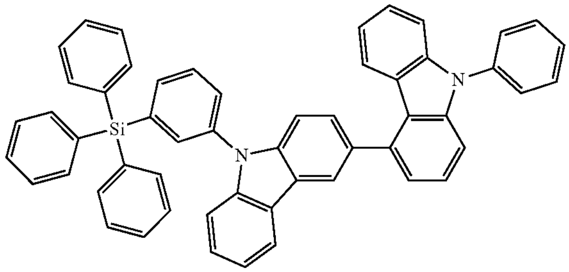
HTH40
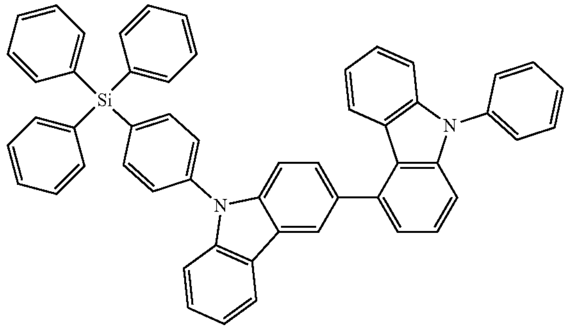
HTH41
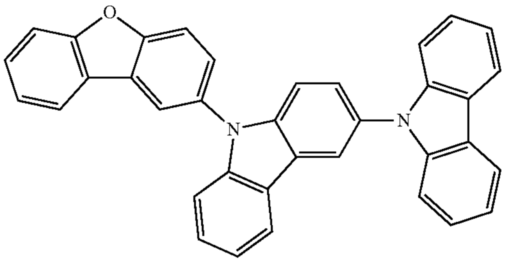
HTH42
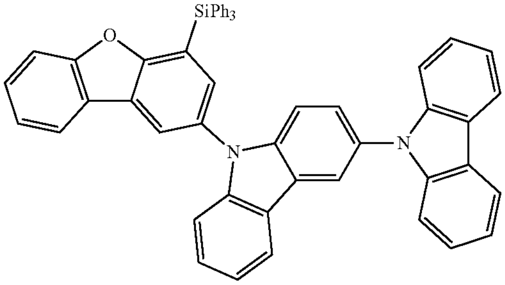
HTH43
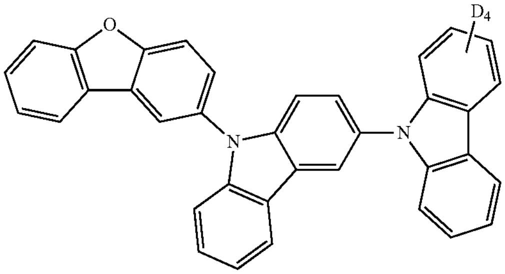
-continued
HTH44
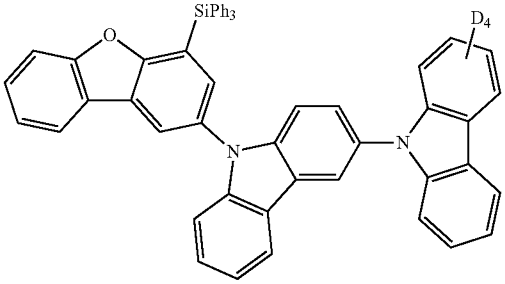
HTH45
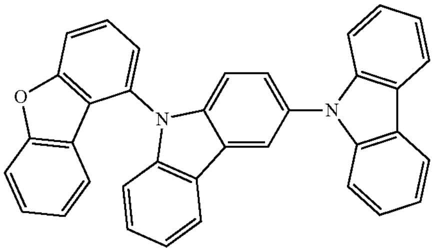
HTH46
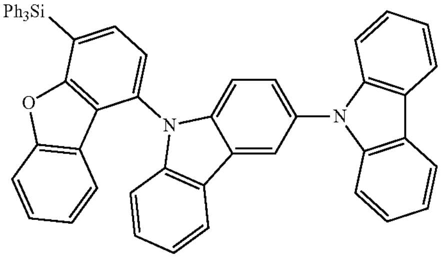
HTH47
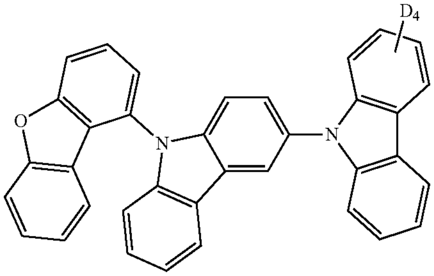
HTH48
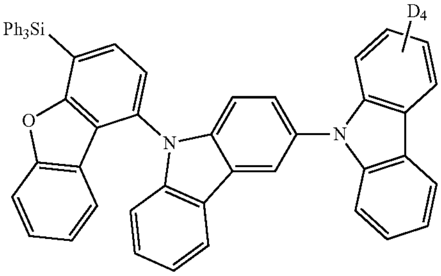

-continued
HTH49
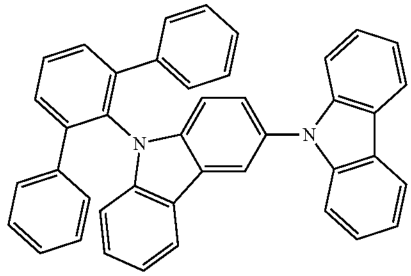
HTH50
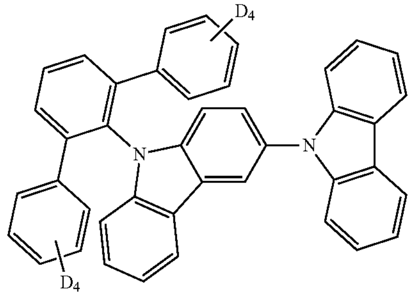
HTH51
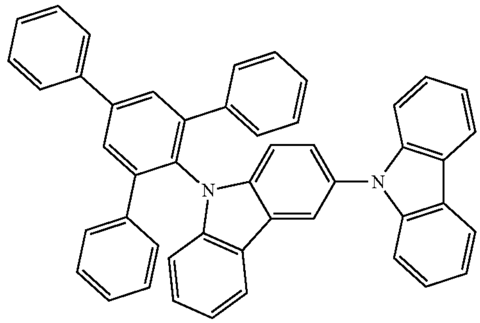
HTH52
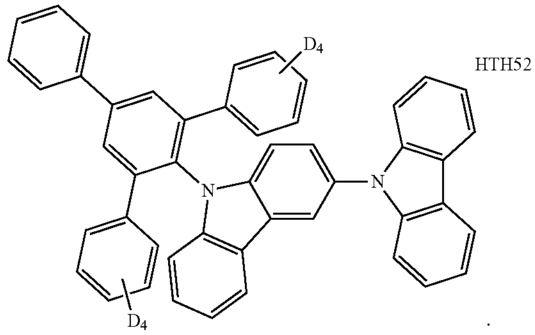
.
In one or more embodiments, the fourth compound may include at least one of Compounds DFD1 to DFD12:
DFD1
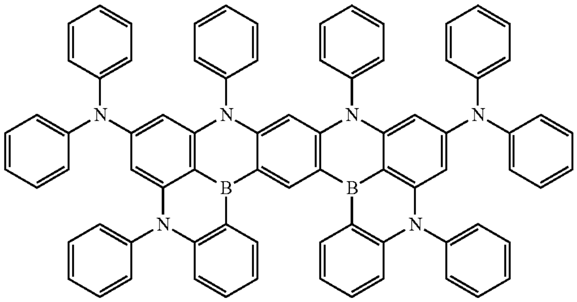
DFD2
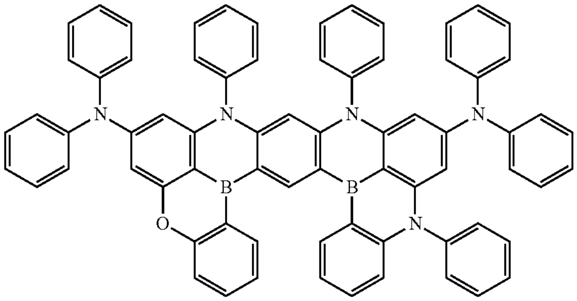
DFD3
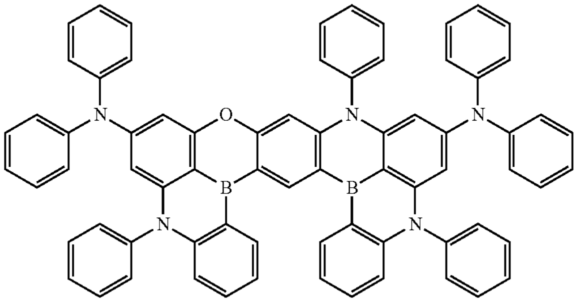
DFD4
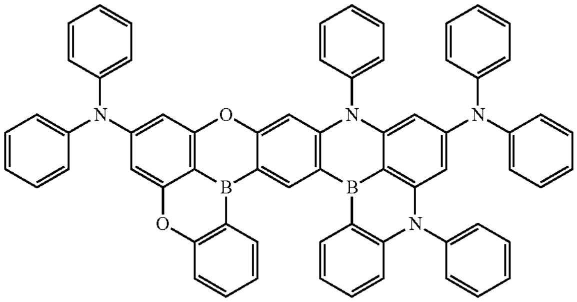

-continued
DFD5
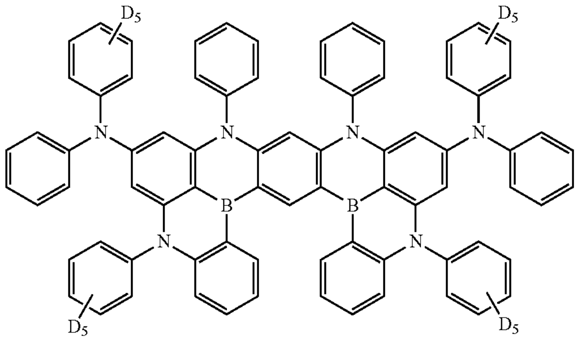
DFD6
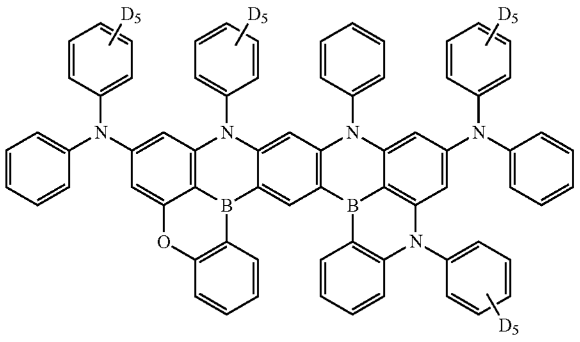
DFD7
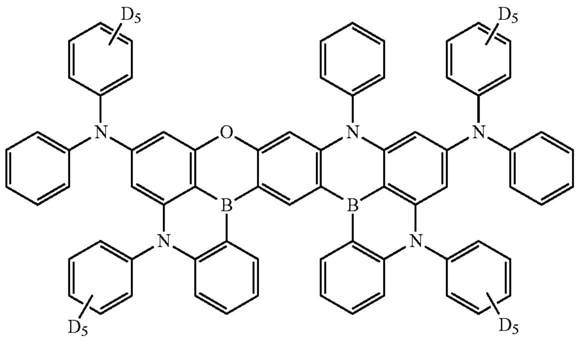
DFD8
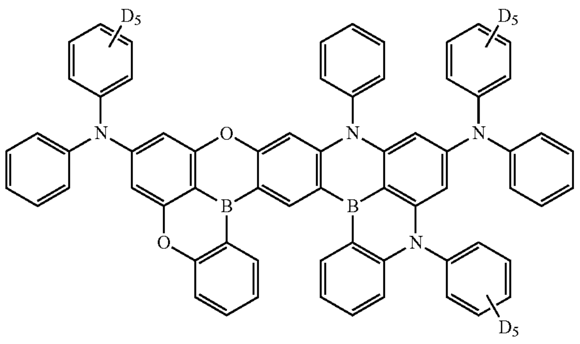
-continued
DFD9
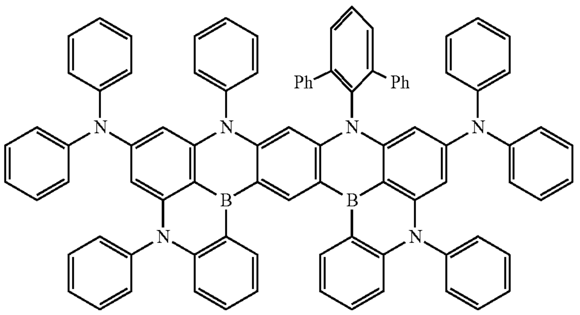
DFD10
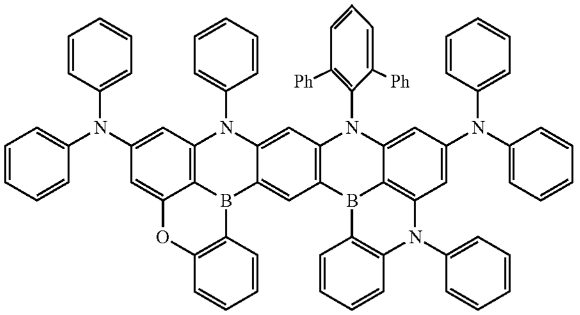
DFD11
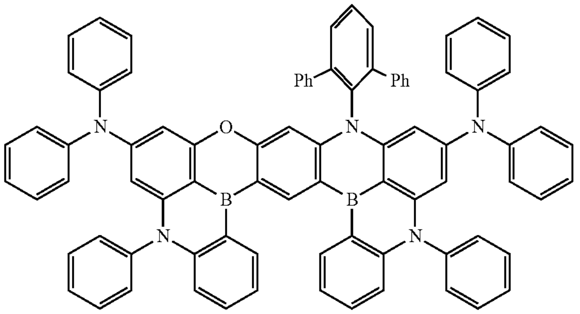
DFD12
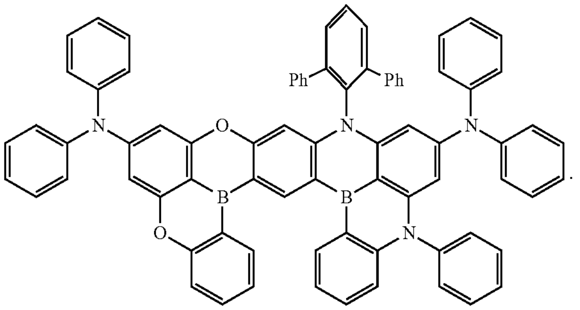
In the compound described above, Ph represents a phenyl group, D5 represents substitution with five deuterium, and D4 represents substitution with four deuterium. In one or more embodiments, a group represented by

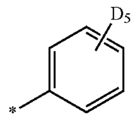

is identical to a group represented by

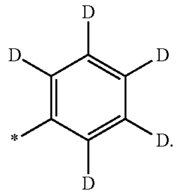

In one or more embodiments, the light-emitting device may satisfy at least one of Condition 1 to Condition 4:

LUMO energy level (eV) of the third compound>LUMO energy level (eV) of the first compound    Condition 1

LUMO energy level (eV) of the first compound>LUMO energy level (eV) of the second compound    Condition 2

HOMO energy level (eV) of the first compound>HOMO energy level (eV) of the third compound    Condition 3

HOMO energy level (eV) of the third compound>HOMO energy level (eV) of the second compound    Condition 4

Each of the HOMO energy level and LUMO energy level of each of the first compound, the second compound, and the third compound may be a negative value, and may be measured according to a suitable method.

In one or more embodiments, an absolute value of a difference between the LUMO energy level of the first compound and the LUMO energy level of the second compound may be about 0.1 eV or more and about 1.0 eV or less, an absolute value of a difference between the LUMO energy level of the first compound and the LUMO energy level of the third compound may be about 0.1 eV or more and about 1.0 eV or less, an absolute value of a difference between the HOMO energy level of the first compound and the HOMO energy level of the second compound may be about 1.25 eV or less (for example, about 1.25 eV or less and about 0.2 eV or more), and an absolute value of a difference between the HOMO energy level of the first compound and the HOMO energy level of the third compound may be about 1.25 eV or less (for example, about 1.25 eV or less and about 0.2 eV or more).

When the relationships between LUMO energy level and HOMO energy level satisfy the conditions as described above, a suitable balance between holes and electrons injected into the emission layer can be achieved.

The light-emitting device may have a structure of a first embodiment or a second embodiment described hereinbelow.

Description of First Embodiment

In the first embodiment, the emission layer in the interlayer of the light-emitting device may include the first compound, the emission layer may further include a host, the first compound may be different from the host, and the emission layer may emit phosphorescent light or fluorescent light emitted from the first compound. For example, in the first embodiment, the first compound may be a dopant or an emitter. In one or more embodiments, the first compound may be a phosphorescent dopant or a phosphorescent emitter.

The phosphorescent light or fluorescent light emitted from the first compound may be blue light.

The emission layer may further include an auxiliary dopant. The auxiliary dopant may serve to improve luminescence efficiency from the first compound by effectively (or suitably) transferring energy to the first compound which is a dopant or an emitter.

The auxiliary dopant may be different from each of the first compound and the host.

In one or more embodiments, the auxiliary dopant may be a delayed fluorescence emitting compound.

In one or more embodiments, the auxiliary dopant may be a compound including at least one cyclic group including boron (B) and nitrogen (N) as ring-forming atoms.

Description of Second Embodiment

In the second embodiment, the emission layer in the interlayer of the light-emitting device may include the first compound, the emission layer may further include a host and a dopant, the first compound may be different from each of the host and the dopant, and the emission layer may emit phosphorescent light or fluorescent light (for example, delayed fluorescent light) emitted from the dopant.

In one or more embodiments, the first compound of the second embodiment may not be a dopant, and may serve as an auxiliary dopant which transfers energy to a dopant (or an emitter).

In one or more embodiments, the first compound of the second embodiment may serve as an emitter, and may also serve as an auxiliary dopant which transfers energy to a dopant (or an emitter).

In one or more embodiments, the phosphorescent light or fluorescent light emitted from the dopant (or, an emitter) of the second embodiment may be blue phosphorescent light or blue fluorescent light (for example, blue delayed fluorescent light).

The dopant (or an emitter) of the second embodiment may be a phosphorescent dopant material (for example, in the present specification, an organometallic compound represented by Formula 1, an organometallic compound represented by Formula 401, or any combination thereof) or a fluorescent dopant material (for example, in the present specification, a compound represented by Formula 501, a compound represented by Formula 502, a compound represented by Formula 503, or any combination thereof).

The blue light of the first embodiment and the second embodiment may be blue light having a maximum emission wavelength of about 430 nm to about 480 nm, about 430 nm to about 475 nm, about 440 nm to about 475 nm, or about 455 nm to about 470 nm.

The auxiliary dopant of the first embodiment may include, for example, the fourth compound represented by Formula 502 or 503 in the present specification.

The host of the first embodiment and the second embodiment may be a host material (for example, in the present specification, a compound represented by Formula 301, a compound represented by Formula 301-1, a compound represented by Formula 301-2, or any combination thereof).

In one or more embodiments, the host of the first embodiment and the second embodiment may be the second compound or the third compound described in the present specification, or any combination thereof.

In one or more embodiments, the light-emitting device may further include at least one of a first capping layer located outside the first electrode and a second capping layer located outside the second electrode, and the organometallic compound represented by Formula 1 may be included in at least one of the first capping layer and the second capping layer. The first capping layer and the second capping layer are the same as described in the present specification.

In one or more embodiments, the light-emitting device may include:

a first capping layer located outside the first electrode and including the organometallic compound represented by Formula 1;

a second capping layer located outside the second electrode and including the organometallic compound represented by Formula 1; or the first capping layer and the second capping layer.

The wording "(interlayer and/or capping layer) includes the organometallic compound represented by Formula 1" as used herein may be understood as "(interlayer and/or capping layer) may include one kind of organometallic compound represented by Formula 1 or two different kinds of organometallic compounds, each represented by Formula 1."

In one or more embodiments, the interlayer and/or capping layer may include Compound 1 only as the organometallic compound. In this regard, Compound 1 may exist (e.g., may be included) in the emission layer of the light-emitting device. In one or more embodiments, the interlayer may include, as the organometallic compound, Compound 1 and Compound 2. In this regard, Compound 1 and Compound 2 may exist (e.g., may be included) in an identical (e.g., in the same) layer (for example, Compound 1 and Compound 2 may all exist in an emission layer), or different layers (for example, Compound 1 may exist in an emission layer and Compound 2 may exist in an electron transport region).

The term "interlayer" as used herein refers to a single layer and/or all of a plurality of layers located between the first electrode and the second electrode of the light-emitting device.

According to one or more embodiments, provided is an electronic apparatus including the light-emitting device. The electronic apparatus may further include a thin-film transistor. In one or more embodiments, the electronic apparatus may further include a thin-film transistor including a source electrode and a drain electrode, and the first electrode of the light-emitting device may be electrically connected (e.g., electrically coupled) to the source electrode or the drain electrode. In one or more embodiments, the electronic apparatus may further include a color filter, a color conversion layer, a touch screen layer, a polarizing layer, or any combination thereof. More details on the electronic apparatus are as described in the present specification.

Description of FIG. 1

FIG. 1 is a schematic cross-sectional view of a light-emitting device 10 according to one or more embodiments of the disclosure. The light-emitting device 10 includes a first electrode 110, an interlayer 130, and a second electrode 150.

Hereinafter, a structure of the light-emitting device 10 according to one or more embodiments and a method of manufacturing the light-emitting device 10 will be described in connection with FIG. 1.

First Electrode 110

In FIG. 1, a substrate may be additionally located under the first electrode 110 or above the second electrode 150. As the substrate, a glass substrate and/or a plastic substrate may be used. In one or more embodiments, the substrate may be a flexible substrate, and may include plastics with excellent (or suitable) heat resistance and durability, such as polyimide, polyethylene terephthalate (PET), polycarbonate, polyethylene napthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high work function material that facilitates injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In one or more embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be used as a material for forming the first electrode.

The first electrode 110 may have a single-layered structure including (e.g., consisting of) a single layer or a multilayer structure including a plurality of layers. In one or more embodiments, the first electrode 110 may have a three-layered structure of ITO/Ag/ITO.

Interlayer 130

The interlayer 130 may be located on the first electrode 110. The interlayer 130 may include an emission layer.

The interlayer 130 may further include a hole transport region between the first electrode 110 and the emission layer, and an electron transport region between the emission layer and the second electrode 150.

The interlayer 130 may further include metal-containing compounds such as organometallic compounds, inorganic materials such as quantum dots, and/or the like, in addition to various organic materials.

In one or more embodiments, the interlayer 130 may include, i) two or more emitting units sequentially stacked between the first electrode 110 and the second electrode 150 and ii) a charge generation layer located between the two adjacent emitting units. When the interlayer 130 includes the emitting units and the charge generation layer as described above, the light-emitting device 10 may be a tandem light-emitting device.

Hole Transport Region in Interlayer 130

The hole transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron-blocking layer structure, wherein, in each structure, layers are stacked sequentially from the first electrode 110.

The hole transport region may include a compound represented by Formula 201, a compound represented by Formula 202, or any combination thereof:

Formula 201

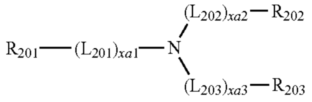

Formula 202

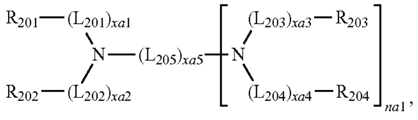

wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, and/or a $C_2$-$C_5$ alkenylene group unsubstituted or substituted with at least one $R_{10a}$, to form a $C_8$-$C_{60}$ polycyclic group (for example, a carbazole group and/or the like) unsubstituted or substituted with at least one $R_{10a}$ (for example, Compound HT16), $R_{203}$ and $R_{204}$ may optionally be linked via a single bond, a $C_1$-$C_5$ alkylene group unsubstituted or substituted with at least one $R_{10a}$, and/or a $C_2$-$C_5$ alkenylene group unsubstituted or substituted with at least one $R_{10a}$ to form a $C_8$-$C_{60}$ polycyclic group unsubstituted or substituted with at least one $R_{10a}$, and na1 may be an integer from 1 to 4.

In one or more embodiments, each of Formulae 201 and 202 may include at least one of groups represented by Formulae CY201 to CY217:

CY201

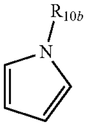

CY202

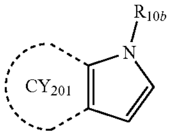

CY203

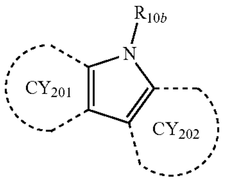

CY204

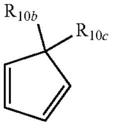

CY205

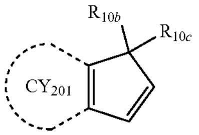

CY206

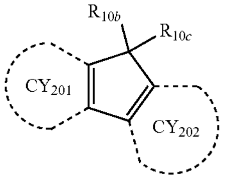

CY206

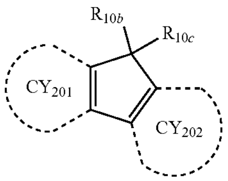

CY207

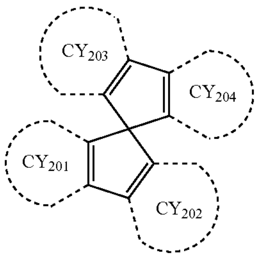

-continued

CY208

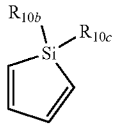

CY209

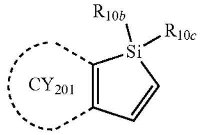

CY210

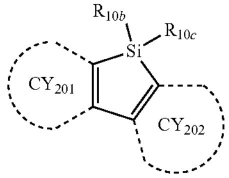

CY211

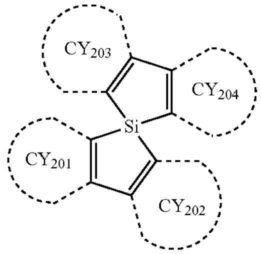

CY212

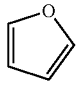

CY213

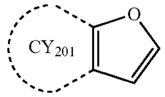

CY214

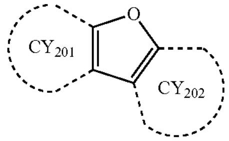

CY215

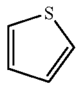

CY216

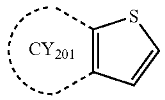

-continued

CY217

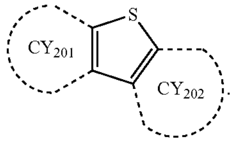

In Formulae CY201 to CY217, $R_{10b}$ and $R_{10c}$ are each the same as described in connection with $R_{10a}$ in the present specification, ring CY201 to ring CY204 may each independently be a $C_3$-$C_{20}$ carbocyclic group or a $C_1$-$C_{20}$ heterocyclic group, and at least one hydrogen in Formulae CY201 to CY217 may be unsubstituted or substituted with at least one $R_{10a}$ as described in the present specification.

In one or more embodiments, ring CY201 to ring CY204 in Formulae CY201 to CY217 may each independently be a benzene group, a naphthalene group, a phenanthrene group, or an anthracene group.

In one or more embodiments, each of Formulae 201 and 202 may include at least one of groups represented by Formulae CY201 to CY203.

In one or more embodiments, Formula 201 may include at least one of groups represented by Formulae CY201 to CY203 and at least one of groups represented by Formulae CY204 to CY217.

In one or more embodiments, xa1 in Formula 201 may be 1, $R_{201}$ may be a group represented by one of Formulae CY201 to CY203, xa2 may be 0, and $R_{202}$ may be a group represented by one of Formulae CY204 to CY207.

In one or more embodiments, each of Formulae 201 and 202 may not include groups represented by Formulae CY201 to CY203.

In one or more embodiments, each of Formulae 201 and 202 may not include groups represented by Formulae CY201 to CY203, and may include at least one of groups represented by Formulae CY204 to CY217.

In one or more embodiments, each of Formulae 201 and 202 may not include groups represented by Formulae CY201 to CY217.

In one or more embodiments, the hole transport region may include one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1
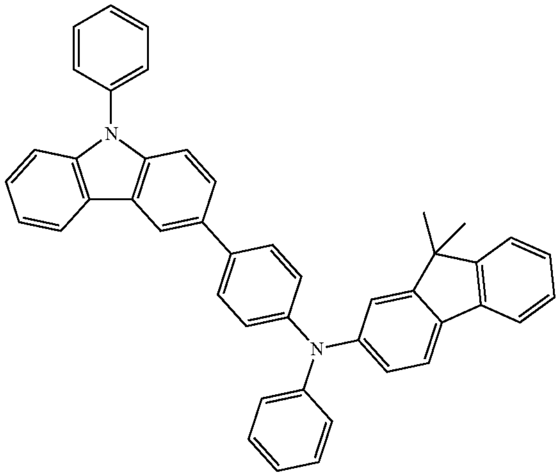
HT2
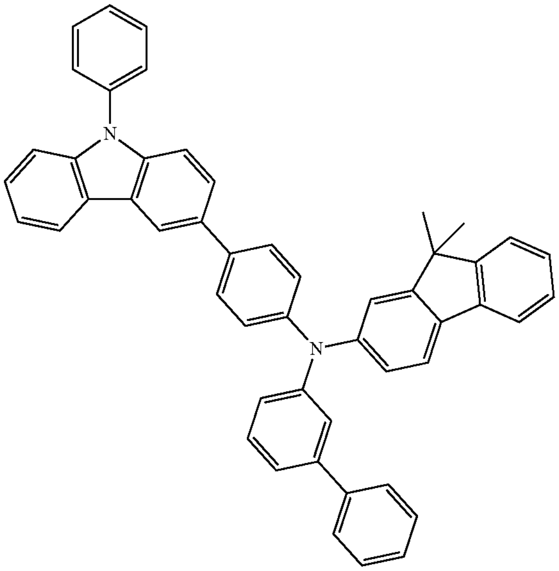
HT3
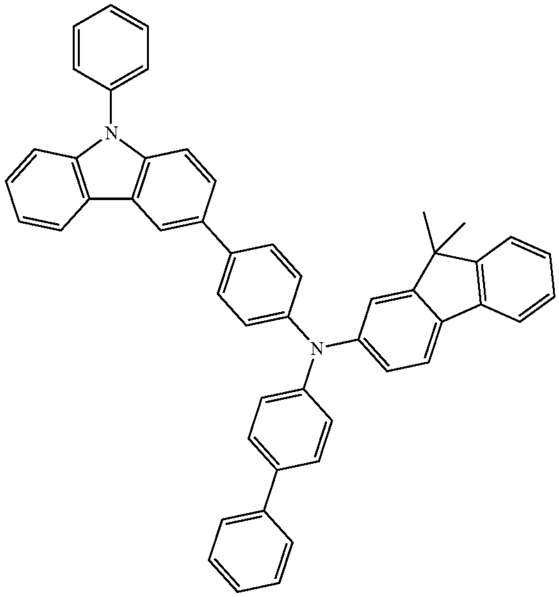
HT4
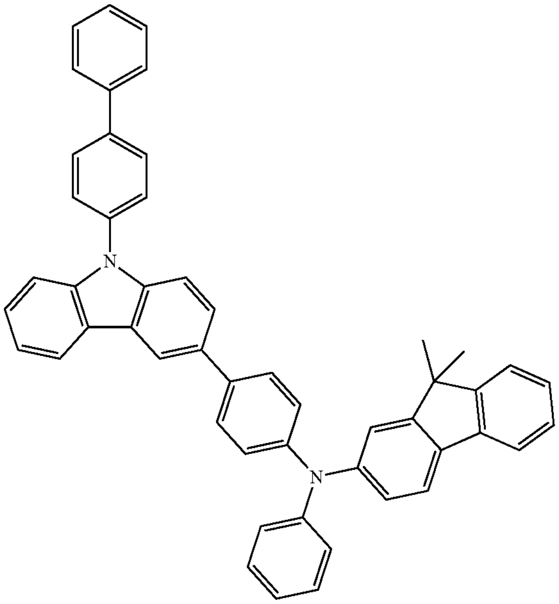

-continued
HT5
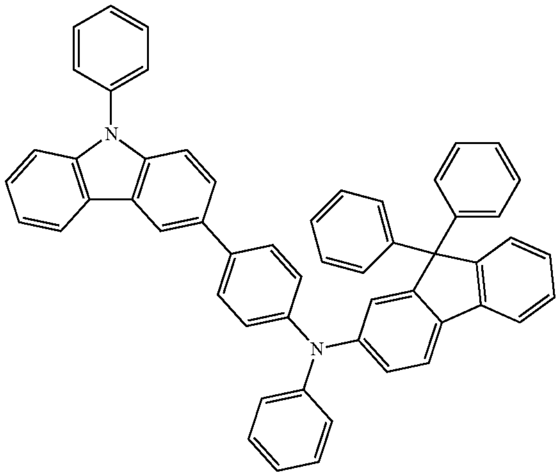
HT6
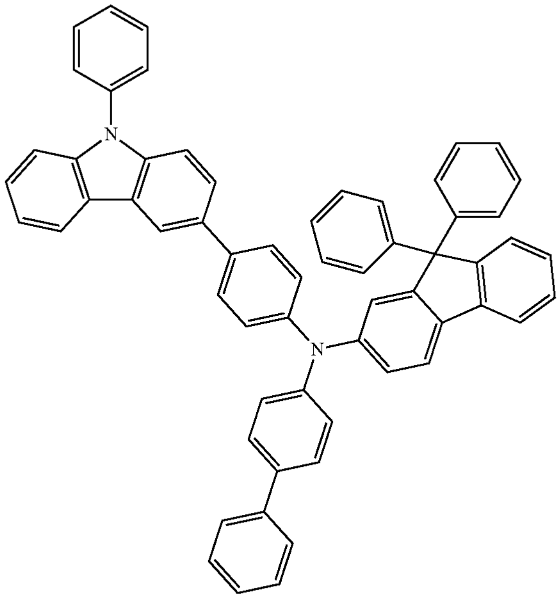
HT7
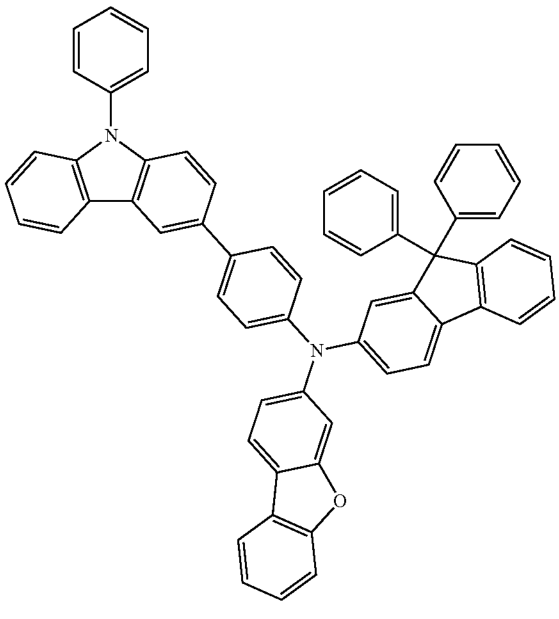
HT8
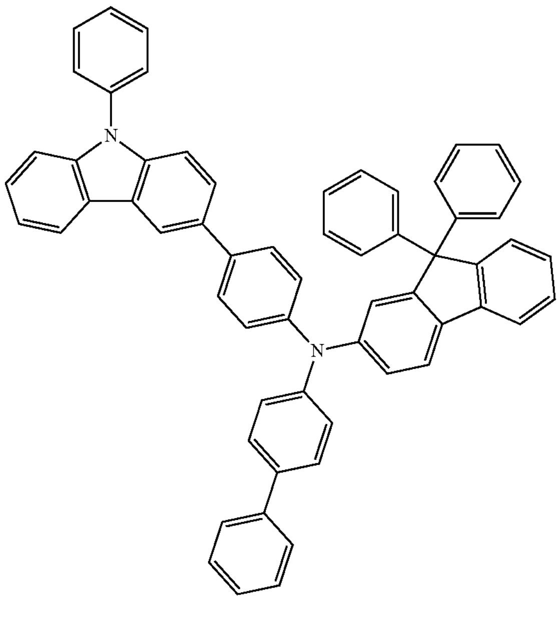

-continued
HT9
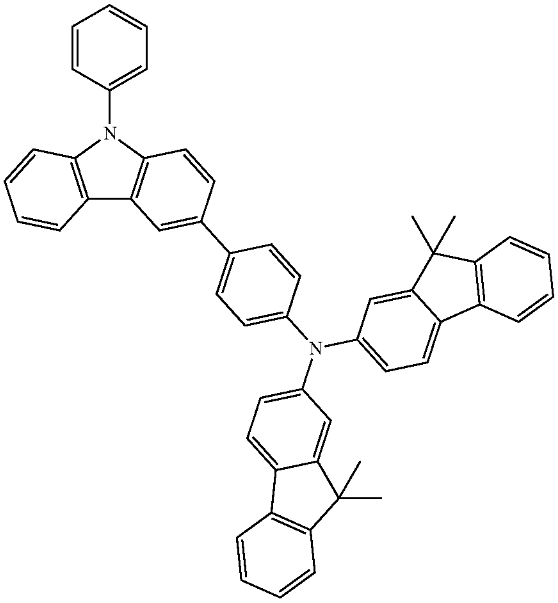
HT10
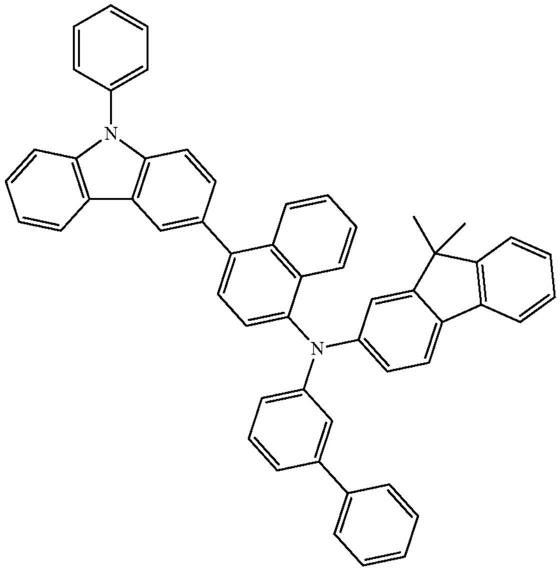
HT11
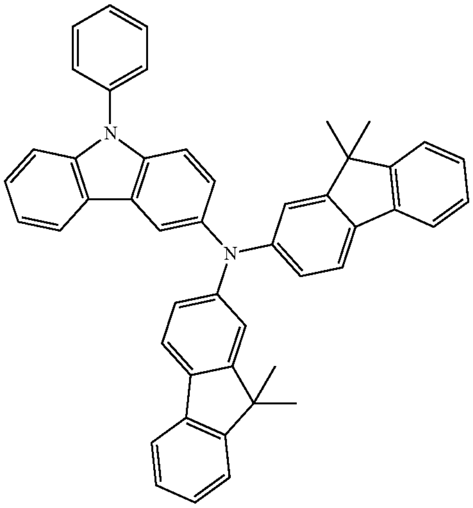
HT12
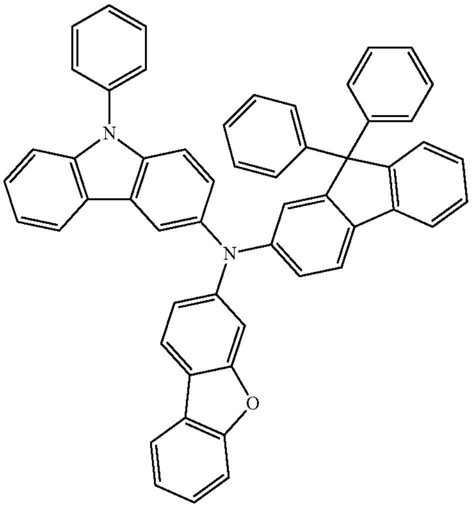

-continued
HT13
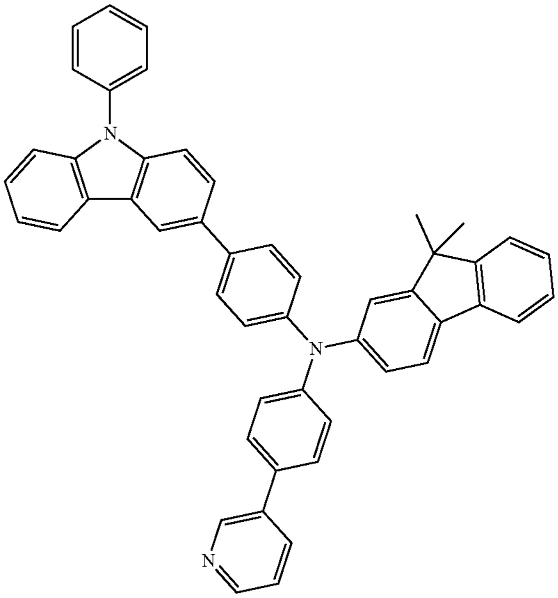
HT14
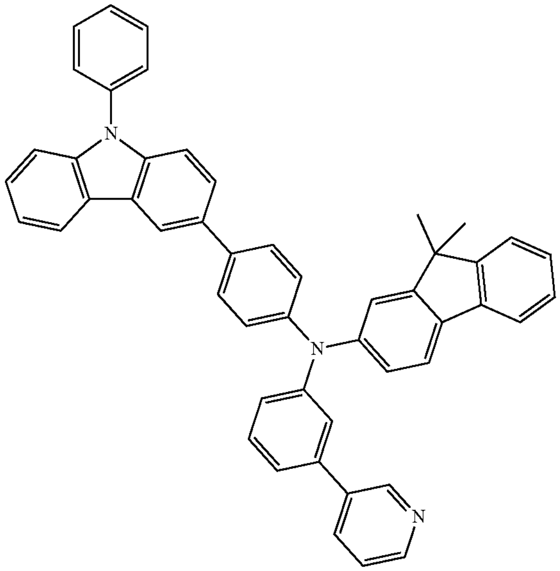
HT15
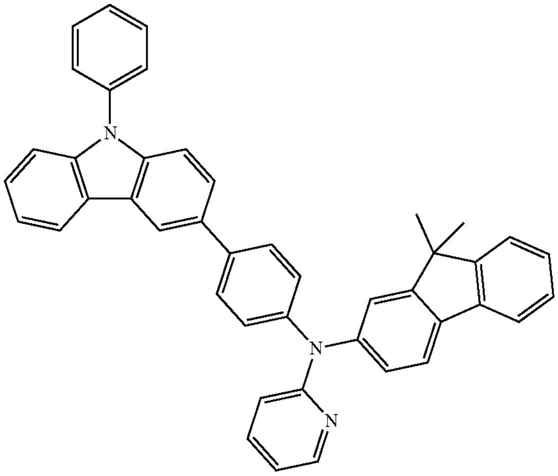
HT16
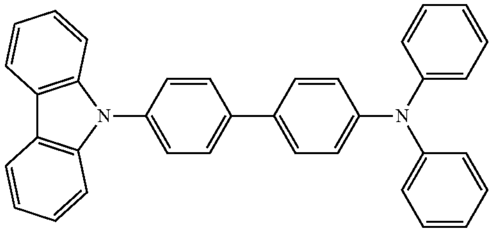
HT17
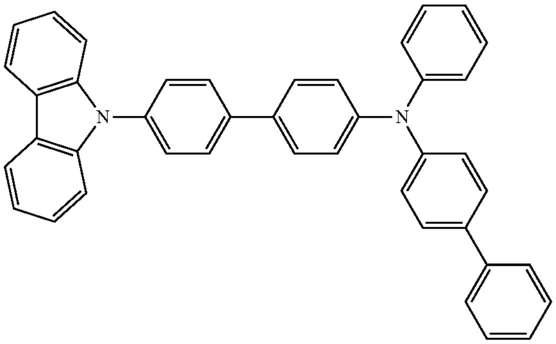
HT18
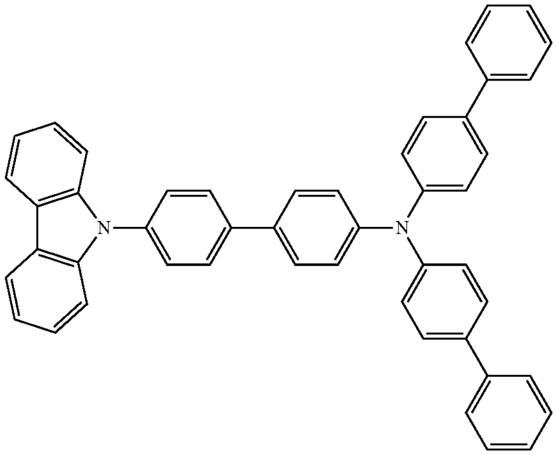

-continued
HT19
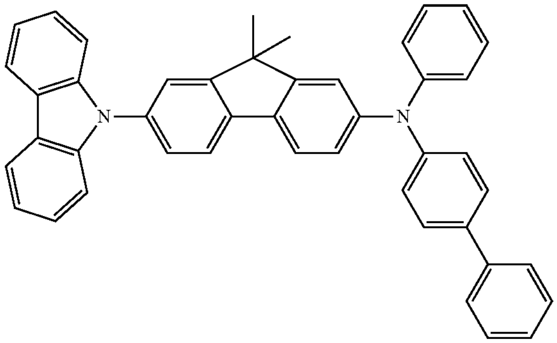
HT20
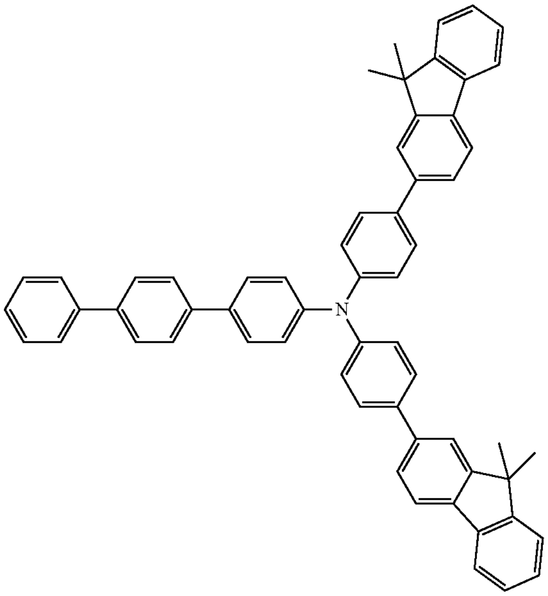
HT21
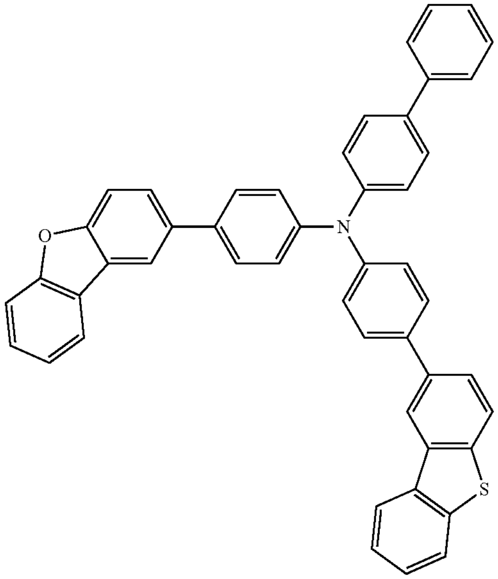
HT22
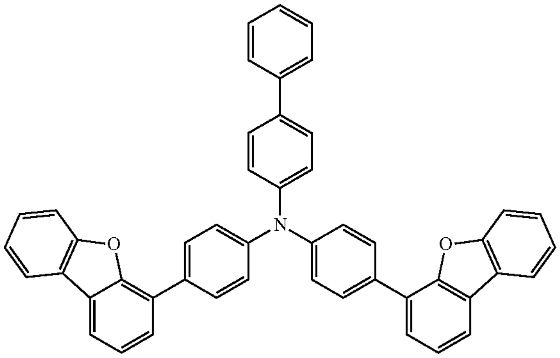

-continued
HT23
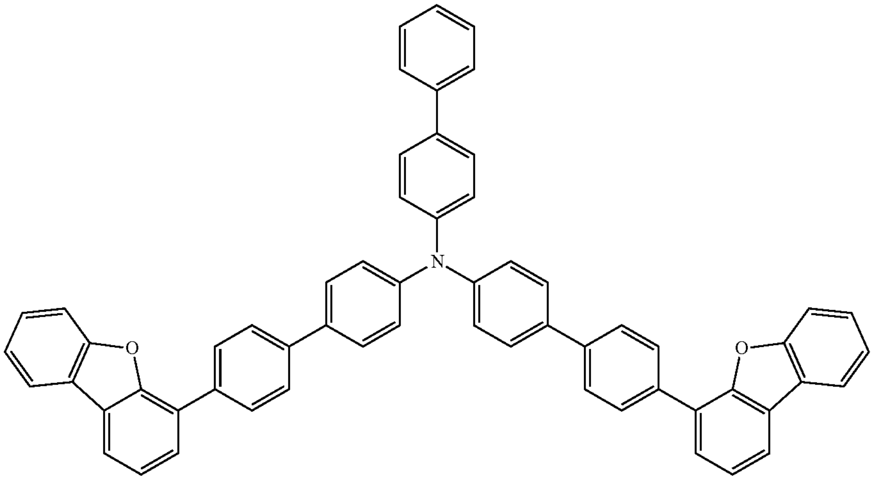
HT24
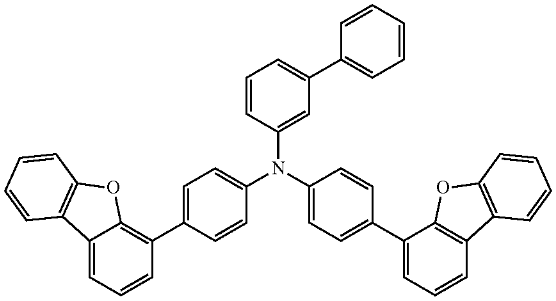
HT25
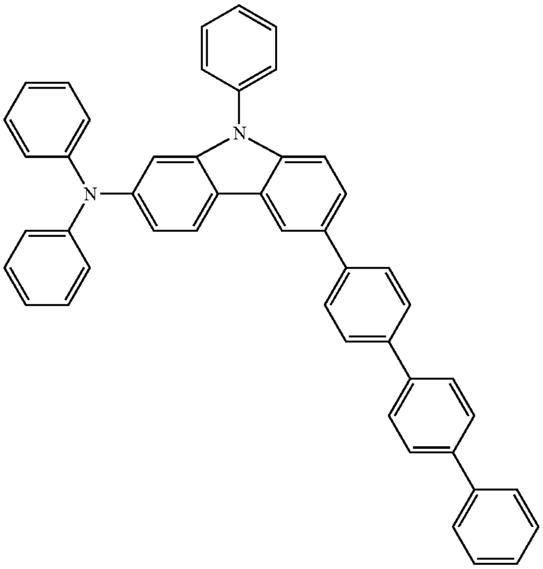
HT26
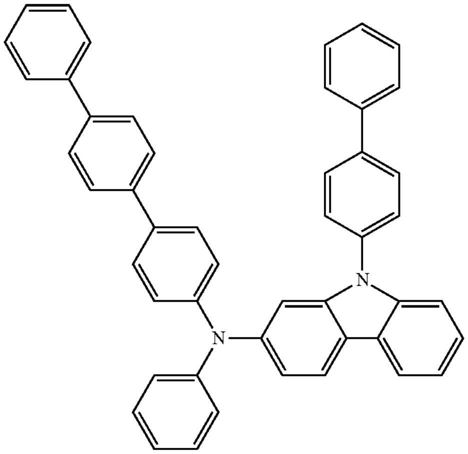
HT27
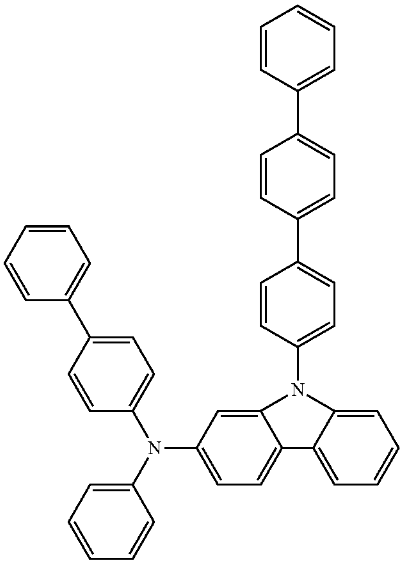

-continued
HT28
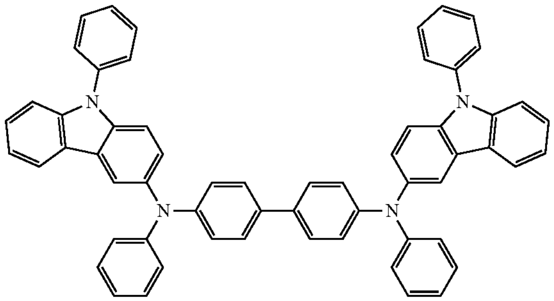
HT29
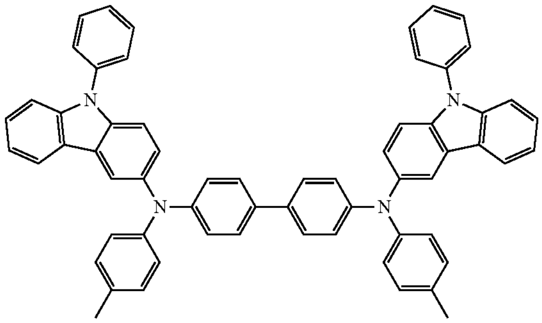
HT30
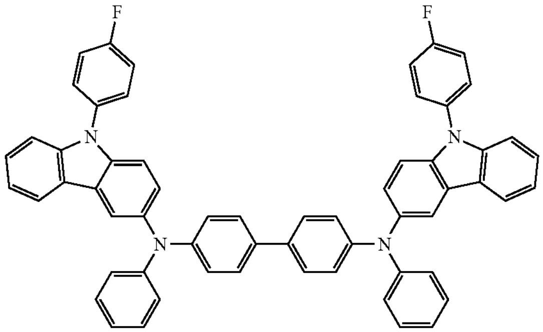
HT31
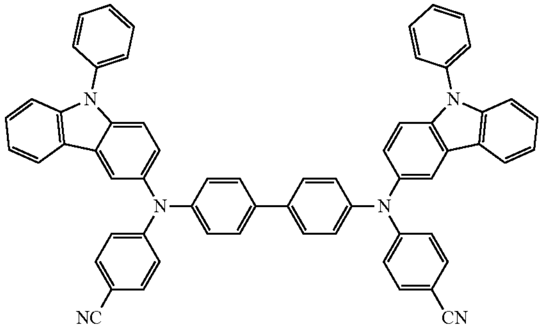
HT32
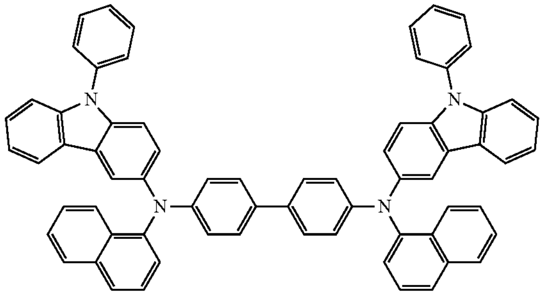
HT33
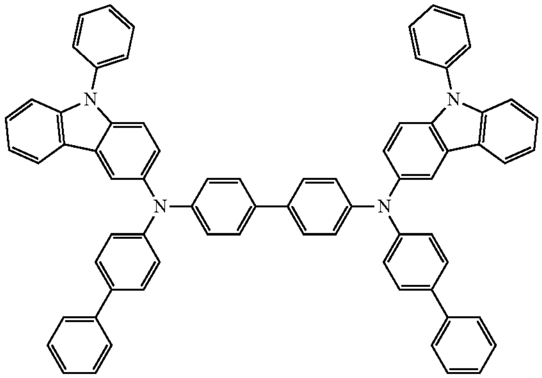
HT34
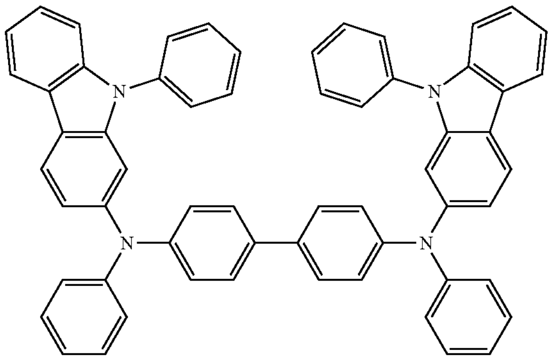
HT35
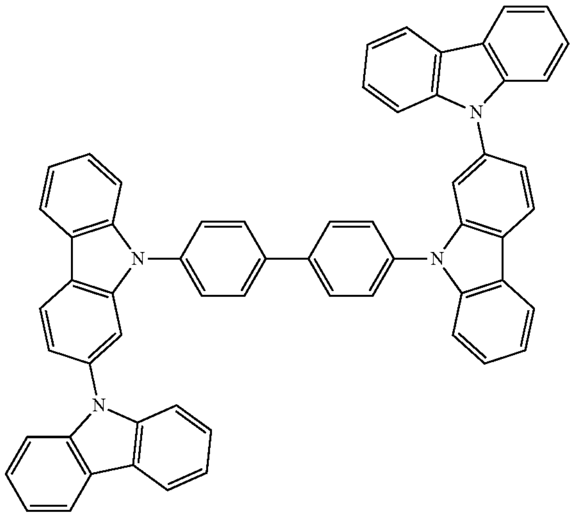

-continued
HT36
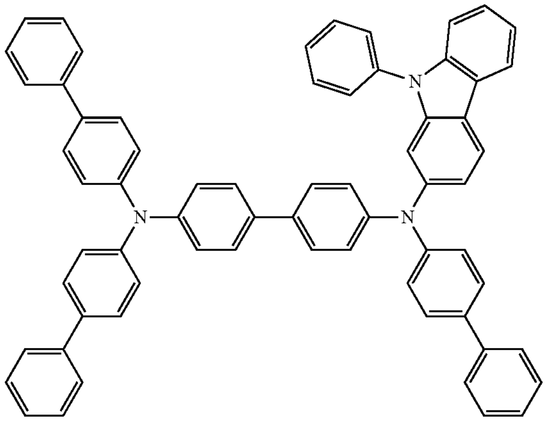
HT37
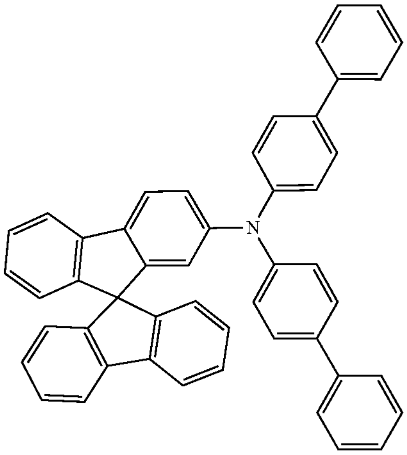
HT38
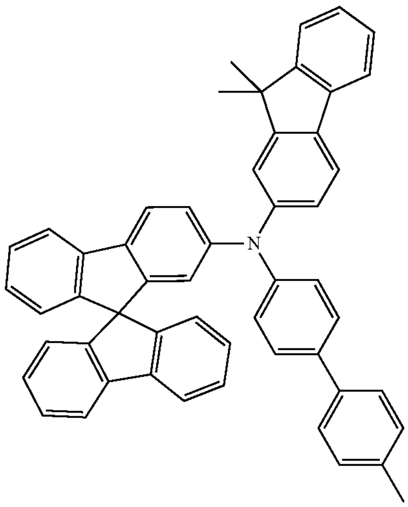
HT39
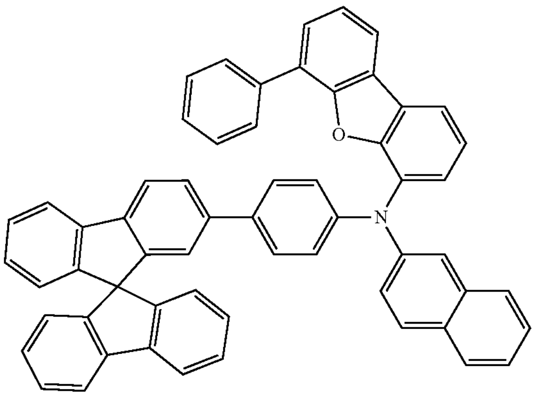
HT40
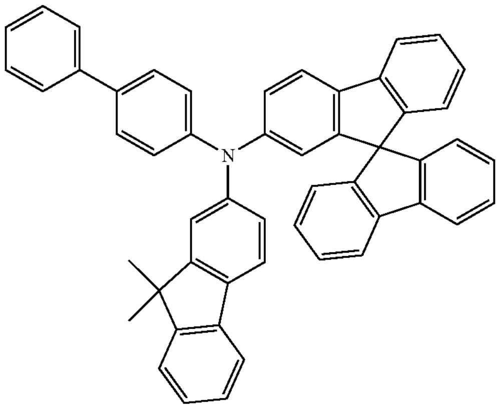
HT41
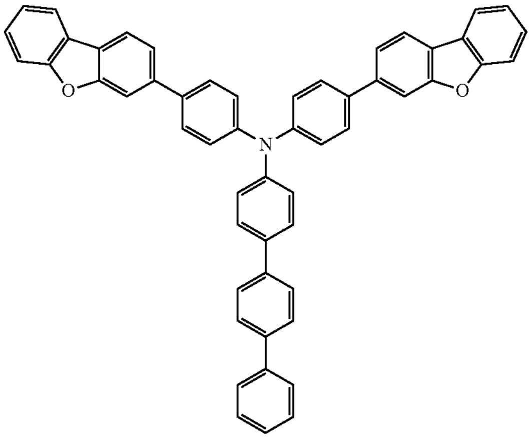

-continued
HT42
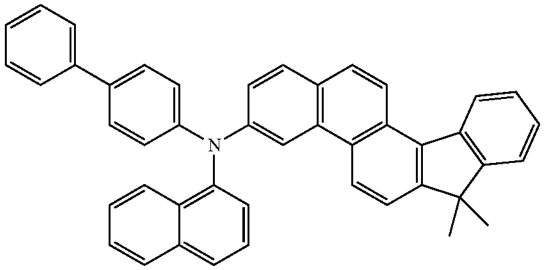
HT43
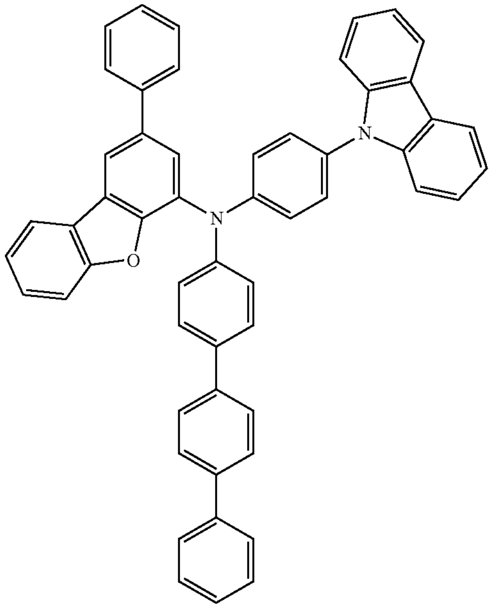
HT44
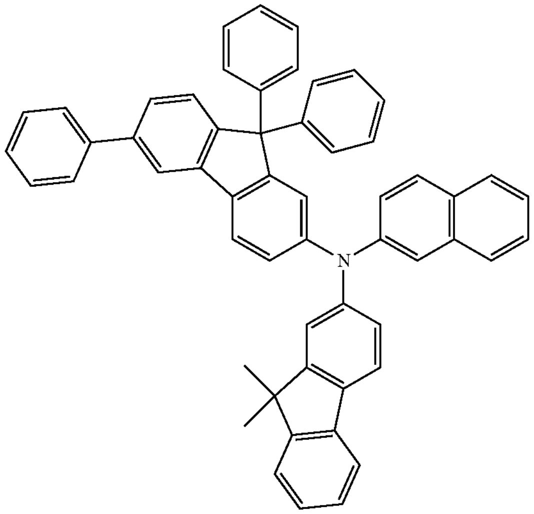
HT45
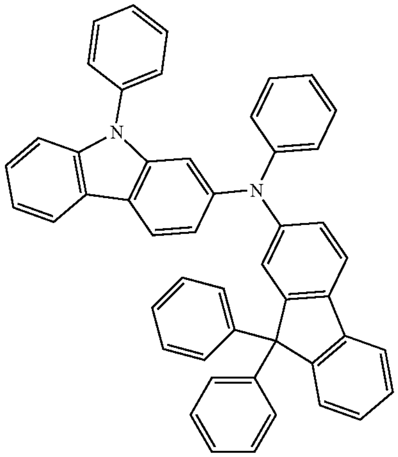
HT46
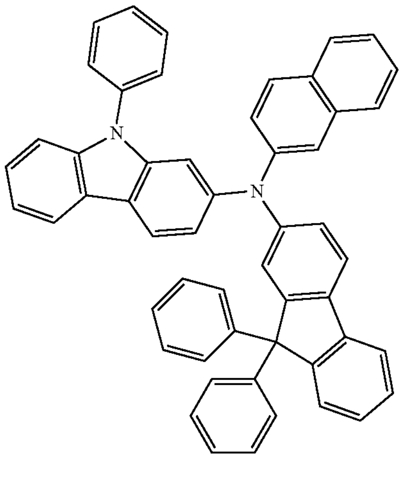

-continued
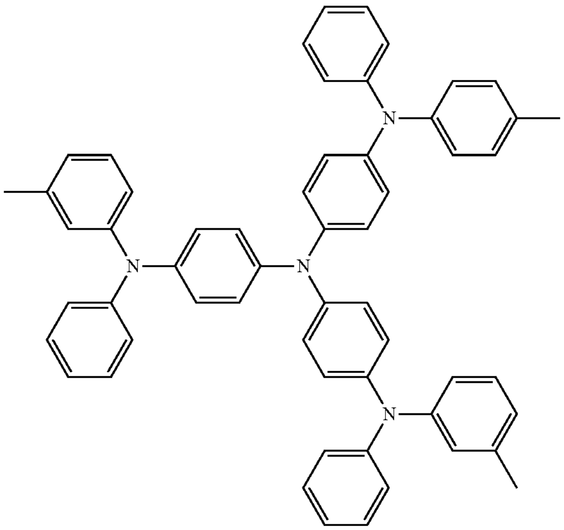
m-MTDATA
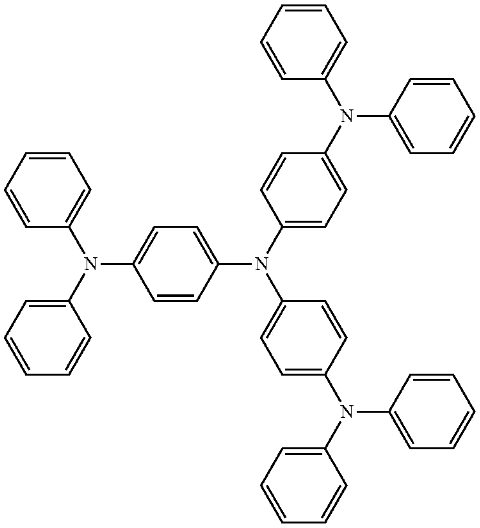
TDATA
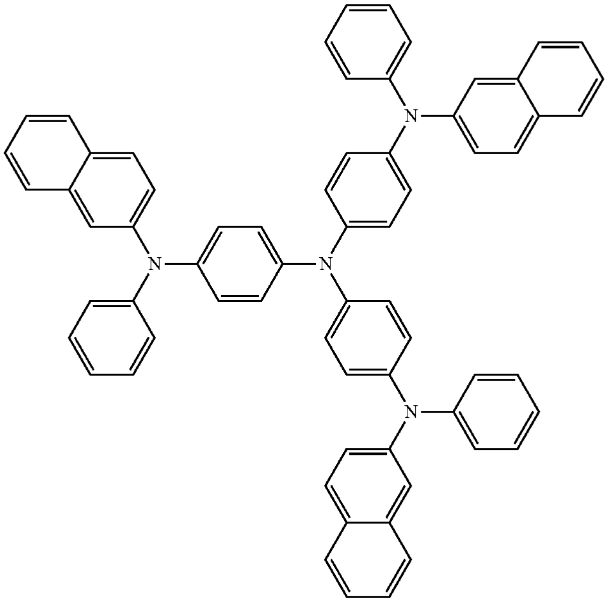
2-TNATA
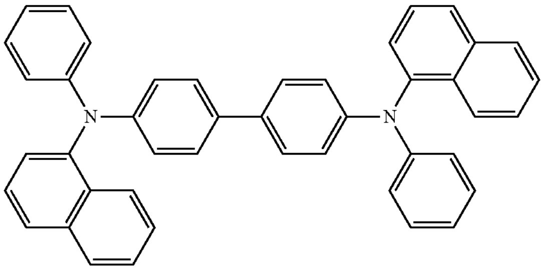
NPB -continued
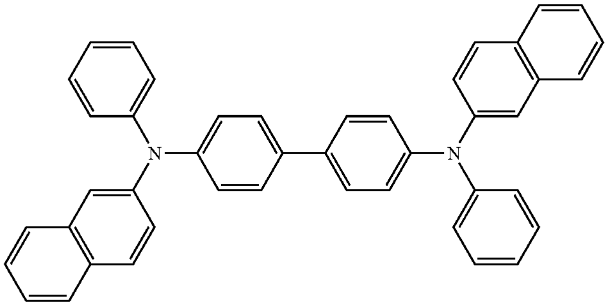
β-NPB
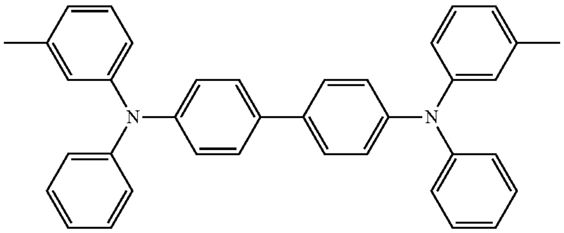
TPD
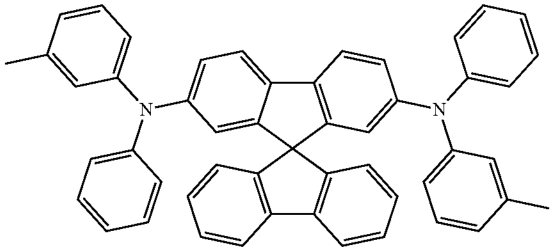
Spiro-TPD
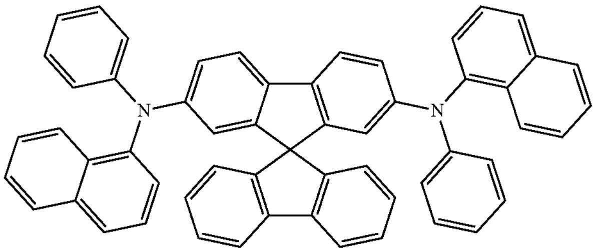
Spiro-NPB
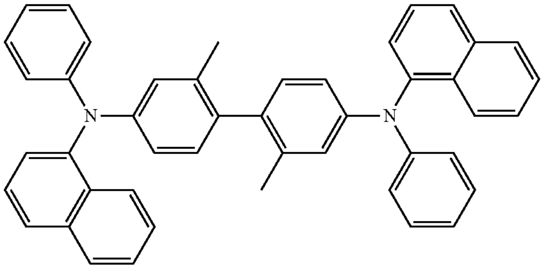
methylated-NPB
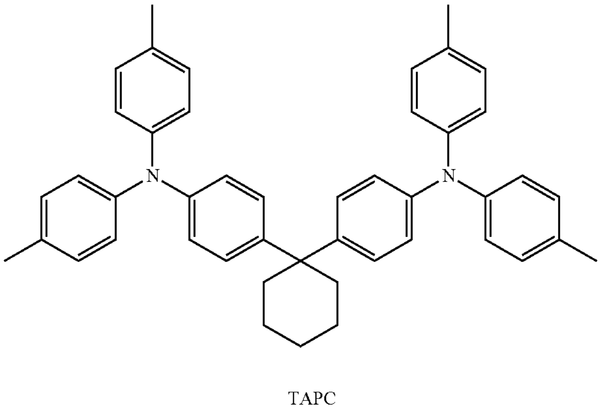
TAPC -continued

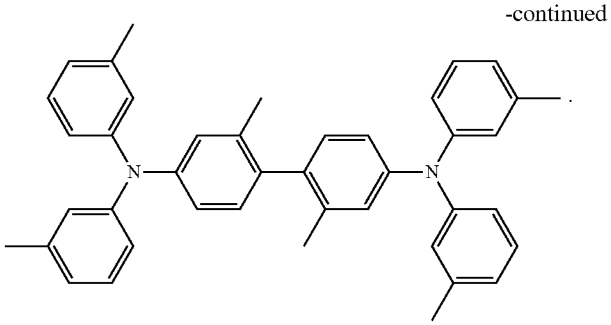

HMTPD

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer and the hole transport layer are each independently within their respective ranges, satisfactory (or suitable) hole-transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block or reduce the leakage of electrons from an emission layer to a hole transport region. Materials that may be included in the hole transport region may be included in the emission auxiliary layer and/or the electron blocking layer.

p-Dopant

The hole transport region may further include, in addition to the materials described above, a charge-generation material for the improvement of conductive properties. The charge-generation material may be uniformly or non-uniformly dispersed in the hole transport region (for example, in the form of a single layer including (e.g., consisting of) a charge-generation material).

The charge-generation material may be, for example, a p-dopant.

In one or more embodiments, a LUMO energy level of the p-dopant may be about −3.5 eV or less.

In one or more embodiments, the p-dopant may include a quinone derivative, a cyano group-containing compound, a compound containing element EL1 and element EL2, or any combination thereof.

Examples of the quinone derivative may include TCNQ, F4-TCNQ, and the like.

Examples of the cyano group-containing compound may include HAT-CN, a compound represented by Formula 221 below, and the like.

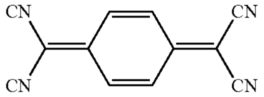

TCNQ

-continued

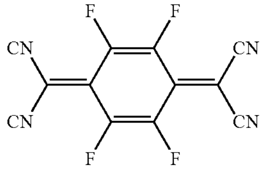

F4-TCNQ

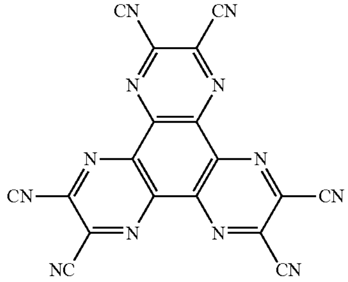

HAT-CN

Formula 221

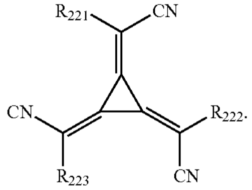

In Formula 221, $R_{221}$ to $R_{223}$ may each independently be a $C_3$-$C_{60}$ carbocyclic group unsubstituted or substituted with at least one $R_{10a}$ or a $C_1$-$C_6$ heterocyclic group unsubstituted or substituted with at least one $R_{10a}$, at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be metal, metalloid, or a combination thereof, and element EL2 may be non-metal, metalloid, or a combination thereof.

Examples of the metal may include: an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and tellurium (Te).

Examples of the non-metal may include oxygen (O) and halogen (for example, F, Cl, Br, I, etc.).

In one or more embodiments, examples of the compound containing element EL1 and element EL2 may include metal oxide, metal halide (for example, metal fluoride, metal chloride, metal bromide, and/or metal iodide), metalloid halide (for example, metalloid fluoride, metalloid chloride, metalloid bromide, and/or metalloid iodide), metal telluride, or any combination thereof.

Examples of the metal oxide may include tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and rhenium oxide (for example, $ReO_3$, etc.).

Examples of the metal halide may include alkali metal halide, alkaline earth metal halide, transition metal halide, post-transition metal halide, and lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $Hfl_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $CoCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, CuF, CuCl, CuBr, CuI, etc.), silver halide (for example, AgF, AgCl, AgBr, AgI, etc.), and gold halide (for example, AuF, AuCl, AuBr, AuI, etc.).

Examples of the post-transition metal halide may include zinc halide (for example, $ZnF_2$, $ZnCl_2$, $ZnBr_2$, $ZnI_2$, etc.), indium halide (for example, $InI_3$, etc.), and tin halide (for example, $SnI_2$, etc.).

Examples of the lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$, $SmBr_3$, YbI, $YbI_2$, $YbI_3$, and $SmI_3$.

Examples of the metalloid halide may include antimony halide (for example, $SbCl_5$, etc.).

Examples of the metal telluride may include alkali metal telluride (for example, $Li_2Te$, $Na_2Te$, $K_2Te$, $Rb_2Te$, $Cs_2Te$, etc.), alkaline earth metal telluride (for example, BeTe, MgTe, CaTe, SrTe, BaTe, etc.), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), post-transition metal telluride (for example, ZnTe, etc.), and lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer in Interlayer 130

When the light-emitting device 10 is a full-color light-emitting device, the emission layer may be patterned into a red emission layer, a green emission layer, and/or a blue emission layer, according to a sub-pixel. In one or more embodiments, the emission layer may have a stacked structure of two or more layers of a red emission layer, a green emission layer, and a blue emission layer, in which the two or more layers contact each other or are separated from each other. In one or more embodiments, the emission layer may include two or more materials of a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or any combination thereof.

An amount of the dopant in the emission layer may be from about 0.01 parts by weight to about 15 parts by weight based on 100 parts by weight of the host.

In one or more embodiments, the emission layer may include a quantum dot.

In one or more embodiments, the emission layer may include a delayed fluorescence material. The delayed fluorescence material may act as a host or a dopant in the emission layer.

A thickness of the emission layer may be in a range of about 100 Å to about 1,000 Å, for example, about 200 Å to about 600 Å. When the thickness of the emission layer is within any of these ranges, excellent (or improved) light-emission characteristics may be obtained without a substantial increase in driving voltage.

Host

The host in the emission layer may include the second compound or the third compound described in the present specification, or any combination thereof.

In one or more embodiments, the host may include a compound represented by Formula 301 below:

$$[Ar_{301}]_{xb11}-[(L_{301})_{xb1}-R_{301}]_{xb21}, \quad \text{Formula 301}$$

wherein, in Formula 301, $Ar_{301}$ and $L_{301}$ may each independently be a $C_3$-$C_{60}$ carbocyclic group unsubstituted or substituted with at least one $R_{10a}$ or a $C_1$-$C_6$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(═O)($Q_{301}$), —S(═O)$_2$($Q_{301}$), or —P(═O)($Q_{301}$)($Q_{302}$), xb21 may be an integer from 1 to 5, and $Q_{301}$ to $Q_{303}$ are the same as described in connection with $Q_1$.

In one or more embodiments, when xb11 in Formula 301 is 2 or more, two or more of $Ar_{301}$(s) may be linked to each other via a single bond.

In one or more embodiments, the host may include a compound represented by Formula 301-1, a compound represented by Formula 301-2, or any combination thereof:

Formula 301-1

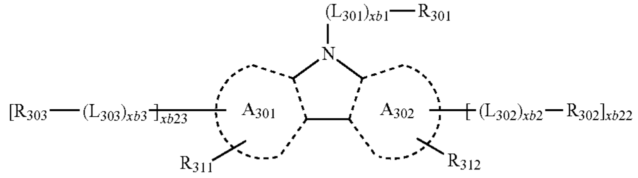

Formula 301-2

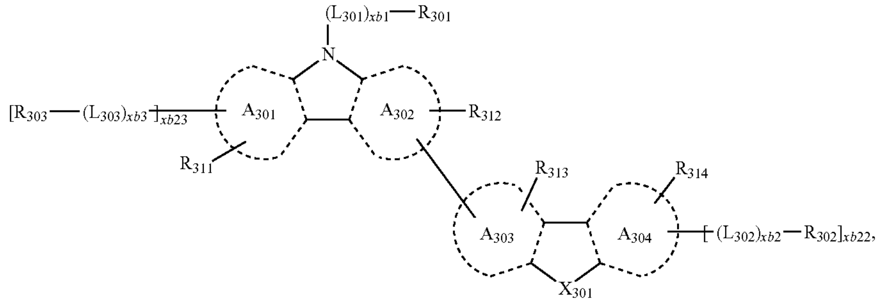

wherein, in Formulae 301-1 and 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[($L_{304}$)$_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ are the same as described in the present specification, $L_{302}$ to $L_{304}$ are each independently the same as described in connection with $L_{301}$, xb2 to xb4 are each independently the same as described in connection with xb1, and $R_{302}$ to $R_{305}$ and $R_{311}$ to $R_{314}$ are the same as described in connection with $R_{301}$.

In one or more embodiments, the host may include an alkali earth metal complex, a post-transition metal complex, or a combination thereof. In one or more embodiments, the host may include a Be complex (for example, Compound H55), an Mg complex, a Zn complex, or a combination thereof.

In one or more embodiments, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof:

H1

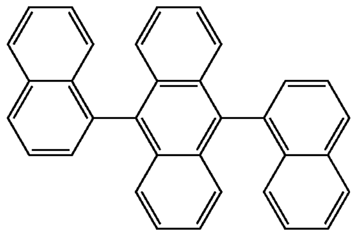

-continued

H2

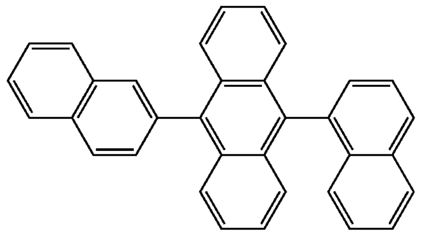

H3

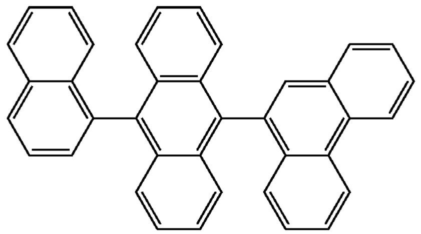

-continued
H4
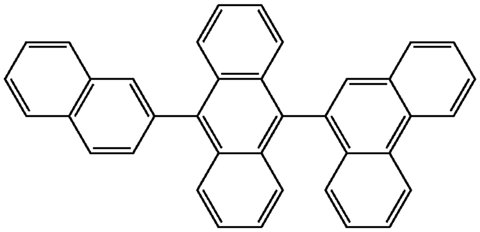
H5
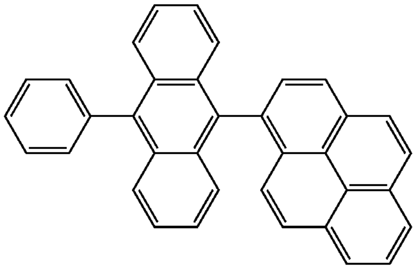
H6
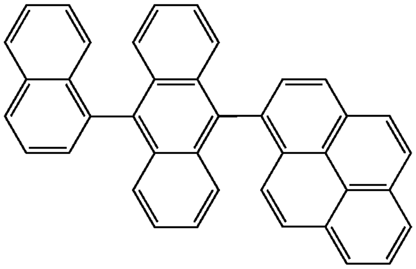
H7
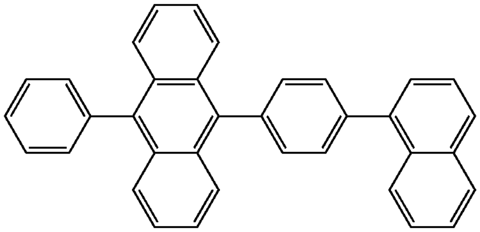
H8
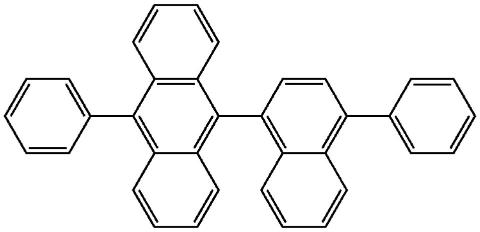
H9
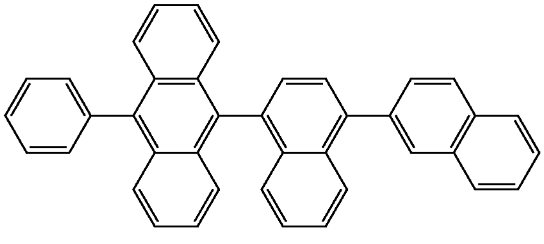
-continued
H10
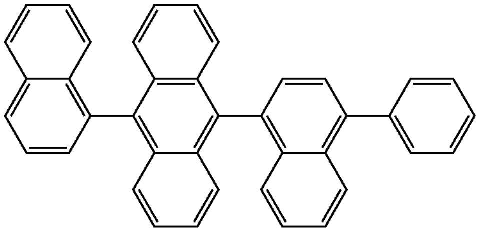
H11
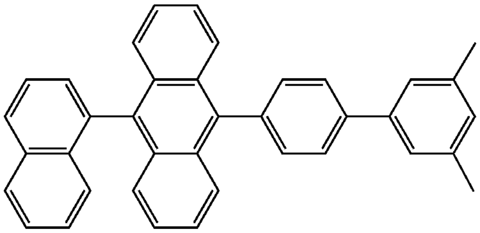
H12
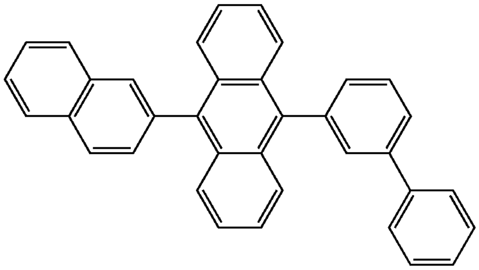
H13
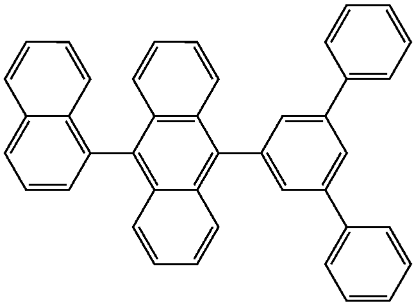
H14
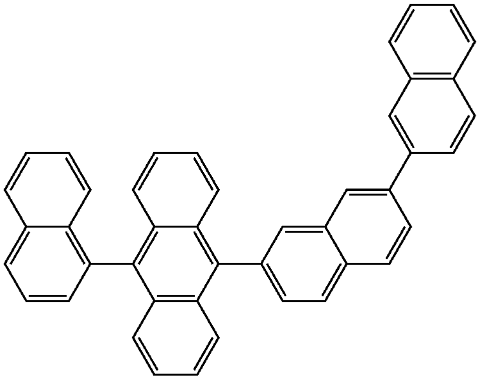

-continued
H15
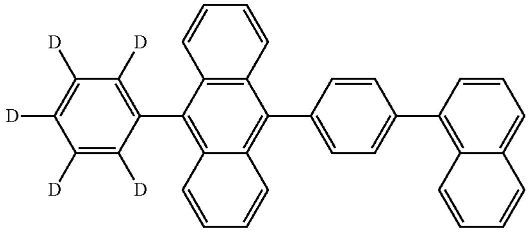
H16
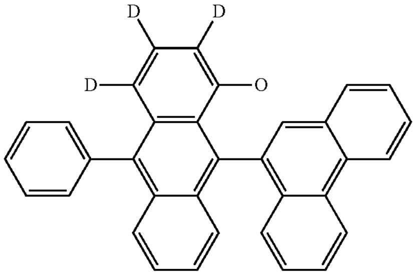
H17
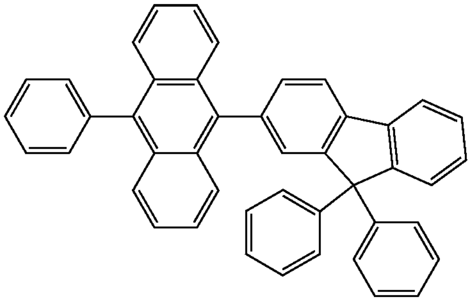
H18
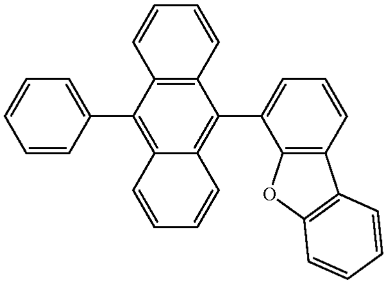
H19
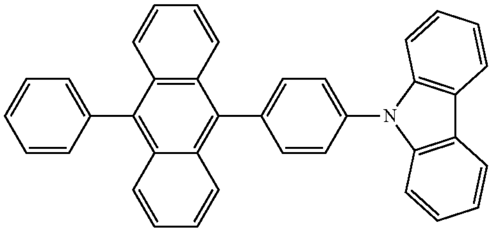
-continued
H20
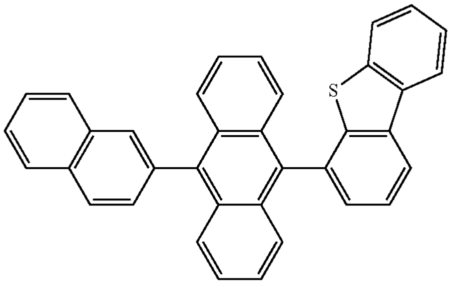
H21
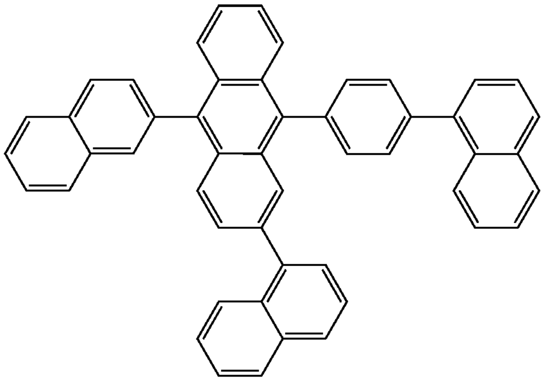
H22
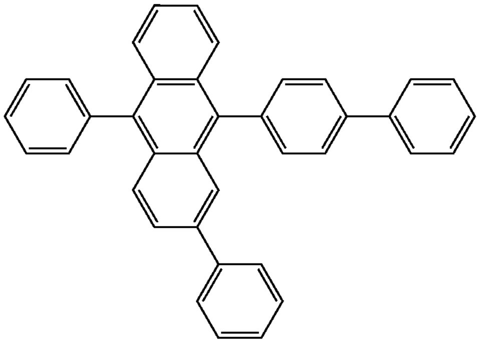
H23
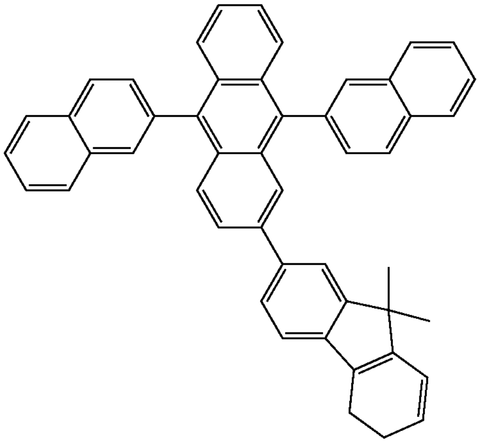

H24
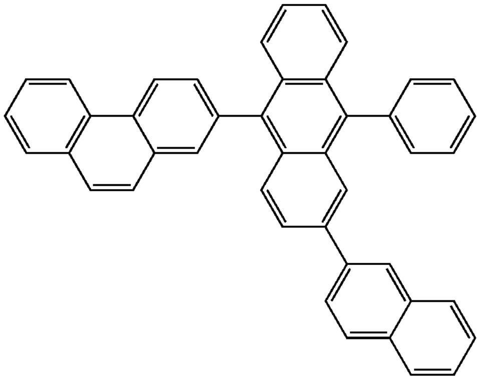
H25
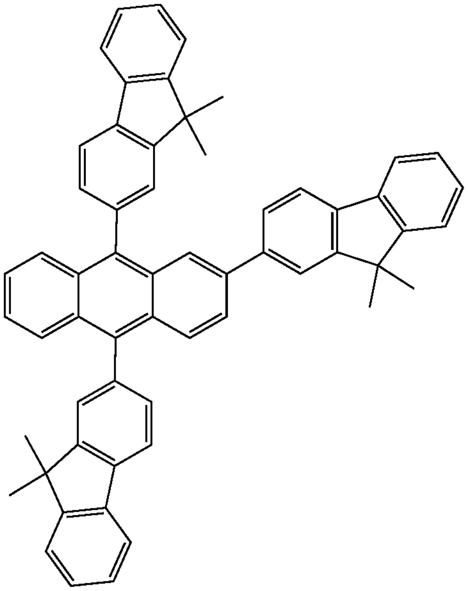
H26
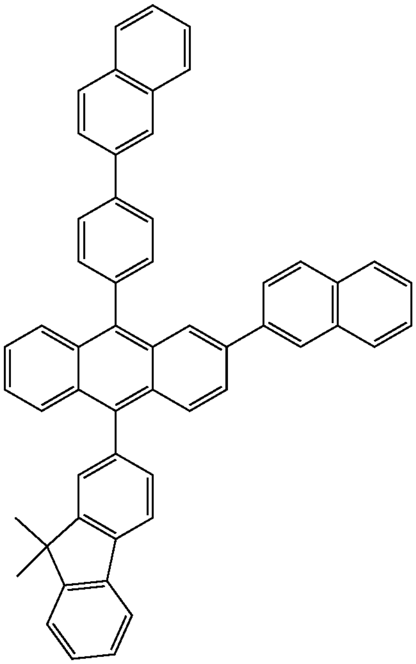
H27
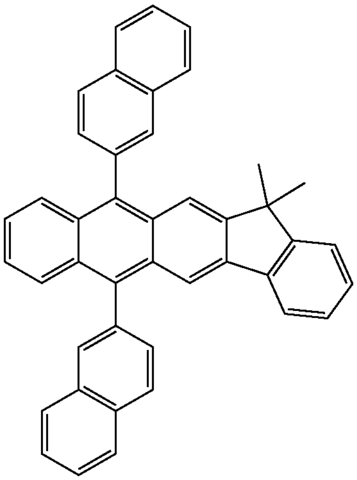
H28
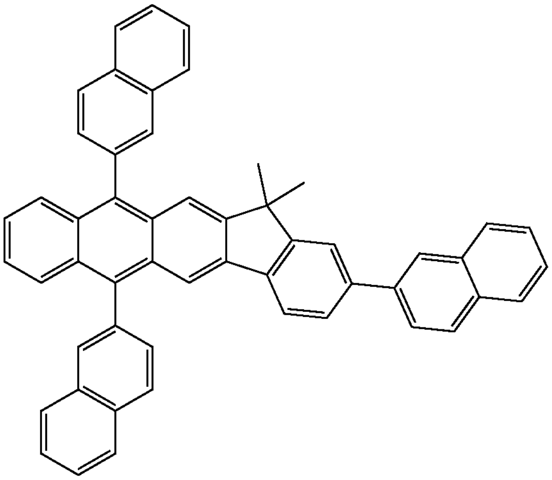
H29
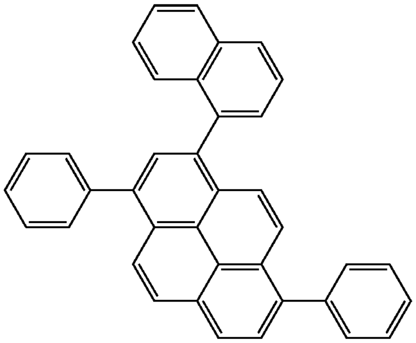

-continued
H30
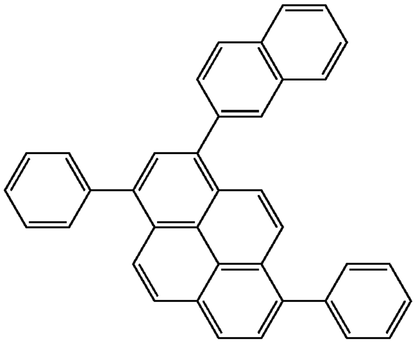
H31
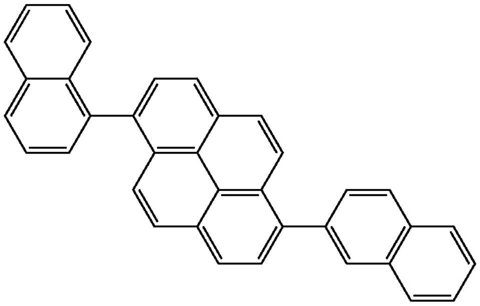
H32
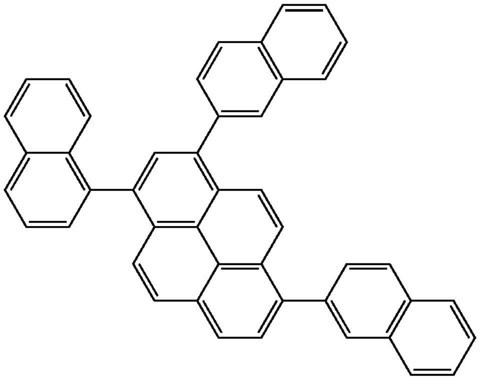
H33
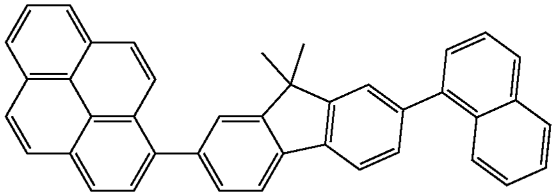
H34
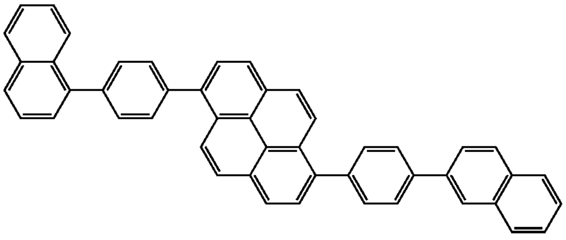
-continued
H35
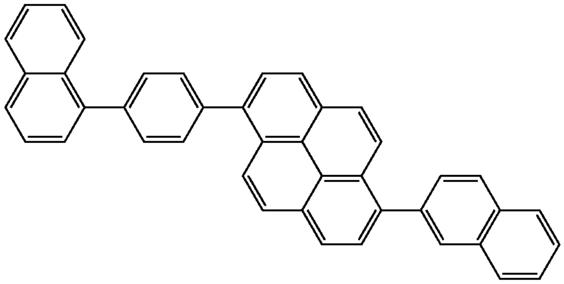
H36
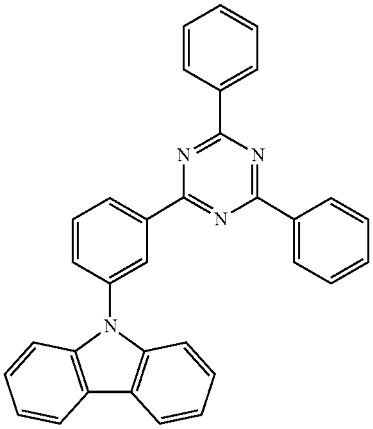
H37
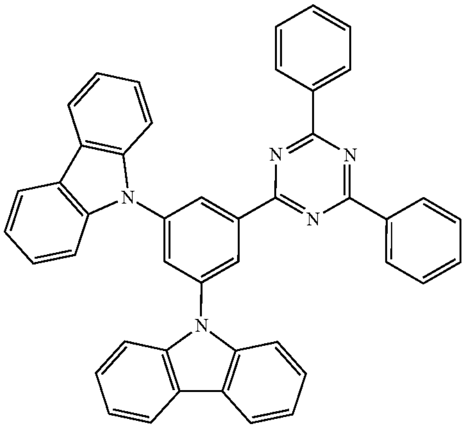
H38
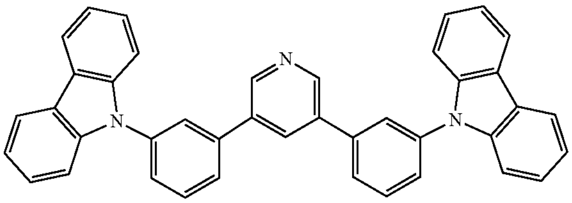

-continued
H39
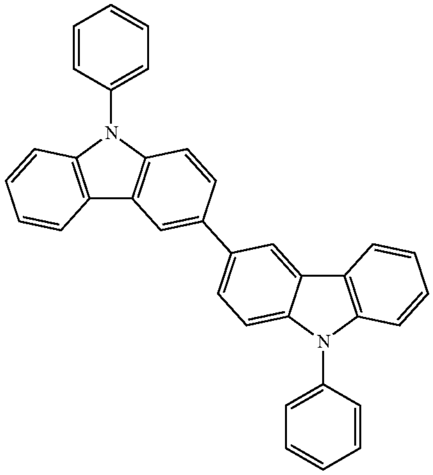
H40
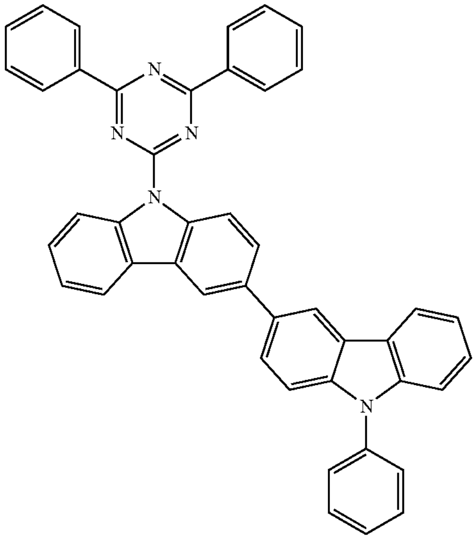
H41
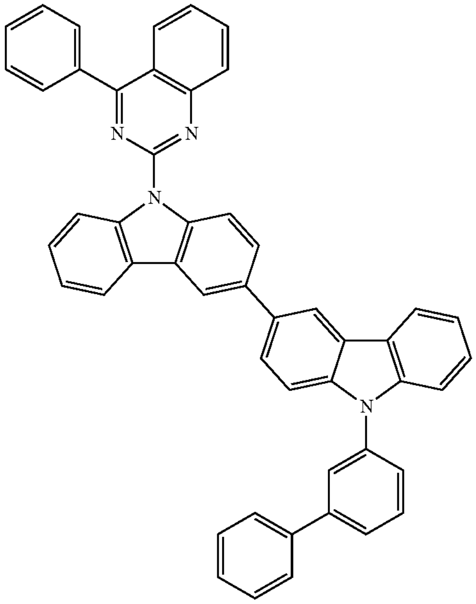
-continued
H42
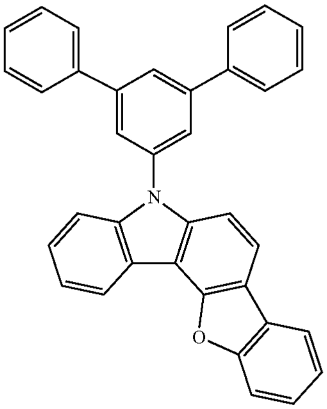
H43
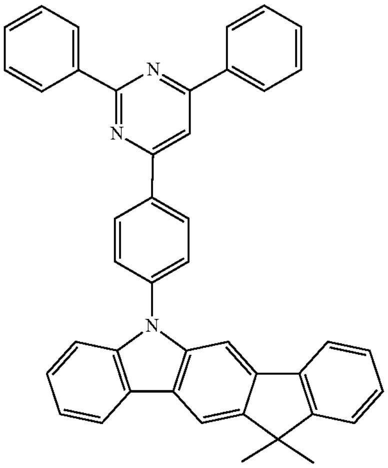
H44
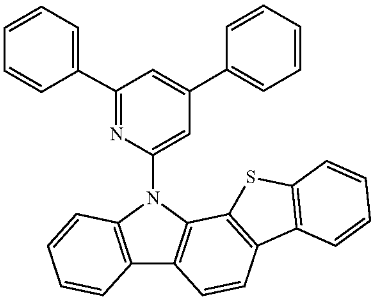
H45
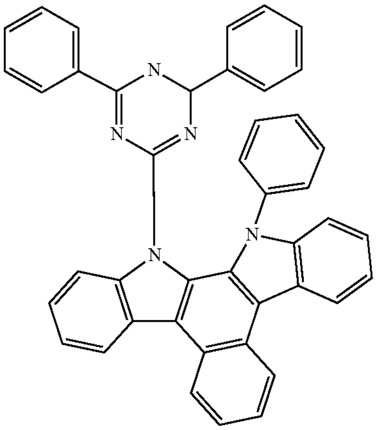

H46
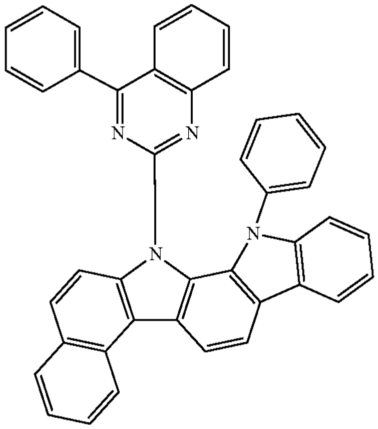
H47
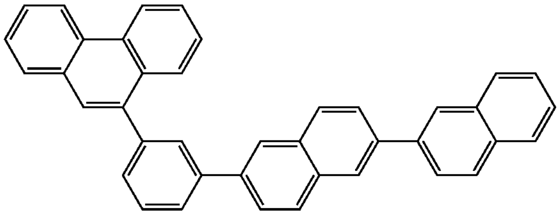
H48
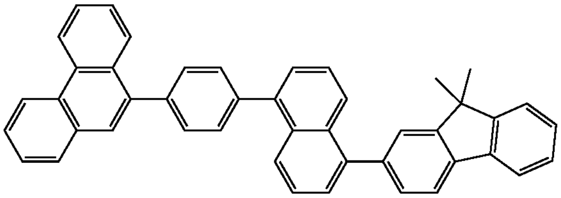
H49
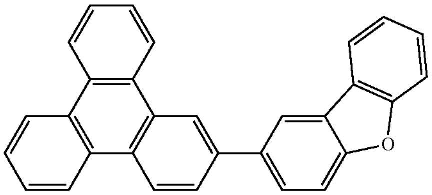
H50
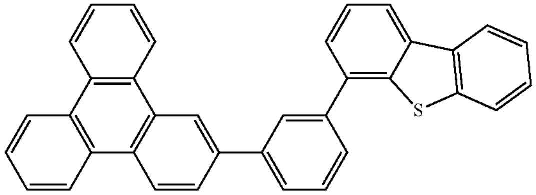
H51
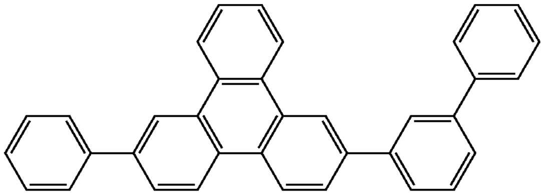
H52
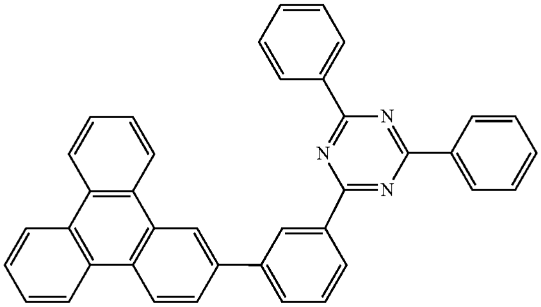
H53
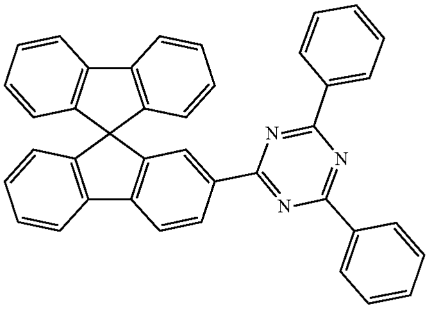
H54
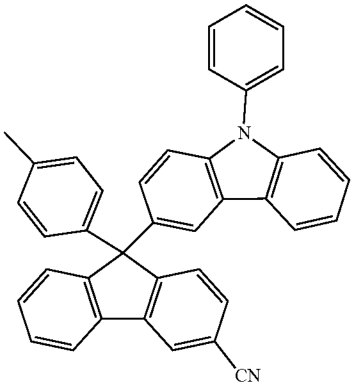
H55
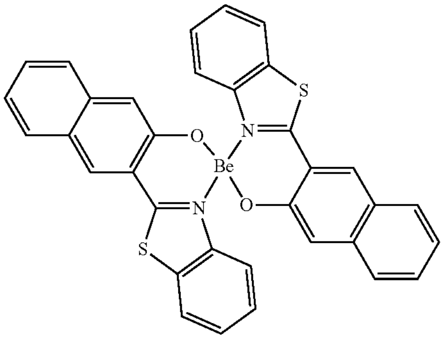

-continued
H56
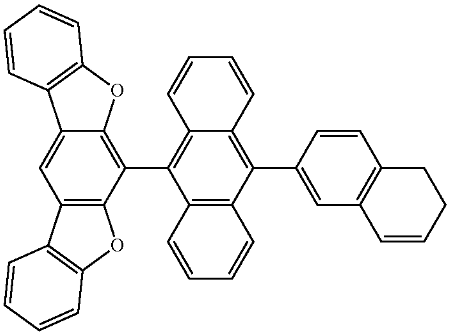
H57
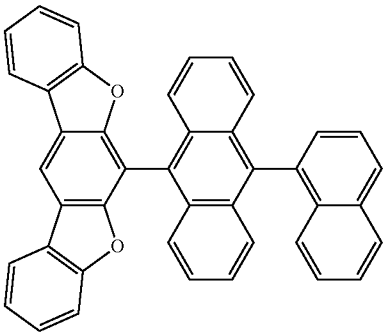
H58
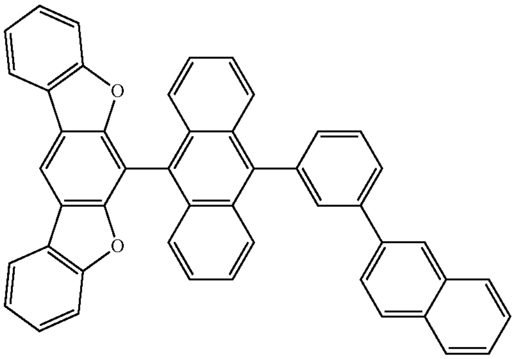
H59
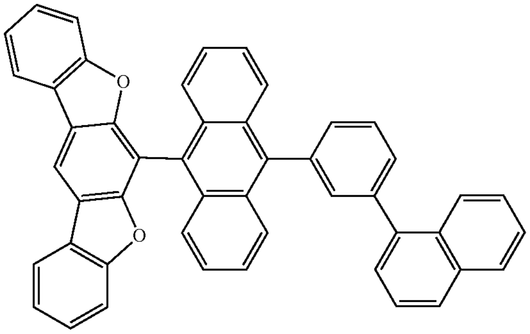
-continued
H60
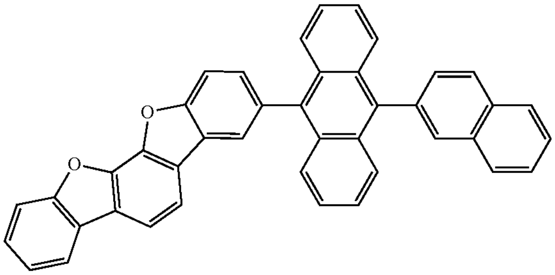
H61
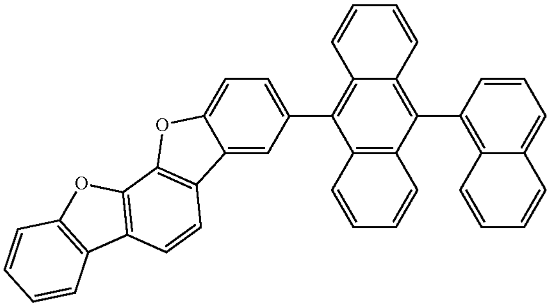
H62
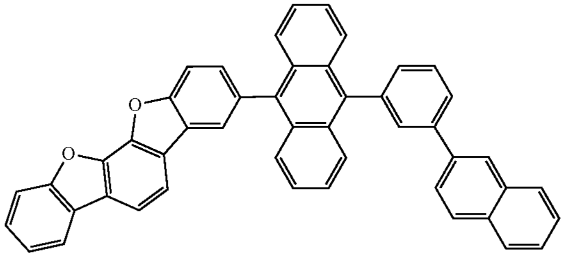
H63
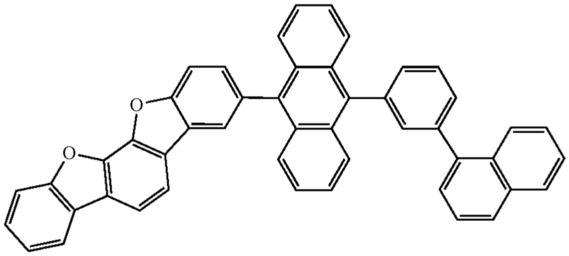
H64
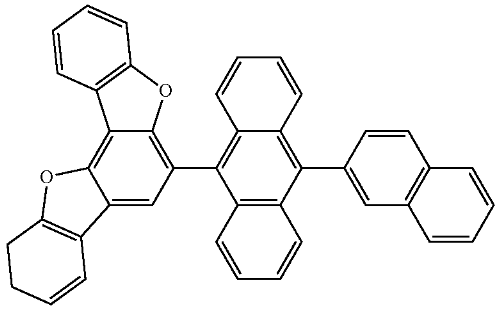

H65
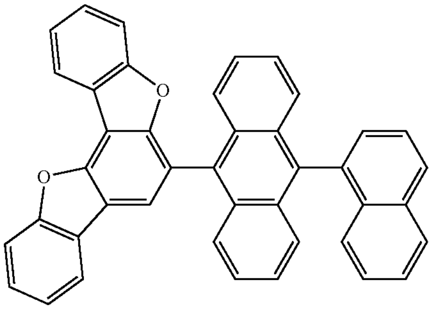
H66
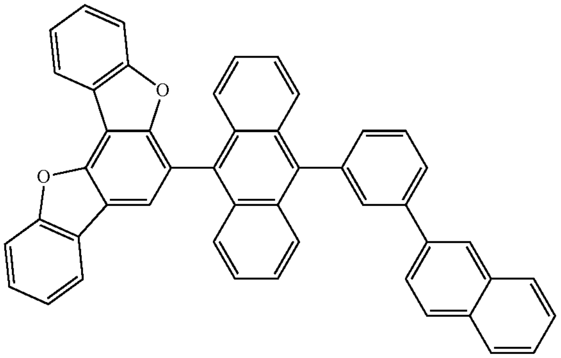
H67
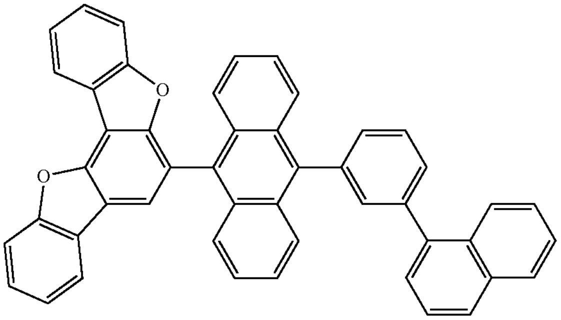
H68
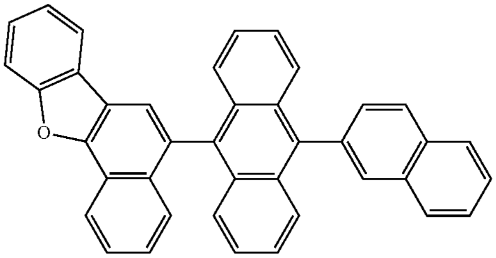
H69
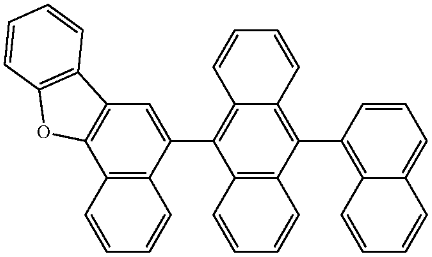
H70
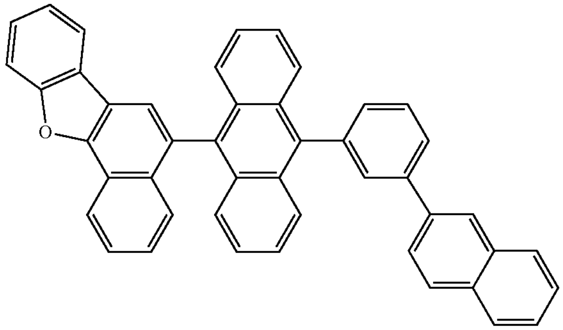
H71
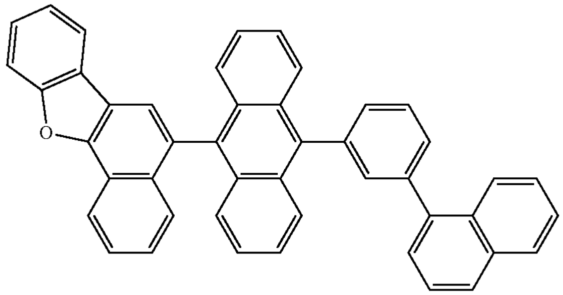
H72
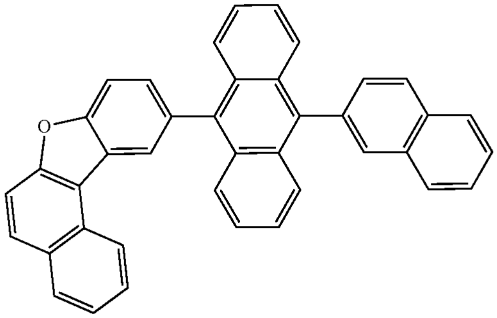
H73
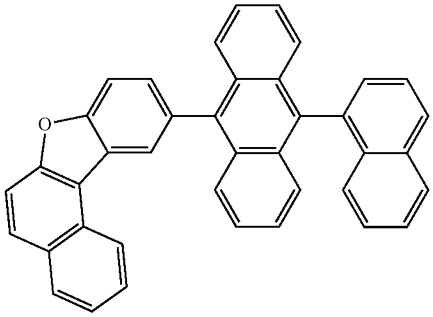

-continued
H74
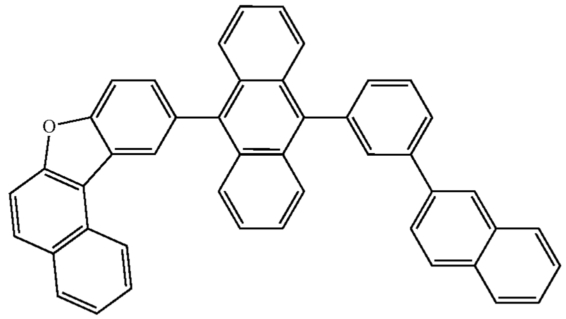
H75
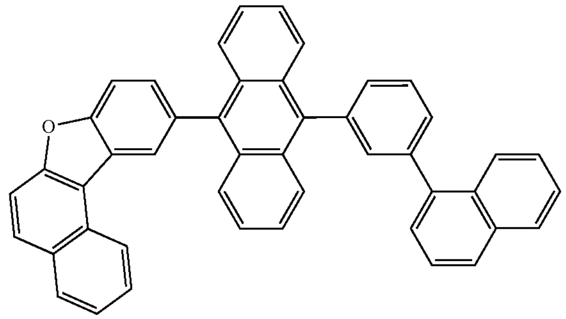
H76
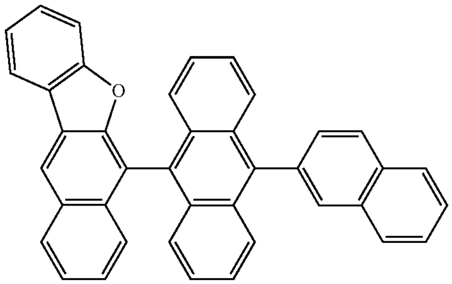
H77
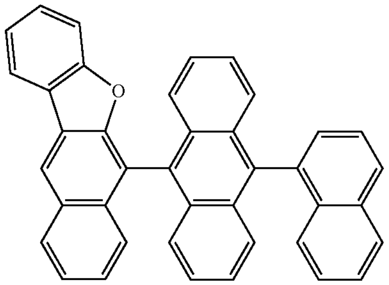
H78
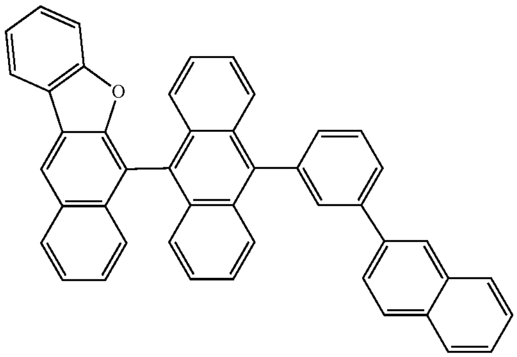
-continued
H79
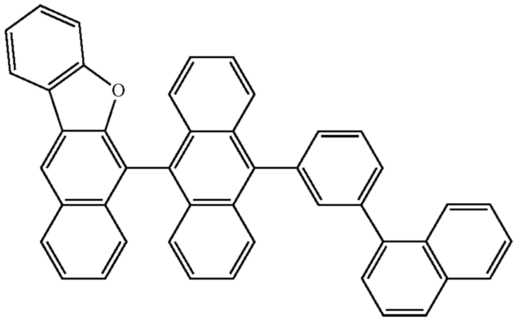
H80
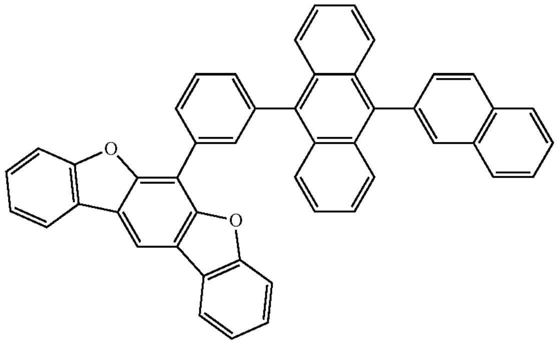
H81
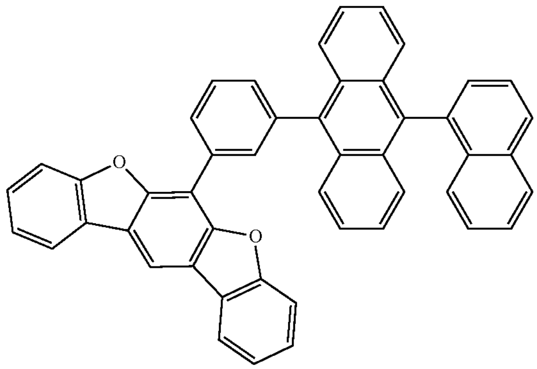
H82
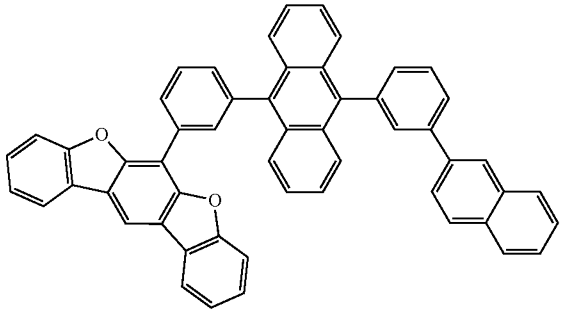

-continued
H83
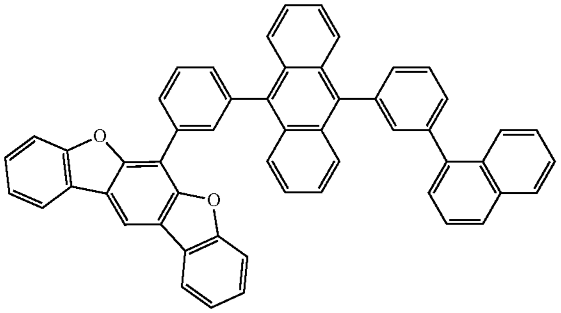
H84
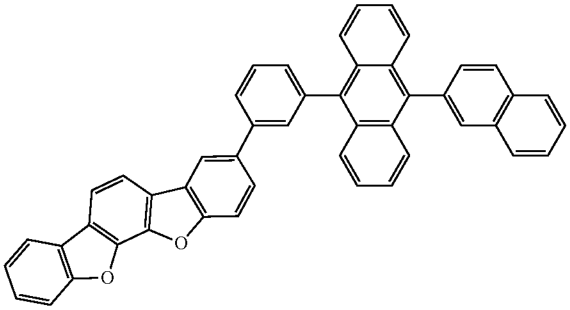
H85
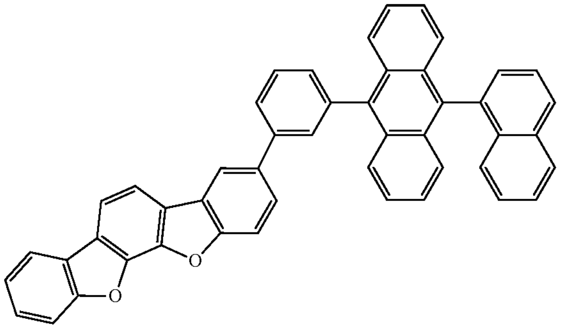
H86
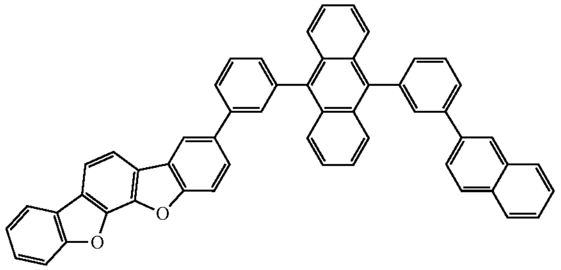
H87
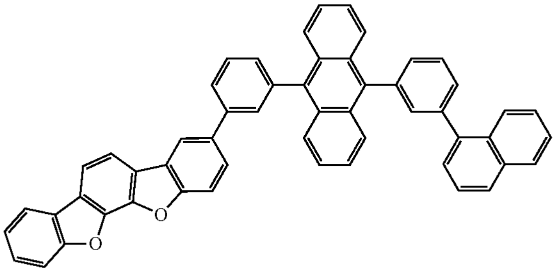
-continued
H88
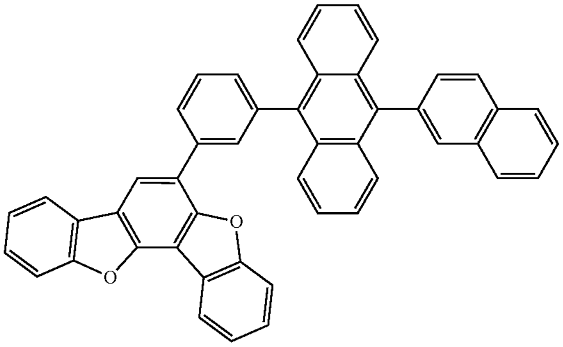
H89
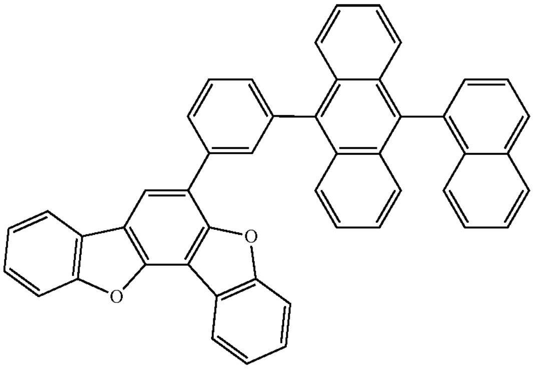
H90
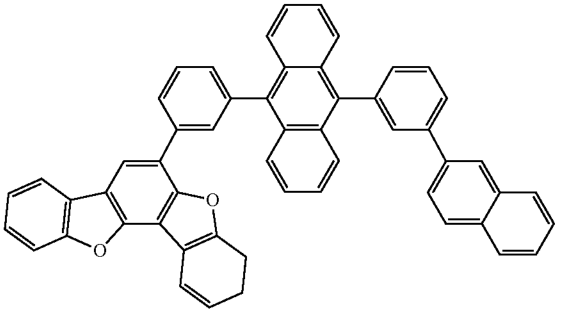
H91
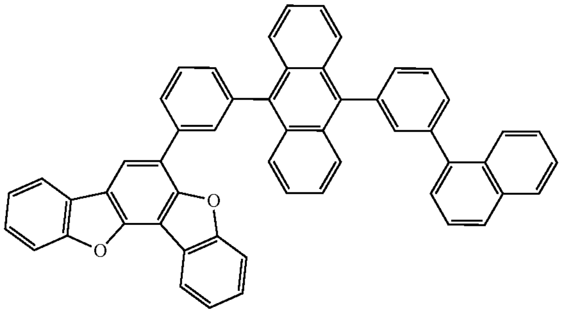

-continued
H92
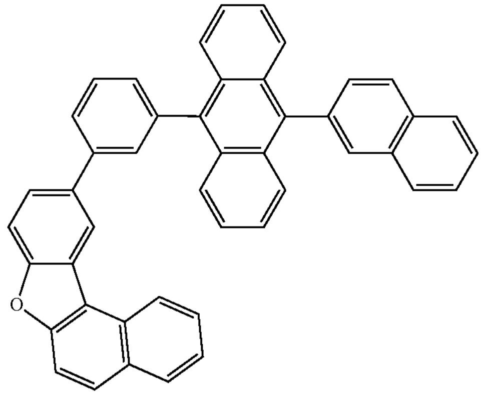
H93
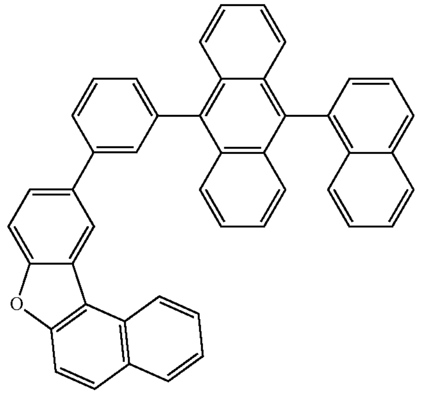
H94
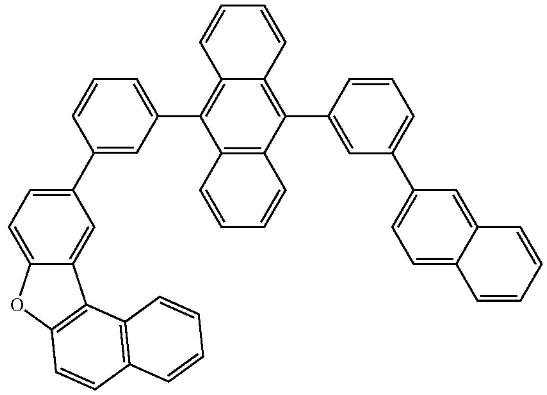
H95
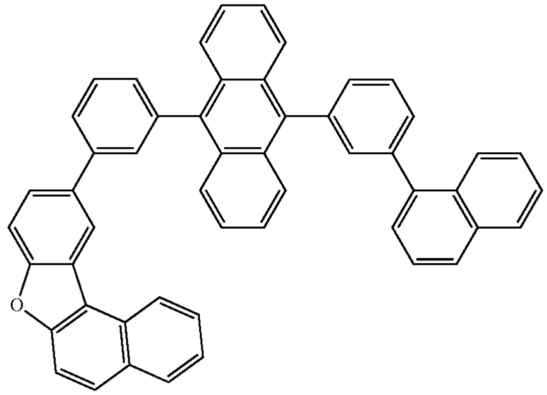
-continued
H96
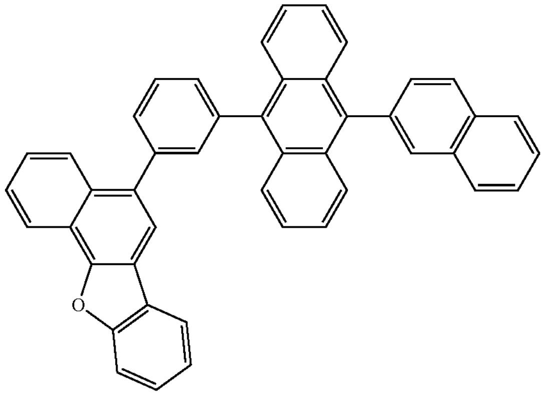
H97
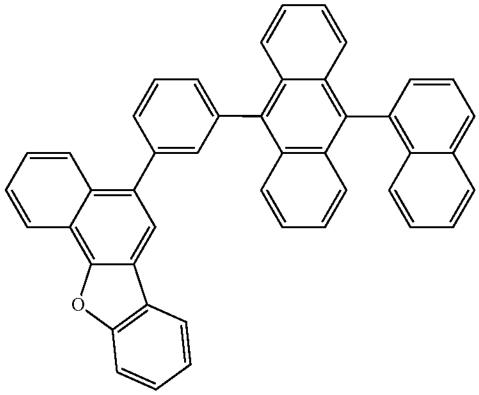
H98
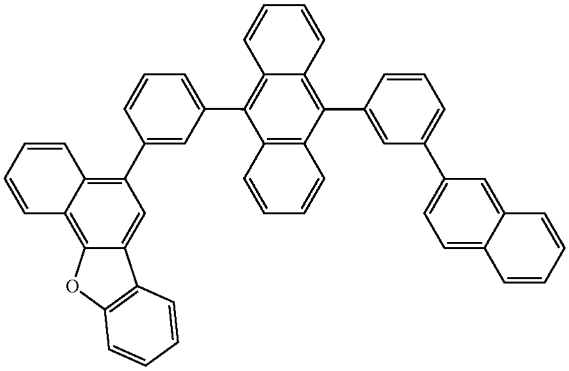
H99
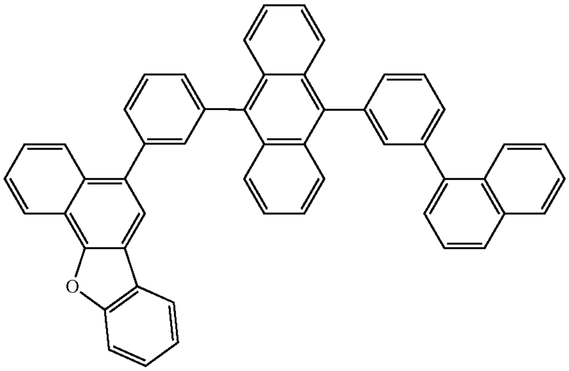

-continued
H100
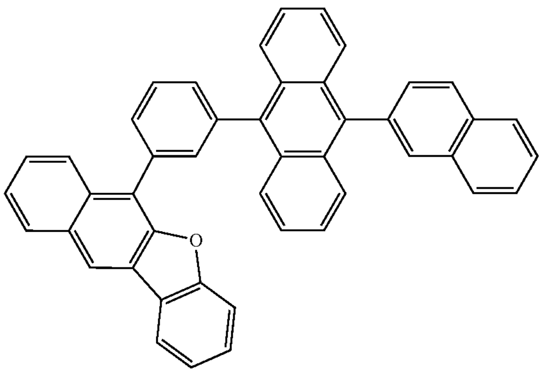
H101
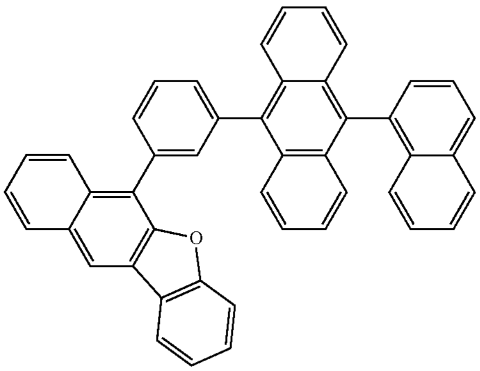
H102
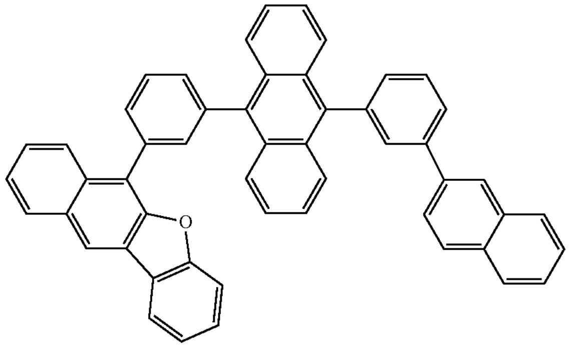
H103
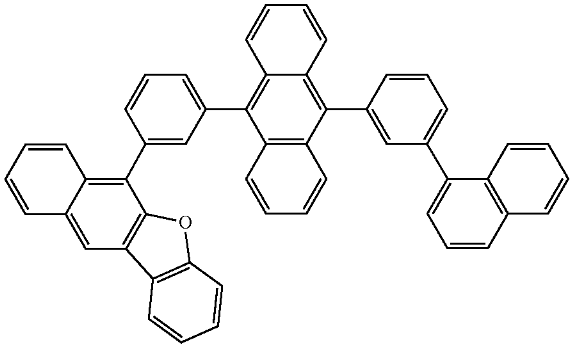
-continued
H104
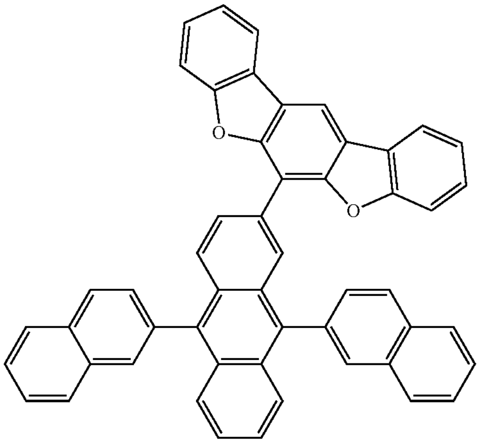
H105
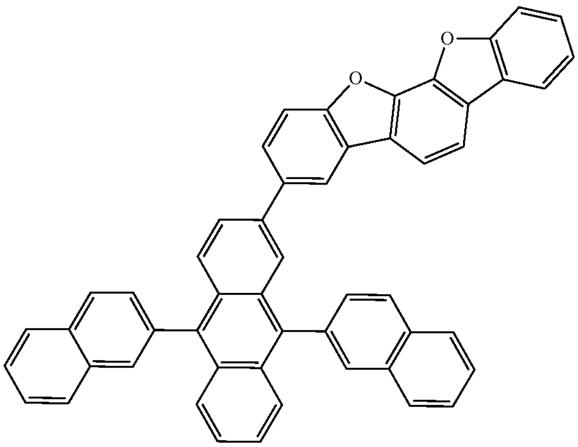
H106
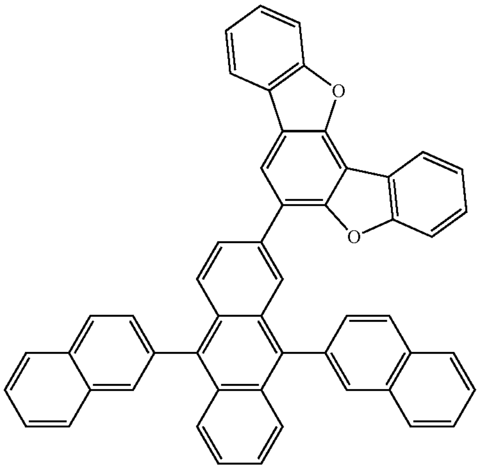

-continued
H107
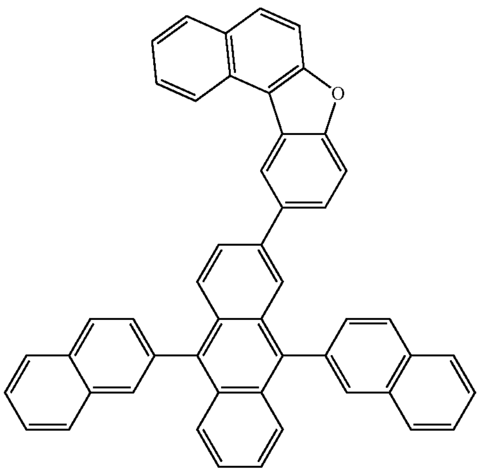
H108
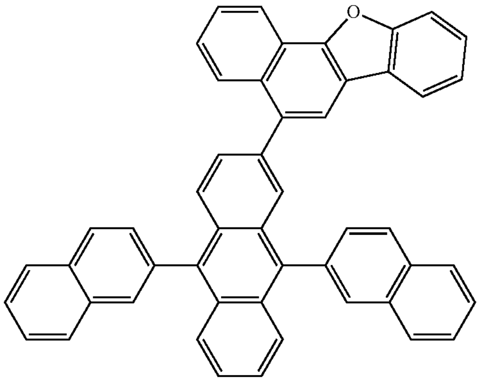
H109
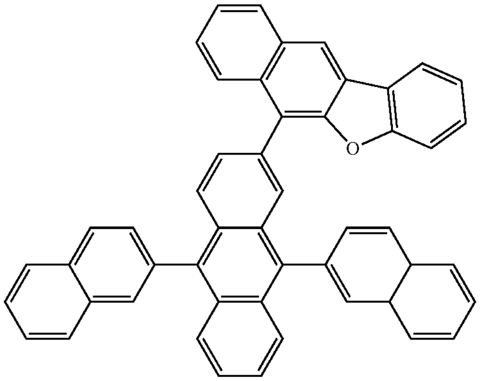
H110
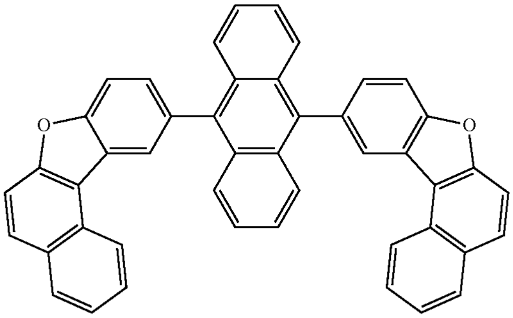
-continued
H111
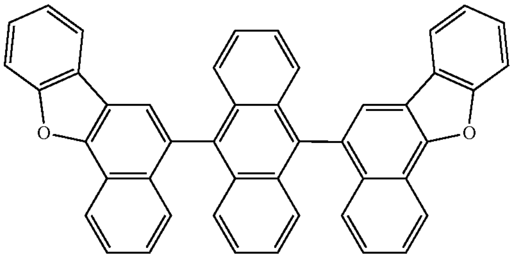
H112
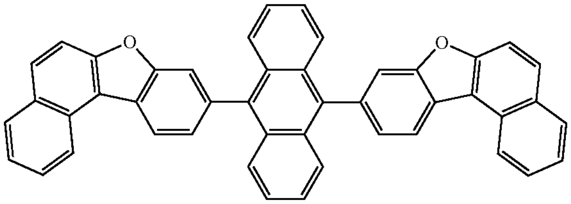
H113
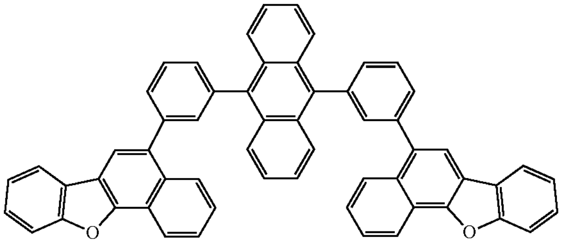
H114
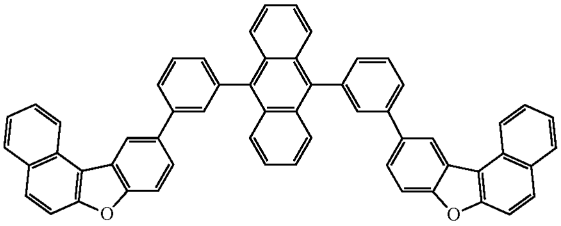
H115
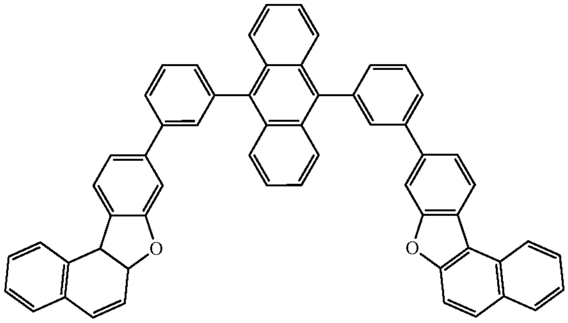

-continued
H116
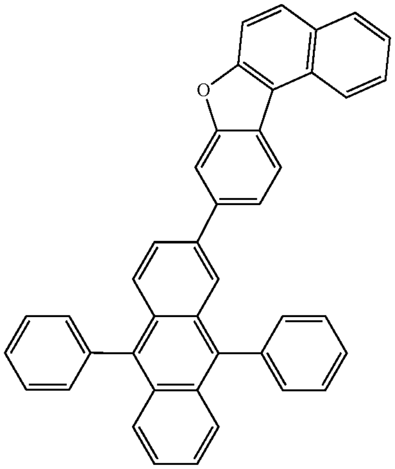
H117
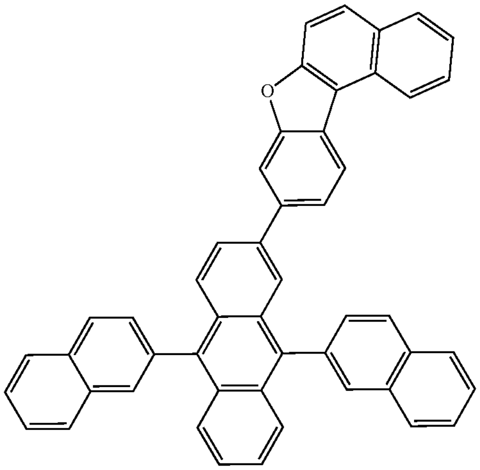
H118
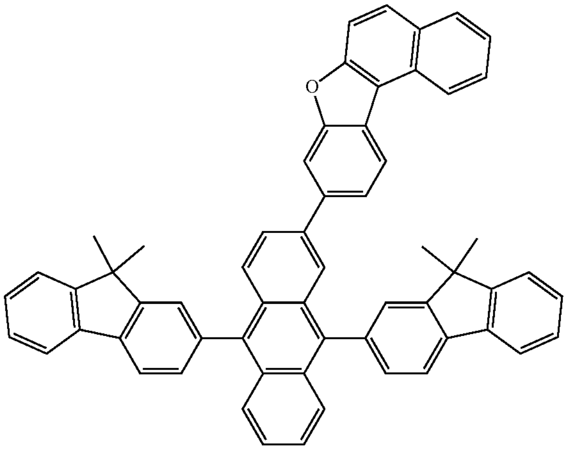
-continued
H119
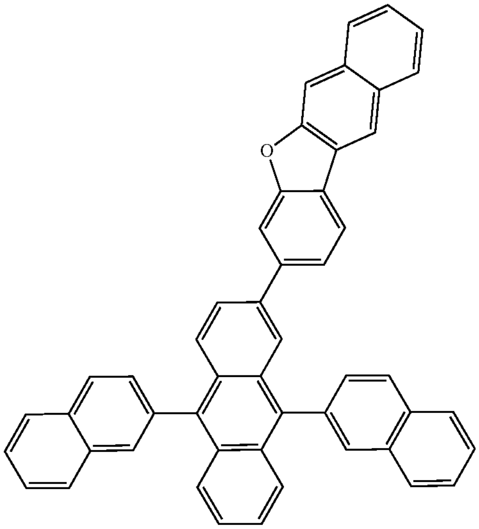
H120
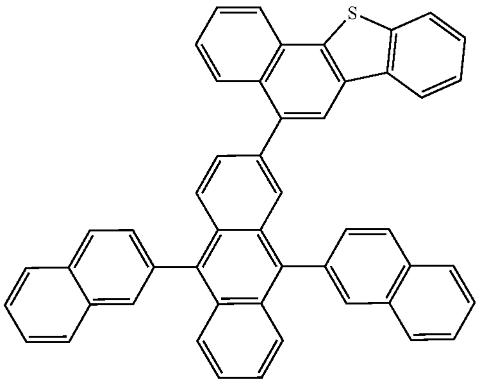
H121
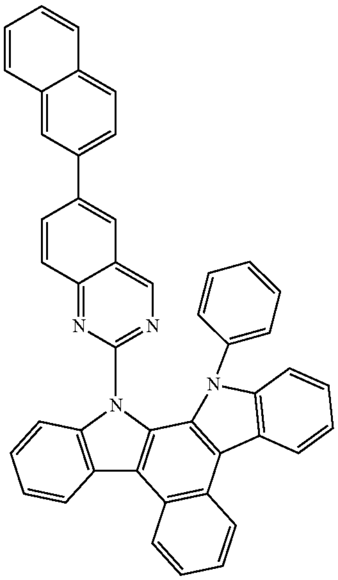

-continued

H122

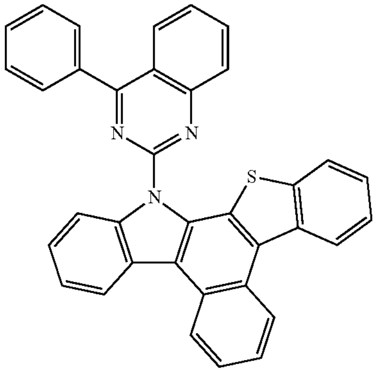

H123

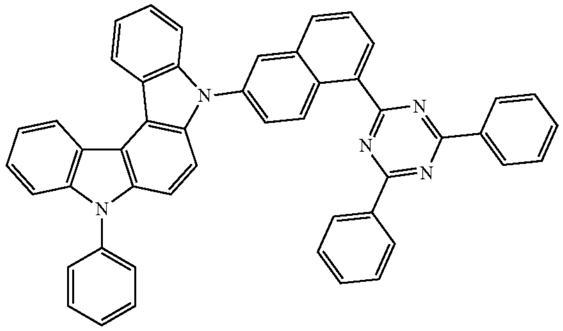

H124

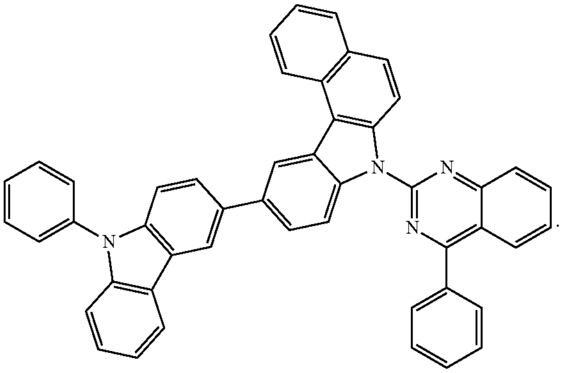

In one or more embodiments, the host may include a silicon-containing compound, a phosphine oxide-containing compound, or any combination thereof.

The host may have various suitable modifications, For example, the host may include only one kind of compound, or may include two or more kinds of different compounds.

Phosphorescent Dopant

The emission layer may include the first compound as described in the present specification, as a phosphorescent dopant.

In one or more embodiments, when the emission layer includes the first compound as described in the present specification and the first compound serves as an auxiliary dopant, the emission layer may further include a phosphorescent dopant.

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In one or more embodiments, the phosphorescent dopant may include an organometallic compound represented by Formula 401:

Formula 401

$$M(L_{401})_{xc1}(L_{402})_{xc2}$$

Formula 402

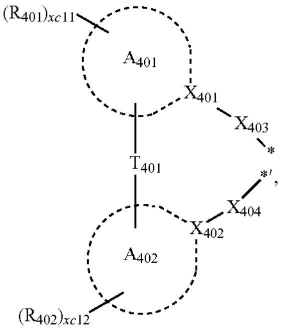

wherein, in Formulae 401 and 402,

M may be a transition metal (for example, iridium (Ir), platinum (Pt), palladium (Pd), osmium (Os), titanium (Ti), gold (Au)hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is two or more, two or more of $L_{401}$(s) may be identical to or different from each other, $L_{402}$ may be an organic ligand, and xc2 may be 0, 1, 2, 3, or 4, wherein, when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(═O)—*', *—N($Q_{411}$)-*', *—C($Q_{411}$)($Q_{412}$)*', *—C($Q_{411}$)═C($Q_{412}$)-*', *—C($Q_{411}$)═*', or *═C($Q_{411}$)-*', $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ are the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(═O)($Q_{401}$), —S(═O)$_2$($Q_{401}$), or —P(═O)($Q_{401}$)($Q_{402}$), $Q_{401}$ to $Q_{403}$ are the same as described in connection with $Q_1$, xc11 and xc12 may each independently be an integer from 0 to 10, and

* and *' in Formula 402 each indicate a binding site to M in Formula 401.

In one or more embodiments, in Formula 402, i) $X_{401}$ may be nitrogen, and $X_{402}$ may be carbon, or ii) each of $X_{401}$ and $X_{402}$ may be nitrogen.

In one or more embodiments, when xc1 in Formula 401 is 2 or more, two ring $A_{401}$ in two or more of $L_{401}$(s) may be optionally linked to each other via $T_{402}$, which is a linking group, and/or two ring $A_{402}$ may optionally be linked to each other via $T_{403}$, which is a linking group (see e.g., Compounds PD1 to PD4 and PD7). $T_{402}$ and $T_{403}$ are the same as described in connection with $T_{401}$.

$L_{402}$ in Formula 401 may be an organic ligand. In one or more embodiments, $L_{402}$ may include a halogen group, a diketone group (for example, an acetylacetonate group), a carboxylic acid group (for example, a picolinate group), —C(═O), an isonitrile group, —CN group, a phosphorus group (for example, a phosphine group, a phosphite group, etc.), or any combination thereof.

The phosphorescent dopant may include, for example, one of compounds PD1 to PD39, or any combination thereof:

PD1

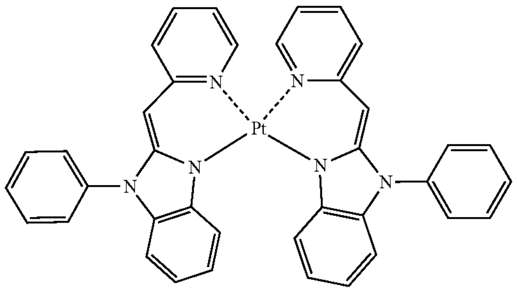

PD2

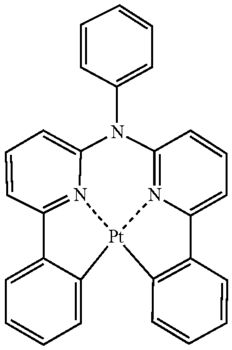

PD3

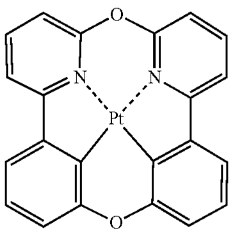

-continued

PD4

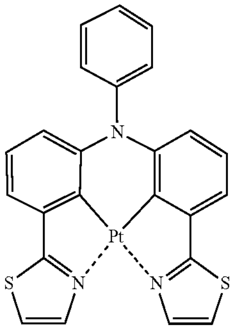

PD5

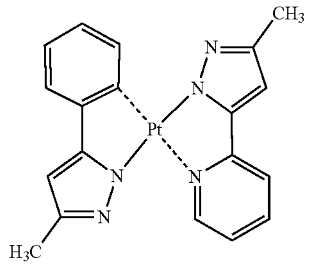

PD6

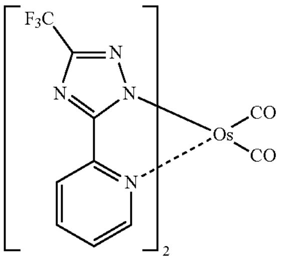

PD7

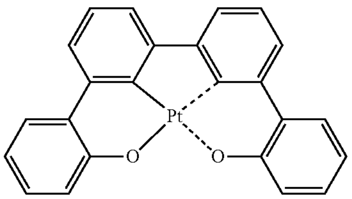

PD8

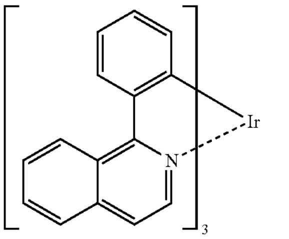

PD9

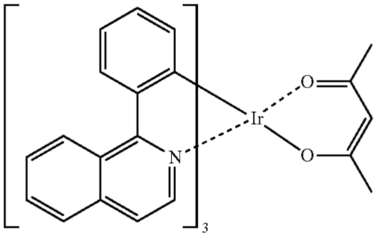

-continued
PD10
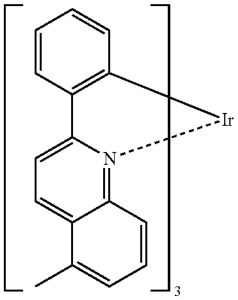
PD11
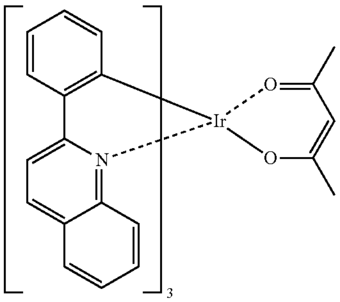
PD12
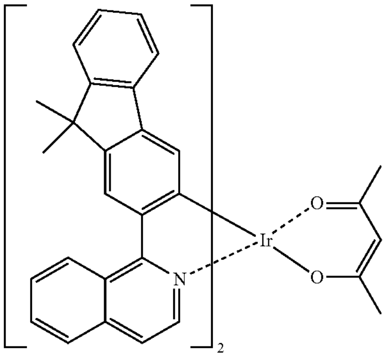
PD13
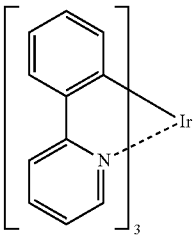
PD14
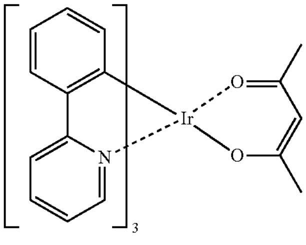
-continued
PD15
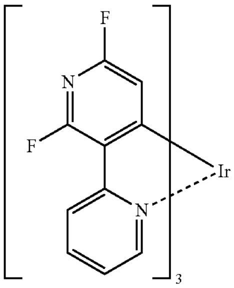
PD16
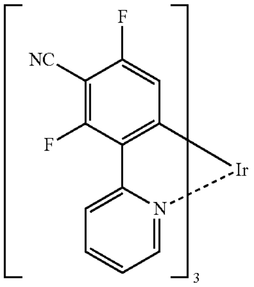
PD17
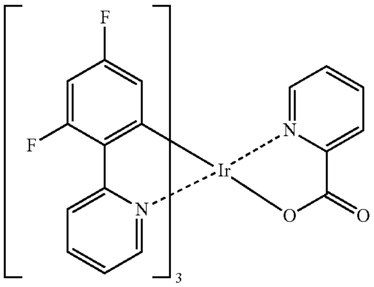
PD18
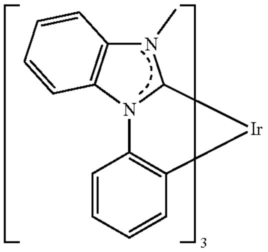
PD19
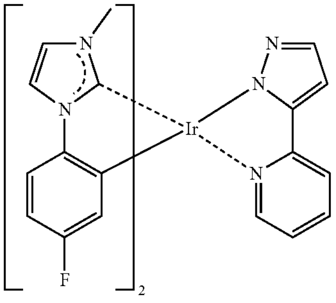

-continued
PD20
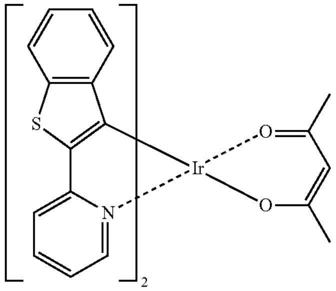
PD21
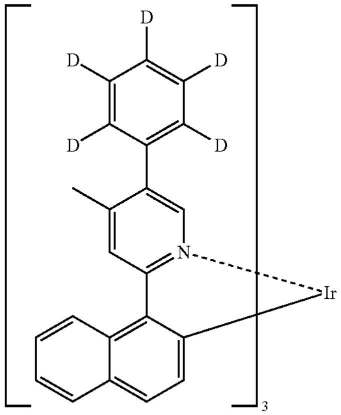
PD22
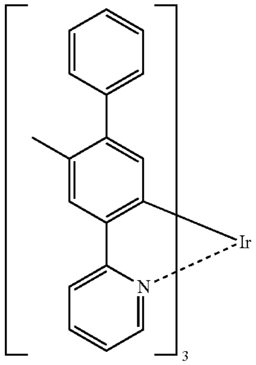
PD23
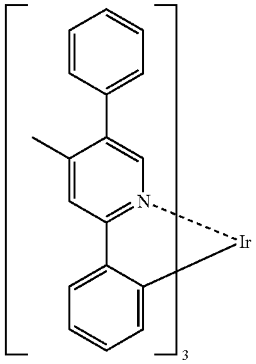
-continued
PD24
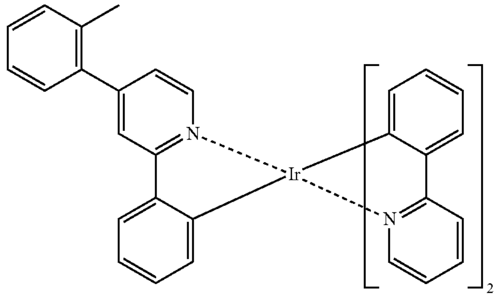
PD25
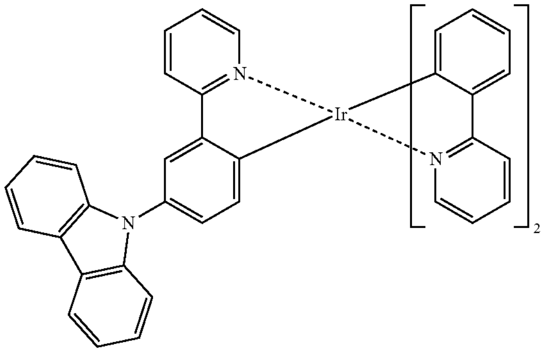
PD26
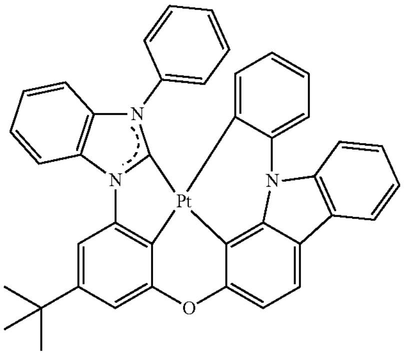
PD27
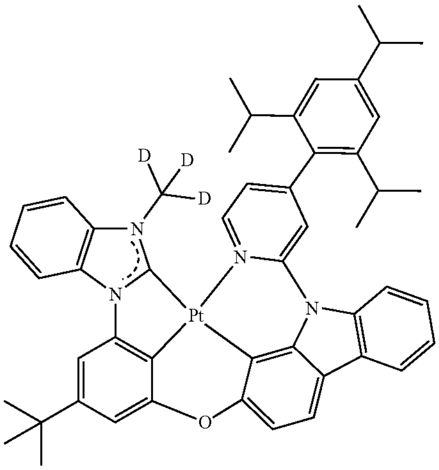

-continued
PD28
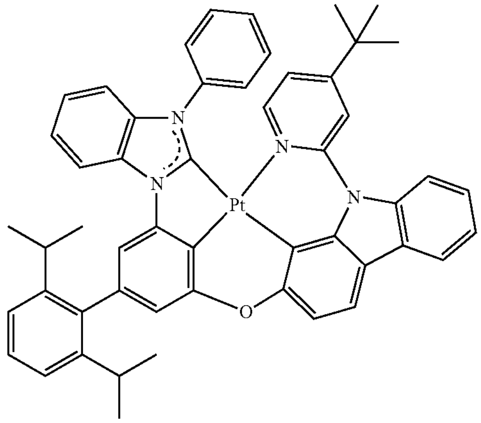
PD29
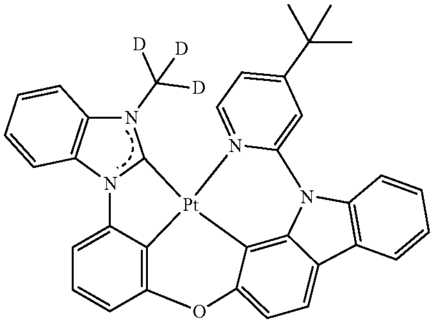
PD30
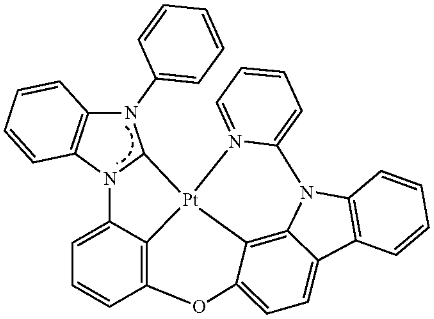
PD31
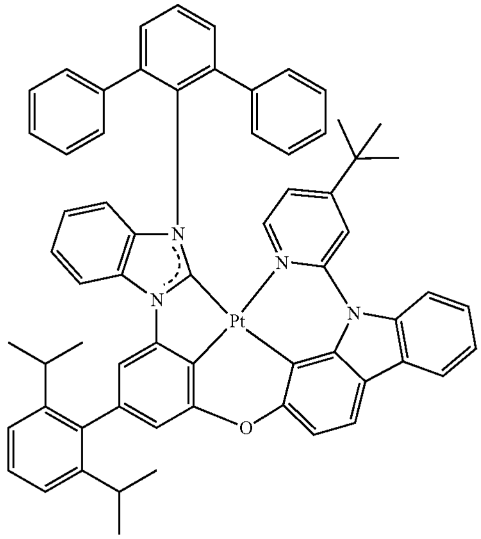
-continued
PD32
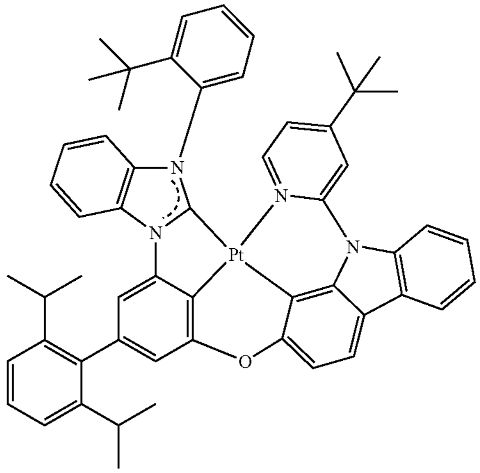
PD33
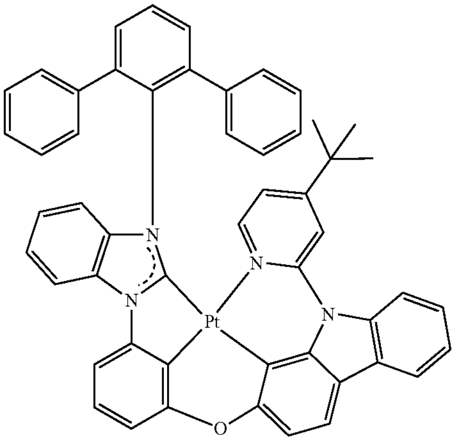
PD34
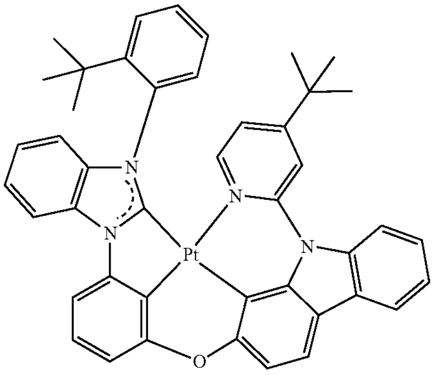

-continued

PD35

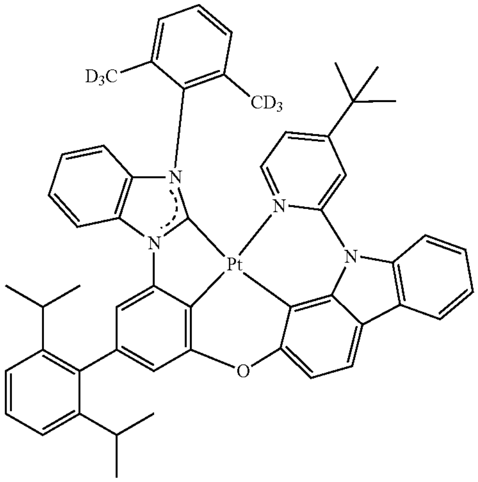

PD36

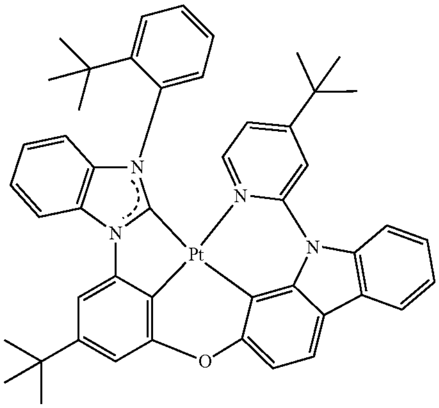

PD37

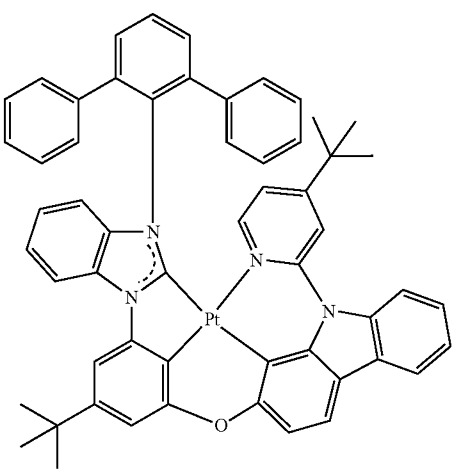

-continued

PD38

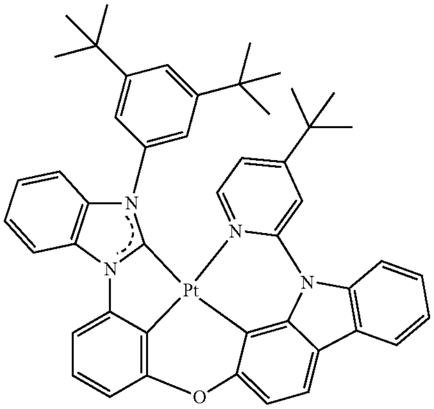

PD39

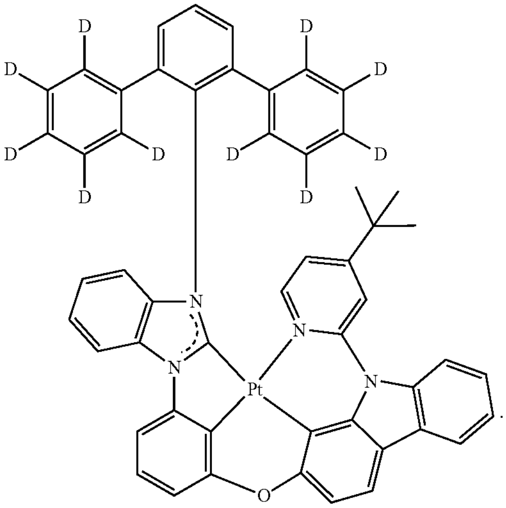

Fluorescent Dopant

When the emission layer includes the first compound as described in the present specification and the first compound serves as an auxiliary dopant, the emission layer may further include a fluorescent dopant.

In one or more embodiments, when the emission layer includes the first compound as described in the present specification and the first compound serves as a phosphorescent dopant, the emission layer may further include an auxiliary dopant.

The fluorescent dopant and the auxiliary dopant may each independently include an amine group-containing compound, a styryl group-containing compound, or any combination thereof.

In one or more embodiments, the fluorescent dopant and the auxiliary dopant may each independently include a compound represented by Formula 501 below:

Formula 501

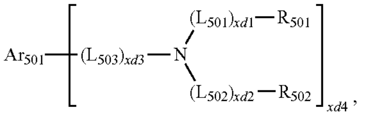

wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In one or more embodiments, $Ar_{501}$ in Formula 501 may be a condensed cyclic group (for example, an anthracene group, a chrysene group, and/or a pyrene group) in which three or more monocyclic groups are condensed together.

In one or more embodiments, xd4 in Formula 501 may be 2.

In one or more embodiments, the fluorescent dopant and the auxiliary dopant may each independently include one of the following Compounds FD1 to FD36, DPVBi, DPAVBi, or any combination thereof:

FD1

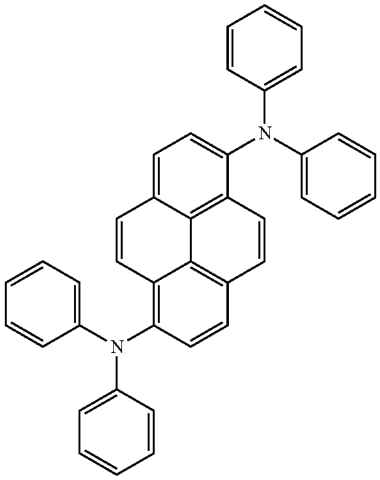

FD2

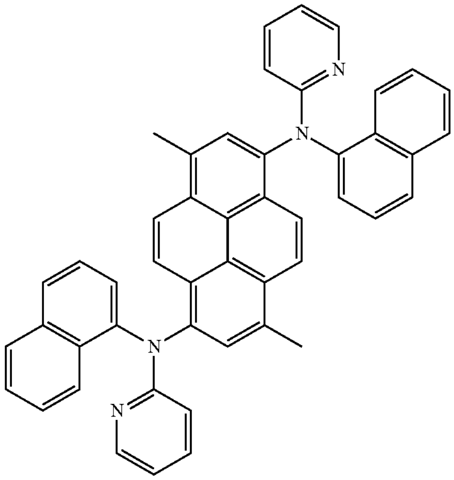

-continued

FD3

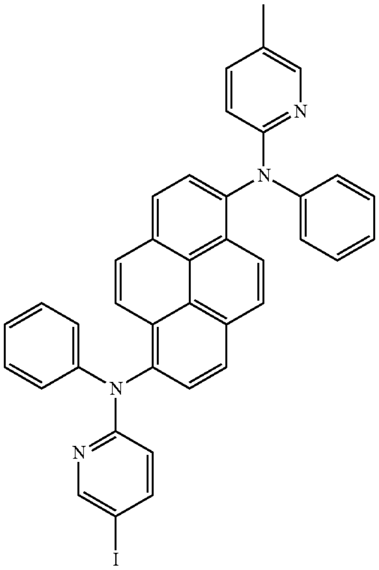

FD4

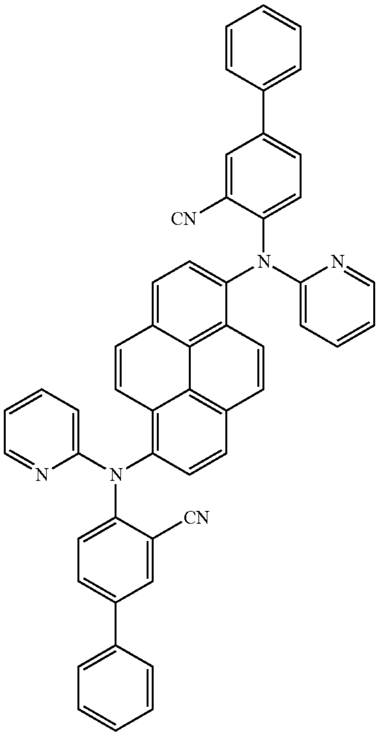

-continued
FD5
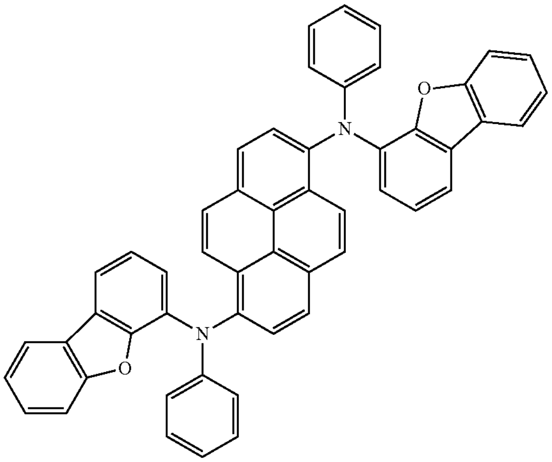
FD6
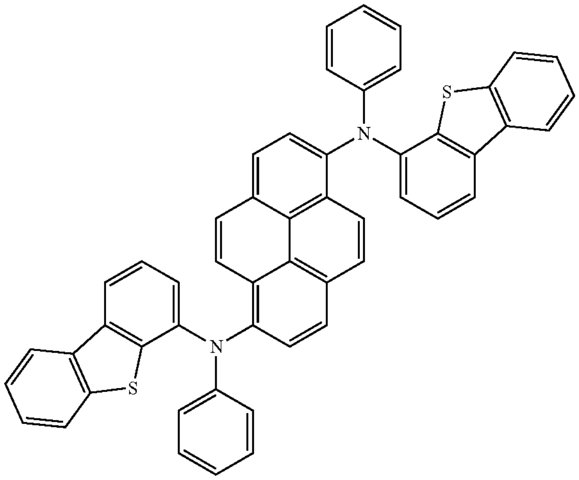
FD7
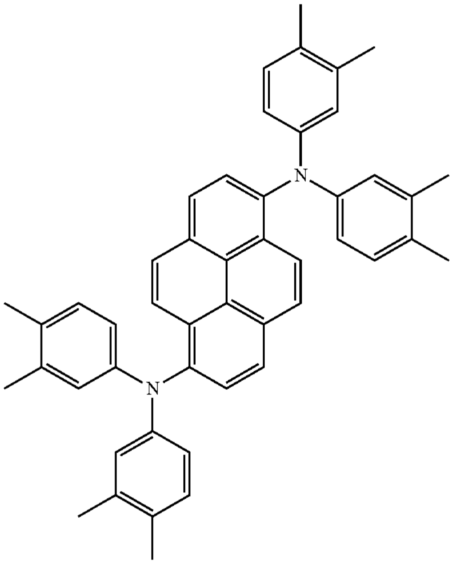
-continued
FD8
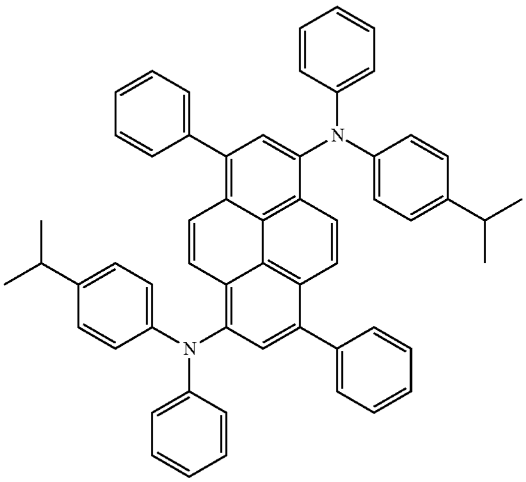
FD9
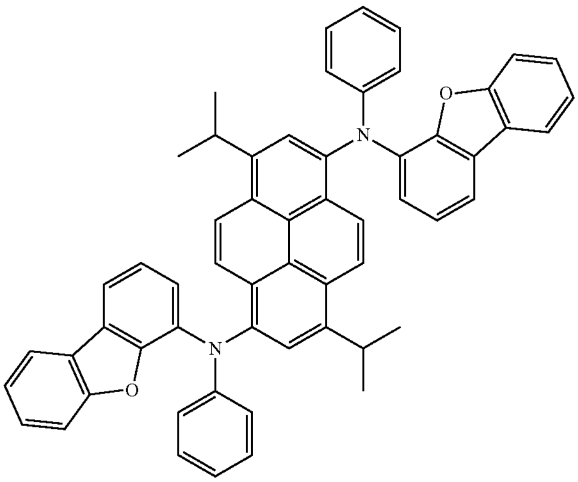
FD10
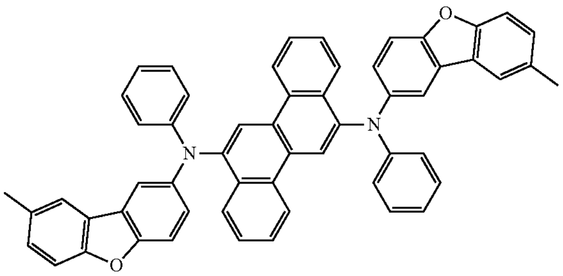
FD11
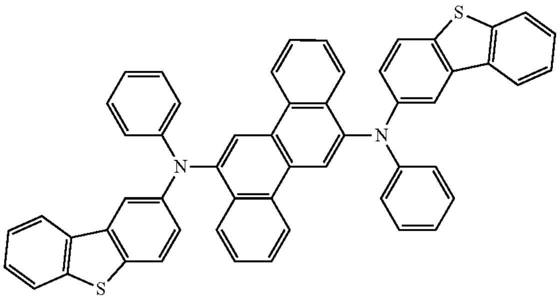

-continued
FD12
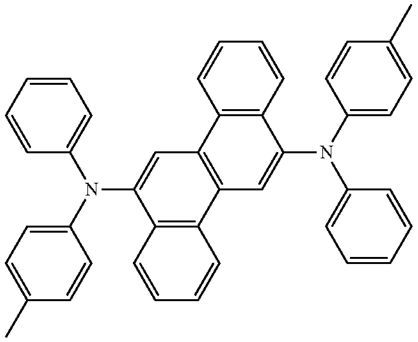
FD13
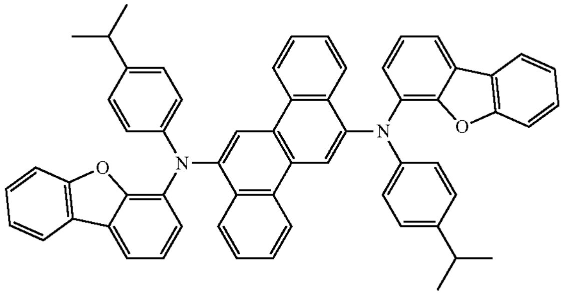
FD14
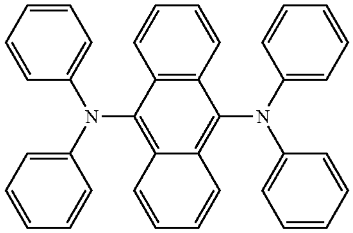
FD15
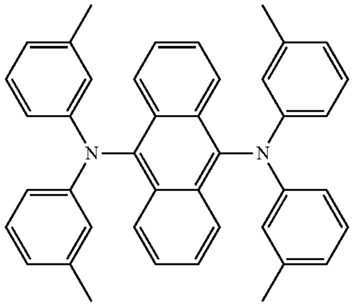
FD16
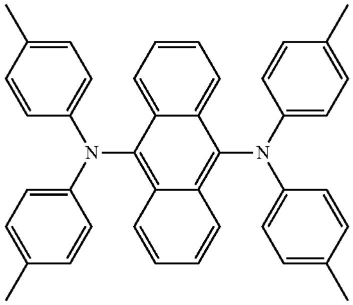
-continued
FD17
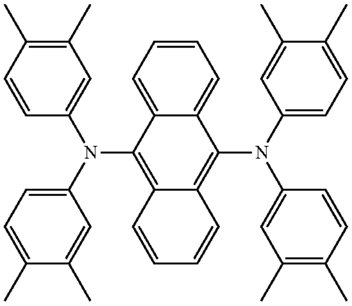
FD18
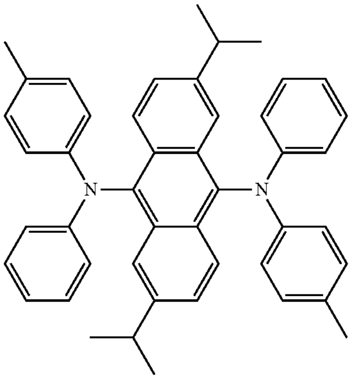
FD19
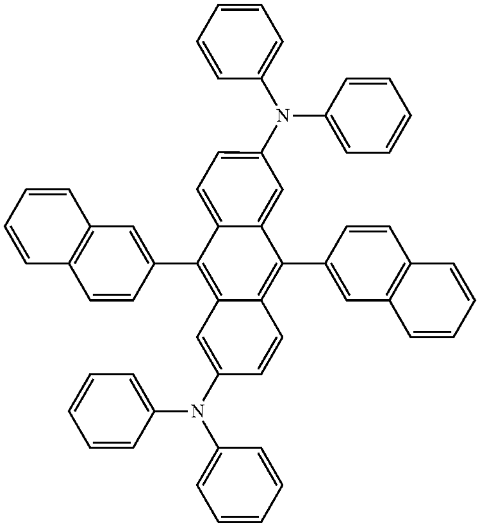
FD20
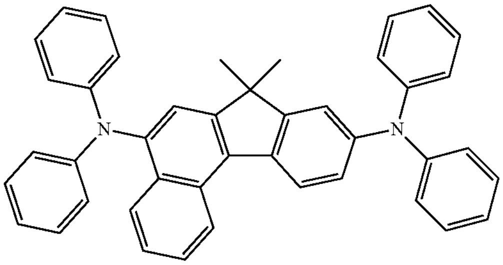

-continued
FD21
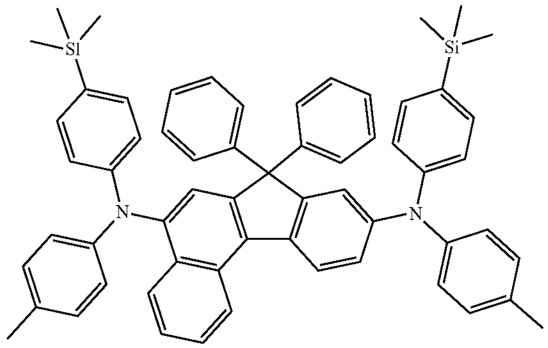
FD22
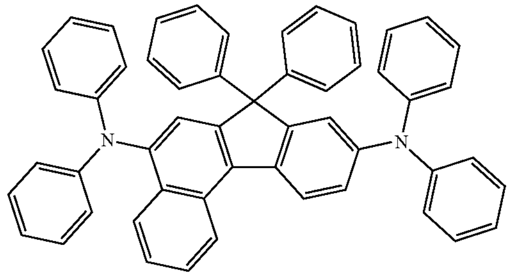
FD23
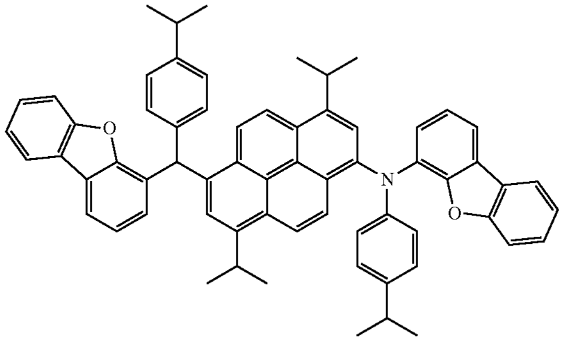
FD24
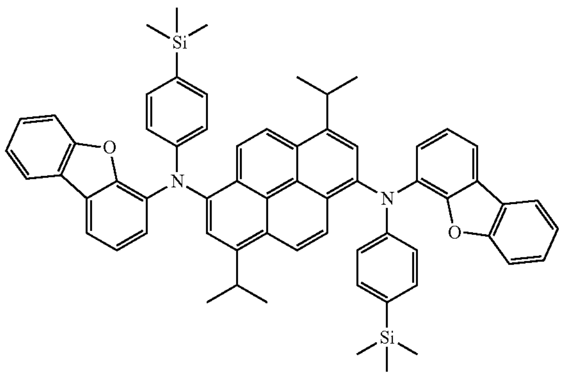
-continued
FD25
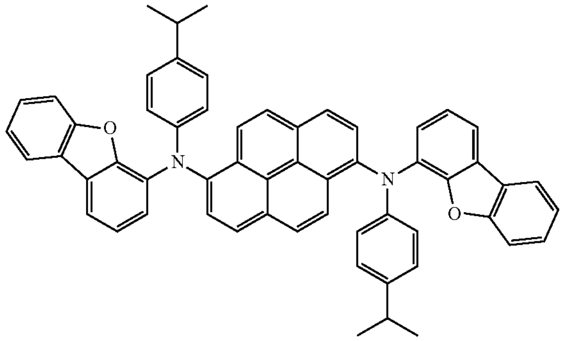
FD26
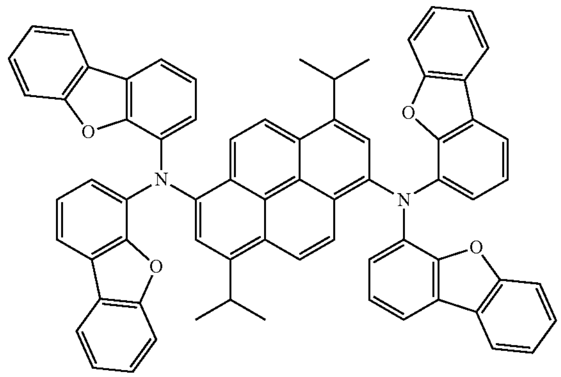
FD27
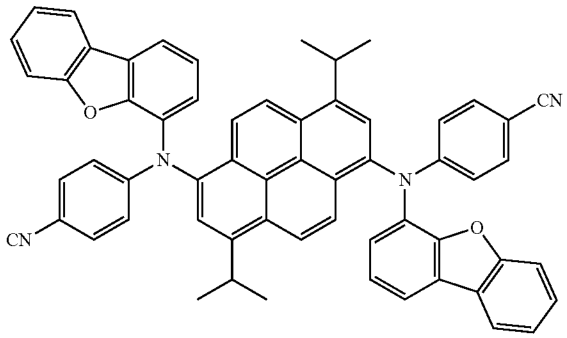
FD28
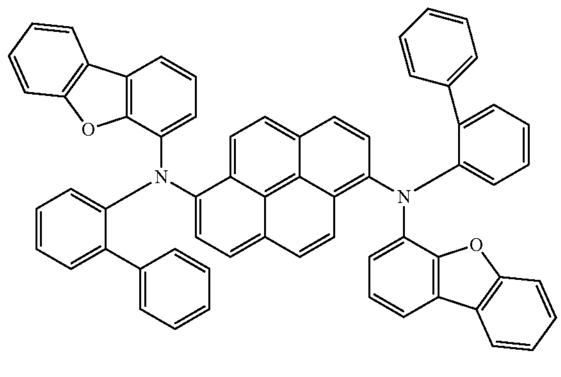

-continued
FD29
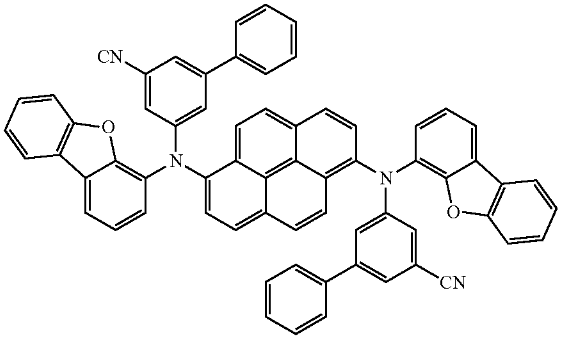
FD30
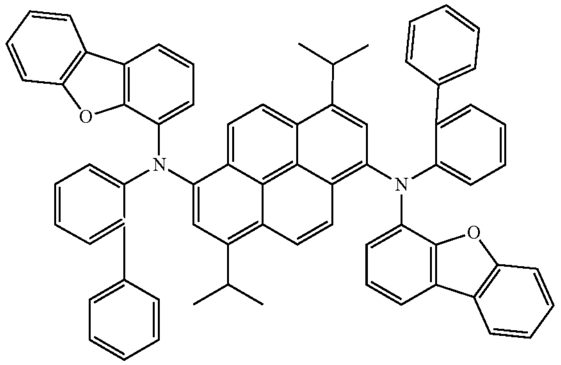
FD31
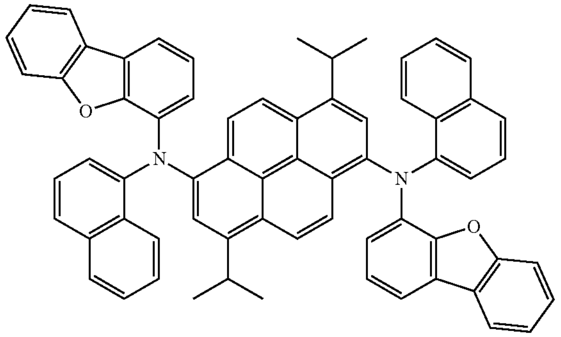
FD32
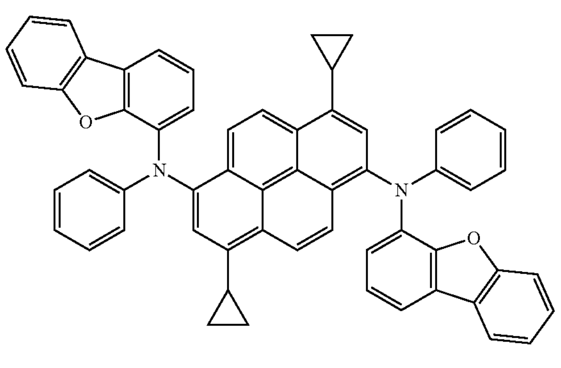
-continued
FD33
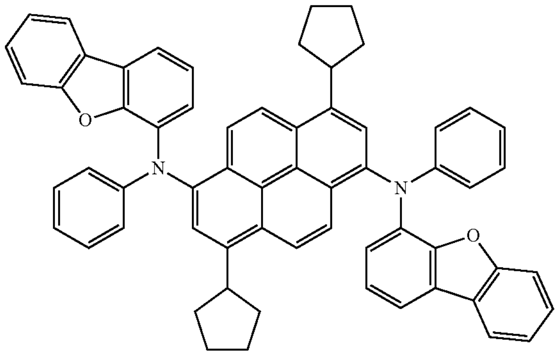
FD34
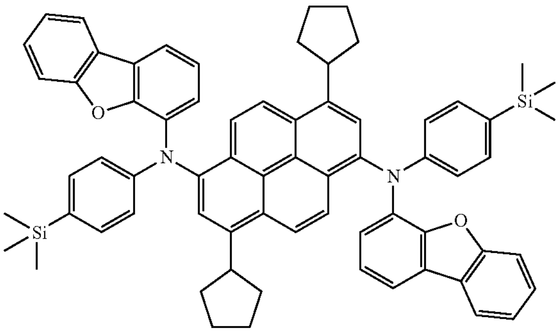
FD35
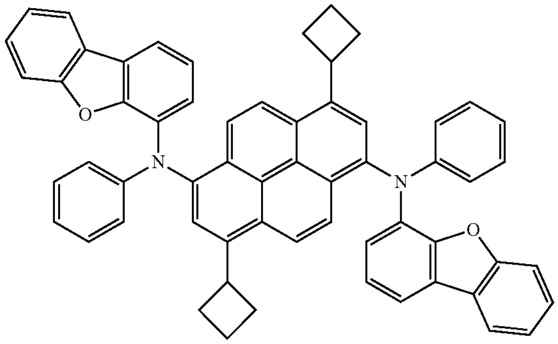
FD36
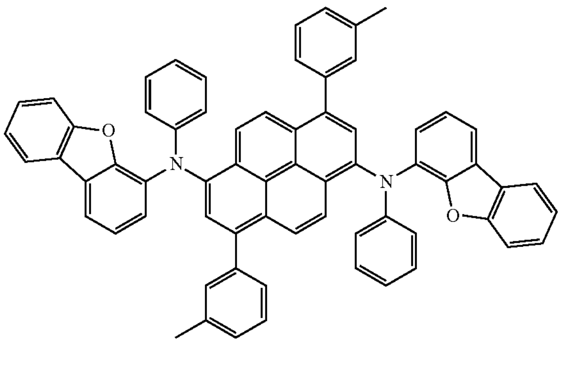
.

-continued

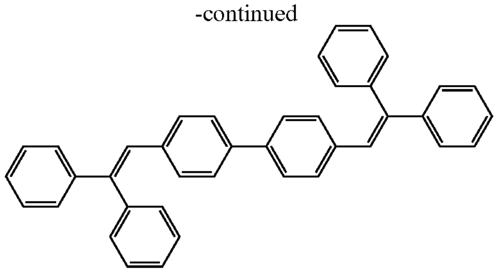

DPVBi

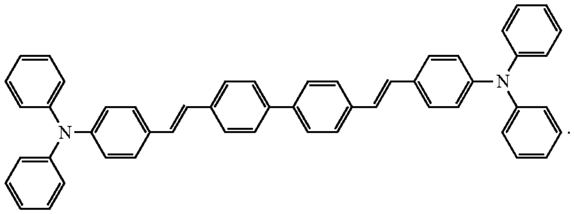

DPAVBi

In one or more embodiments, the fluorescent dopant and the auxiliary dopant may each independently include the fourth compound represented by Formula 502 or 503 as described in the present specification.

Delayed Fluorescence Material

The emission layer may include the fourth compound as described in the present specification, as a delayed fluorescence material.

In one or more embodiments, the emission layer may include the fourth compound, and may further include a delayed fluorescence material.

In the present specification, the delayed fluorescence material may be selected from compounds capable of emitting delayed fluorescent light based on a delayed fluorescence emission mechanism.

The delayed fluorescence material included in the emission layer may act as a host or a dopant depending on the other materials included in the emission layer.

In one or more embodiments, the difference between the triplet energy level (eV) of the delayed fluorescence material and the singlet energy level (eV) of the delayed fluorescence material may be greater than or equal to 0 eV and less than or equal to 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively (or suitably) occur, and thus, the luminescence efficiency of the light-emitting device 10 may be improved.

In one or more embodiments, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), and ii) a material including a $C_8$-$C_{60}$ polycyclic group in which two or more cyclic groups are condensed while sharing boron (B).

Examples of the delayed fluorescence material may include at least one of the following Compounds DF1 to DF9:

DF1

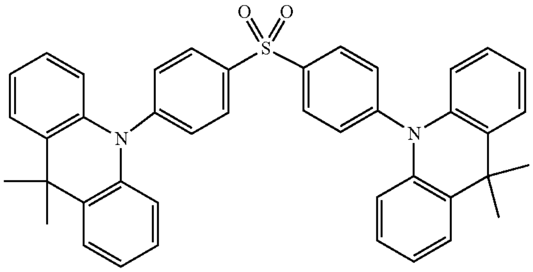

(DMAC-DPS)

DF2

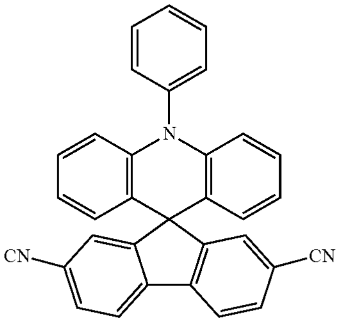

(ACRFLCN)

DF3

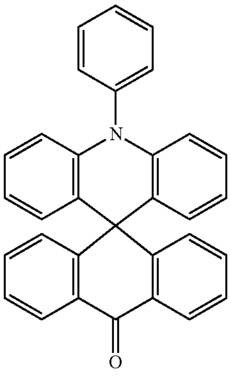

(ACRSA)

-continued

DF4

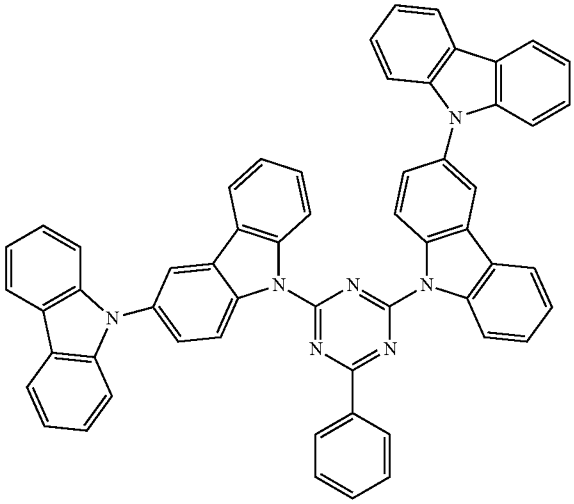

(CC2TA)

DF5

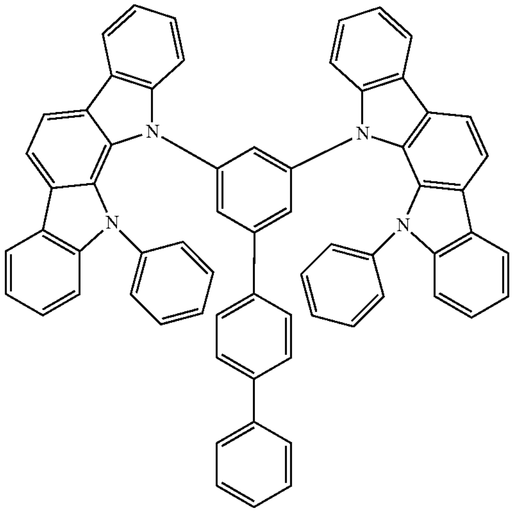

DF6

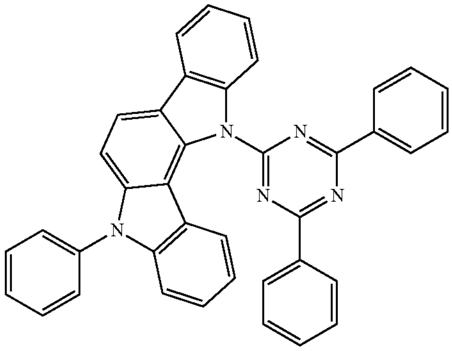

(PIC-TRZ2)

-continued

DF7

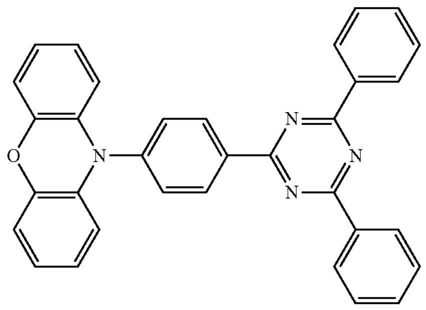

(PXZ-TRZ)

DF8

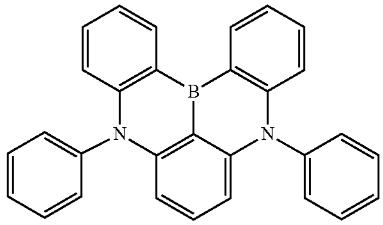

(DABNA-1)

DF9

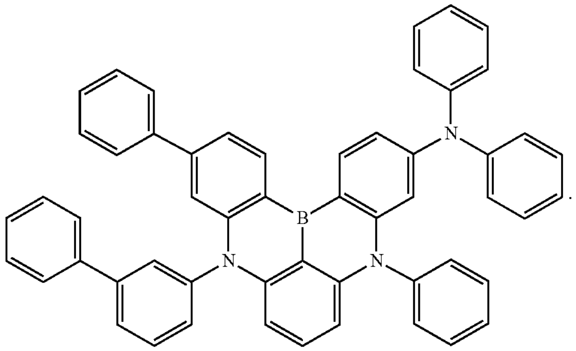

(DABNA-2)

Quantum Dot

The emission layer may include a quantum dot.

In the present specification, a quantum dot refers to a crystal of a semiconductor compound, and may include any suitable material capable of emitting light of various emission wavelengths according to the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

According to the wet chemical process, a precursor material is mixed with an organic solvent to grow a quantum dot particle crystal. When the crystal grows, the organic solvent naturally acts as a dispersant coordinated on the surface of the quantum dot crystal and controls the growth of the crystal so that the growth of quantum dot particles can be controlled through a process which is more easily performed than vapor deposition methods, such as metal organic chemical vapor deposition (MOCVD) and/or molecular beam epitaxy (MBE), and which requires low costs.

The quantum dot may include: a Group II-VI semiconductor compound; a Group III-V semiconductor compound;

a Group III-VI semiconductor compound; a Group I-III-VI semiconductor compound; a Group IV-VI semiconductor compound; a Group IV element, a Group IV compound; or any combination thereof.

Examples of the Group II-VI semiconductor compound may include: a binary compound, such as CdSe, CdTe, ZnS, ZnSe, ZnTe, ZnO, HgS, HgSe, HgTe, MgSe, and/or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS; a quaternary compound, such as CdZnSeS, CdZnSeTe, CdZnSTe, CdHgSeS, CdHgSeTe, CdHgSTe, HgZnSeS, HgZnSeTe, and/or HgZnSTe; or any combination thereof.

Examples of the Group III-V semiconductor compound may include: a binary compound, such as GaN, GaP, GaAs, GaSb, AlN, AlP, AlAs, AlSb, InN, InP, InAs, and/or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, and/or InPSb; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and/or InAlPSb; or any combination thereof. In one or more embodiments, the Group III-V semiconductor compound may further include Group II elements. Examples of the Group III-V semiconductor compound further including Group II elements may include InZnP, InGaZnP, InAlZnP, and the like.

Examples of the Group III-VI semiconductor compound may include: a binary compound, such as GaS, GaSe, $Ga_2Se_3$, GaTe, InS, InSe, $In_2S_3$, $In_2Se_3$, and/or InTe; a ternary compound, such as $InGaS_3$, and/or $InGaSe_3$; or any combination thereof.

Examples of the Group I-III-VI semiconductor compound may include: a ternary compound, such as AgInS, $AgInS_2$, CuInS, $CuInS_2$, $CuGaO_2$, $AgGaO_2$, and/or $AgAlO_2$; or any combination thereof.

Examples of the Group IV-VI semiconductor compound may include: a binary compound, such as SnS, SnSe, SnTe, PbS, PbSe, PbTe, and/or the like; a ternary compound, such as SnSeS, SnSeTe, SnSTe, PbSeS, PbSeTe, PbSTe, SnPbS, SnPbSe, SnPbTe, and/or the like; a quaternary compound, such as SnPbSSe, SnPbSeTe, SnPbSTe, and/or the like; or any combination thereof.

The Group IV element and the Group IV compound may include: a single element compound, such as Si and/or Ge; a binary compound, such as SiC and/or SiGe; or any combination thereof.

Each element included in a multi-element compound such as the binary compound, ternary compound and quaternary compound, may exist in a particle with a uniform concentration or non-uniform concentration.

In one or more embodiments, the quantum dot may have a single structure or a dual core-shell structure. In the case of the quantum dot having a single structure, the concentration of each element included in the corresponding quantum dot is uniform. In one or more embodiments, the material contained in the core and the material contained in the shell may be different from each other.

The shell of the quantum dot may act as a protective layer to prevent or reduce chemical degeneration of the core to maintain semiconductor characteristics and/or as a charging layer to impart electrophoretic characteristics to the quantum dot. The shell may be a single layer or a multi-layer. The element presented in the interface between the core and the shell of the quantum dot may have a concentration gradient that decreases toward the center of the quantum dot.

Examples of the shell of the quantum dot may be an oxide of metal, metalloid, and/or non-metal, a semiconductor compound, and any combination thereof. Examples of the oxide of metal, metalloid, and/or non-metal may include: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO; a ternary compound, such as $MgAl_2O_4$, $CoFe_2O_4$, $NiFe_2O_4$, and/or $CoMn_2O_4$; or any combination thereof. Examples of the semiconductor compound may include, as described herein, a Group II-VI semiconductor compound, a Group III-V semiconductor compound, a Group III-VI semiconductor compound, a Group I-III-VI semiconductor compound, a Group IV-VI semiconductor compound, or any combination thereof. In one or more embodiments, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be about 45 nm or less, for example, about 40 nm or less, for example, about 30 nm or less, and within any of these ranges, color purity and/or color reproducibility may be increased. In addition, because the light emitted through the quantum dot is emitted in all directions, the wide viewing angle can be improved.

The quantum dot may be a spherical particle, a pyramidal particle, a multi-arm particle, a cubic nanoparticle, a nanotube particle, a nanowire particle, a nanofiber particle, and/or a nanoplate particle.

Because the energy band gap can be adjusted by controlling the size of the quantum dot, light having various wavelength bands can be obtained from the quantum dot emission layer. Therefore, by using quantum dots of different sizes, a light-emitting device that emits light of various wavelengths may be implemented. In one or more embodiments, the size of the quantum dot may be selected to emit red, green, and/or blue light. In one or more embodiments, the size of the quantum dot may be configured to emit white light by combining light of various colors.

Electron Transport Region in Interlayer 130

The electron transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron transport region may include a buffer layer, a hole blocking layer, an electron control layer, an electron transport layer, an electron injection layer, or any combination thereof.

In one or more embodiments, the electron transport region may have an electron transport layer/electron injection layer structure, a hole-blocking layer/electron transport layer/electron injection layer structure, an electron control layer/electron transport layer/electron injection layer structure, or a buffer layer/electron transport layer/electron injection layer structure, wherein, for each structure, constituting layers are sequentially stacked from an emission layer.

In one or more embodiments, the electron transport region (for example, the buffer layer, the hole blocking layer, the electron control layer, and/or the electron transport layer in the electron transport region) may include a metal-free compound including at least one π electron-deficient nitrogen-containing $C_1$-$C_{60}$ cyclic group.

In one or more embodiments, the electron transport region may include a compound represented by Formula 601 below:

$$[Ar_{601}]_{xe11}\text{-}[(L_{601})_{xe1}\text{-}R_{601}]_{xe21},$$ Formula 601 wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_6$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $-Si(Q_{601})(Q_{602})(Q_{603})$, $-C(=O)(Q_{601})$, $-S(=O)_2(Q_{601})$, or $-P(=O)(Q_{601})(Q_{602})$, $Q_{601}$ to $Q_{603}$ are the same as described in connection with $Q_1$, xe21 may be 1, 2, 3, 4, or 5, and at least one selected from $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In one or more embodiments, when xe11 in Formula 601 is 2 or more, two or more of $Ar_{601}$(s) may be linked via a single bond.

In one or more embodiments, $Ar_{601}$ in Formula 601 may be a substituted or unsubstituted anthracene group.

In one or more embodiments, the electron transport region may include a compound represented by Formula 601-1:

Formula 601-1

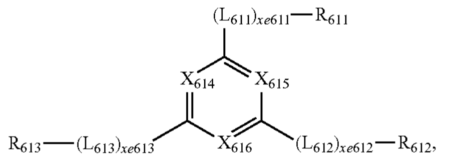

wherein, in Formula 601-1, $X_{614}$ may be N or $C(R_{614})$, $X_{615}$ may be N or $C(R_{615})$, $X_{616}$ may be N or $C(R_{616})$, at least one of $X_{614}$ to $X_{616}$ may be N, $L_{611}$ to $L_{613}$ are the same as described in connection with $L_{601}$, xe611 to xe613 are the same as described in connection with xe1, $R_{611}$ to $R_{613}$ are the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In one or more embodiments, xe1 and xe611 to xe613 in Formulae 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), Alq3, BAlq, TAZ, NTAZ, or any combination thereof:

ET1

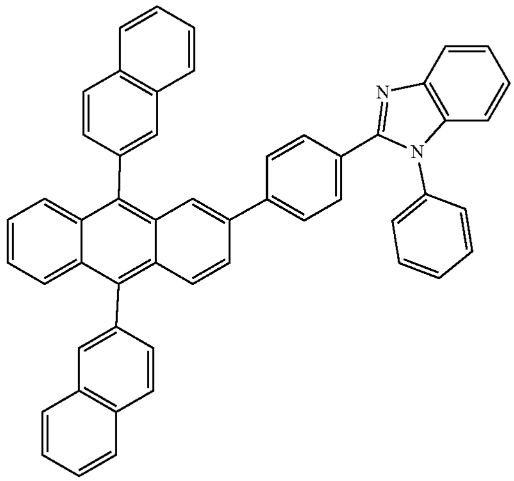

ET2

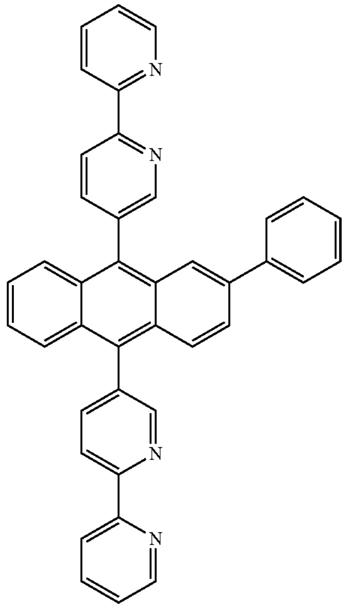

-continued
ET3
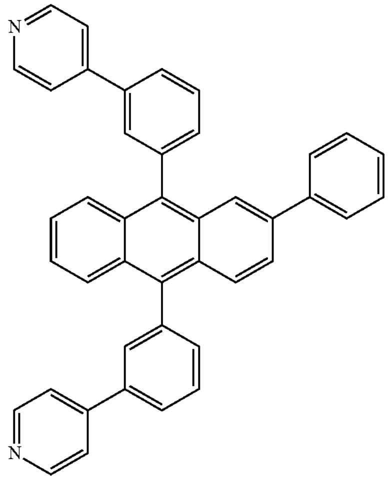
ET4
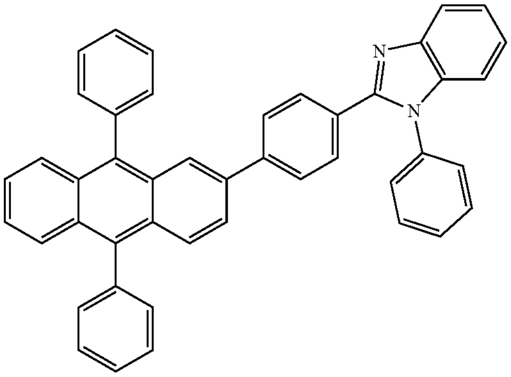
ET5
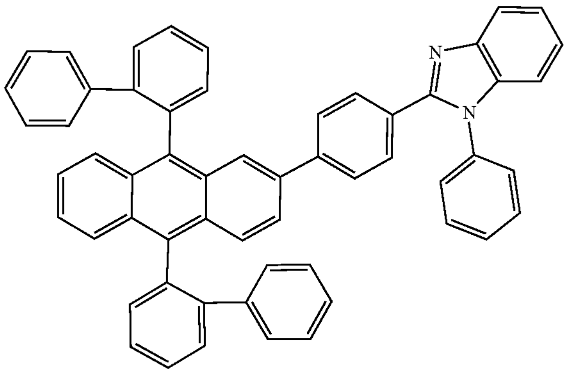
-continued
ET6
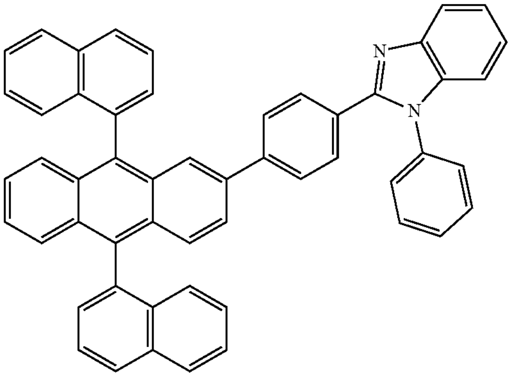
ET7
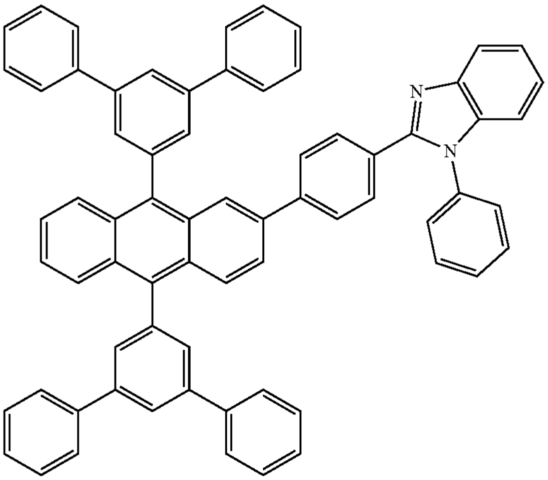
ET8
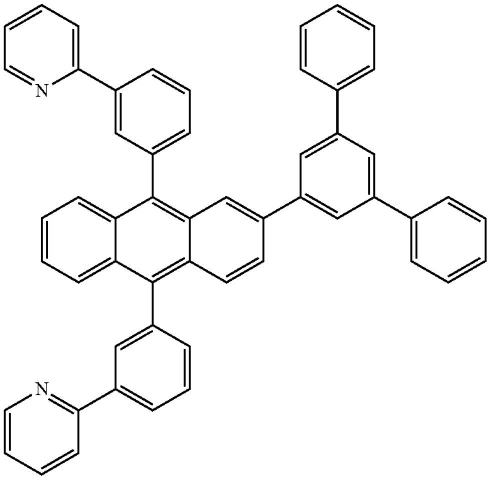

-continued
ET9
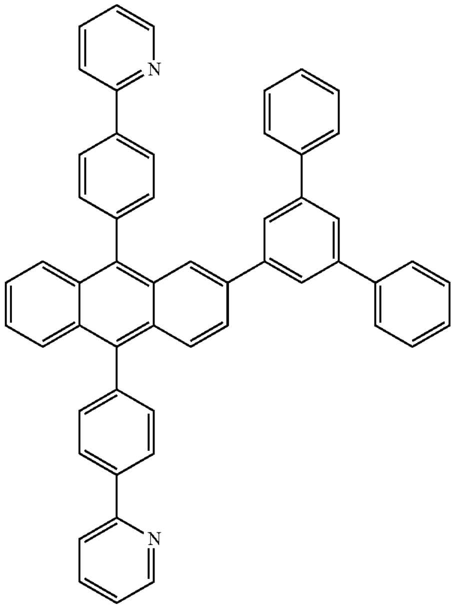
ET10
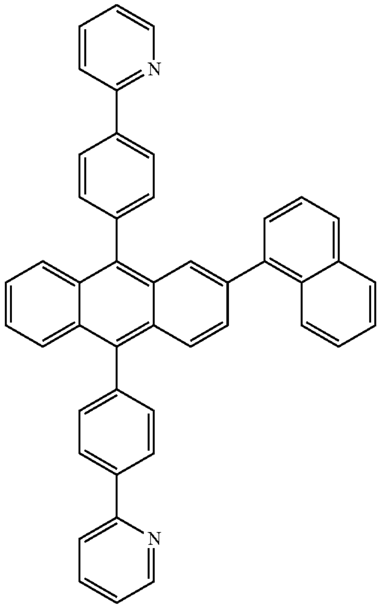
-continued
ET11
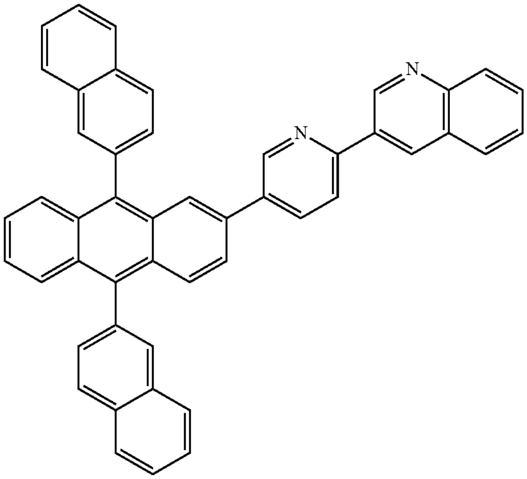
ET12
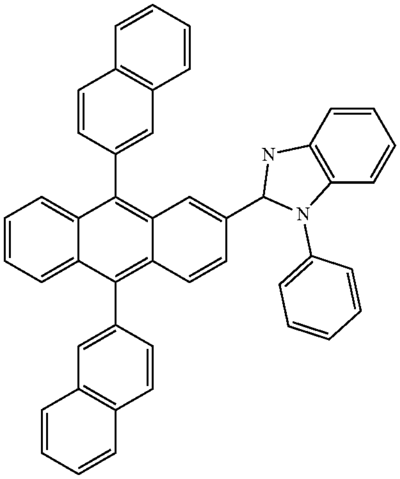
ET13
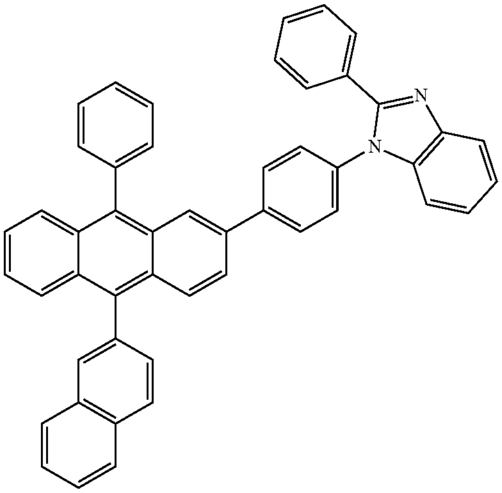

-continued
ET14
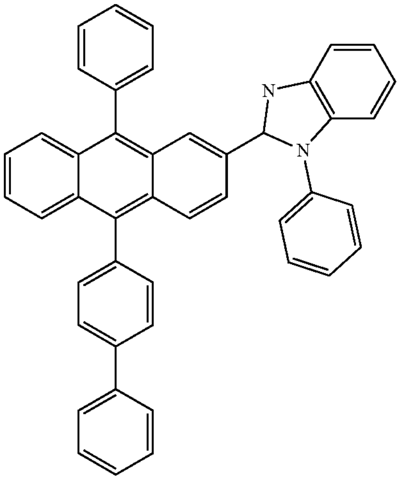
ET15
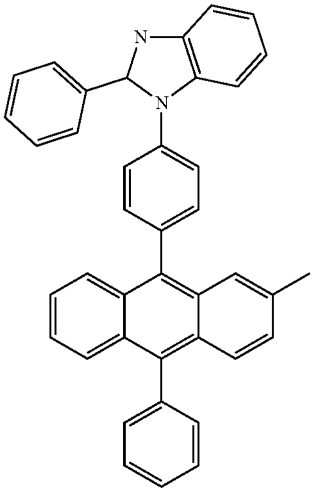
ET16
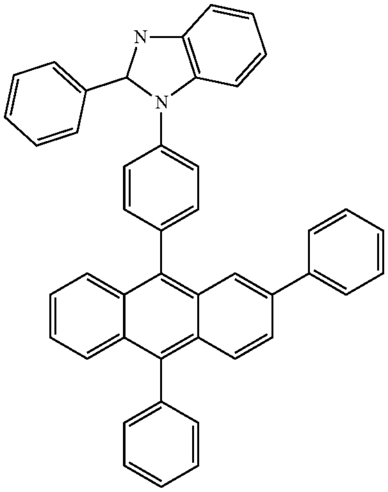
-continued
ET17
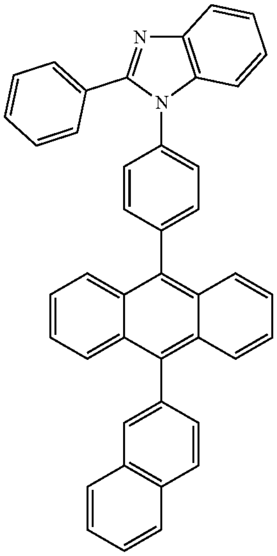
ET18
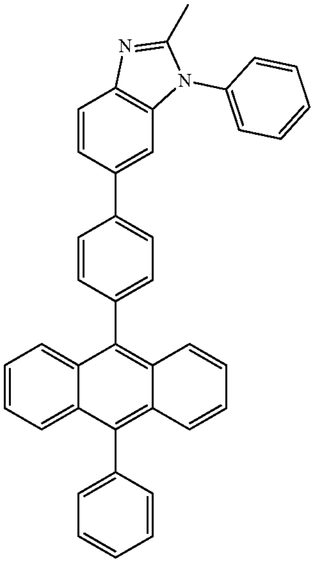
ET19
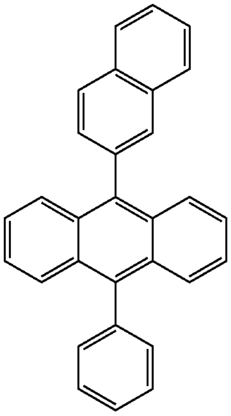

-continued
ET20
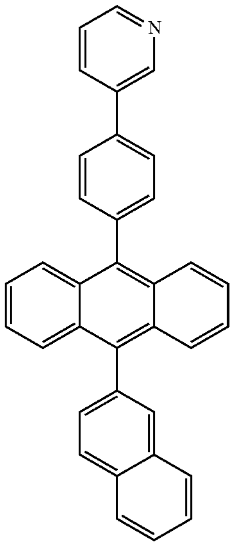
ET21
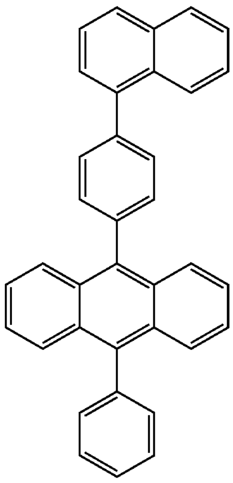
ET22
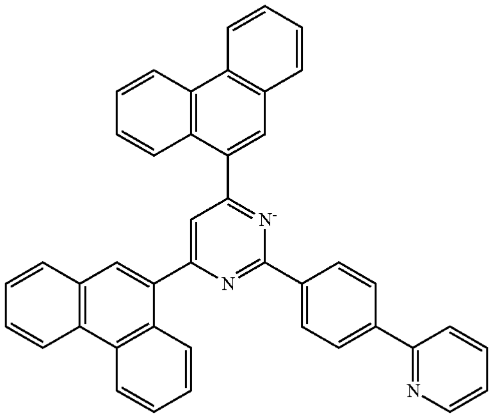
-continued
ET23
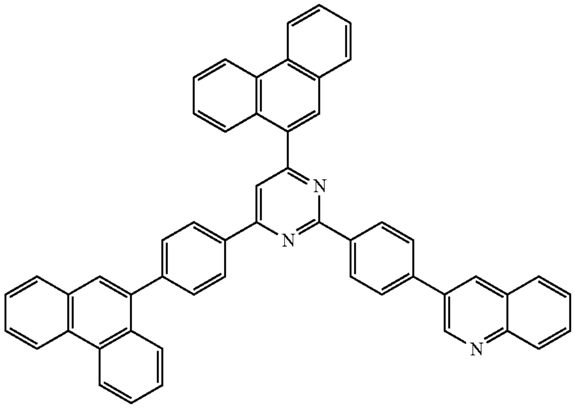
ET24
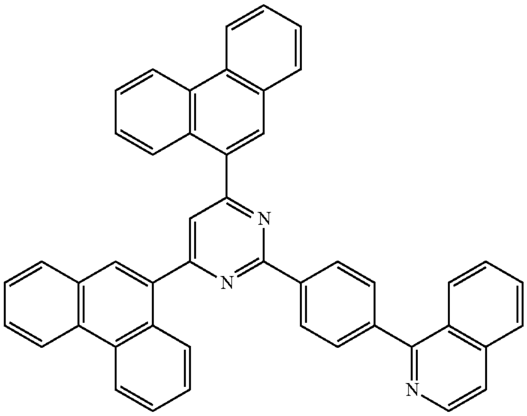
ET25
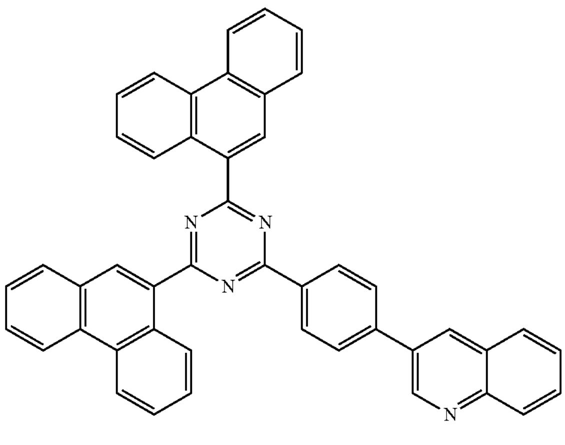

-continued
ET26
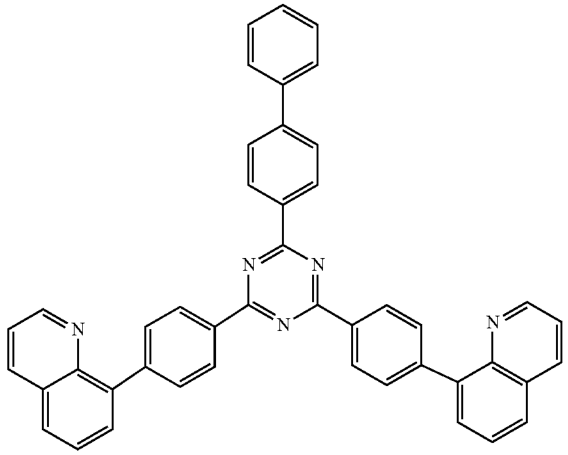
ET27
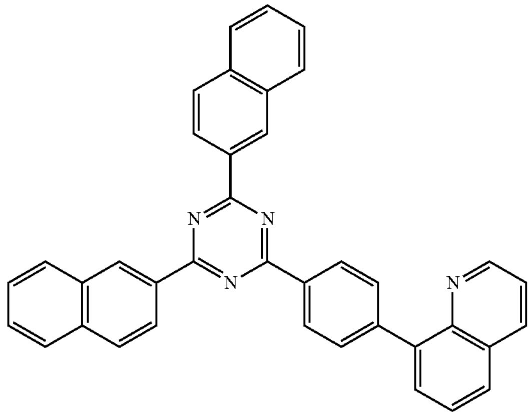
ET28
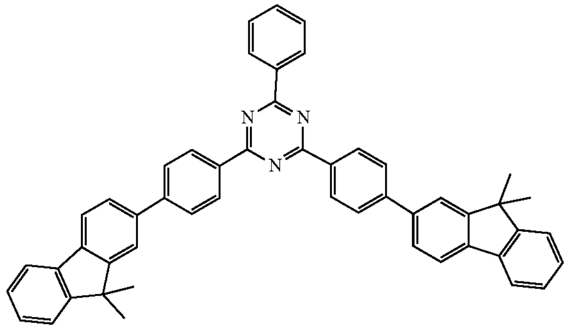
-continued
ET29
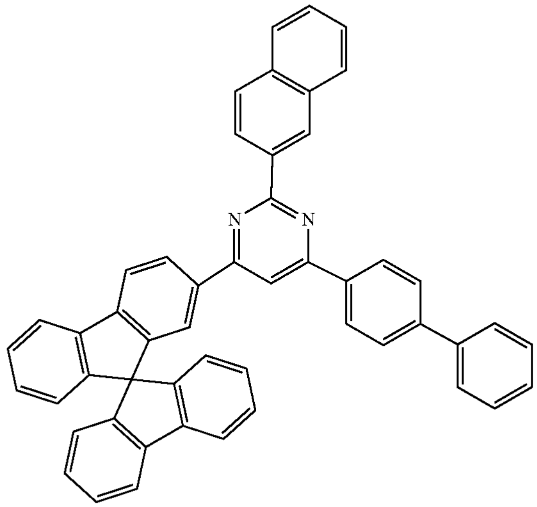
ET30
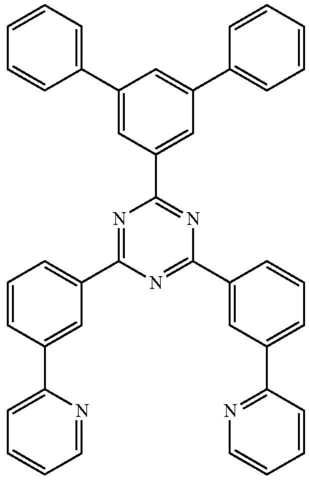
ET31
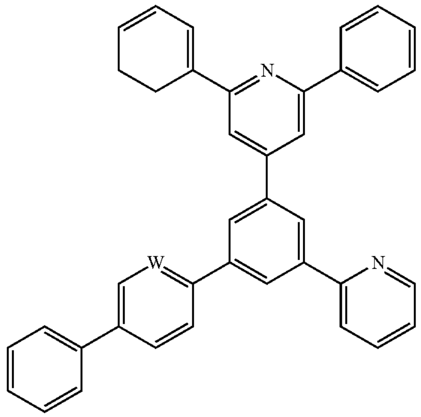

-continued
ET32
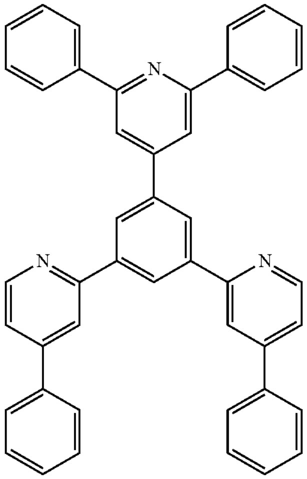
ET33
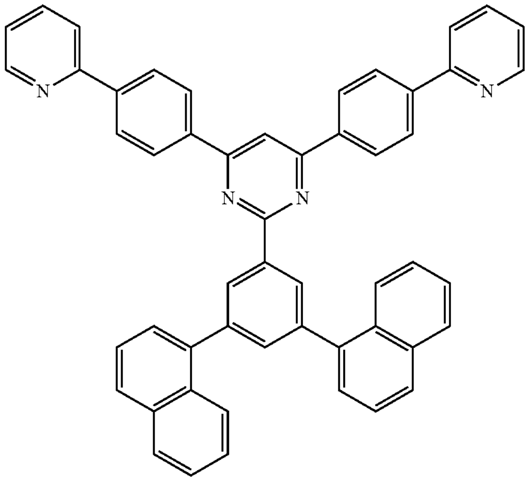
ET34
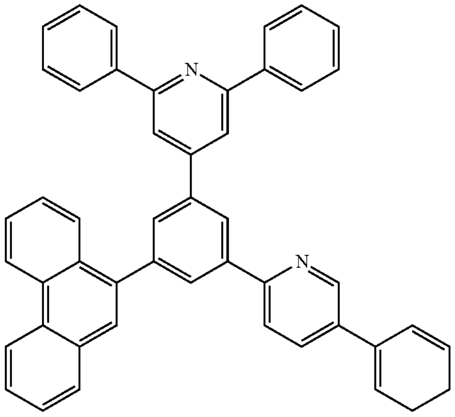
-continued
ET35
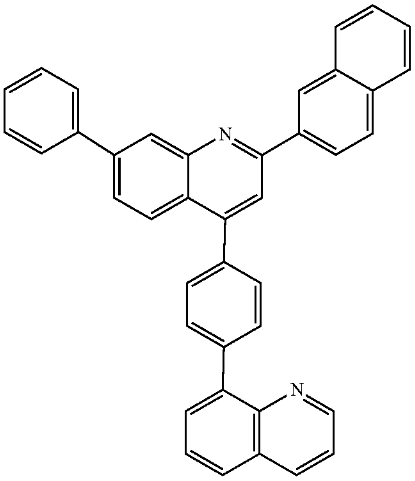
ET36
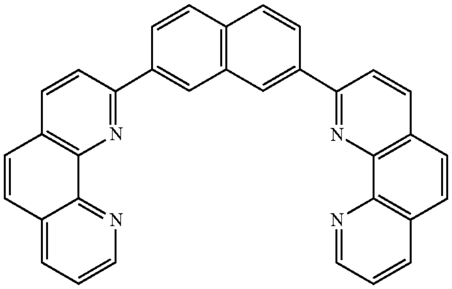
ET37
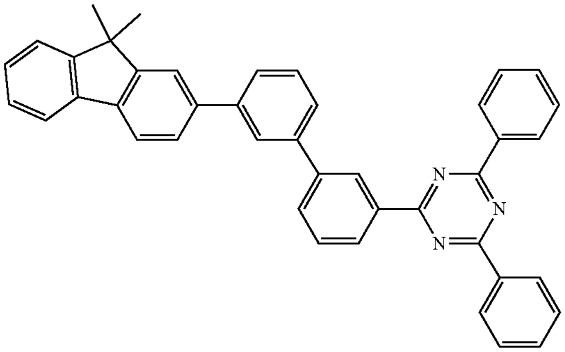
ET38
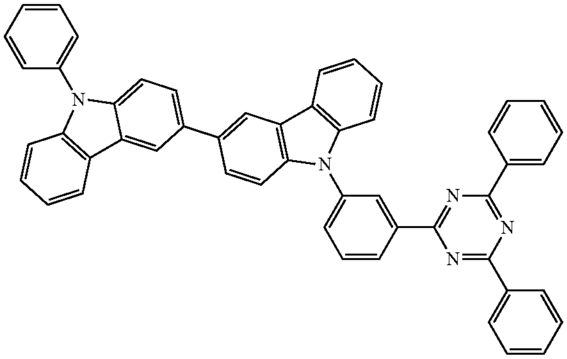

-continued
ET39
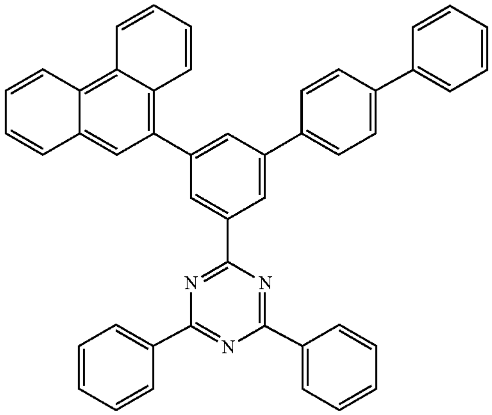
ET40
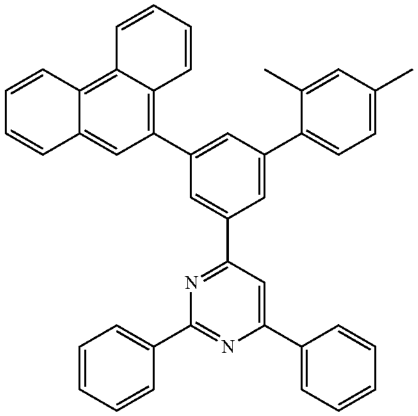
ET41
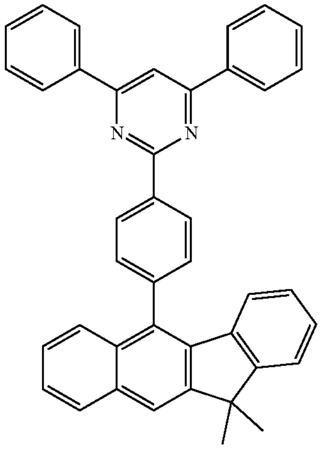
-continued
ET42
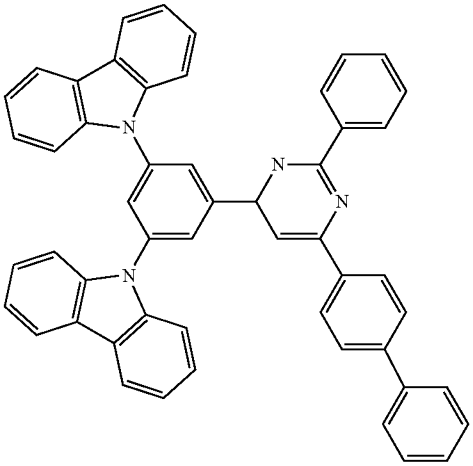
ET43
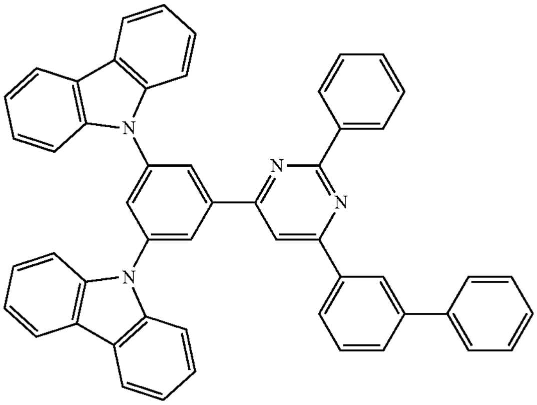
ET44
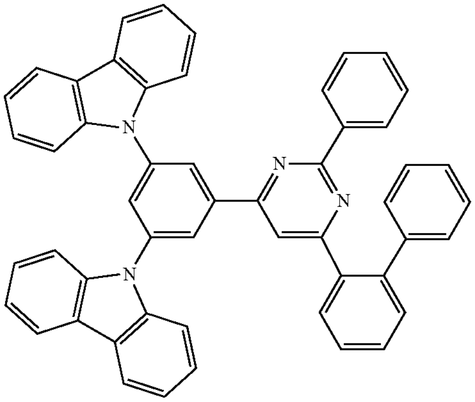
ET45
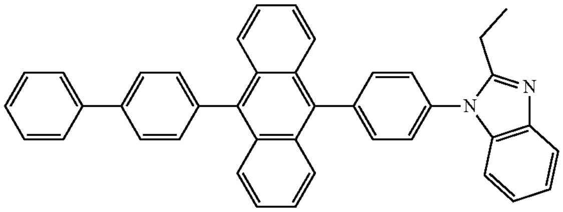

-continued

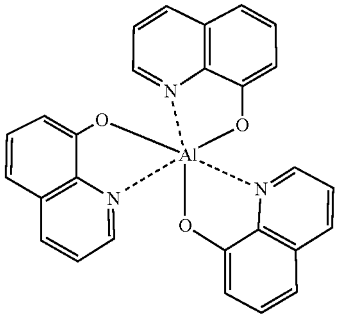

$Alq_3$

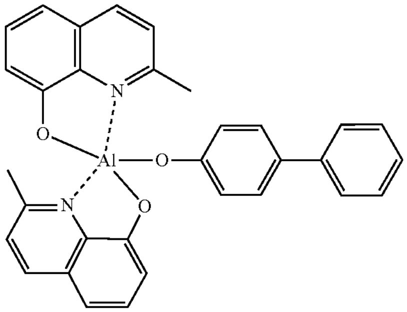

BAlq

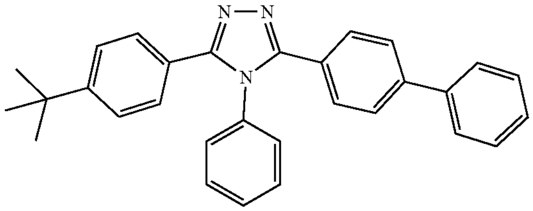

TAZ

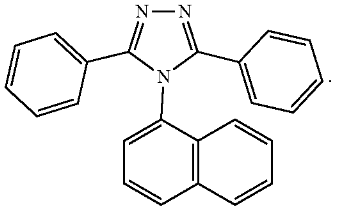

NTAZ

A thickness of the electron transport region may be from about 60 Å to about 5,000 Å, for example, from about 100 Å to about 4,000 Å. When the electron transport region includes a buffer layer, a hole blocking layer, an electron control layer, an electron transport layer, or any combination thereof, the thickness of the buffer layer, the hole blocking layer, and/or the electron control layer may each independently be from about 20 Å to about 1000 Å, for example, about 30 Å to about 300 Å, and the thickness of the electron transport layer may be from about 100 Å to about 1000 Å, for example, about 150 Å to about 500 Å. When the thicknesses of the buffer layer, hole blocking layer, electron control layer, electron transport layer and/or electron transport region are within their respective ranges, satisfactory (or suitable) electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may each independently include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In one or more embodiments, the metal-containing material may include a Li complex. The Li complex may include, for example, Compound ET-D1 (LiQ) and/or Compound ET-D2:

ET-D1

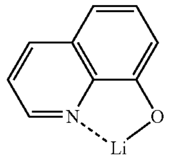

ET-D2

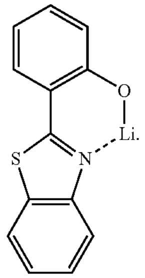

The electron transport region may include an electron injection layer that facilitates the injection of electrons from the second electrode 150. The electron injection layer may be in direct contact with the second electrode 150.

The electron injection layer may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include one or more oxides, halides (for example, fluorides, chlorides, bromides, and/or iodides), and/or tellurides of the alkali metal, the alkaline earth metal, and the rare earth metal, respectively, or any combination thereof.

The alkali metal-containing compound may include alkali metal oxides, such as $Li_2O$, $Cs_2O$, and/or $K_2O$; alkali metal halides, such as LiF, NaF, CsF, KF, LiI, NaI, CsI, and/or KI; or any combination thereof. The alkaline earth metal-containing compound may include an alkaline earth metal oxide, such as BaO, SrO, CaO, $Ba_xSr_{1-x}O$ (x is a real number satisfying the condition of $0<x<1$), $Ba_xCa_{1-x}O$ (x is a real number satisfying the condition of $0<x<1$), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In one or more embodiments, the rare earth metal-containing compound may include lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof.

The electron injection layer may include (e.g., may consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In one or more embodiments, the electron injection layer may further include an organic material (for example, a compound represented by Formula 601).

In one or more embodiments, the electron injection layer may include (e.g., may consist of): i) an alkali metal-containing compound (for example, an alkali metal halide); ii) a) an alkali metal-containing compound (for example, an alkali metal halide) and b) an alkali metal, an alkaline earth metal, a rare earth metal; or any combination thereof. In one or more embodiments, the electron injection layer may be a KI:Yb co-deposited layer, an RbI:Yb co-deposited layer, and/or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth-metal complex, the rare earth metal complex, or any combination thereof may be homogeneously or non-homogeneously dispersed in a matrix including the organic material.

A thickness of the electron injection layer may be in a range of about 1 Å to about 100 Å, and, for example, about 3 Å to about 90 Å. When the thickness of the electron injection layer is within any of the ranges described above, satisfactory (or suitable) electron injection characteristics may be obtained without a substantial increase in driving voltage.

Second Electrode 150

The second electrode 150 may be located on the interlayer 130 having such the structure according to embodiments of the present disclosure. The second electrode 150 may be a cathode, which is an electron injection electrode, and as the material for the second electrode 150, a metal, an alloy, an electrically conductive compound, or any combination thereof, each having a low work function, may be used (e.g., utilized).

In one or more embodiments, the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or a combination thereof. The second electrode 150 may be a transmissive electrode, a semi-transmissive electrode, or a reflective electrode.

The second electrode 150 may have a single-layered structure or a multi-layered structure including two or more layers.

Capping Layer

A first capping layer may be located outside the first electrode 110, and/or a second capping layer may be located outside the second electrode 150. In one or more embodiments, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in an emission layer of the interlayer 130 of the light-emitting device 10 may be extracted toward the outside through the first electrode 110, which is a semi-transmissive electrode or a transmissive electrode, and the first capping layer, or light generated in an emission layer of the interlayer 130 of the light-emitting device 10 may be extracted toward the outside through the second electrode 150, which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 10 is increased, so that the luminescence efficiency of the light-emitting device 10 may be improved.

Each of the first capping layer and second capping layer may include a material having a refractive index (at 589 nm) of 1.6 or more.

The first capping layer and the second capping layer may each independently be an organic capping layer including an organic material, an inorganic capping layer including an inorganic material, or an organic-inorganic composite capping layer including an organic material and an inorganic material.

At least one of the first capping layer or the second capping layer may each independently include one or more selected from carbocyclic compounds, heterocyclic compounds, amine group-containing compounds, porphyrin derivatives, phthalocyanine derivatives, naphthalocyanine derivatives, alkali metal complexes, alkaline earth metal complexes, and combinations thereof. The carbocyclic compound, the heterocyclic compound, and the amine group-containing compound may each independently be optionally substituted with a substituent containing O, N, S, Se, Si, F, Cl, Br, I, or any combination thereof. In one or more embodiments, at least one of the first capping layer and the second capping layer may each independently include an amine group-containing compound.

In one or more embodiments, at least one of the first capping layer and the second capping layer may each independently include a compound represented by Formula 201, a compound represented by Formula 202, or any combination thereof.

In one or more embodiments, at least one of the first capping layer and the second capping layer may each independently include one of Compounds HT28 to HT33, one of Compounds CP1 to CP6, β-NPB, or any combination thereof:

CP1

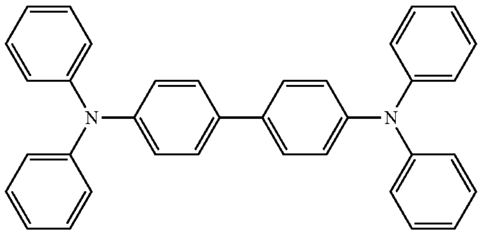

CP2

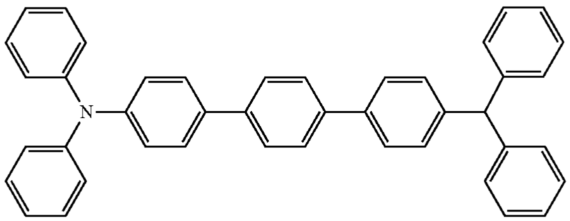

CP3

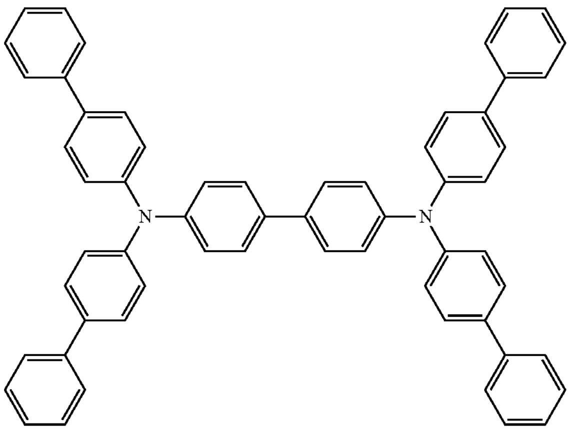

-continued

CP4

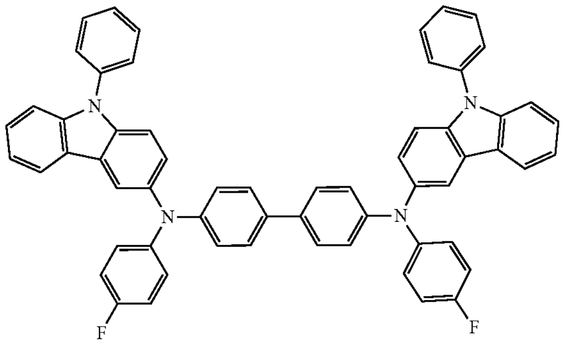

CP5

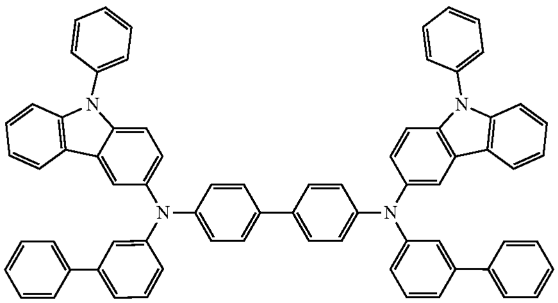

CP6

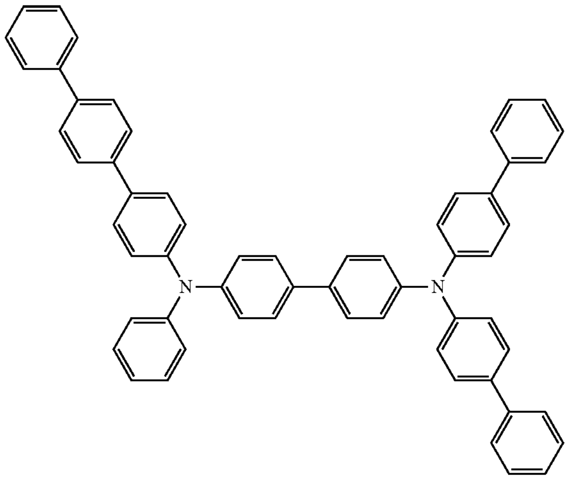

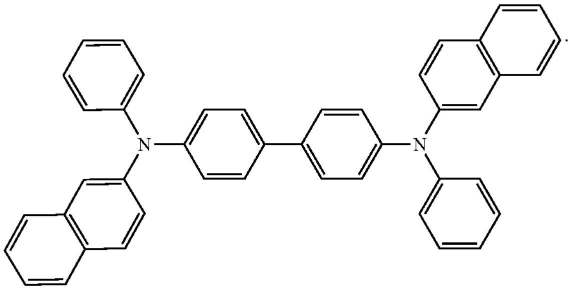

β-NPB

Film

The organometallic compound represented by Formula 1 may be included in various suitable films. Thus, according to one or more embodiments, a film including the organometallic compound represented by Formula 1 may be provided. The film may be, for example, an optical member (e.g., light control means) (for example, a color filter, a color conversion member, a capping layer, a light extraction efficiency enhancement layer, a selective light absorbing layer, a polarizing layer, and/or a quantum dot-containing layer), a light-blocking member (for example, a light reflective layer and/or a light absorbing layer), a protective member (for example, an insulating layer and/or a dielectric layer).

Electronic Apparatus

The light-emitting device may be included in various suitable electronic apparatuses. In one or more embodiments, the electronic apparatus including the light-emitting device may be a light-emitting apparatus, an authentication apparatus, and/or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. In one or more embodiments, light emitted from the light-emitting device may be blue light or white light. The light-emitting device may be the same as described above. In one or more embodiments, the color conversion layer may include quantum dots. The quantum dot may be, for example, a quantum dot as described herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel-defining layer may be located among the subpixel areas to define each of the subpixel areas.

The color filter may further include a plurality of color filter areas and light-shielding patterns located among (or between) the color filter areas, and the color conversion layer may include a plurality of color conversion areas and light-shielding patterns located among (or between) the color conversion areas.

The color filter areas (or the color conversion areas) may include a first area to emit first color light, a second area to emit second color light, and/or a third area to emit third color light, and the first color light, the second color light, and/or the third color light may have different maximum emission wavelengths from one another. In one or more embodiments, the first color light may be red light, the second color light may be green light, and the third color light may be blue light. In one or more embodiments, the color filter areas (or the color conversion areas) may include quantum dots. In one or more embodiments, the first area may include a red quantum dot, the second area may include a green quantum dot, and the third area may not include a quantum dot. The quantum dot is the same as described in the present specification. The first area, the second area, and/or the third area may each further include a scatterer.

In one or more embodiments, the light-emitting device may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum emission wavelengths. For example, the first light may be blue light, the first first-color light may be red light, the second first-color light may be green light, and the third first-color light may be blue light.

The electronic apparatus may further include a thin-film transistor, in addition to the light-emitting device as described above. The thin-film transistor may include a source electrode, a drain electrode, and an activation layer, wherein any one of the source electrode and the drain electrode may be electrically connected (e.g., electrically coupled) to any one of the first electrode and the second electrode of the light-emitting device.

The thin-film transistor may further include a gate electrode, a gate insulating film, etc.

The activation layer may include crystalline silicon, amorphous silicon, organic semiconductor, oxide semiconductor, and/or the like.

The electronic apparatus may further include a sealing portion for sealing the light-emitting device. The sealing portion and/or the color conversion layer may be located between the color filter and the light-emitting device. The sealing portion allows light from the light-emitting device to be extracted to the outside, while simultaneously (e.g., concurrently or at the same time) preventing or reducing ambient air and/or moisture from penetrating into the light-emitting device. The sealing portion may be a sealing substrate including a transparent glass substrate and/or a plastic substrate. The sealing portion may be a thin-film encapsulation layer including at least one layer of an organic layer and/or an inorganic layer. When the sealing portion is a thin film encapsulation layer, the electronic apparatus may be flexible.

Various suitable functional layers may be additionally located on the sealing portion, in addition to the color filter and/or the color conversion layer, according to the use of the electronic apparatus. The functional layers may include a touch screen layer, a polarizing layer, and/or the like. The touch screen layer may be a pressure-sensitive touch screen layer, a capacitive touch screen layer, and/or an infrared touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device, a biometric information collector.

The electronic apparatus may be applied to various suitable displays, light sources, lighting, personal computers (for example, a mobile personal computer), mobile phones, digital cameras, electronic diaries, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, various suitable measuring instruments, meters (for example, meters for a vehicle, an aircraft, and/or a vessel), projectors, and/or the like.

Figure 2:
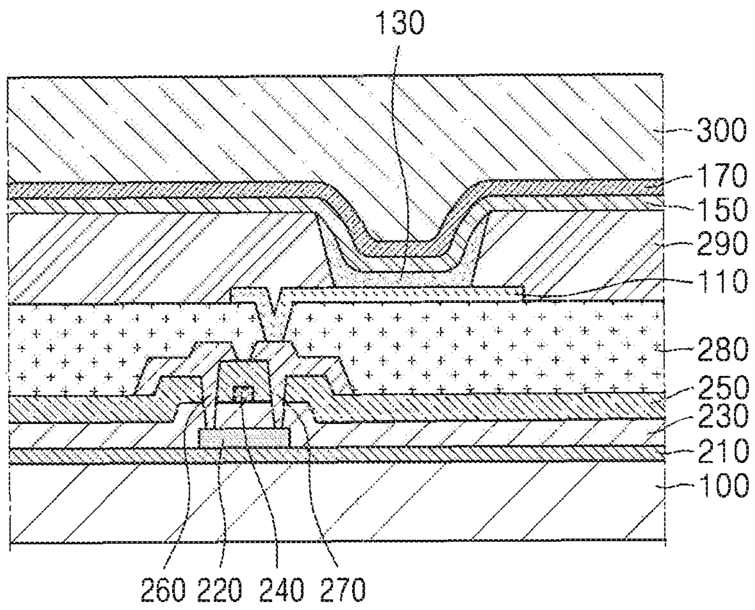
FIGS. 2 and 3 are each a cross-sectional view of a light-emitting apparatus according to one or more embodiments.
Figure 3:
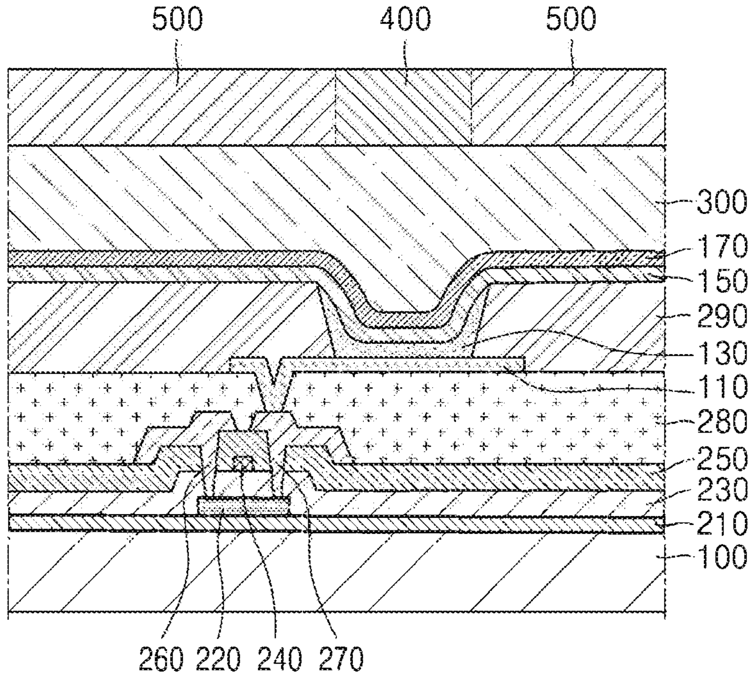

Description of FIGS. 2 and 3

FIG. 2 is a cross-sectional view of a light-emitting apparatus according to one or more embodiments of the disclosure.

The light-emitting apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, and/or a metal substrate. A buffer layer 210 may be formed on the substrate 100. The buffer layer 210 may prevent or reduce the penetration of impurities through the substrate 100 and may provide a flat surface on the substrate 100.

A TFT may be located on the buffer layer 210. The TFT may include an activation layer 220, a gate electrode 240, a source electrode 260, and a drain electrode 270.

The activation layer 220 may include an inorganic semiconductor such as silicon and/or polysilicon, an organic semiconductor, and/or an oxide semiconductor, and may include a source region, a drain region and a channel region.

A gate insulating film 230 for insulating the activation layer 220 from the gate electrode 240 may be located on the activation layer 220, and the gate electrode 240 may be located on the gate insulating film 230.

An interlayer insulating film 250 may be located on the gate electrode 240. The interlayer insulating film 250 may be placed between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be in contact with the exposed portions of the source region and the drain region of the activation layer 220.

The TFT is electrically connected (e.g., electrically coupled) to a light-emitting device to drive the light-emitting device, and is covered by a passivation layer 280. The passivation layer 280 may include an inorganic insulating film, an organic insulating film, or a combination thereof. A light-emitting device is provided on the passivation layer 280. The light-emitting device may include a first electrode 110, an interlayer 130, and a second electrode 150.

The first electrode 110 may be formed on the passivation layer 280. The passivation layer 280 does not completely cover the drain electrode 270 and exposes a portion of the drain electrode 270, and the first electrode 110 may be connected (e.g., electrically coupled) to the exposed portion of the drain electrode 270.

A pixel-defining layer 290 containing an insulating material may be located on the first electrode 110. The pixel-defining layer 290 exposes a region of the first electrode 110, and an interlayer 130 may be formed in the exposed region of the first electrode 110. The pixel-defining layer 290 may be a polyimide and/or polyacrylic organic film. In one or more embodiments, at least some layers of the interlayer 130 may extend beyond the upper portion of the pixel-defining layer 290 to be located in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture and/or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE), and/or the like), or a combination thereof; or a combination of the inorganic film and the organic film.

FIG. 3 is a cross-sectional view of a light-emitting apparatus according to one or more embodiments of the disclosure.

The light-emitting apparatus of FIG. 3 is the same as the light-emitting apparatus of FIG. 2, except that a light-shielding pattern 500 and a functional region 400 are additionally located on the encapsulation portion 300. The functional region 400 may be i) a color filter area, ii) a color conversion area, or iii) a combination of the color filter area and the color conversion area. In one or more embodiments, the light-emitting device included in the light-emitting apparatus of FIG. 3 may be a tandem light-emitting device.

Manufacture Method

Respective layers included in the hole transport region, the emission layer, and respective layers included in the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, the emission layer, and layers constituting the electron transport region are each independently formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definition of Terms

The term "$C_3$-$C_{60}$ carbocyclic group" as used herein refers to a cyclic group consisting of carbon atoms only as ring-forming atoms and having three to sixty carbon atoms, and the term "$C_1$-$C_{60}$ heterocyclic group" as used herein refers to a cyclic group that has one to sixty carbon atoms and further has, in addition to carbon, a heteroatom as a ring-forming atom. The $C_3$-$C_{60}$ carbocyclic group and the $C_1$-$C_{60}$ heterocyclic group may each independently be a monocyclic group consisting of one ring or a polycyclic group in which two or more rings are condensed with each other. In one or more embodiments, the $C_1$-$C_{60}$ heterocyclic group has 3 to 61 ring-forming atoms.

The "cyclic group" as used herein may include the $C_3$-$C_{60}$ carbocyclic group and the $C_1$-$C_{60}$ heterocyclic group.

The term "π electron-rich $C_3$-$C_{60}$ cyclic group" as used herein refers to a cyclic group that has three to sixty carbon atoms and does not include *—N═*' as a ring-forming moiety, and the term "π electron-deficient nitrogen-containing $C_1$-$C_{60}$ cyclic group" as used herein refers to a heterocyclic group that has one to sixty carbon atoms and includes *—N═*' as a ring-forming moiety.

In one or more embodiments, the $C_3$-$C_{60}$ carbocyclic group may be i) group T1 or ii) a condensed cyclic group in which two or more groups T1 are condensed with each other (for example, the $C_3$-$C_{60}$ carbocyclic group may be a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, an indenoanthracene group, etc.), the $C_1$-$C_{60}$ heterocyclic group may be i) group T2, ii) a condensed cyclic group in which two or more groups T2 are condensed with each other, or iii) a condensed cyclic group in which at least one group T2 and at least one group T1 are condensed with each other (for example, the $C_1$-$C_{60}$ heterocyclic group may be a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) group T1, ii) a condensed cyclic group in which two or more groups T1 are condensed with each other, iii) group T3, iv) a condensed cyclic group in which two or more groups T3 are condensed with each other, or v) a condensed cyclic group in which at least one group T3 and at least one group T1 are condensed with each other (for example, the π electron-rich $C_3$-$C_{60}$ cyclic group may be the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) group T4, ii) a condensed cyclic group in which two or more group T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with one another (for example, the π electron-deficient nitrogen-containing $C_1$-$C_{60}$ cyclic group may be a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, group T3 may be a furan group, a thiophene group, a 1H-pyrrole group, a silole group, or a borole group, and group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may refer to a group condensed to any cyclic group or a polyvalent group (for example, a divalent group, a trivalent group, a tetravalent group, etc.), depending on the structure of a formula in connection with which the terms are used. In one or more embodiments, "a benzene group" may be a benzo group, a phenyl group, a phenylene group, and/or the like, which may be easily understood by one of ordinary skill in the art according to the structure of a formula including the "benzene group."

Examples of the monovalent $C_3$-$C_{60}$ carbocyclic group and the monovalent $C_1$-$C_6$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group that has one to sixty carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having the same structure as the $C_1$-$C_6$ alkyl group.

The term "$C_2$-$C_{60}$ alkenyl group" as used herein refers to a monovalent hydrocarbon group having at least one carbon-carbon double bond in the middle and/or at the terminus of the $C_2$-$C_{60}$ alkyl group, and examples thereof may include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle and/or at the terminus of the $C_2$-$C_{60}$ alkyl group, and examples thereof may include an ethynyl group and a propynyl group. The term "$C_2$-$C_6$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{11}$ is the $C_1$-$C_{60}$ alkyl group), and examples thereof may include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group that further includes, in addition to carbon atom(s) (e.g., 1 to 10 carbon atoms), at least one heteroatom as a ring-forming atom, and examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" used herein refers to a monovalent cyclic group that has three to ten carbon atoms and at least one carbon-carbon double bond in the ring thereof and no aromaticity, and examples thereof may include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group that has, in addition to carbon atom(s) (e.g., 1 to 10 carbon atoms), at least one heteroatom as a ring-forming atom, and at least one carbon-carbon double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having six to sixty carbon atoms. The term "$C_6$-$C_{60}$ arylene group" as used herein refers to a divalent group having the same structure as the $C_6$-$C_{60}$ aryl group. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each independently include two or more rings, the respective rings may be condensed with each other.

The term "$C_1$-$C_{60}$ heteroaryl group" as used herein refers to a monovalent group having a heterocyclic aromatic system that has, in addition to carbon atom(s), at least one heteroatom as a ring-forming atom, and 1 to 60 carbon atoms. The term "$C_1$-$C_{60}$ heteroarylene group" as used herein refers to a divalent group having the same structure as the $C_1$-$C_{60}$ heteroaryl group. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each independently include two or more rings, the respective rings may be condensed with each other.

The term "monovalent non-aromatic condensed polycyclic group" as used herein refers to a monovalent group having two or more rings condensed to each other, only carbon atoms (for example, having 8 to 60 carbon atoms) as ring-forming atoms, and no aromaticity in its molecular structure when considered as a whole. Examples of the monovalent non-aromatic condensed polycyclic group may include an indenyl group, a fluorenyl group, a spiro-bifluorenyl group, a benzofluorenyl group, an indenophenanthrenyl group, and an indeno anthracenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group having two or more rings condensed to each other, at least one heteroatom other than carbon atoms (for example, having 1 to 60 carbon atoms), as a ring-forming atom, and non-aromaticity in its molecular structure when considered as a whole. Examples of the monovalent non-aromatic condensed heteropolycyclic group may include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having the same structure as the monovalent non-aromatic condensed heteropolycyclic group.

The term "$C_6$-$C_{60}$ aryloxy group" as used herein refers to a group represented by —$OA_{102}$ (wherein $A_{102}$ is the $C_6$-$C_{60}$ aryl group), and the term "$C_6$-$C_{60}$ arylthio group" as used herein refers to a group represented by —$SA_{103}$ (wherein $A_{103}$ is the $C_6$-$C_{60}$ aryl group).

The term "$C_7$-$C_{60}$ aryl alkyl group" used herein refers to a group represented by -$A_{104}A_{105}$ (where $A_{104}$ may be a $C_1$-$C_{54}$ alkylene group, and $A_{105}$ may be a $C_6$-$C_{59}$ aryl group), and the term "$C_2$-$C_{60}$ heteroaryl alkyl group" used herein refers to a group represented by -$A_{106}A_{107}$ (where $A_{106}$ may be a $C_1$-$C_{59}$ alkylene group, and $A_{107}$ may be a $C_1$-$C_{59}$ heteroaryl group).

$R_{10a}$ may be:

deuterium (-D), —F, —Cl, —Br, —I, a hydroxyl group, a cyano group, or a nitro group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_6$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

$Q_1$ to $Q_3$, $Q_{11}$ to $Q_{13}$, $Q_{21}$ to $Q_{23}$, and $Q_{31}$ to $Q_{33}$ used herein may each independently be: hydrogen; deuterium; —F; —Cl; —Br; —I; a hydroxyl group; a cyano group; a nitro group; a $C_1$-$C_6$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

The term "heteroatom" as used herein refers to any atom other than a carbon atom. Examples of the heteroatom may include O, S, N, P, Si, B, Ge, Se, and any combination thereof.

The term "the third-row transition metal" used herein includes hafnium (Hf), tantalum (Ta), tungsten (W), rhenium (Re), osmium (Os), iridium (Ir), platinum (Pt), gold (Au), and the like.

The term "Ph" as used herein refers to a phenyl group, the term "Me" as used herein refers to a methyl group, the term "Et" as used herein refers to an ethyl group, the term "ter-Bu" or "$Bu^t$" as used herein refers to a tert-butyl group, and the term "OMe" as used herein refers to a methoxy group.

The term "biphenyl group" as used herein refers to "a phenyl group substituted with a phenyl group." For example, the "biphenyl group" may be a substituted phenyl group having a $C_6$-$C_{60}$ aryl group as a substituent.

The term "terphenyl group" as used herein refers to "a phenyl group substituted with a biphenyl group". For example, the "terphenyl group" may be a substituted phenyl group having, as a substituent, a $C_6$-$C_{60}$ aryl group substituted with a $C_6$-$C_{60}$ aryl group.

* and *' as used herein, unless defined otherwise, each refer to a binding site to a neighboring atom in a corresponding formula or moiety.

Hereinafter, a compound and light-emitting device according to one or more embodiments of the disclosure will be described in more detail with reference to Synthesis Examples and Examples. The wording "B was used instead of A" used in describing Synthesis Examples refers to an identical molar equivalent of B being used in place of A.

EXAMPLES

Synthesis Example 1: Synthesis of Compound 1

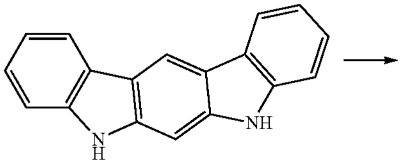

1-1

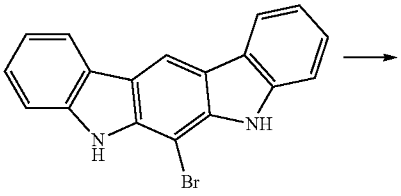

1-2

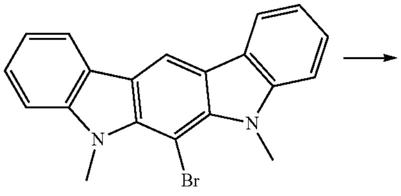

1-3

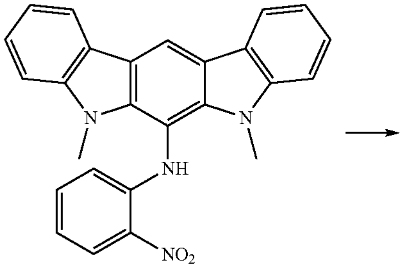

1-4

-continued

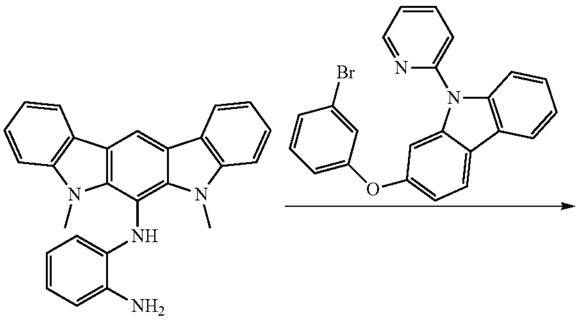

1-5

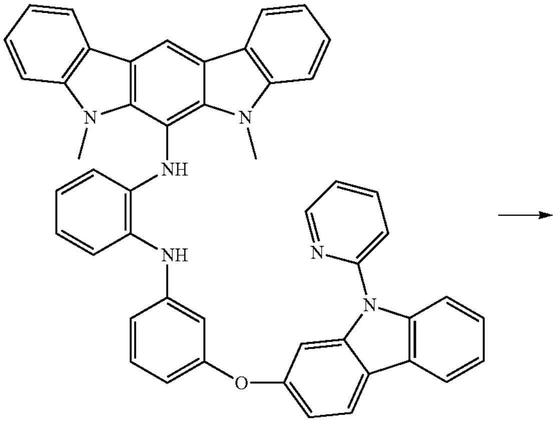

1-6

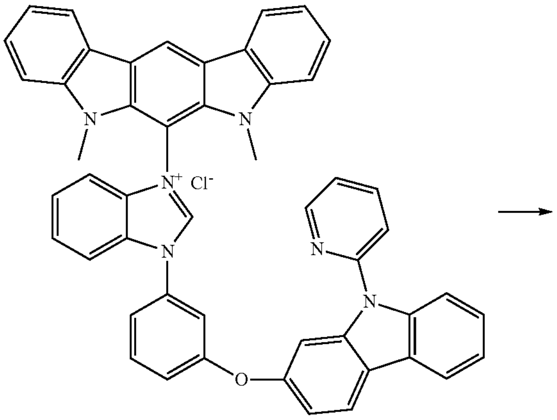

1-7

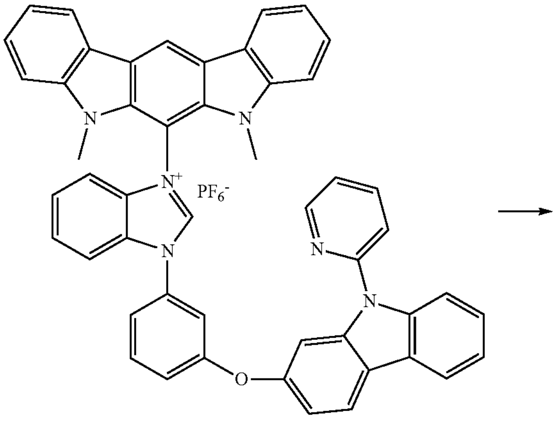

1-8

-continued

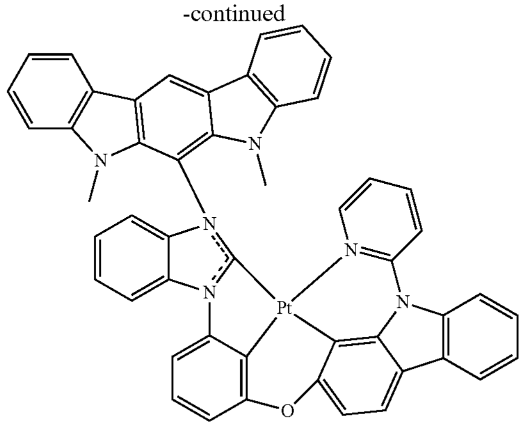

1

1) Synthesis of Intermediate 1-2

2.56 g (10 mmol) of 5,7-dihydroindolo-[2,3-b]carbazole was dissolved in methylene chloride, and 1.78 g (10 mmol) of N-bromosuccinimide was added dropwise thereto. After stirring the resultant at room temperature for an hour, a solvent was removed therefrom under reduced pressure, and an organic layer was extracted using methylene chloride and distilled water. The extracted organic layer was washed with a saturated aqueous sodium chloride solution and dried by using sodium sulfate. A residue from which the solvent was removed was separated using column chromatography to obtain 3.25 g (9.7 mmol) of Intermediate 1-2.

2) Synthesis of Intermediate 1-3

3.25 g (9.7 mmol) of Intermediate 1-2 was suspended in excess iodomethane. The reaction mixture was heated, and stirred at 110° C. for 24 hours. After completion of the reaction, distilled water was added thereto and an extraction process was performed thereon by using ethyl acetate. An extracted organic layer was washed with a saturated aqueous sodium chloride solution and dried by using sodium sulfate. A residue from which the solvent was removed was separated using column chromatography to obtain 2.82 g (7.76 mmol) of Intermediate 1-3.

3) Synthesis of Intermediate 1-4

2.82 g (7.76 mmol) of Intermediate 1-3, 1.61 g (11.64 mmol) of 2-nitroaniline, SPhos (0.58 mmol), $Pd_2(dba)_3$ (0.39 mmol), and sodium t-butoxide (15 mmol) were suspended in toluene, heated at 100° C., and then stirred for 10 hours. After completion of the reaction, a solvent was removed therefrom under reduced pressure, and an organic layer was extracted using methylene chloride and distilled water. The extracted organic layer was washed with a saturated aqueous sodium chloride solution and dried by using sodium sulfate. A residue from which the solvent was removed was separated using column chromatography to obtain 2.67 g (6.36 mmol) of Intermediate 1-4.

4) Synthesis of Intermediate 1-5

2.67 g (6.36 mmol) of Intermediate 1-4, tin (19 mmol), and 5 mL (32 mmol, conc. 36.5%) of hydrochloric acid were dissolved in 60 ml of ethanol, and then stirred at 100° C. for 8 hours. The reaction solution was cooled at room temperature, 2.5 g of sodium hydroxide was dissolved in 10 mL of water and added to a filtrate obtained by filtering under reduced pressure, and then an organic layer was extracted three times using 60 ml or water and 60 ml of dichloromethane. The organic layer obtained therefrom was dried using magnesium sulfate, and a residue obtained by evaporating a solvent was separated and purified by silica gel column chromatography to obtain 2.33 g (5.98 mmol) of Intermediate 1-5.

5) Synthesis of Intermediate 1-6

2.48 g (5.98 mmol) of 2-(3-bromophenoxy)-9-(pyridine-2-nyl)-9H-carbazole, 2.33 g (5.98 mmol) of Intermediate 1-5, SPhos (0.45 mmol), $Pd_2(dba)_3$ (0.3 mmol), and sodium t-butoxide (11.9 mmol) were suspended in 50 ml of a toluene solvent, heated at 100° C., and then stirred for 4 hours. After completion of the reaction, a solvent was removed therefrom under reduced pressure, and an organic layer was extracted using methylene chloride and distilled water. The extracted organic layer was washed with a saturated aqueous sodium chloride solution and dried by using sodium sulfate. A residue from which the solvent was removed was separated using column chromatography to obtain 3.29 g (4.54 mmol) of Intermediate 1-6.

6) Synthesis of Intermediate 1-7

3.29 g (4.54 mmol) of Intermediate 1-6 was dissolved in 227 mmol of triethylorthoformate, and then 5.5 mmol of HCl was added dropwise thereto. The resultant was heated 100° C. and then heated for 20 hours. After completion of the reaction, a solvent was removed therefrom under reduced pressure, and an organic layer was extracted using methylene chloride and distilled water. The extracted organic layer was washed with a saturated aqueous sodium chloride solution and dried by using sodium sulfate. A residue from which the solvent was removed was separated using column chromatography to obtain 2.91 g (3.77 mmol) of Intermediate 1-7.

7) Synthesis of Intermediate 1-8

2.91 g (3.77 mmol) of Intermediate 1-7 was suspended in a mixed solution of 80 ml of methyl alcohol and 20 ml of water. 11.3 mmol of ammonium hexafluorophosphate was added to the reaction vessel, followed by stirring at room temperature for 15 hours. After completion of the reaction, a resulting solid was filtered and washed with ether. The washed solid was dried to obtain 3.17 g (3.6 mmol) of Intermediate 1-8.

8) Synthesis of Compound 1

3.17 g (3.6 mmol) of Intermediate 1-8, 1.48 g (3.96 mmol) of dichloro(1,5-cyclooctadiene)platinum, and 0.88 g (10.8 mmol) of sodium acetate were suspended in 40 ml of dioxane. The reaction mixture was heated, and stirred at 120° C. for 72 hours. After completion of the reaction, the resultant was cooled at room temperature, 100 ml of distilled water was added thereto, and an organic layer was extracted using ethyl acetate. The extracted organic layer was washed with a saturated aqueous sodium chloride solution and dried by using sodium sulfate. A residue from which the solvent was removed was separated using column chromatography to obtain 1.0 g (1.1 mmol) of Compound 1.

Synthesis Example 2: Synthesis of Compound 8

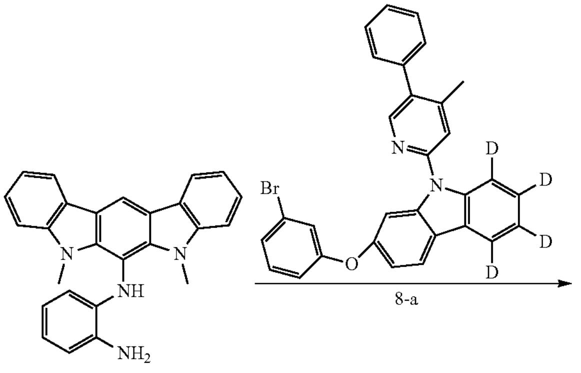

1-5

8-a

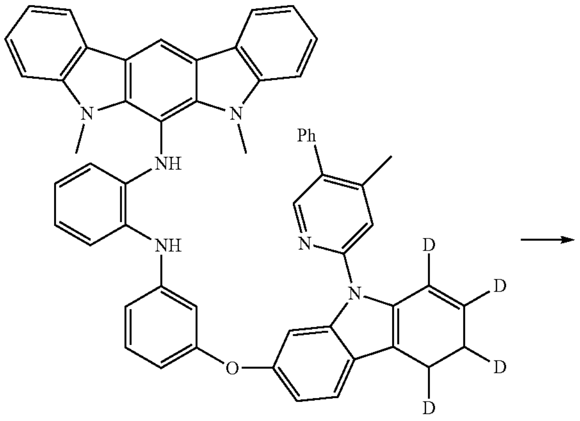

8-1

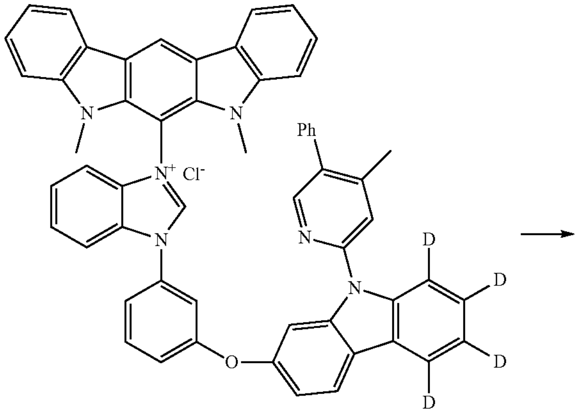

8-2

-continued

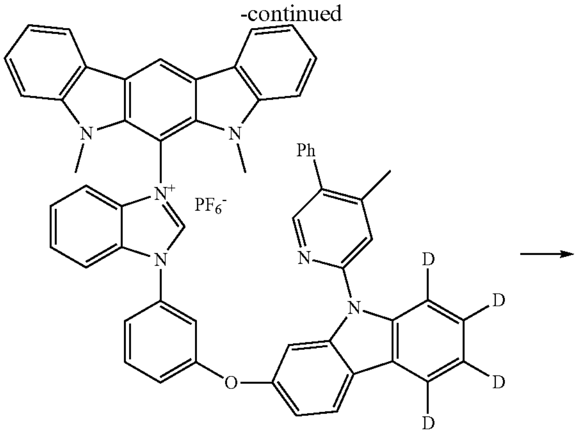

8-3

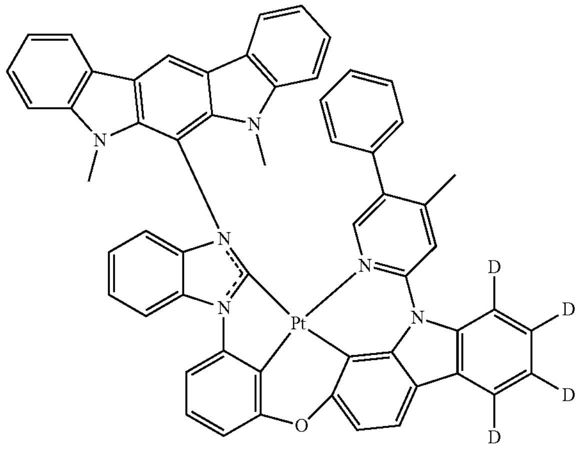

8

1) Synthesis of Intermediate 8-1

Intermediate 8-1 was obtained in substantially the same manner as used to obtain Intermediate 1-6 of Synthesis Example 1, except that Intermediate 8-a was used instead of 2-(3-bromophenoxy)-9-(pyridine-2-nyl)-9H-carbazole.

2) Synthesis of Intermediate 8-2

Intermediate 8-2 was obtained in substantially the same manner as used to obtain Intermediate 1-7 of Synthesis Example 1, except that Intermediate 8-1 was used instead of Intermediate 1-6.

3) Synthesis of Intermediate 8-3

Intermediate 8-3 was obtained in substantially the same manner as used to obtain Intermediate 1-8 of Synthesis Example 1, except that Intermediate 8-2 was used instead of Intermediate 1-7.

4) Synthesis of Compound 8

Compound 8 was obtained in substantially the same manner as used in Synthesis Example 1, except that Intermediate 8-3 was used instead of Intermediate 1-8.

Synthesis Example 3: Synthesis of Compound 32

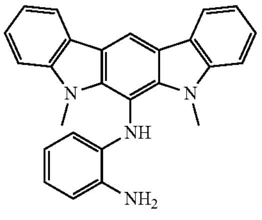

1-5

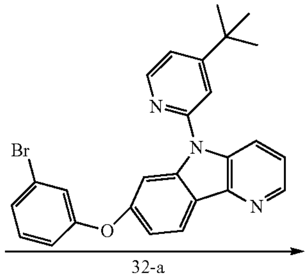

32-a

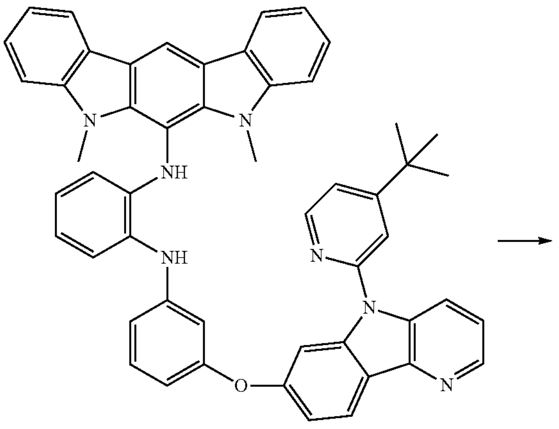

32-1

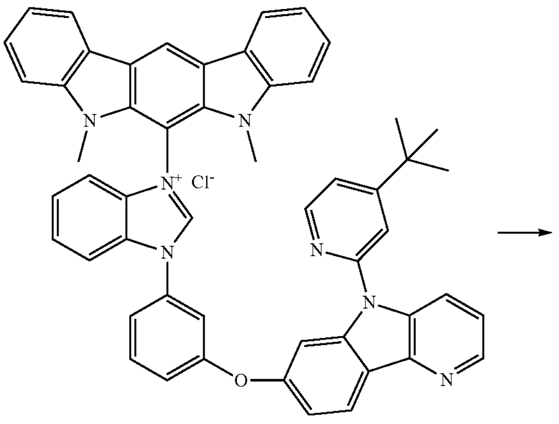

32-2

-continued

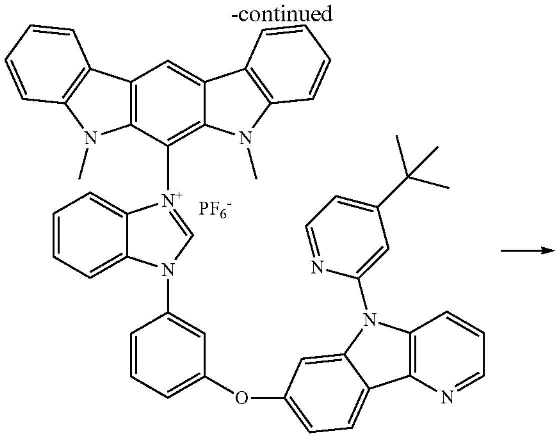

32-3

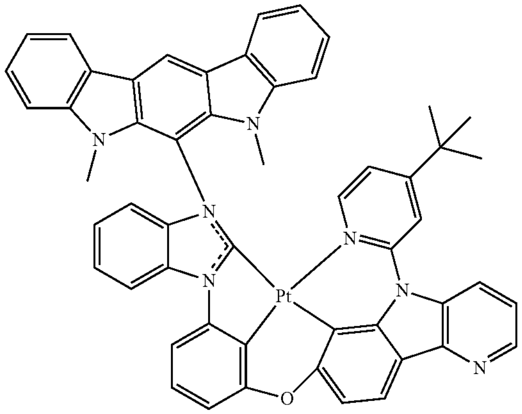

32

1) Synthesis of Intermediate 32-1

Intermediate 32-1 was obtained in substantially the same manner as used to obtain Intermediate 1-6 of Synthesis Example 1, except that Intermediate 32-a was used instead of 2-(3-bromophenoxy)-9-(pyridine-2-nyl)-9H-carbazole.

2) Synthesis of Intermediate 32-2

Intermediate 32-2 was obtained in substantially the same manner as used to obtain Intermediate 1-7 of Synthesis Example 1, except that Intermediate 32-1 was used instead of Intermediate 1-6.

3) Synthesis of Intermediate 32-3

Intermediate 32-3 was obtained in substantially the same manner as used to obtain Intermediate 1-8 of Synthesis Example 1, except that Intermediate 32-2 was used instead of Intermediate 1-7.

4) Synthesis of Compound 32

Compound 32 was obtained in substantially the same manner as used in Synthesis Example 1, except that Intermediate 32-3 was used instead of Intermediate 1-8.

Synthesis Example 4: Synthesis of Compound 47

Compound 47 was obtained in substantially the same manner as in Synthesis Example 2, except that iodomethane substituted with deuterium was used instead of iodomethane.

Synthesis Example 5: Synthesis of Compound 55

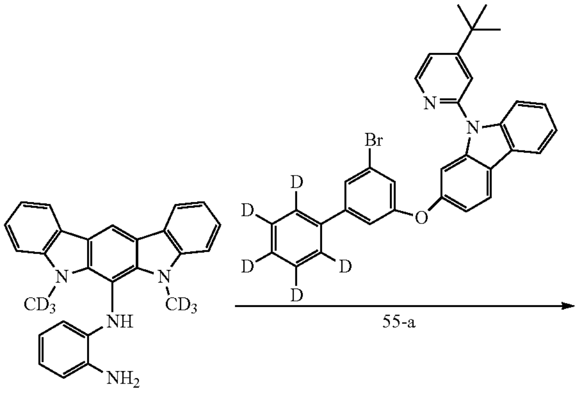

55-a 1-5-d

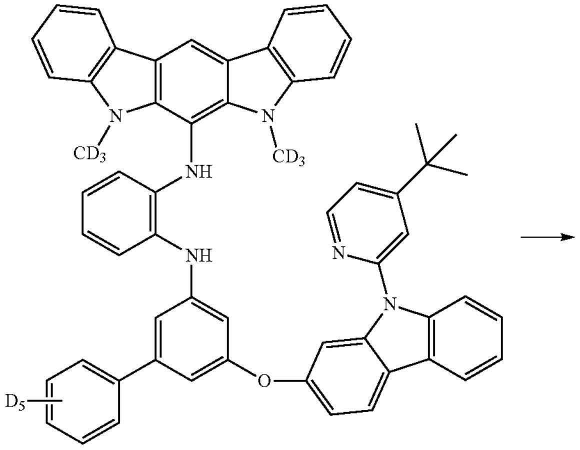

55-1

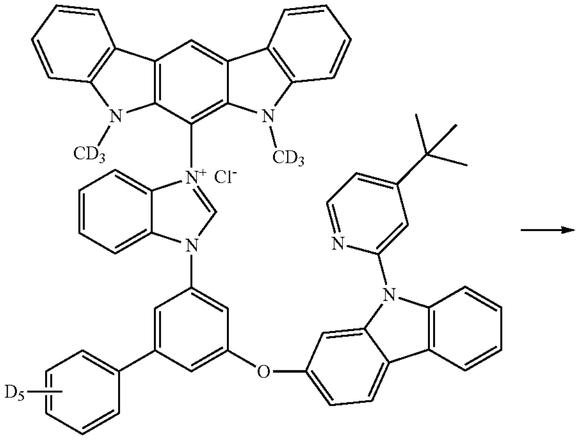

55-2

-continued

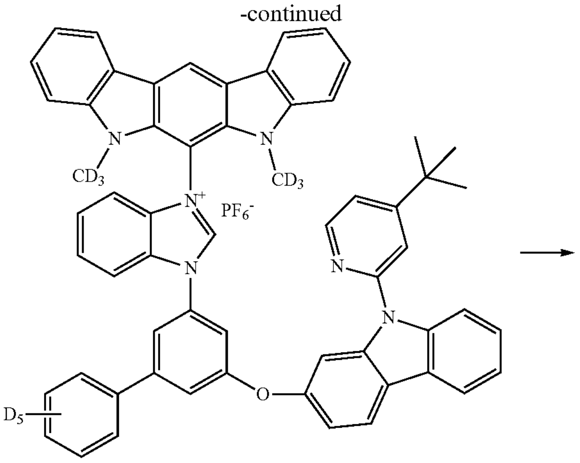

55-3

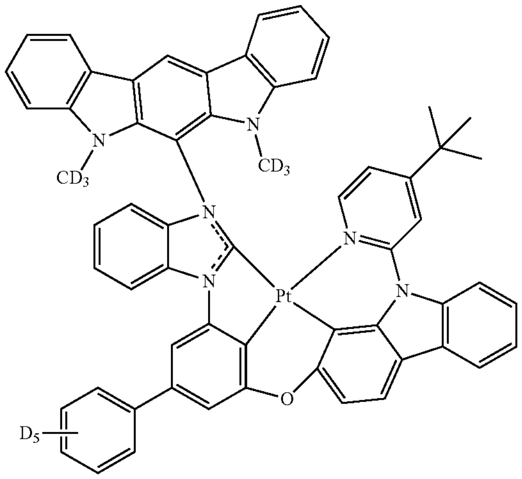

55

1) Synthesis of Intermediate 55-1

Intermediate 55-1 was obtained in substantially the same manner as used to obtain Intermediate 1-6 of Synthesis Example 1, except that Intermediate 55-a was used instead of 2-(3-bromophenoxy)-9-(pyridine-2-nyl)-9H-carbazole, and Intermediate 1-5-d was used instead of Intermediate 1-5.

2) Synthesis of Intermediate 55-2

Intermediate 55-2 was obtained in substantially the same manner as used to obtain Intermediate 1-7 of Synthesis Example 1, except that Intermediate 55-1 was used instead of Intermediate 1-6.

3) Synthesis of Intermediate 55-3

Intermediate 55-3 was obtained in substantially the same manner as used to obtain Intermediate 1-8 of Synthesis Example 1, except that Intermediate 55-2 was used instead of Intermediate 1-7.

4) Synthesis of Compound 55

Compound 55 was obtained in substantially the same manner as used in Synthesis Example 1, except that Intermediate 55-3 was used instead of Intermediate 1-8.

Synthesis Example 6: Synthesis of Compound 61

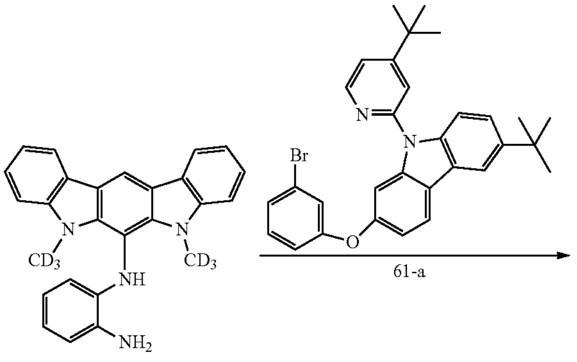

61-a 1-5-d

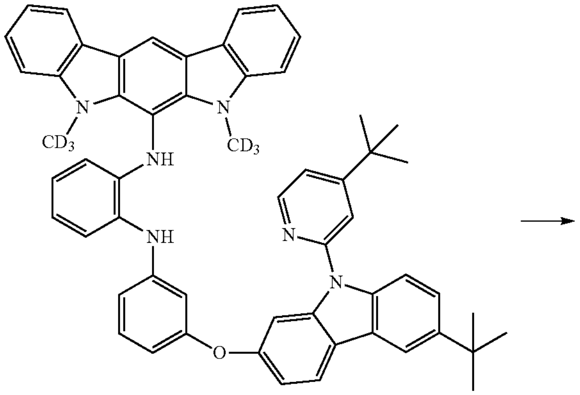

61-1

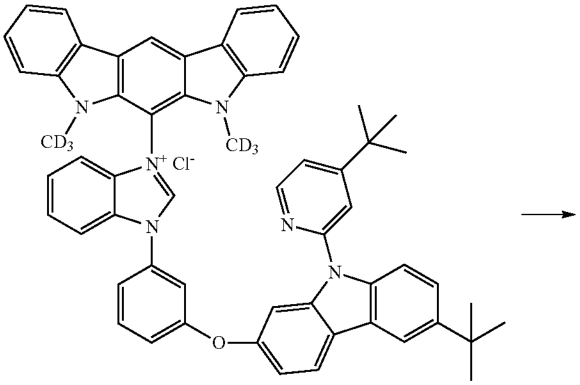

61-2

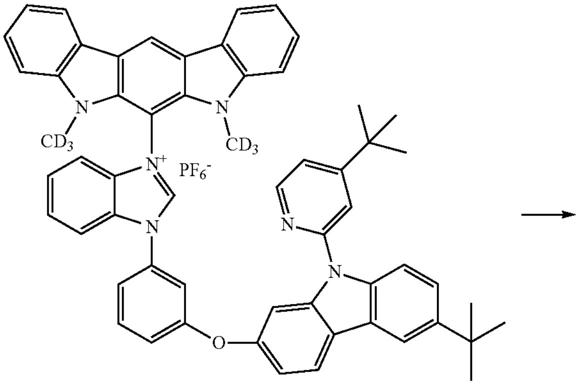

61-3

-continued

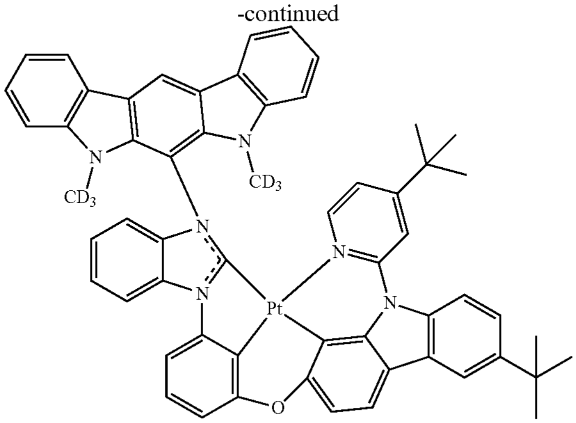

61

1) Synthesis of Intermediate 61-1

Intermediate 61-1 was obtained in substantially the same manner as used to obtain Intermediate 1-6 of Synthesis Example 1, except that Intermediate 61-a was used instead of 2-(3-bromophenoxy)-9-(pyridine-2-nyl)-9H-carbazole, and Intermediate 1-5-d was used instead of Intermediate 1-5.

2) Synthesis of Intermediate 61-2

Intermediate 61-2 was obtained in substantially the same manner as used to obtain Intermediate 1-7 of Synthesis Example 1, except that Intermediate 61-1 was used instead of Intermediate 1-6.

3) Synthesis of Intermediate 61-3

Intermediate 61-3 was obtained in substantially the same manner as used to obtain Intermediate 1-8 of Synthesis Example 1, except that Intermediate 61-2 was used instead of Intermediate 1-7.

4) Synthesis of Compound 61

Compound 61 was obtained in substantially the same manner as used in Synthesis Example 1, except that Intermediate 61-3 was used instead of Intermediate 1-8.

Synthesis Example 7: Synthesis of Compound 87

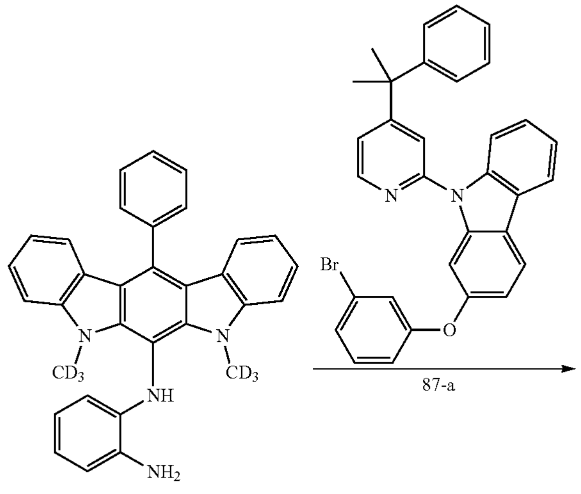

1-5-p

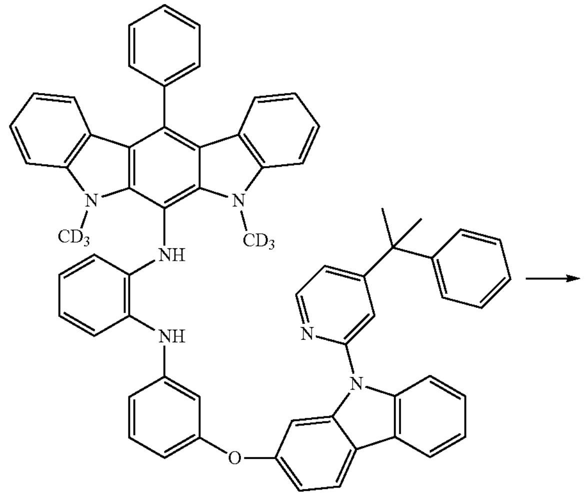

87-1

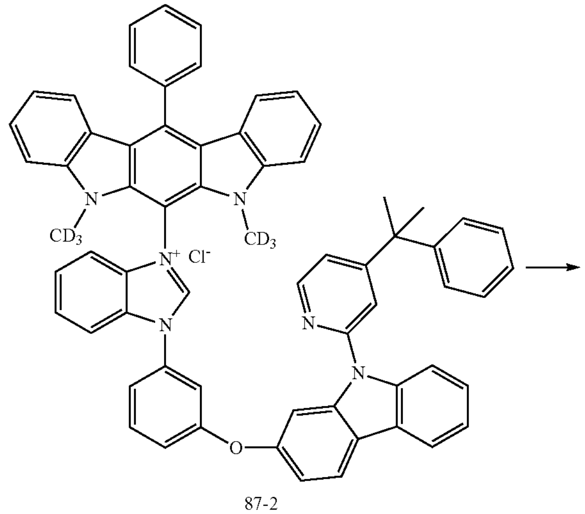

87-2

-continued

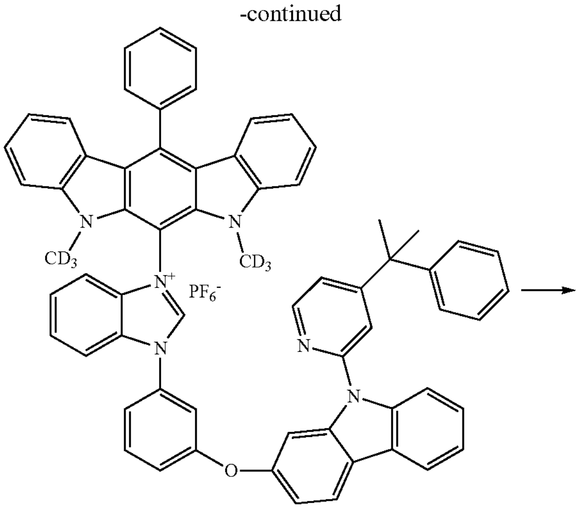

87-3

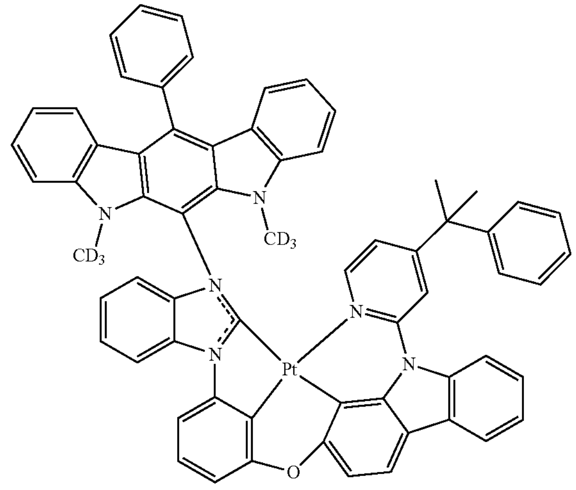

87

1) Synthesis of Intermediate 87-1

Intermediate 87-1 was obtained in substantially the same manner as used to obtain Intermediate 1-6 of Synthesis Example 1, except that Intermediate 87-a was used instead of 2-(3-bromophenoxy)-9-(pyridine-2-nyl)-9H-carbazole, and Intermediate 1-5-p was used instead of Intermediate 1-5.

2) Synthesis of Intermediate 87-2

Intermediate 87-2 was obtained in substantially the same manner as used to obtain Intermediate 1-7 of Synthesis Example 1, except that Intermediate 87-1 was used instead of Intermediate 1-6.

3) Synthesis of Intermediate 87-3

Intermediate 87-3 was obtained in substantially the same manner as used to obtain Intermediate 1-8 of Synthesis Example 1, except that Intermediate 87-2 was used instead of Intermediate 1-7.

4) Synthesis of Compound 87
Compound 87 was obtained in substantially the same manner as used in Synthesis Example 1, except that Intermediate 87-3 was used instead of Intermediate 1-8.
Synthesis Example 8: Synthesis of Compound 128
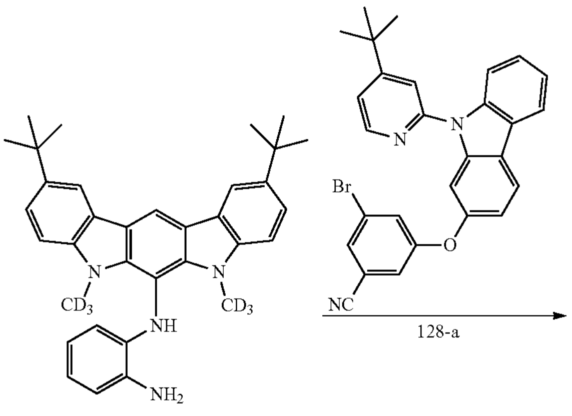
128-a
1-5-t
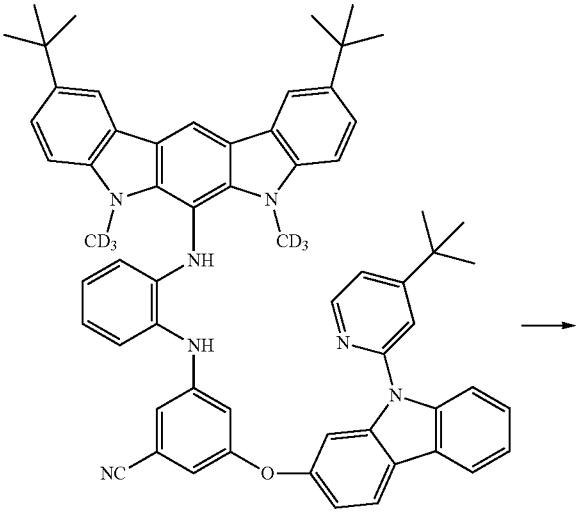
128-1
-continued
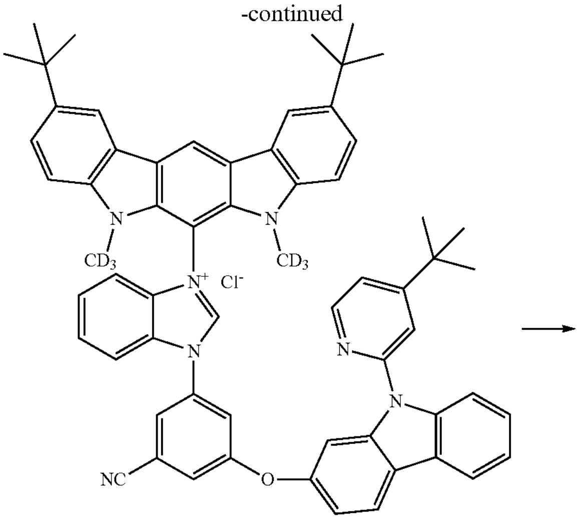
128-2
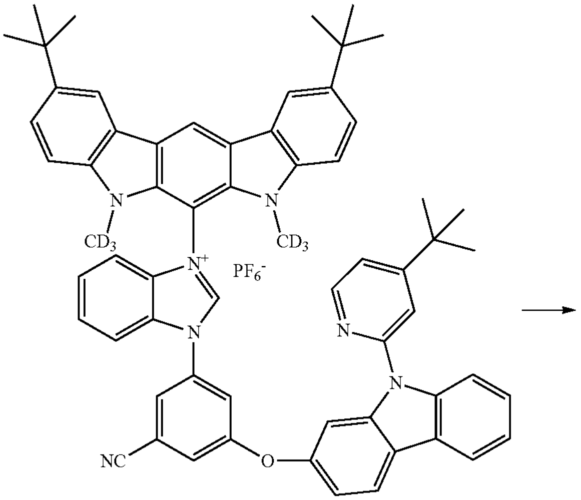
128-3
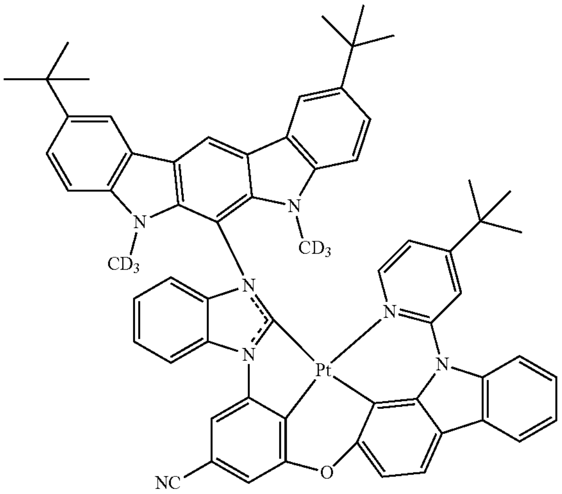
128
1) Synthesis of Intermediate 128-1
Intermediate 128-1 was obtained in substantially the same manner as used to obtain Intermediate 1-6 of Synthesis Example 1, except that Intermediate 128-a was used instead of 2-(3-bromophenoxy)-9-(pyridine-2-nyl)-9H-carbazole, and Intermediate 1-5-t was used instead of Intermediate 1-5.

2) Synthesis of Intermediate 128-2

Intermediate 128-2 was obtained in substantially the same manner as used to obtain Intermediate 1-7 of Synthesis Example 1, except that Intermediate 128-1 was used instead of Intermediate 1-6.

3) Synthesis of Intermediate 128-3

Intermediate 128-3 was obtained in substantially the same manner as used to obtain Intermediate 1-8 of Synthesis Example 1, except that Intermediate 128-2 was used instead of Intermediate 1-7.

4) Synthesis of Compound 128

Compound 128 was obtained in substantially the same manner as used in Synthesis Example 1, except that Intermediate 128-3 was used instead of Intermediate 1-8.

$^1$H NMR and MS/FAB of the compounds synthesized according to Synthesis Examples 1 to 8 are shown in Table 1 below. Synthesis methods of other compounds in addition to the compounds synthesized in Synthesis Examples 1 to 8 may be easily recognized by those skilled in the art by referring to the synthesis paths and source materials.

TABLE 1

| | | MS/FAB | |
|---|---|---|---|
| Compound | $^1$H NMR ($CDCl_3$, 500 MHz) | found | calc. |
| 1 | δ 8.73(d, 1H), 8.39-8.36(m, 2H), 8.19-8.15(m, 3H), 7.70-7.59(m, 3H), 7.49-7.32(m, 4H), 7.24-7.14(m, 7H), 6.95-6.90(m, 3H), 6.83(s, 1H), 6.69-6.66(m, 2H), 3.82(s, 6H) | 927.2283 | 927.2285 |
| 8 | δ 9.08(s, 1H), 8.39-8.36(m, 2H), 8.15(d, 1H), 7.70-7.65(m, 2H), 7.59(s, 1H), 7.51-7.39(m, 7H), 7.25-7.14(m, 5H), 6.95-6.90(m, 3H), 6.83(s, 1H), 6.69-6.66(m, 2H), 3.82(s, 6H), 2.68(s, 3H) | 1021.3005 | 1021.3006 |
| 32 | δ 8.74(d, 1H), 8.42-8.37(m, 3H), 8.15(d, 1H), 7.97(d, 1H), 7.70-7.65(m, 2H), 7.45-7.39(m, 4H), 7.24-7.14(m, 6H), 6.95-6.90(m, 3H), 6.83(s, 1H), 6.69-6.66(m, 2H), 3.82(s, 6H), 1.32(s, 9H) | 984.2865 | 984.2864 |
| 47 | δ 9.08(s, 1H), 8.39-8.36(m, 2H), 8.15(d, 1H), 7.70-7.65(m, 2H), 7.59(s, 1H), 7.51-7.39(m, 7H), 7.25-7.14(m, 5H), 6.95-6.90(m, 3H), 6.83(s, 1H), 6.69-6.66(m, 2H), 2.68(s, 3H) | 1027.3385 | 1027.3383 |
| 55 | δ 8.74(d, 1H), 8.39-8.37(m, 2H), 8.19-8.16(m, 2H), 7.70-7.55(m, 3H), 7.50-7.39(m, 5H), 7.24-7.14(m, 5H), 6.99-6.95(m, 4H), 6.83(s, 1H), 6.69(d, 1H), 1.32(s, 9H) | 1070.3918 | 1070.3915 |
| 61 | δ 8.74(d, 1H), 8.39-8.37(m, 3H), 8.15(d, 1H), 7.70-7.62(m, 3H), 7.50-7.39(m, 5H), 7.24-7.14(m, 5H), 6.99-6.95(m, 3H), 6.83(s, 1H), 6.69-6.66(m, 2H), 1.43(s, 9H), 1.32(s, 9H) | 1045.3916 | 1045.3914 |
| 87 | δ 8.73(d, 1H), 8.39-8.37(m, 2H), 8.19(d, 1H), 8.00(d, 1H), 7.70-7.55(m, 9H), 7.50-7.39(m, 6H), 7.24-7.14(m, 9H), 6.99-6.95(m, 3H), 6.69-6.66(m, 2H), 1.69(s, 6H) | 1127.3755 | 1127.3757 |
| 128 | δ 8.76-8.74(m, 2H), 8.39(d, 1H), 8.19-8.17(m, 2H), 7.74(d, 1H), 7.66(d, 1H), 7.58(d, 1H), 7.50-7.42(m, 5H), 7.21-7.14(m, 5H), 6.99-6.95(m, 2H), 6.83(s, 1H), 6.69(d, 1H), 1.43(s, 18H), 1.32(s, 9H) | 1126.4493 | 1126.4492 |

Evaluation Example 1

According to the method described in Table 2, the HOMO and LUMO energy levels of each of Compounds 1, 8, 32, 47, 55, 61, 87, and 128 were evaluated, and results thereof are shown in Table 3.

TABLE 2

| | |
|---|---|
| HOMO energy level evaluation method | By using cyclic voltammetry (CV) (electrolyte: 0.1M $Bu_4NPF_6$/solvent: dimethylforamide (DMF)/electrode: 3-electrode system (working electrode: GC, reference electrode: Ag/AgCl, and auxiliary electrode: Pt)), the potential (V)-current (A) graph of each compound was obtained, and then, from the oxidation onset of the graph, the HOMO energy level of each compound was calculated. |
| LUMO energy level evaluation method | By using cyclic voltammetry (CV) (electrolyte: 0.1M $Bu_4NPF_6$/solvent: dimethylforamide (DMF)/electrode:3-electrode system (working electrode: GC, referencee lectrode: Ag/AgCl, and auxiliary electrode: Pt)), the potential (V)-current (A) graph of each compound was obtained, and then, from the reduction onset of the graph, the LUMO energy level of each compound was calculated. |

TABLE 3

| Compound No. | HOMO (eV) | LUMO (eV) |
|---|---|---|
| 1 | 5.28 | 2.10 |
| 8 | 5.33 | 2.13 |
| 32 | 5.41 | 2.17 |
| 47 | 5.33 | 2.13 |
| 55 | 5.37 | 2.12 |
| 61 | 5.36 | 2.14 |
| 87 | 5.31 | 2.20 |
| 128 | 5.56 | 2.23 |

Example 1

As an anode, a glass substrate (product of Corning Inc.) with a 15 Ω/cm$^2$ (1,200 Å) ITO formed thereon was cut to a size of 50 mm×50 mm×0.7 mm, sonicated using isopropyl alcohol and pure water each for 5 minutes, washed by irradiation of ultraviolet rays and exposure of ozone thereto for 30 minutes, and then mounted on a vacuum deposition apparatus.

2-TNATA was vacuum-deposited on the anode to form a hole injection layer having a thickness of 600 Å, and 4,4'-bis[N-(1-naphthyl)-N-phenylaminobiphenyl (hereinafter, NPB) was vacuum-deposited on the hole injection layer to form a hole transport layer having a thickness of 300 Å.

Compound 1 (first compound), Compound ETH2 (second compound), and Compound HTH29 (third compound) were vacuum-deposited on the hole transport layer to form an emission layer having a third compound of 400 Å. In this regard, an amount of Compound 1 is 10 wt % based on a total weight (100 wt %) of the emission layer, and a weight ratio of Compound ETH2 to Compound HTH29 was adjusted to 3:7.

Compound ETH2 was vacuum-deposited on the emission layer to form a hole blocking layer having a thickness of 50 Å, $Alq_3$ was vacuum-deposited on the hole blocking layer to form an electron transport layer having a thickness of 300 Å, LiF was vacuum-deposited on the electron transport layer to form an electron injection layer having a thickness of 10 Å, and then Al was vacuum-deposited thereon to form a cathode having a thickness of 3,000 Å, thereby completing manufacture of an organic light-emitting device.

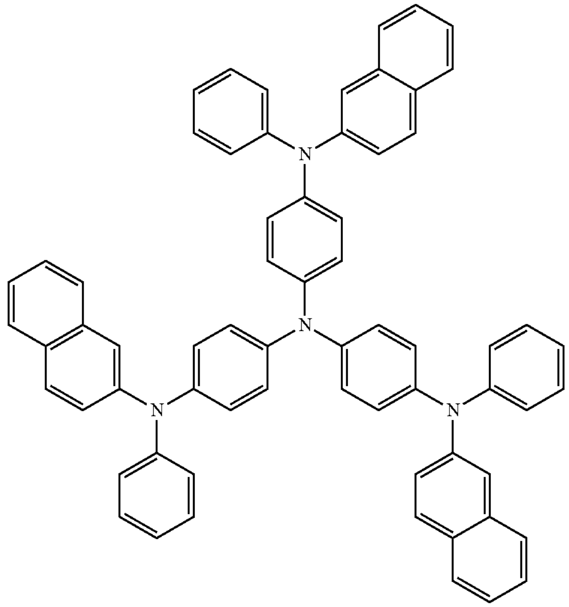

2-TNATA

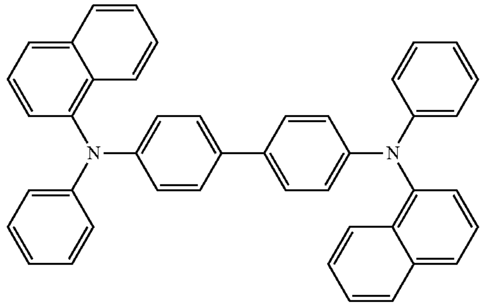

NPB

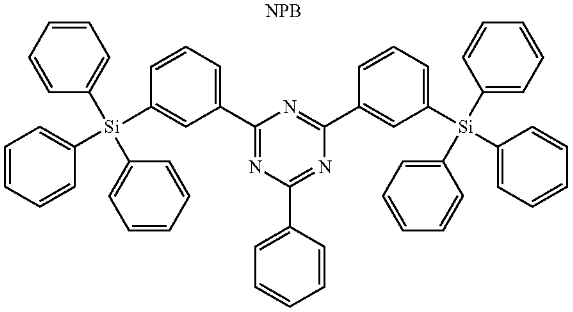

ETH2

Examples 2 to 8

Organic light-emitting devices were manufactured in substantially the same manner as in Example 1, except that, in forming an emission layer, compounds described in Table 4 were respectively used as the first compound.

Evaluation Example 2

Driving voltage (V) at 1,000 cd/m$^2$, color purity (CIEx,y), luminescence efficiency (cd/A), color conversion efficiency (cd/A/y), maximum emission wavelength (nm), and lifespan ($T_{95}$) of the organic light-emitting devices manufactured in Examples 1 to 8 were each measured using a Keithley SMU 236 and a luminance meter PR650, and results thereof are shown in Tables 4 and 5, respectively. In Table 5, the lifespan ($T_{95}$) is a measure of the time (Hr) taken when the luminance reaches 95% of the initial luminance.

TABLE 4

| No. | Dopant First compound | Host Second compound | Host Third compound | Luminance ($cd/m^2$) | Driving voltage (V) | Color purity (CIEx, y) |
|---|---|---|---|---|---|---|
| Example 1 | 1 | ETH2 | HTH29 | 1000 | 4.6 | (0.14, 0.16) |
| Example 2 | 1 | ETH68 | HTH41 | 1000 | 4.4 | (0.14, 0.16) |

TABLE 4-continued

| No. | Dopant First compound | Host Second compound | Host Third compound | Luminance ($cd/m^2$) | Driving voltage (V) | Color purity (CIEx, y) |
|---|---|---|---|---|---|---|
| Example 3 | 8 | ETH2 | HTH41 | 1000 | 4.7 | (0.14, 0.16) |
| Example 4 | 32 | ETH68 | HTH29 | 1000 | 4.3 | (0.14, 0.15) |
| Example 5 | 55 | ETH68 | HTH29 | 1000 | 4.8 | (0.14, 0.17) |
| Example 6 | 61 | ETH68 | HTH29 | 1000 | 4.7 | (0.14, 0.16) |
| Example 7 | 87 | ETH2 | HTH41 | 1000 | 4.5 | (0.14, 0.15) |
| Example 8 | 128 | ETH68 | HTH29 | 1000 | 4.1 | (0.14, 0.15) |

TABLE 5

| No. | Dopant First compound | Host Second compound | Host Third compound | Luminescence efficiency (cd/A) | Color conversion efficiency (cd/A/y) | Maximum emission wavelength (nm) | Lifespan ($T_{95}$) (Hr) |
|---|---|---|---|---|---|---|---|
| Example 1 | 1 | ETH2 | HTH29 | 19.7 | 118.1 | 462 | 55.1 |
| Example 2 | 1 | ETH68 | HTH41 | 20.5 | 125.3 | 462 | 52.3 |
| Example 3 | 8 | ETH2 | HTH41 | 19.1 | 119.2 | 461 | 60.1 |
| Example 4 | 32 | ETH68 | HTH29 | 18.4 | 122.1 | 461 | 80.2 |
| Example 5 | 55 | ETH68 | HTH29 | 19.6 | 115.6 | 465 | 125.2 |
| Example 6 | 61 | ETH68 | HTH29 | 20.4 | 127.3 | 463 | 98.0 |
| Example 7 | 87 | ETH2 | HTH41 | 20.1 | 129.3 | 461 | 88.3 |
| Example 8 | 128 | ETH68 | HTH29 | 18.4 | 118.2 | 462 | 83.6 |

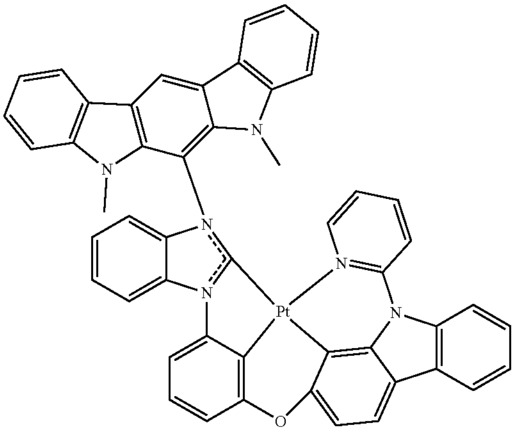

1

TABLE 5-continued
| No. | Dopant First compound | Host Second compound | Host Third compound | Luminescence efficiency (cd/A) | Color conversion efficiency (cd/A/y) | Maximum emission wavelength (nm) | Lifespan ($T_{95}$) (Hr) |
|---|---|---|---|---|---|---|---|
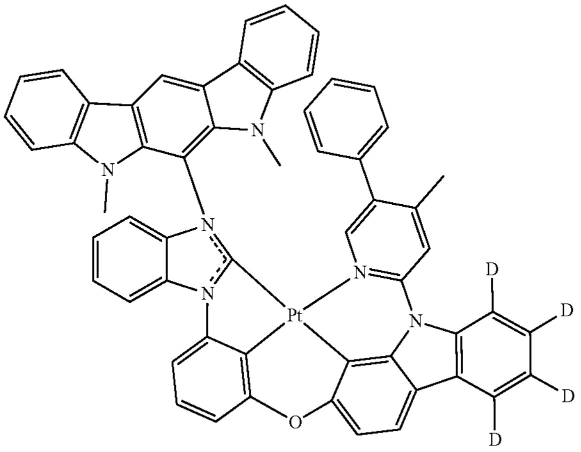
8
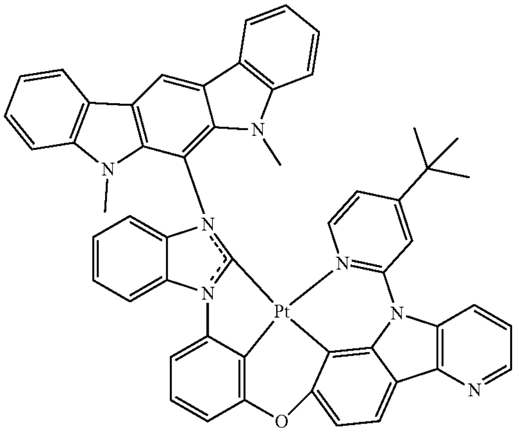
32

TABLE 5-continued
| | Dopant | Host | | | Luminescence | Color conversion | Maximum emission | Lifespan |
|---|---|---|---|---|---|---|---|---|
| No. | First compound | Second compound | Third compound | | efficiency (cd/A) | efficiency (cd/A/y) | wavelength (nm) | ($T_{95}$) (Hr) |
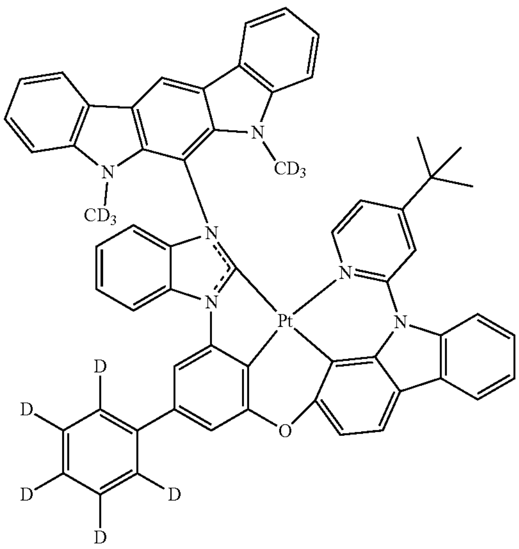
55
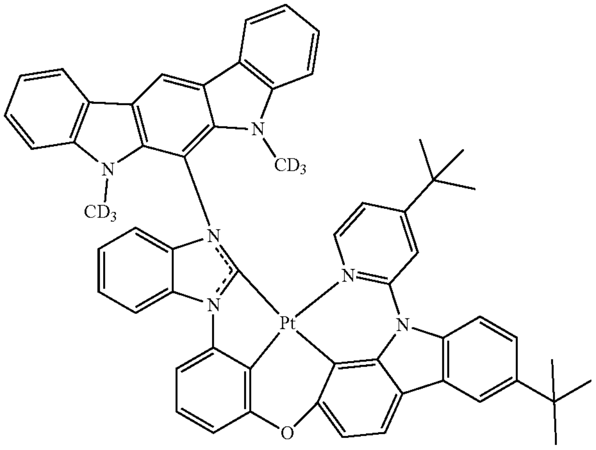
61

TABLE 5-continued

| | Dopant | Host | | Luminescence | Color conversion | Maximum emission | Lifespan |
|---|---|---|---|---|---|---|---|
| No. | First compound | Second compound | Third compound | efficiency (cd/A) | efficiency (cd/A/y) | wavelength (nm) | ($T_{95}$) (Hr) |

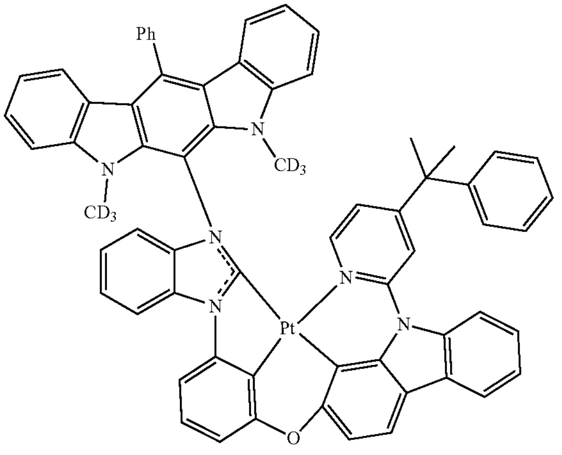

87

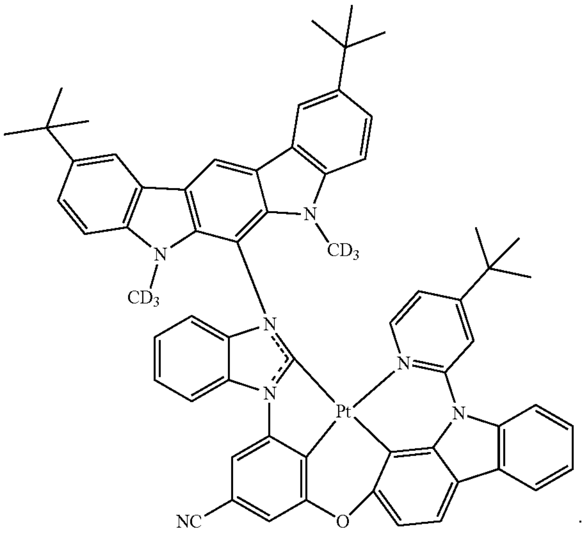

128

From Tables 4 and 5, it may be confirmed that the organic light-emitting devices of Examples 1 to 8 emit deep blue light and have excellent driving voltage, color purity, luminescence efficiency, color conversion efficiency, and lifespan characteristics.

Example 9

In forming an emission layer, an organic light-emitting device was manufactured in substantially the same manner as in Example 1, except that Compound 47 (first compound), Compound ETH2 (second compound), Compound HTH41 (third compound), and Compound DFD1 (fourth compound) were vacuum-deposited on the hole transport layer. In this regard, an amount of Compound 47 was 10 wt % based on a total weight (100 wt %) of the emission layer, an amount of Compound DFD1 is 0.5 wt % based on a total weight (100 wt %) of the emission layer, and a weight ratio of Compound ETH2 to Compound HTH41 was adjusted to 3:7.

Example 10

An organic light-emitting device was manufactured in substantially the same manner as in Example 9, except that Compound DFD2 was used instead of Compound DFD1, as the fourth compound.

Evaluation Example 3

Driving voltage (V) at 1,000 cd/$m^2$, color purity (CIEx,y), luminescence efficiency (cd/A), color conversion efficiency (cd/A/y), maximum emission wavelength (nm), and lifespan ($T_{95}$) of the organic light-emitting devices manufactured in Examples 9 and 10 were each measured using the same method as Evaluation Example 2, and results thereof are shown in Tables 6 and 7, respectively.

TABLE 6

| | Dopant | Host | | Auxiliary dopant | | Driving | Color |
|---|---|---|---|---|---|---|---|
| No. | First compound | Second compound | Third compound | Fourth compound | Luminance (cd/m$^2$) | voltage (V) | purity (CIEx, y) |
| Example 9 | 47 | ETH2 | HTH41 | DFD1 | 1000 | 4.5 | (0.14, 0.14) |
| Example 10 | 47 | ETH2 | HTH41 | DFD2 | 1000 | 4.7 | (0.14, 0.14) |

TABLE 7

| | Dopant | Host | | Auxiliary dopant | Luminescence | Color conversion | Maximum emission | Lifespan |
|---|---|---|---|---|---|---|---|---|
| No. | First compound | Second compound | Third compound | Fourth compound | efficiency (cd/A) | efficiency (cd/A/y) | wavelength (nm) | ($T_{95}$) (Hr) |
| Example 9 | 47 | ETH2 | HTH41 | DFD1 | 20.6 | 147.5 | 460 | 102.3 |
| Example 10 | 47 | ETH2 | HTH41 | DFD2 | 17.6 | 125.9 | 460 | 91.2 |

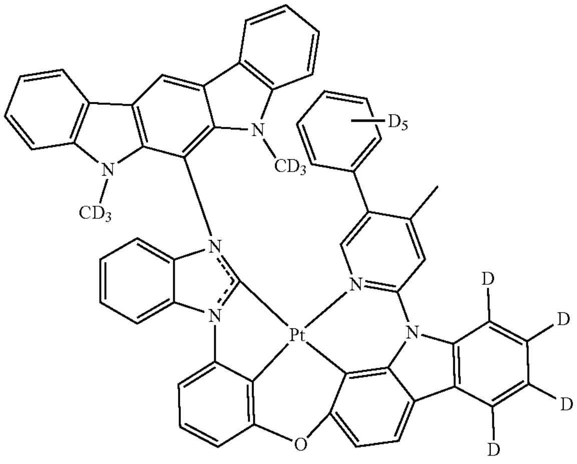

47

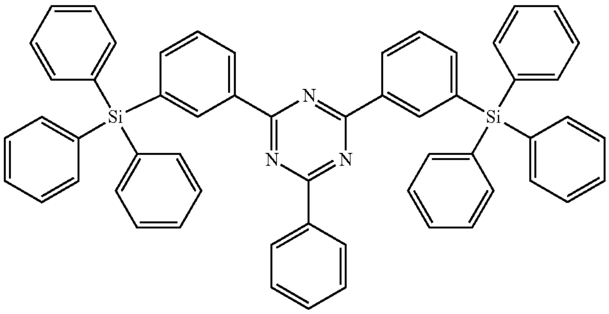

ETH2

TABLE 7-continued

| | Dopant | Host | | Auxiliary dopant | Luminescence | Color conversion | Maximum emission | Lifespan |
|---|---|---|---|---|---|---|---|---|
| No. | First compound | Second compound | Third compound | Fourth compound | efficiency (cd/A) | efficiency (cd/A/y) | wavelength (nm) | ($T_{95}$) (Hr) |

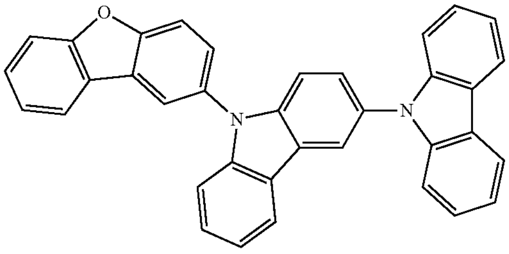

HTH41

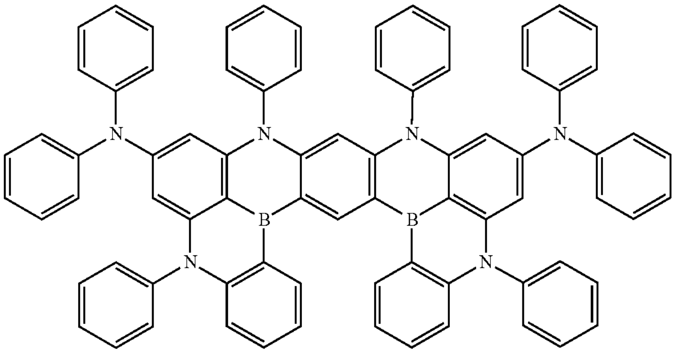

DFD1

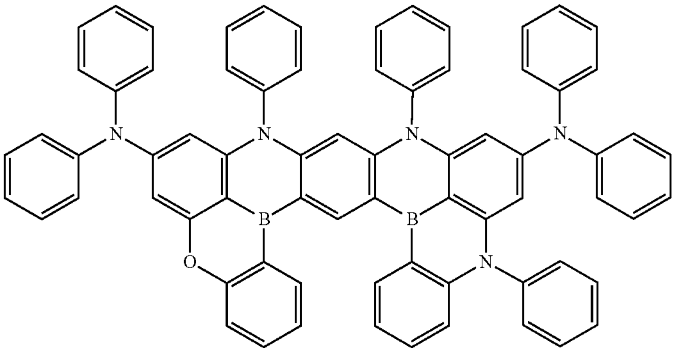

DFD2

.

From Tables 6 and 7, it may be confirmed that the organic light-emitting devices of Examples 9 and 10 emit deep blue light and have excellent driving voltage, color purity, luminescence efficiency, color conversion efficiency, and lifespan characteristics.

Example 11

In forming an emission layer, an organic light-emitting device was manufactured in substantially the same manner as in Example 1, except that Compound 1 (first compound) and Compound ETH2 (second compound) were vacuum-deposited on the hole transport layer to form an emission layer having a thickness of 300 Å, instead of vacuum-depositing Compound 1 (first compound), Compound ETH2 (second compound), and Compound HTH29 (third compound) on the hole transport layer to form an emission layer having a thickness of 400 Å. In this regard, an amount of Compound 1 was adjusted to 10 wt % based on a total weight (100 wt %) of the emission layer.

Comparative Examples 1 and 2

Organic light-emitting devices were manufactured in substantially the same manner as in Example 1, except that Compound CE1 or Compound CE2 were respectively used instead of Compound 1 in forming an emission layer.

Evaluation Example 4

Driving voltage (V) at 1,000 cd/$m^2$, color purity (CIEx,y), luminescence efficiency (cd/A), color conversion efficiency (cd/A/y), maximum emission wavelength (nm), and lifespan ($T_{95}$ at room temperature) of the organic light-emitting devices manufactured in Examples 11 and Comparative Examples 1 and 2 were each measured using the same method as Evaluation Example 2, and results thereof are shown in Tables 8 and 9, respectively.

TABLE 8

| No. | Dopant | Host | Luminance (cd/$m^2$) | Driving voltage (V) | Color purity (CIEx, y) |
|---|---|---|---|---|---|
| Example 11 | 1 | ETH2 | 1000 | 5.3 | (0.14, 0.19) |
| Comparative Example 1 | CE1 | ETH2 | 1000 | 4.9 | (0.14, 0.19) |
| Comparative Example 2 | CE2 | ETH2 | 1000 | 6.2 | (0.14, 0.18) |

TABLE 9

| No. | Dopant | Dopant | Luminescence efficiency (cd/A) | Color conversion efficiency (cd/A/y) | Maximum emission wavelength (nm) | Lifespan ($T_{95}$) (Hr) |
|---|---|---|---|---|---|---|
| Example 11 | 1 | ETH2 | 14.3 | 76.6 | 466 | 6.8 |
| Comparative Example 1 | CE1 | ETH2 | 9.6 | 51.6 | 469 | 2.5 |

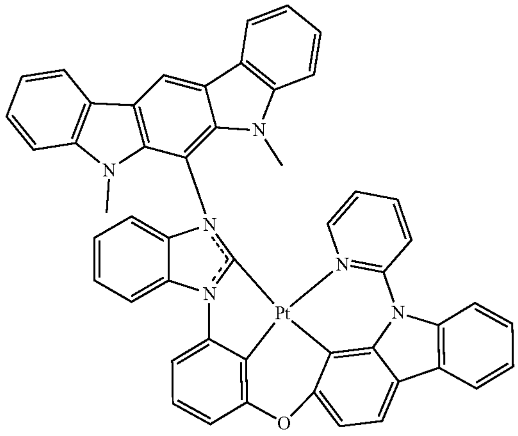

1

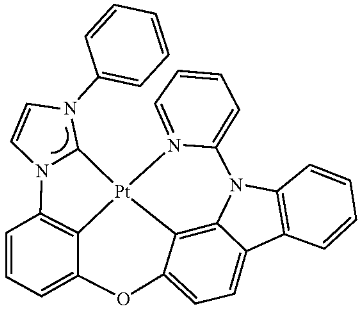

CE1 (Comparative example)

TABLE 9-continued

| No. | Dopant | Dopant | Luminescence efficiency (cd/A) | Color conversion efficiency (cd/A/y) | Maximum emission wavelength (nm) | Lifespan ($T_{95}$) (Hr) |
|---|---|---|---|---|---|---|

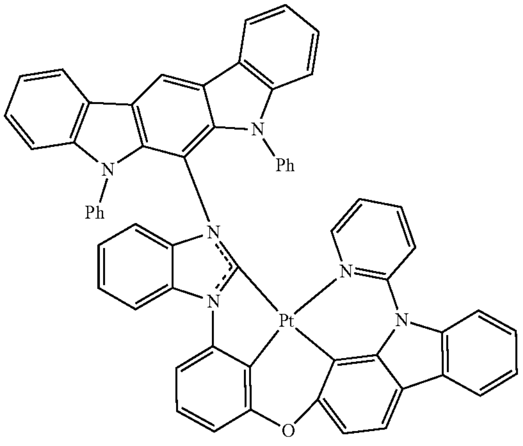

CE2

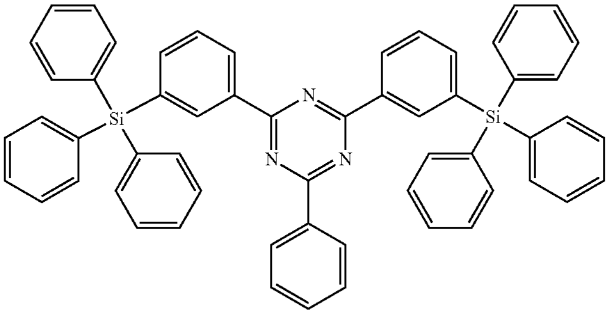

ETH2

.

From Tables 8 and 9, it may be confirmed that the organic light-emitting device of Example 11 emits deep blue light and has superior driving voltage, color purity, luminescence efficiency, color conversion efficiency, and lifespan characteristics, compared to the organic light-emitting devices of Comparative Examples 1 and 2.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims and their equivalents.

What is claimed is:

1. A light-emitting device comprising:

a first electrode;

a second electrode facing the first electrode;

an interlayer between the first electrode and the second electrode, the interlayer comprising an emission layer; and an organometallic compound represented by Formula 1:

Formula 1

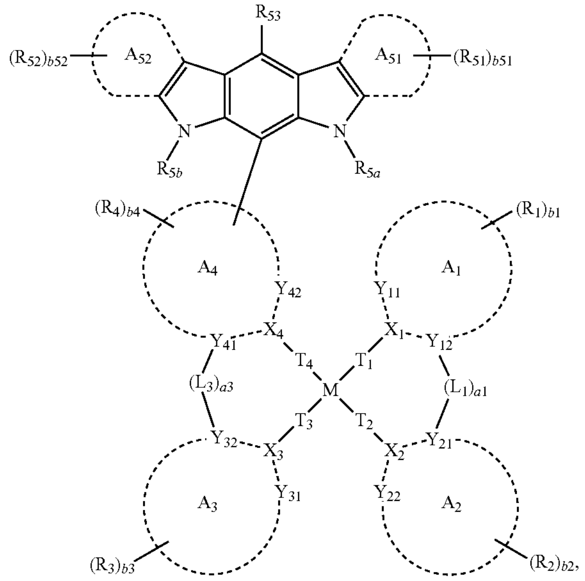

wherein, in Formula 1,

M is platinum (Pt), palladium (Pd), nickel (Ni), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm), $X_1$ to $X_4$, $Y_{11}$, $Y_{12}$, $Y_{21}$, $Y_{22}$, $Y_{31}$, $Y_{32}$, $Y_{41}$, and $Y_{42}$ are each independently C or N, $A_1$ to $A_4$, $A_{51}$, and $A_{52}$ are each independently a $C_3$-$C_{60}$ carbocyclic group or a $C_1$-$C_{60}$ heterocyclic group, $T_1$ to $T_4$ are each independently a single bond, *—O—*', *—S—*', *—C($Z_{11}$)($Z_{12}$)—*', *—C($Z_{11}$)=*', *=C($Z_{11}$)—*', *—C($Z_{11}$)=C($Z_{12}$)—*', *—C(=O)—*', *—C(=S)—*', *—C≡C—*', *—B($Z_{11}$)—*', *N($Z_{11}$)—*', *—P($Z_{11}$)—*', *—Si($Z_{11}$)($Z_{12}$)—*', or *—Ge($Z_{11}$)($Z_{12}$)—*', $L_1$ to $L_3$ are each independently a single bond, a double bond, *—N($Z_{21}$)—*', *—B($Z_{21}$)—*', *—P($Z_{21}$)—*', *—C($Z_{21}$)($Z_{22}$)—*', *—Si($Z_{21}$)($Z_{22}$)—*', *—Ge($Z_{21}$)($Z_{22}$)—*', *—S—*', *—Se—*', *—O—*', *—C(=O)—*', *—S(=O)—*', *—S(=O)$_2$—*', *—C($Z_{21}$)=*', *=C($Z_{21}$)—*', *—C($Z_{21}$)=C($Z_{22}$)—*', *—C(=S)—*', or *—C≡C—*',

* and *' each indicate a binding site to a neighboring atom, a1 to a3 are each independently an integer from 0 to 3, $R_1$ to $R_4$, $R_{51}$ to $R_{53}$, $R_{5a}$, $R_{5b}$, $Z_{11}$, $Z_{12}$, $Z_{21}$, and $Z_{22}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), or —P(=S)($Q_1$)($Q_2$), $R_{5a}$ and $R_{5b}$ are not both simultaneously a benzene group unsubstituted or substituted with at least one $R_{10a}$, b1 to b4, b51, and b52 are each independently an integer from 0 to 10, when b1 is 2 or more, two $R_1$(s) of two or more $R_1$(s) are optionally bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, when b2 is 2 or more, two $R_2$(s) of two or more $R_2$(s) are optionally bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, when b3 is 2 or more, two $R_3$(s) of two or more $R_3$(s) are optionally bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, when b4 is 2 or more, two $R_4$(s) of two or more $R_4$(s) are optionally bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, when b51 is 2 or more, two $R_{51}$(s) of two or more $R_{51}$(s) are optionally bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, when b52 is 2 or more, two $R_{52}$(s) of two or more $R_{52}$(s) are optionally bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —P($Q_{11}$)($Q_{12}$), —C(=O)($Q_{11}$), —S(=O)($Q_{11}$), —S(=O)$_2$($Q_{11}$), —P(=O)($Q_{11}$)($Q_{12}$), —P(=S)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —P($Q_{21}$)($Q_{22}$), —C(=O)($Q_{21}$), —S(=O)($Q_{21}$), —S(=O)$_2$($Q_{21}$), —P(=O)($Q_{21}$)($Q_{22}$), —P(=S)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —P($Q_{31}$)($Q_{32}$), —C(=O)($Q_{31}$), —S(=O)($Q_{31}$), —S(=O)$_2$($Q_{31}$), —P(=O)($Q_{31}$)($Q_{32}$), or —P(=S)($Q_{31}$)($Q_{32}$), and wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_6$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

2. The light-emitting device of claim 1, wherein the interlayer comprises:

i) a first compound being the organometallic compound represented by Formula 1; and ii) a second compound comprising at least one π electron-deficient nitrogen-containing $C_1$-$C_{60}$ cyclic group, a third compound comprising a group represented by Formula 3, a fourth compound to emit delayed fluorescence, or any combination thereof, wherein the first compound, the second compound, the third compound, and the fourth compound are different from each other:

Formula 3

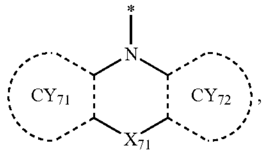

and wherein ring $CY_{71}$ and ring $CY_{72}$ in Formula 3 are each independently a π electron-rich $C_3$-$C_{60}$ cyclic group or a pyridine group, $X_{71}$ in Formula 3 is a single bond, or a linking group comprising O, S, N, B, C, Si, or any combination thereof,

* in Formula 3 indicates a binding site to a neighboring atom of the third compound, and the third compound does not include compounds below:

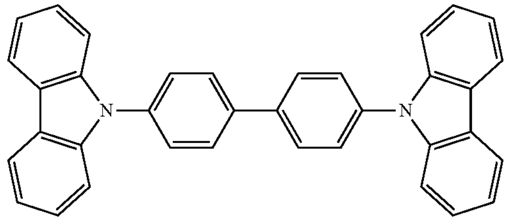

CBP

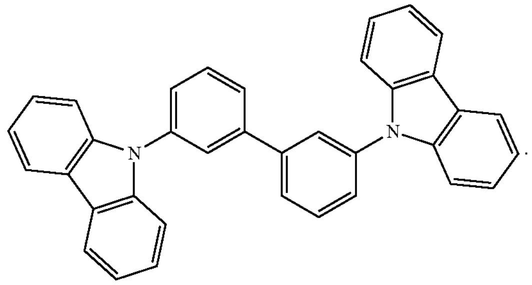

mCBP

3. The light-emitting device of claim 2, wherein the emission layer comprises: i) the first compound; and ii) the second compound, the third compound, the fourth compound, or any combination thereof, and the emission layer is to emit phosphorescent light or fluorescent light emitted from the first compound.

4. The light-emitting device of claim 2, wherein the interlayer comprises: the first compound represented by Formula 1; and at least one selected from the second compound and the third compound.

5. The light-emitting device of claim 4, wherein the interlayer further comprises the fourth compound.

6. The light-emitting device of claim 2, wherein the second compound comprises a pyridine group, a pyrimidine group, a pyrazine group, a pyridazine group, a triazine group, or any combination thereof.

7. The light-emitting device of claim 2, wherein the fourth compound is a compound comprising at least one cyclic group comprising boron (B) and nitrogen (N) as ring-forming atoms.

8. An electronic apparatus comprising:

the light-emitting device of claim 1; and a thin-film transistor, wherein the thin-film transistor comprises a source electrode and a drain electrode, and the first electrode of the light-emitting device is electrically coupled to one of the source electrode or the drain electrode of the thin-film transistor.

9. The electronic apparatus of claim 8, further comprising a color filter, a color conversion layer, a touch screen layer, a polarizing layer, or any combination thereof.

10. An organometallic compound represented by Formula 1:

Formula 1

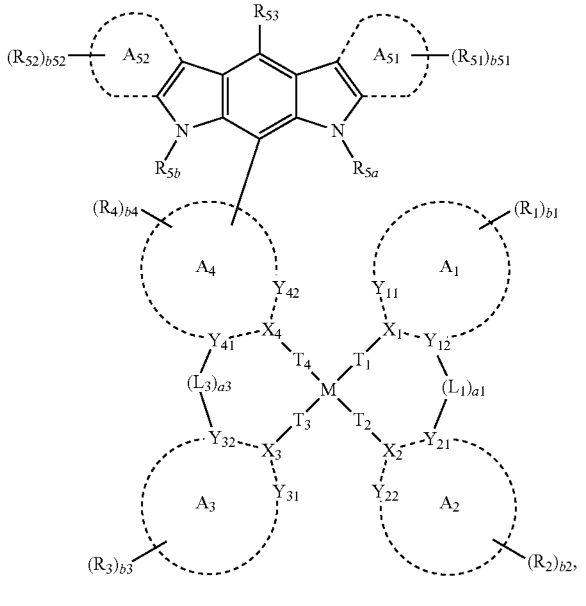

wherein, in Formula 1,

M is platinum (Pt), palladium (Pd), nickel (Ni), copper (Cu), silver (Ag), gold (Au), rhodium (Rh), iridium (Ir), ruthenium (Ru), osmium (Os), titanium (Ti), zirconium (Zr), hafnium (Hf), europium (Eu), terbium (Tb), or thulium (Tm), $X_1$ to $X_4$, $Y_{11}$, $Y_{12}$, $Y_{21}$, $Y_{22}$, $Y_{31}$, $Y_{32}$, $Y_{41}$, and $Y_{42}$ are each independently C or N, $A_1$ to $A_4$, $A_{51}$, and $A_{52}$ are each independently a $C_3$-$C_{60}$ carbocyclic group or a $C_1$-$C_{60}$ heterocyclic group, $T_1$ to $T_4$ are each independently a single bond, *—O—*', *—S—*', *—C($Z_{11}$)($Z_{12}$)—*', *—C($Z_{11}$)=*', *=C($Z_{11}$)—*', *—C($Z_{11}$)=C($Z_{12}$)—*', *—C(=O)—*', *—C(=S)—*', *—C≡C—*', *—B($Z_{11}$)—*', *—N($Z_{11}$)—*', *—P($Z_{11}$)—*', *—Si($Z_{11}$)($Z_{12}$)—*', or *—Ge($Z_{11}$)($Z_{12}$)—*', $L_1$ to $L_3$ are each independently a single bond, a double bond, *—N($Z_{21}$)—*', *—B($Z_{21}$)—*', *—P($Z_{21}$)—*', *—C($Z_{21}$)($Z_{22}$)—*', *—Si($Z_{21}$)($Z_{22}$)—*', *—Ge($Z_{21}$)($Z_{22}$)—*', *—S—*', *—Se—*', *—O—*', *—C(=O)—*', *—S(=O)—*', *—S(=O)$_2$—*', *—C($Z_{21}$)=*', *=C($Z_{21}$)—*', *—C($Z_{21}$)=C($Z_{22}$)—*', *—C(=S)—*', or *—C≡C—*',

* and *' each indicate a binding site to a neighboring atom, a1 to a3 are each independently an integer from 0 to 3, $R_1$ to $R_4$, $R_{51}$ to $R_{53}$, $R_{5a}$, $R_{5b}$, $Z_{11}$, $Z_{12}$, $Z_{21}$, and $Z_{22}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), or —P(=S)($Q_1$)($Q_2$), $R_{5a}$ and $R_{5b}$ are not both simultaneously a benzene group unsubstituted or substituted with at least one $R_{10a}$, b1 to b4, b51, and b52 are each independently an integer from 0 to 10, when b1 is 2 or more, two $R_1$(s) of two or more $R_1$(s) are optionally bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, when b2 is 2 or more, two $R_2$(s) of two or more $R_2$(s) are optionally bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, when b3 is 2 or more, two $R_3$(s) of two or more $R_3$(s) are optionally bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, when b4 is 2 or more, two $R_4$(s) of two or more $R_4$(s) are optionally bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, when b51 is 2 or more, two $R_{51}$(s) of two or more $R_{51}$(s) are optionally bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, when b52 is 2 or more, two $R_{52}$(s) of two or more $R_{52}$(s) are optionally bonded together to form a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —P($Q_{11}$)($Q_{12}$), —C(=O)($Q_{11}$), —S(=O)($Q_{11}$), —S(=O)$_2$($Q_{11}$), —P(=O)($Q_{11}$)($Q_{12}$), —P(=S)($Q_{11}$)($Q_{12}$), or any combination thereof;

a $C_3$-$C_{60}$ carbocyclic group, a $C_1$-$C_6$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —P($Q_{21}$)($Q_{22}$), —C(=O)($Q_{21}$), —S(=O)($Q_{21}$), —S(=O)$_2$($Q_{21}$), —P(=O)($Q_{21}$)($Q_{22}$), —P(=S)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —P($Q_{31}$)($Q_{32}$), —C(=O)($Q_{31}$), —S(=O)($Q_{31}$), —S(=O)$_2$($Q_{31}$), —P(=O)($Q_{31}$)($Q_{32}$), or —P(=S)($Q_{31}$)($Q_{32}$), and wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

11. The organometallic compound of claim 10, wherein a bond between $X_1$ and $T_1$, a bond between $X_2$ and $T_2$, and a bond between $X_3$ and $T_3$ are each a covalent bond, and a bond between $X_4$ and $T_4$ is a coordinate bond.

12. The organometallic compound of claim 10, wherein $Y_{21}$, $Y_{41}$, and $Y_{42}$ are each N.

13. The organometallic compound of claim 10, wherein $A_1$ is an $X_1$-containing 6-membered ring, $A_2$ is an $X_2$-containing 6-membered ring or an $X_2$-containing 6-membered ring condensed with at least one 5-membered ring, $A_3$ is an $X_3$-containing 6-membered ring, and $A_4$ is an $X_4$-containing 5-membered ring or an $X_4$-containing 5-membered ring condensed with at least one 6-membered ring.

14. The organometallic compound of claim 10, wherein a group represented by

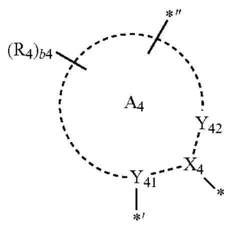

in Formula 1 is one of groups represented by Formulae A4(1) to A4(8):

A4(1)

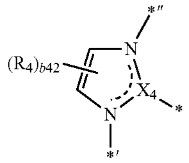

A4(2)

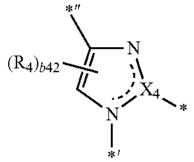

-continued

A4(3)

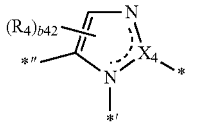

A4(4)

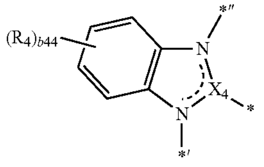

A4(5)

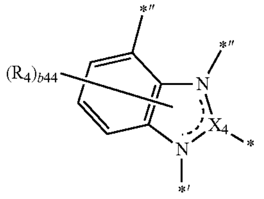

A4(6)

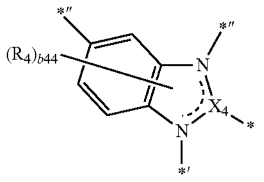

A4(7)

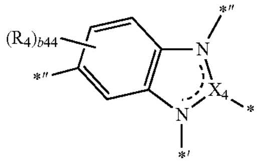

A4(8)

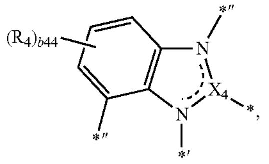

and wherein, in Formulae A4(1) to A4(8), $X_4$ and $R_4$ are each the same as described in connection with Formula 1, b42 is an integer from 0 to 2, b44 is an integer from 0 to 4, and

*, *', and *" each indicate a binding site to a neighboring atom.

15. The organometallic compound of claim 10, wherein $R_{5a}$ and $R_{5b}$ are each independently: hydrogen, deuterium, —F, —Cl, —Br, —I, a hydroxyl group, a cyano group, or a nitro group; or a $C_1$-$C_{20}$ alkyl group, a $C_2$-$C_{20}$ alkenyl group, a $C_2$-$C_{20}$ alkynyl group, or a $C_1$-$C_{20}$ alkoxy group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a phenyl group, a naphthyl group, —$Si(Q_{31})(Q_{32})(Q_{33})$, —$N(Q_{31})(Q_{32})$, —$B(Q_{31})(Q_{32})$, or any combination thereof, and $Q_{31}$ to $Q_{33}$ are each the same as described in connection with Formula 1.

16. The organometallic compound of claim 10, wherein $R_{5a}$ and $R_{5b}$ are each independently: deuterium or —F; or a $C_1$-$C_{20}$ alkyl group unsubstituted or substituted with deuterium, —F, —$CD_3$, —$CD_2H$, —$CDH_2$, —$CF_3$, —$CF_2H$, —$CFH_2$, a phenyl group, or any combination thereof.

17. The organometallic compound of claim 10, wherein $R_1$ to $R_4$, $R_{51}$, $R_{52}$, $Z_{11}$, $Z_{12}$, $Z_{21}$, and $Z_{22}$ are each independently:

hydrogen, deuterium, —F, —Cl, —Br, —I, a hydroxyl group, a cyano group, or a nitro group;

a $C_1$-$C_{20}$ alkyl group, a $C_2$-$C_{20}$ alkenyl group, a $C_2$-$C_{20}$ alkynyl group, or a $C_1$-$C_{20}$ alkoxy group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, —$Si(Q_{31})(Q_{32})(Q_{33})$, —$N(Q_{31})(Q_{32})$, —$B(Q_{31})(Q_{32})$, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an isoindolyl group, an indolyl group, a carbazolyl group, a phenanthrolinyl group, a benzofuranyl group, a benzothiophenyl group, a dibenzofuranyl group, a dibenzothiophenyl group, a benzocarbazolyl group, or a dibenzocarbazolyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an isoindolyl group, an indolyl group, a carbazolyl group, a phenanthrolinyl group, a benzofuranyl group, a benzothiophenyl group, a dibenzofuranyl group, a dibenzothiophenyl group, a benzocarbazolyl group, a dibenzocarbazolyl group, —$Si(Q_{31})(Q_{32})(Q_{33})$, —$N(Q_{31})(Q_{32})$, —$B(Q_{31})(Q_{32})$, or any combination thereof, or $Si(Q_1)(Q_2)(Q_3)$, —$N(Q_1)(Q_2)$, or —$B(Q_1)(Q_2)$, and $Q_1$ to $Q_3$ and $Q_{31}$ to $Q_{33}$ are each the same as described in connection with Formula 1.

18. The organometallic compound of claim 10, wherein Formula 1 is represented by Formula 1-1 or Formula 1-2:

1-1
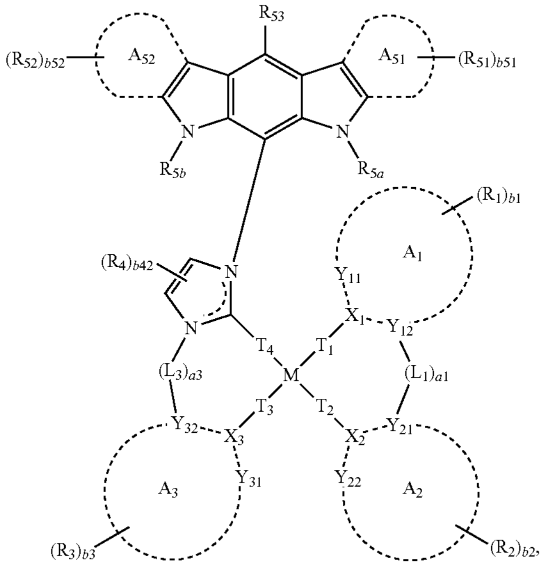
1-2
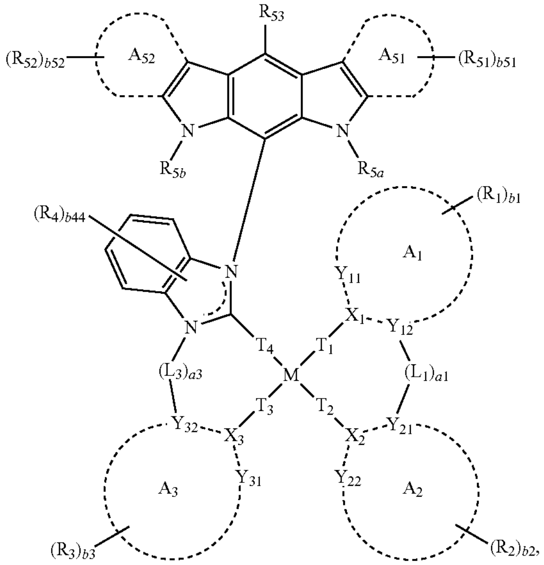
and
wherein, in Formulae 1-1 and 1-2,
M, $X_1$ to $X_3$, $Y_{11}$, $Y_{12}$, $Y_{21}$, $Y_{22}$, $Y_{31}$, $Y_{32}$, $A_1$ to $A_3$, $A_{51}$ and $A_{52}$, $T_1$ to $T_4$, $L_1$ to $L_3$, a1 to a3, $R_1$ to $R_4$, $R_{51}$ to $R_{53}$, $R_{5a}$, $R_{5b}$, b1 to b3, b51, and b52 are each the same as described in connection with Formula 1,
b42 is an integer from 0 to 2, and
b44 is an integer from 0 to 4.
19. The organometallic compound of claim 10, wherein the organometallic compound is selected from Compounds 1 to 128:
1
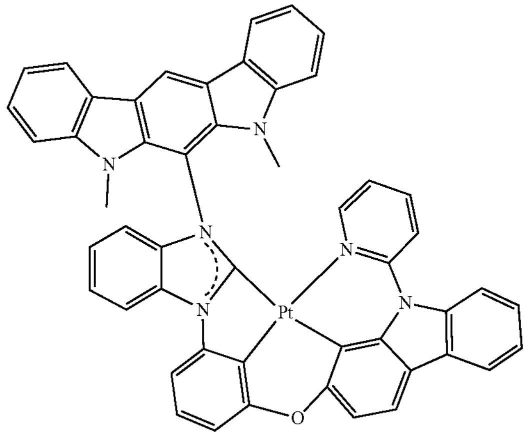
2
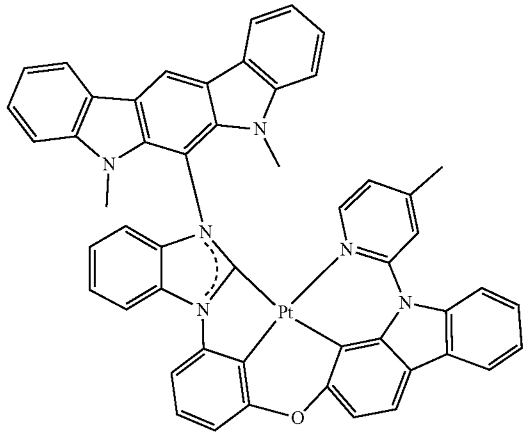
3
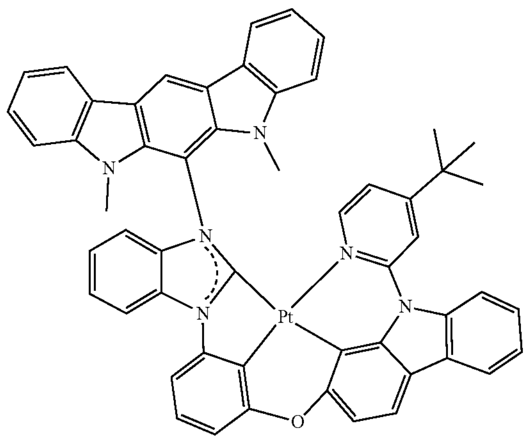

-continued
4
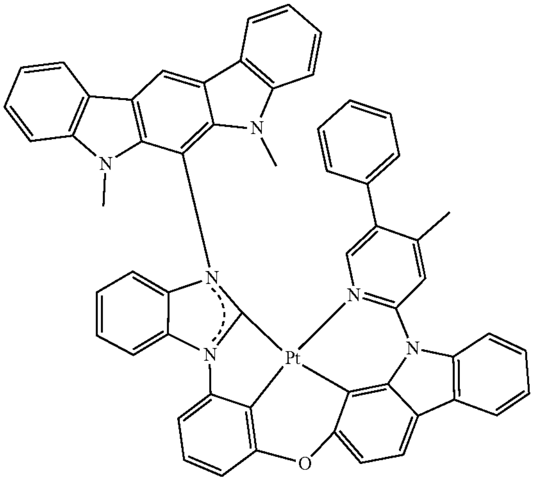
5
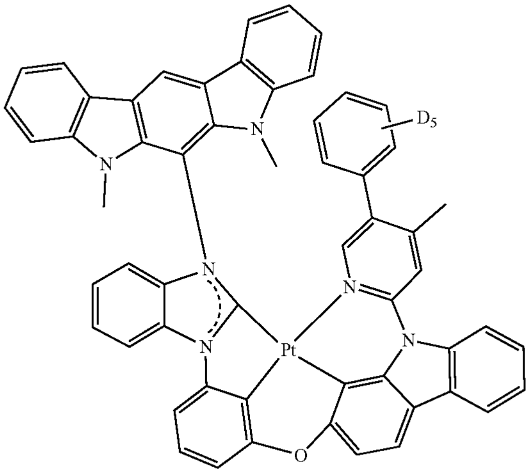
6
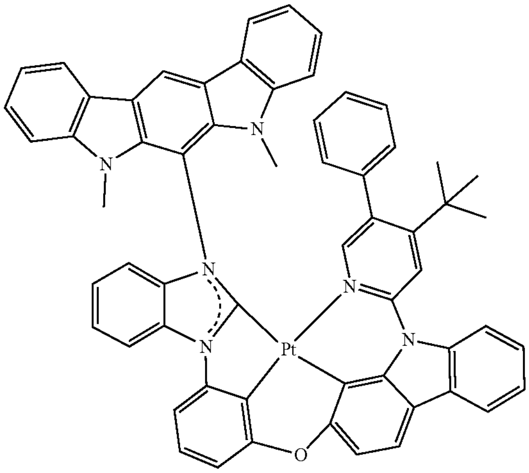
-continued
7
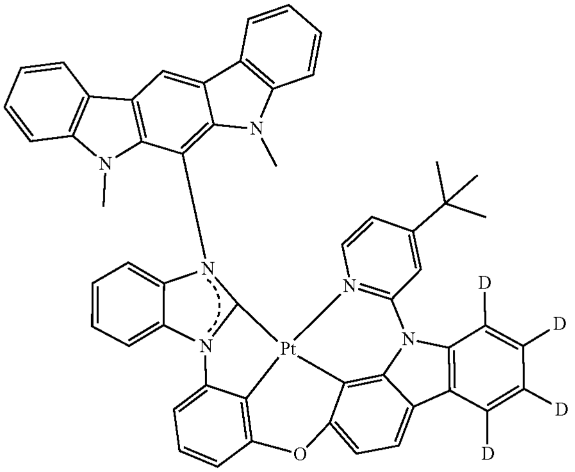
8
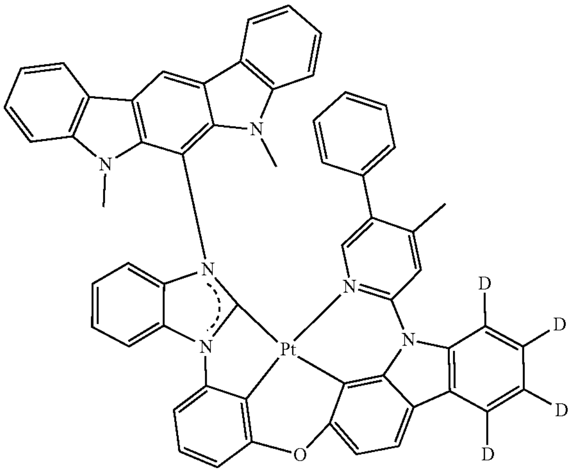
9
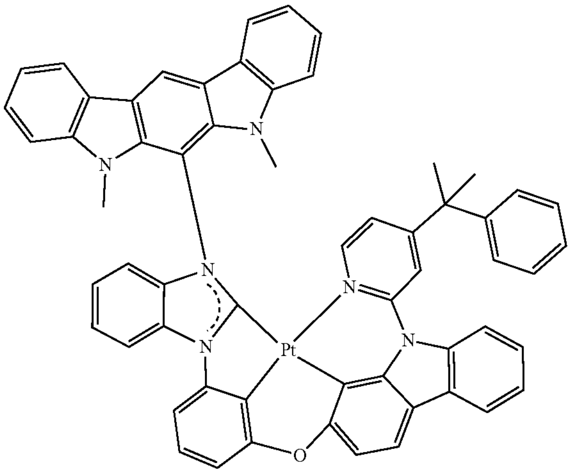

10
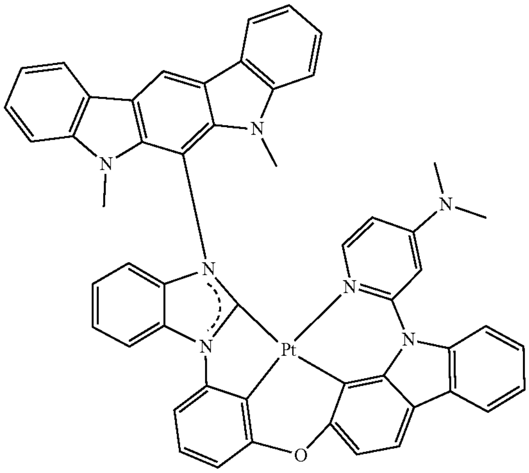
11
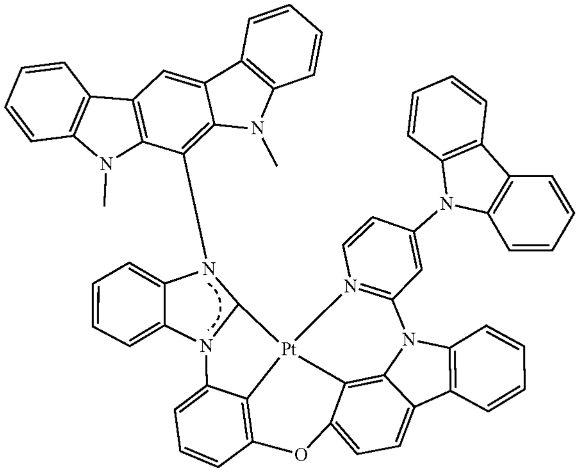
12
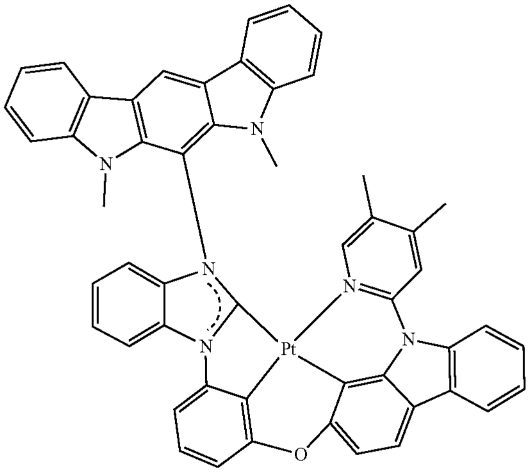
13
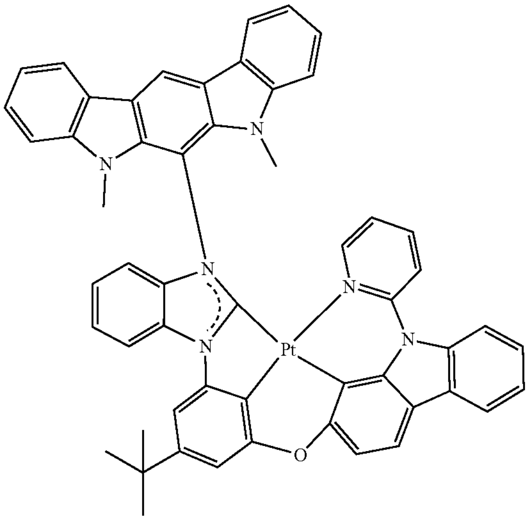
14
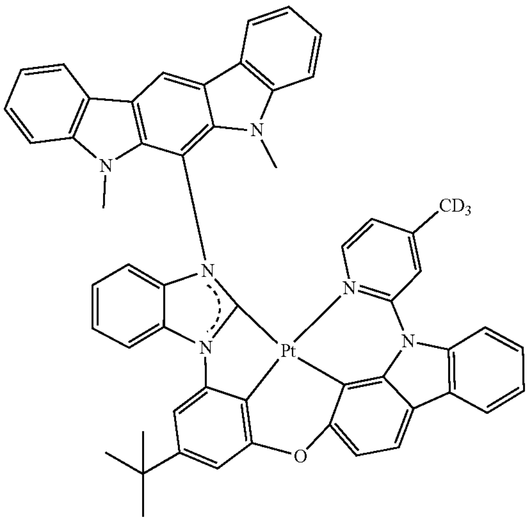
15
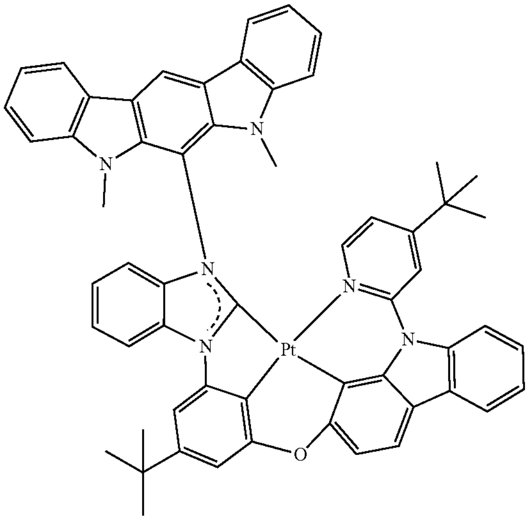

-continued
16
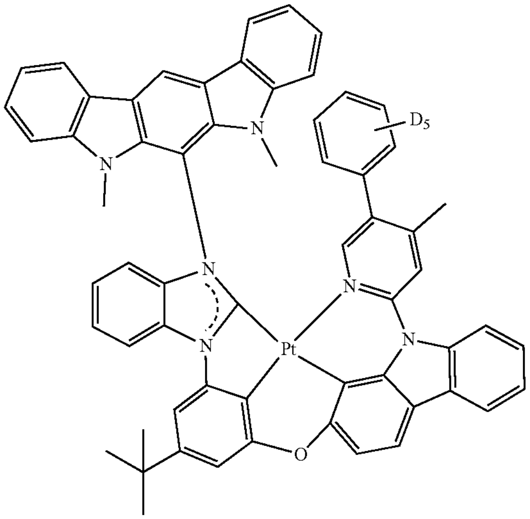
17
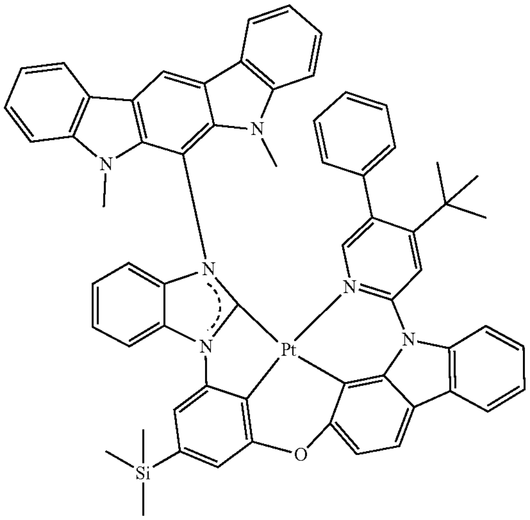
18
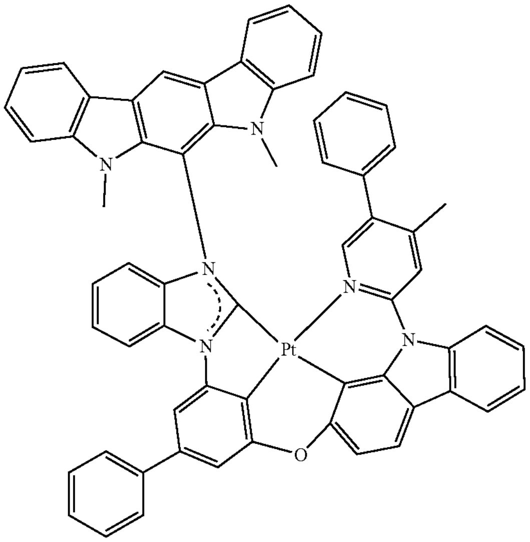
-continued
19
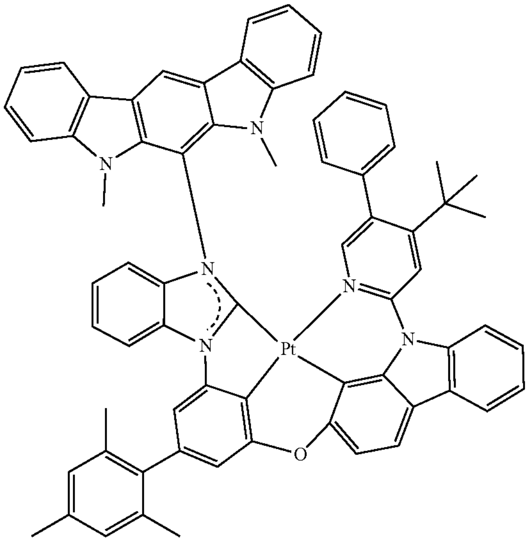
20
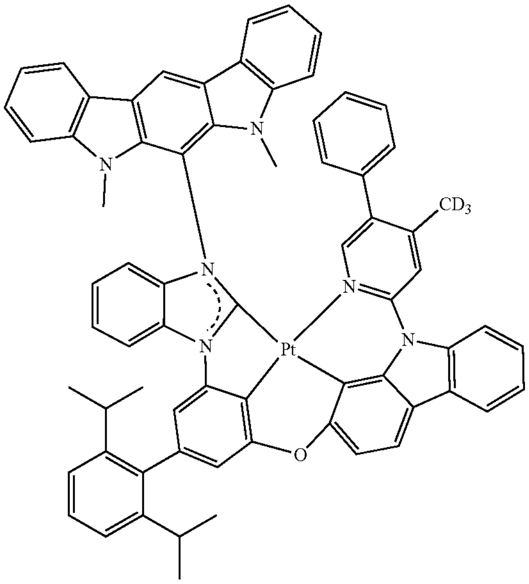
21
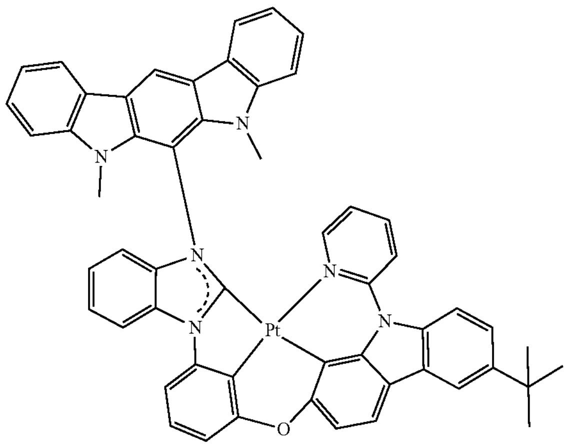

-continued
22
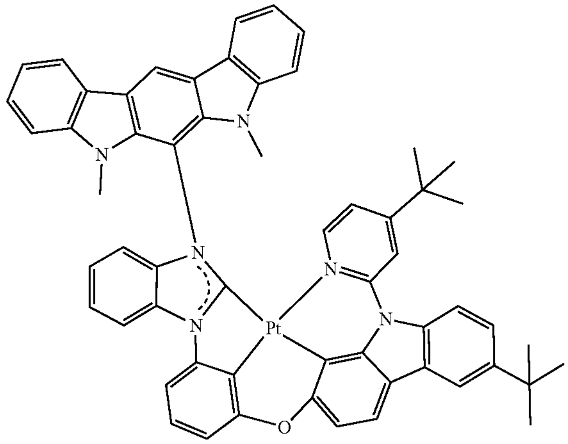
23
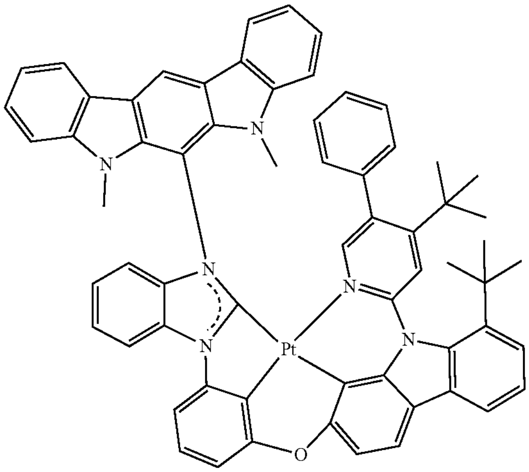
24
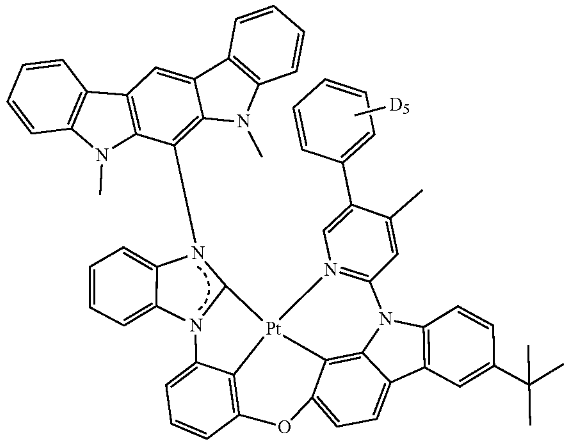
-continued
25
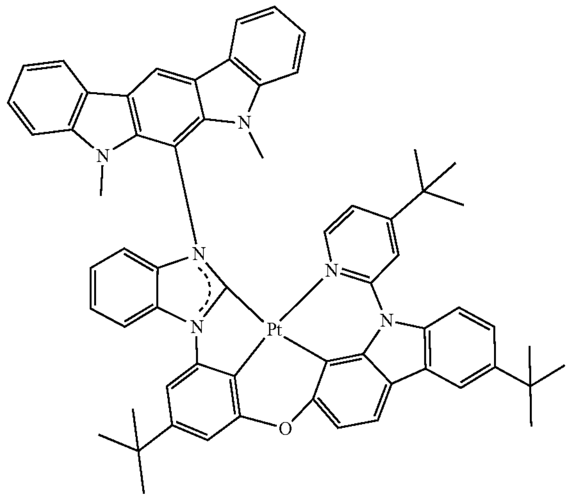
26
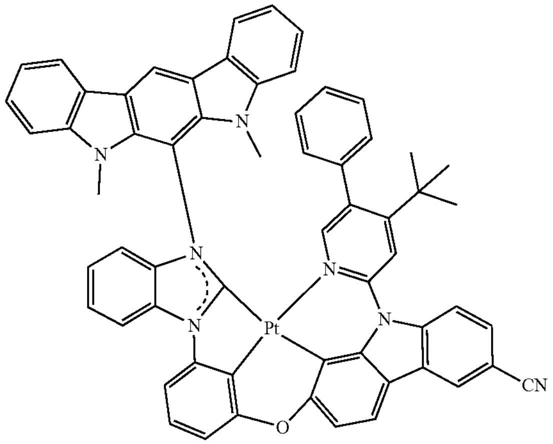
27
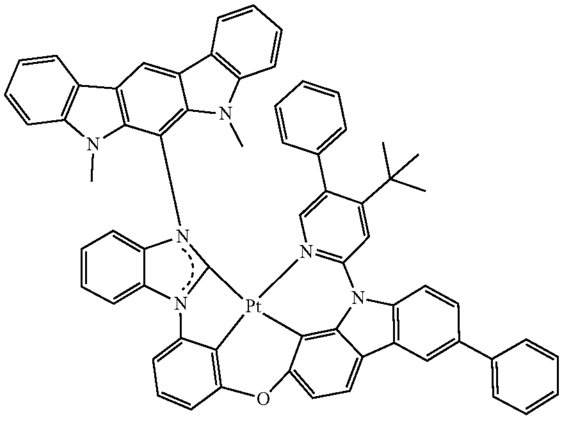

-continued
28
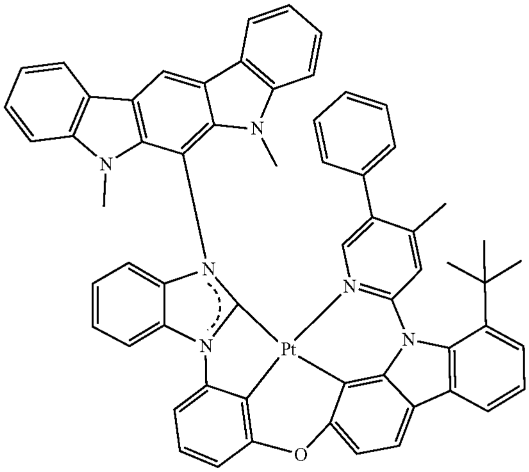
29
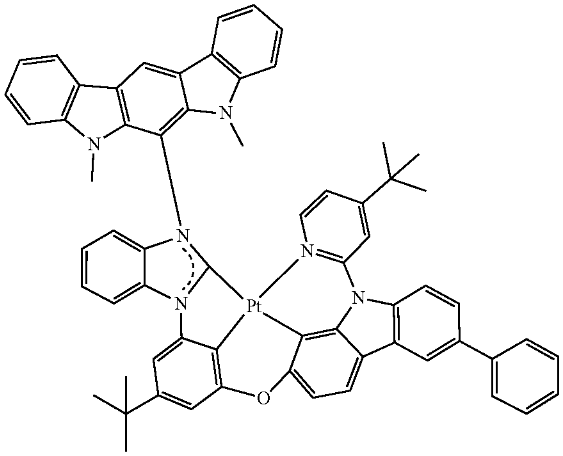
30
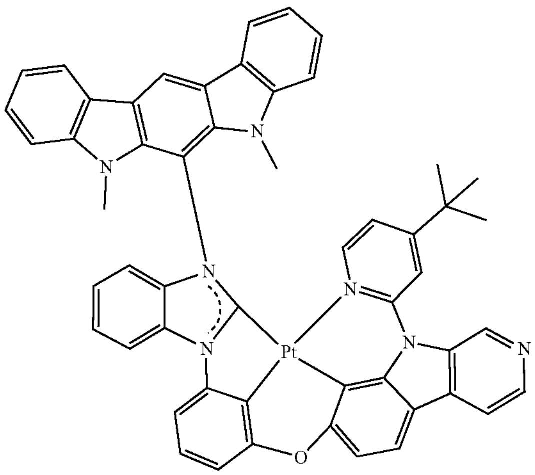
-continued
31
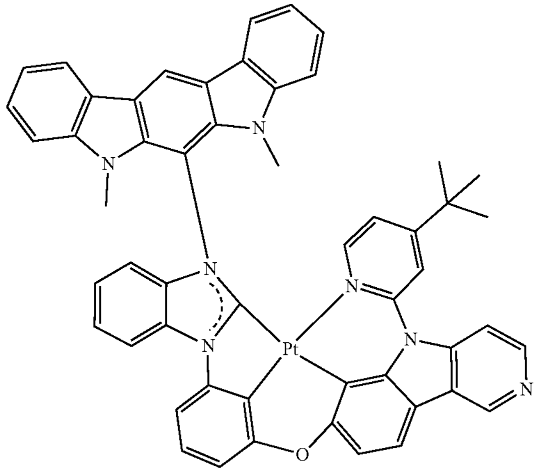
32
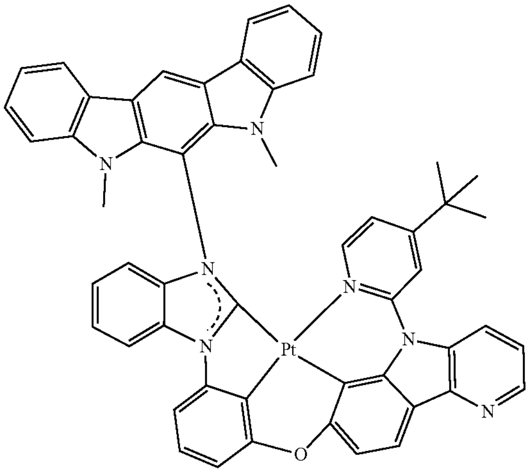
33
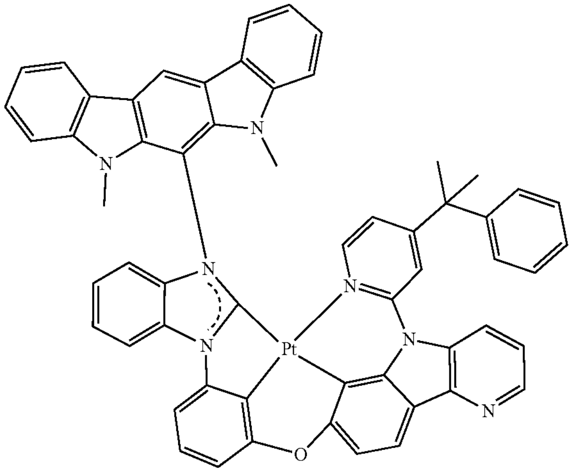

-continued
34
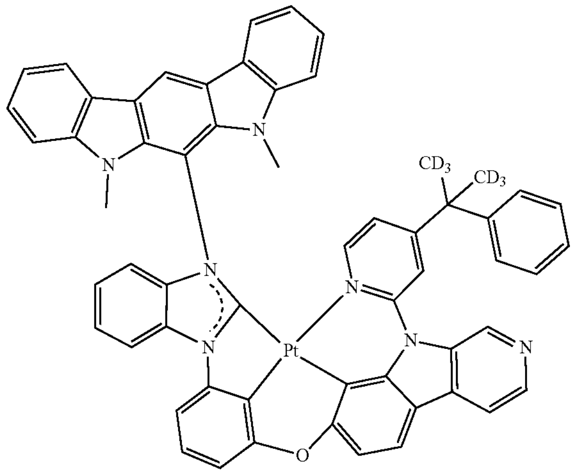
35
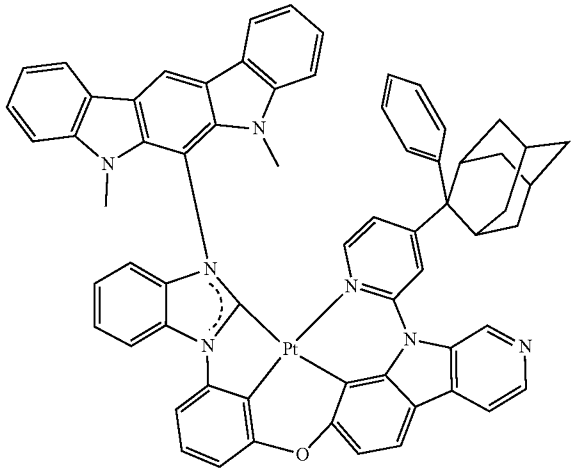
36
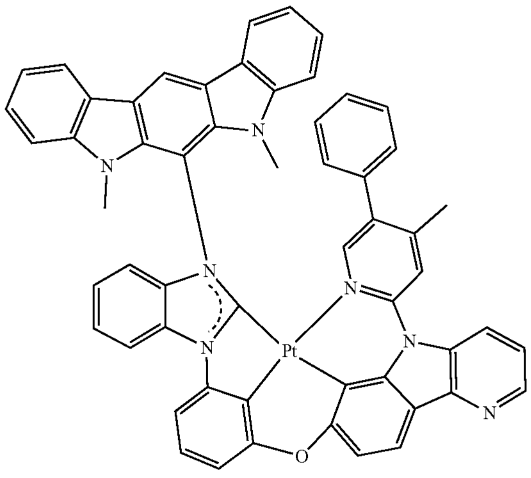
-continued
37
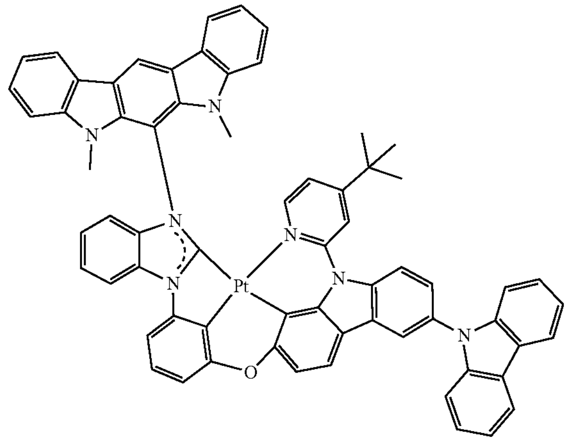
38
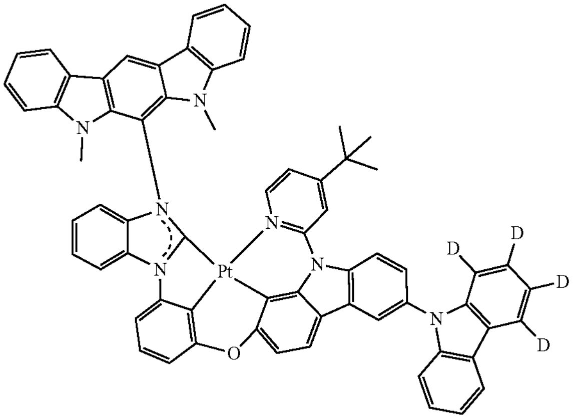
39
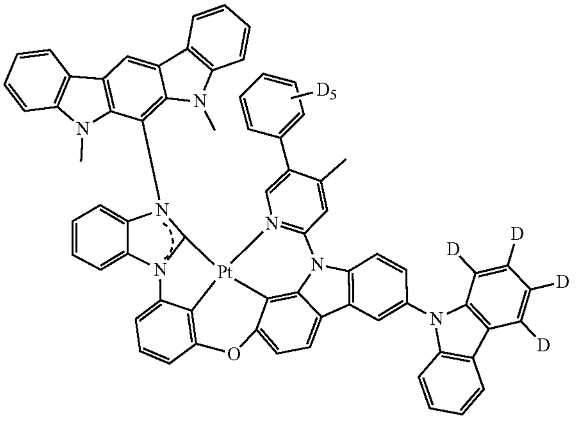

-continued
40
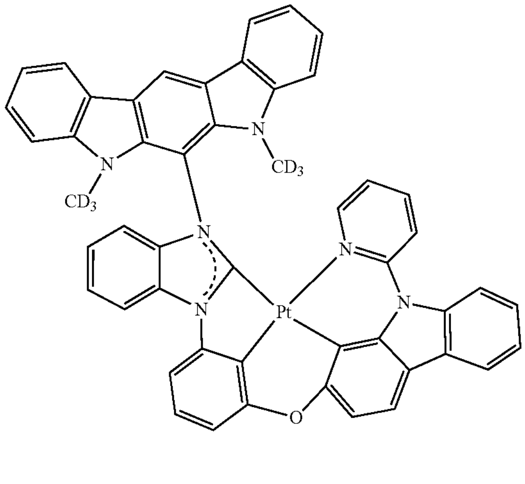
41
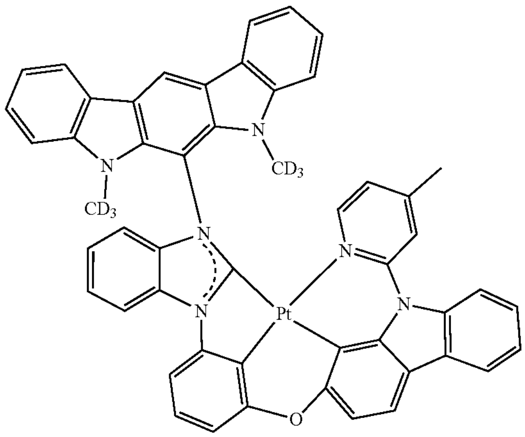
42
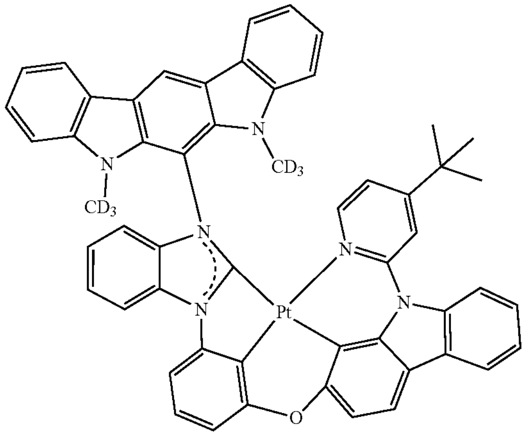
-continued
43
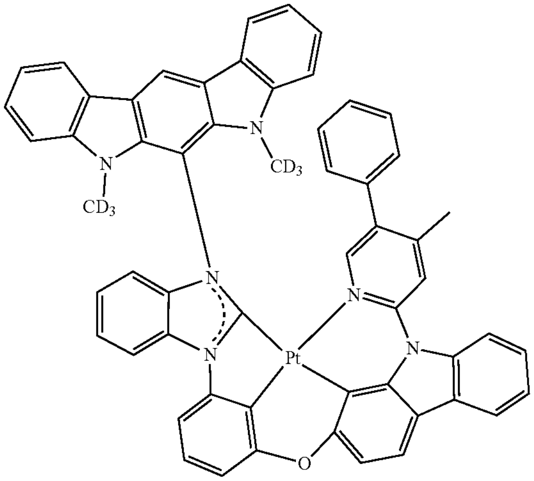
44
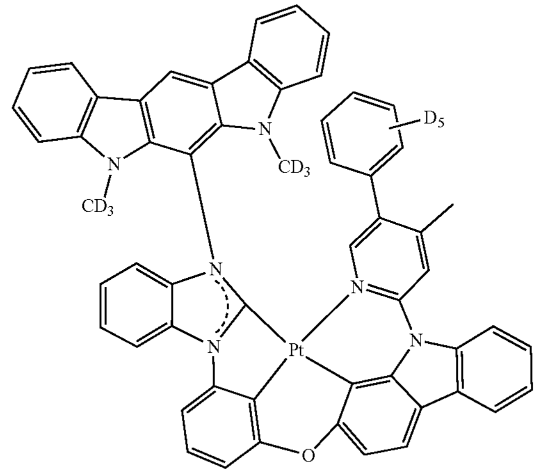
45
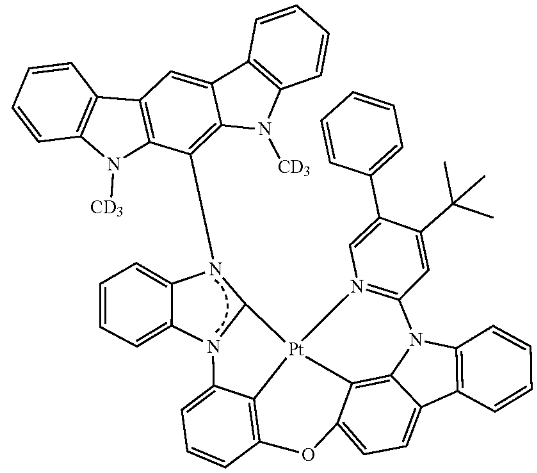

-continued
46
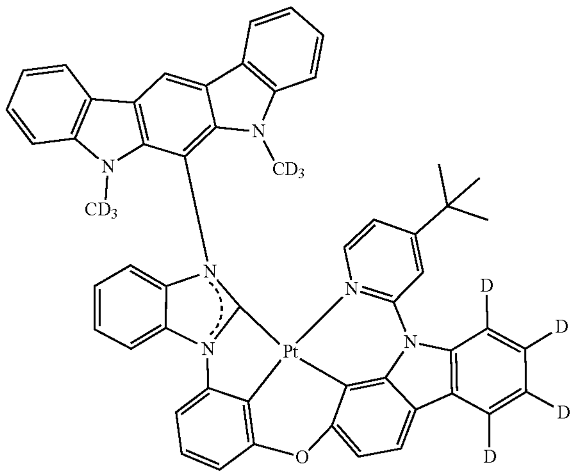
47
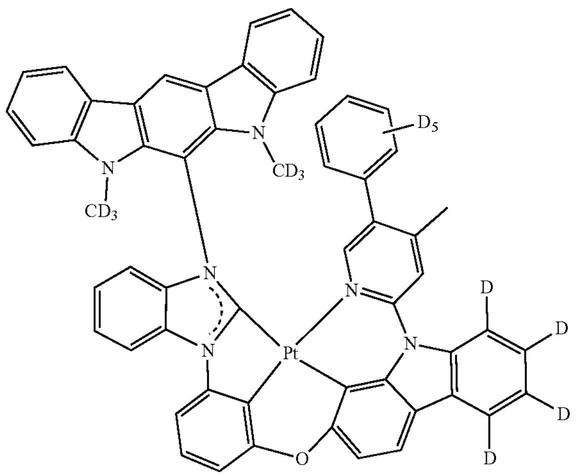
48
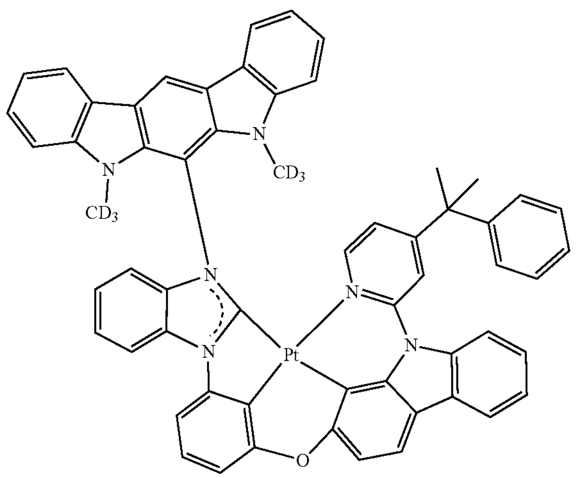
-continued
49
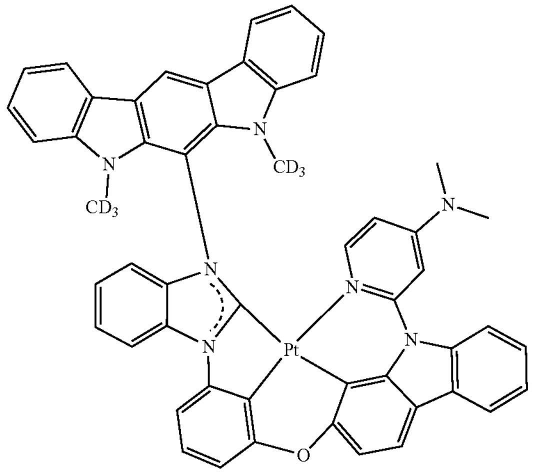
50
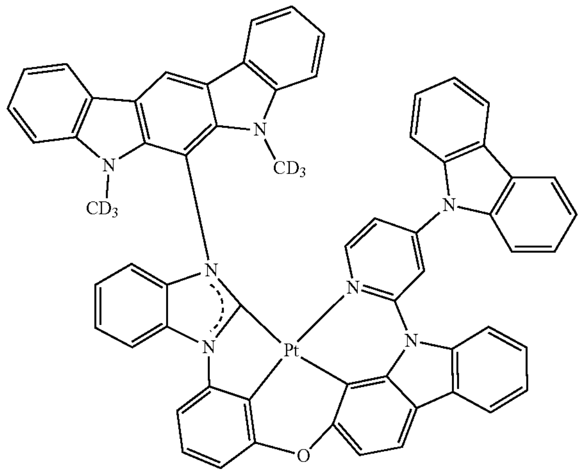
51
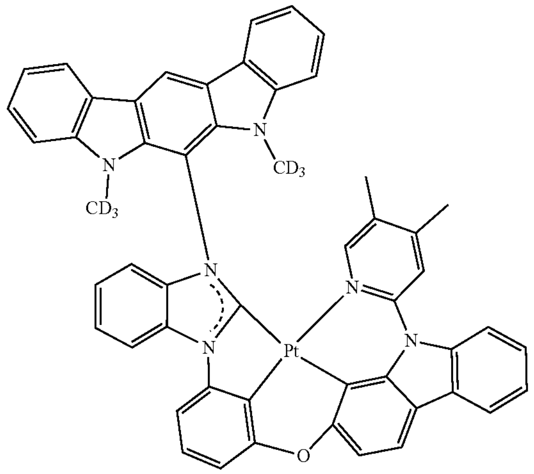

-continued
52
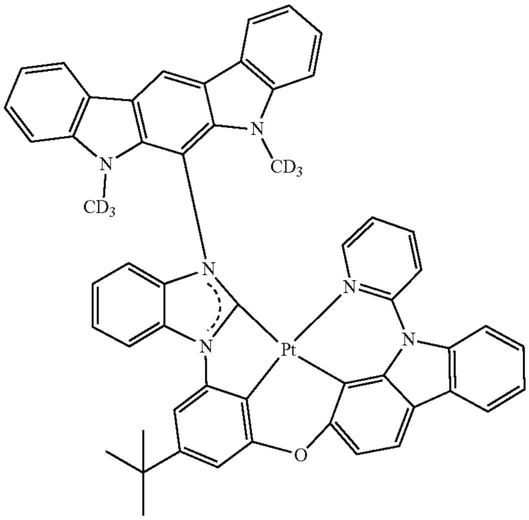
53
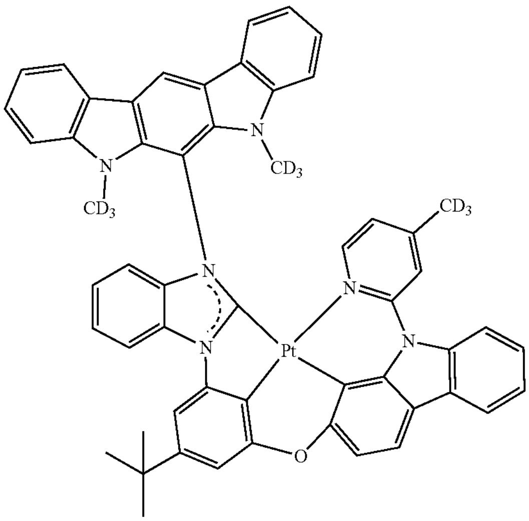
54
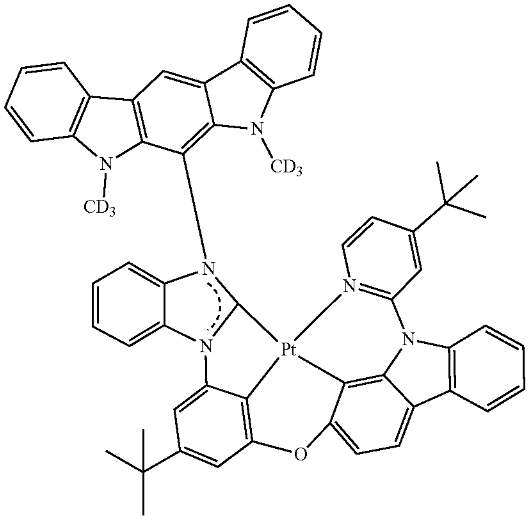
-continued
55
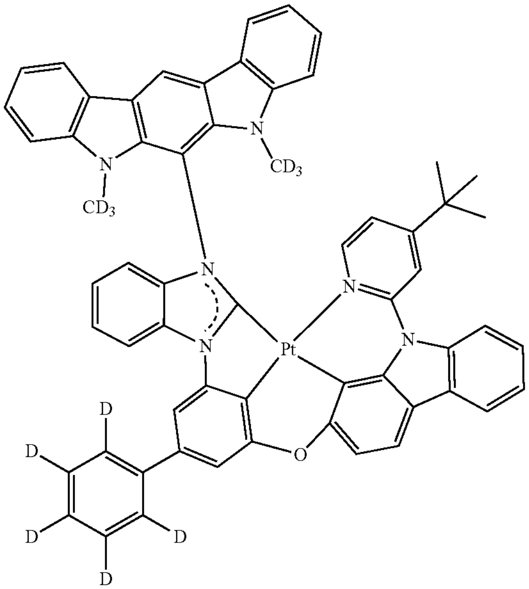
56
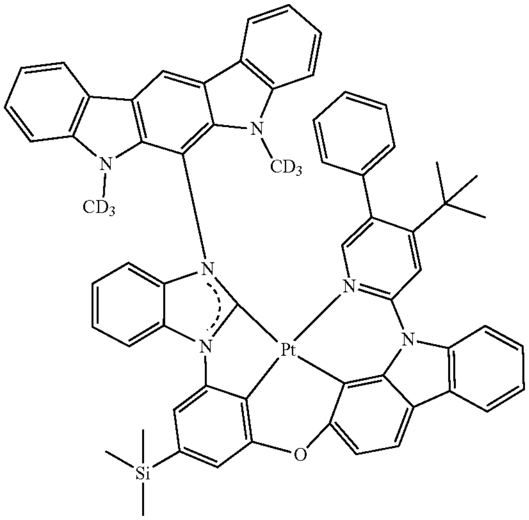

-continued
57
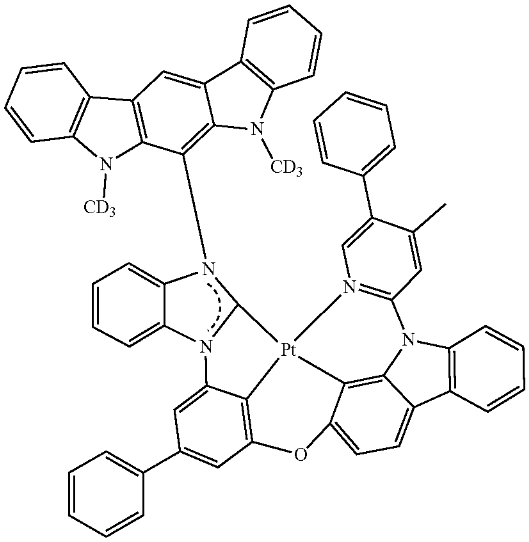
58
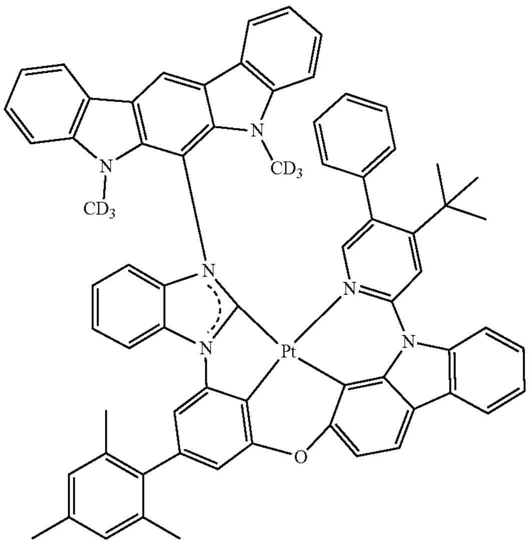
-continued
59
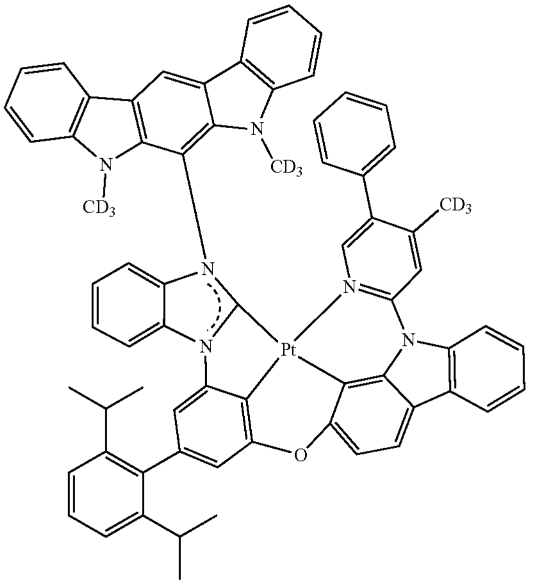
60
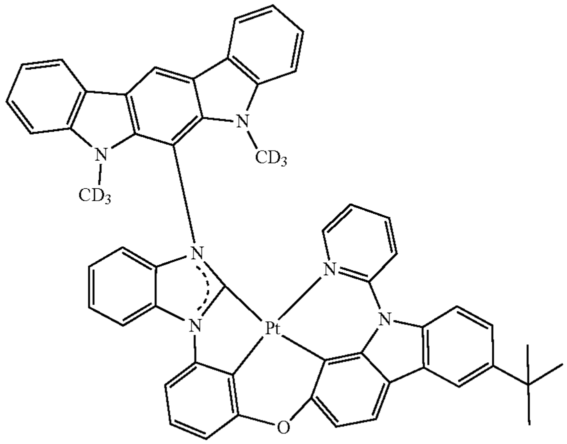
61
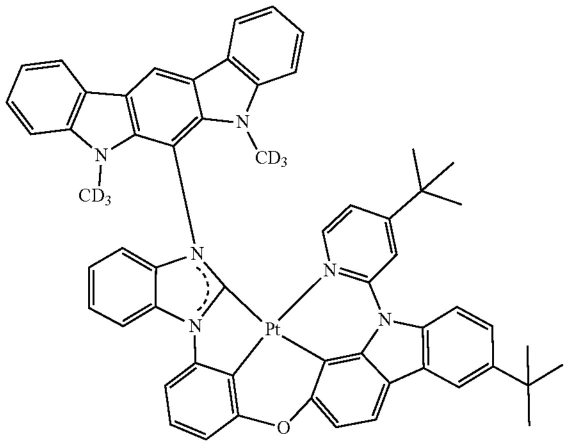

-continued
62
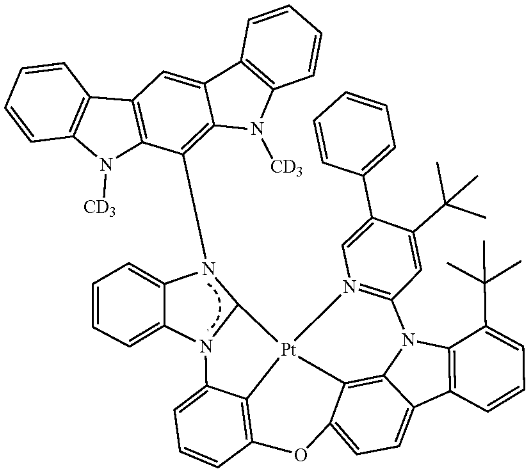
63
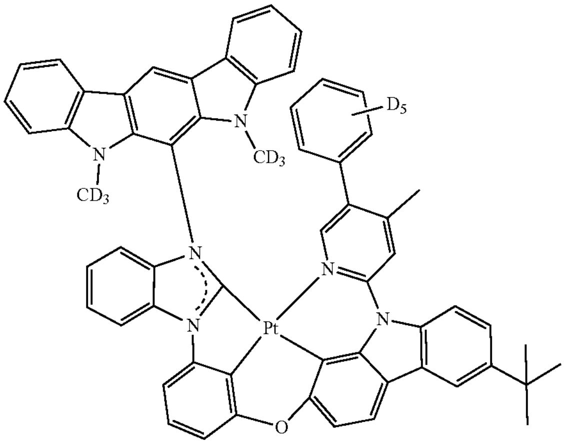
64
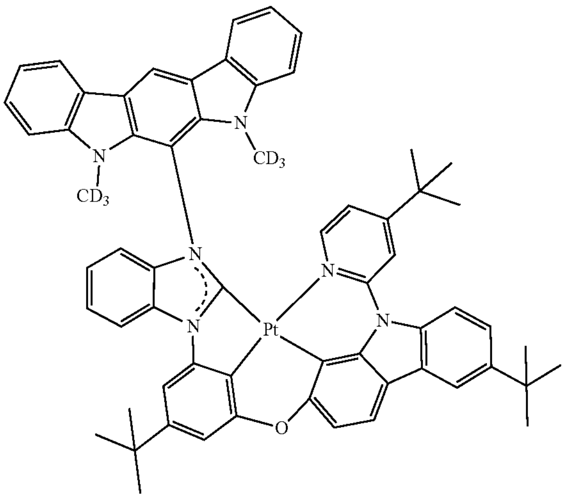
-continued
65
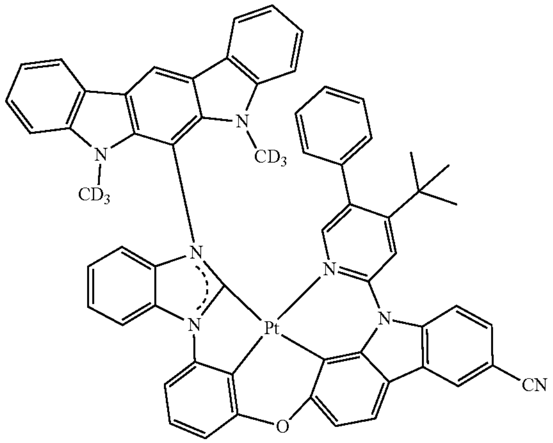
66
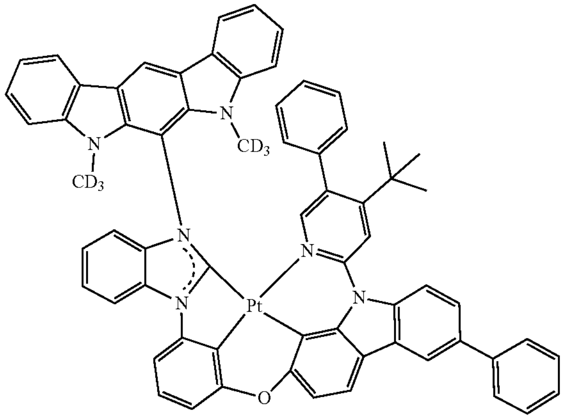
67
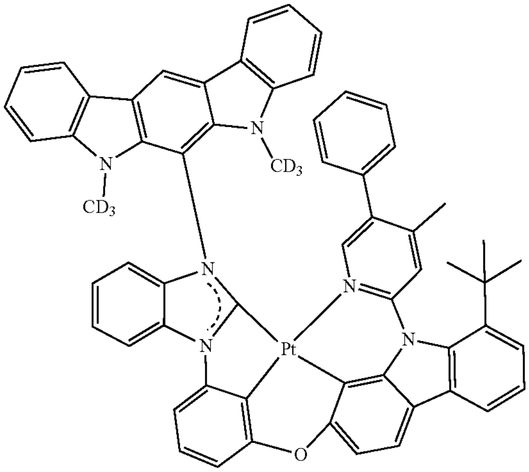

-continued
68
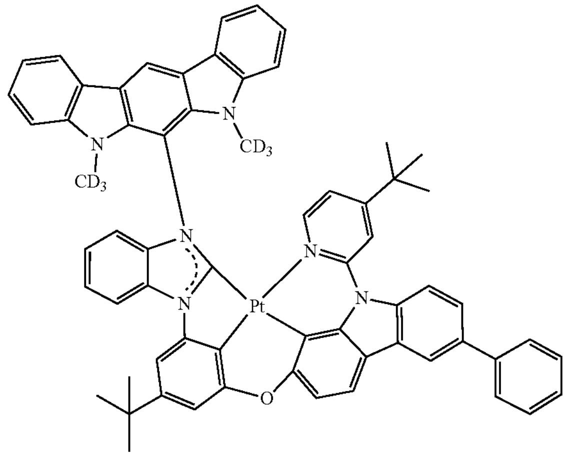
69
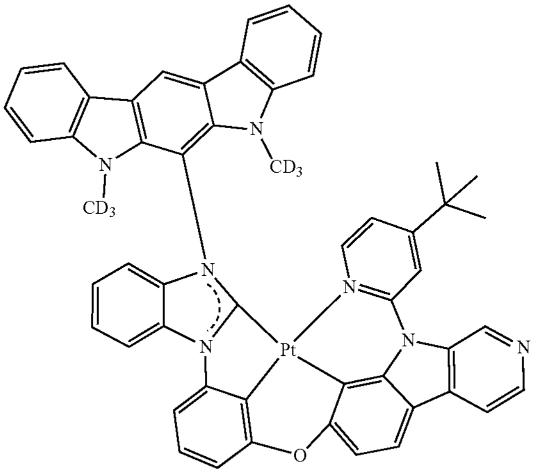
70
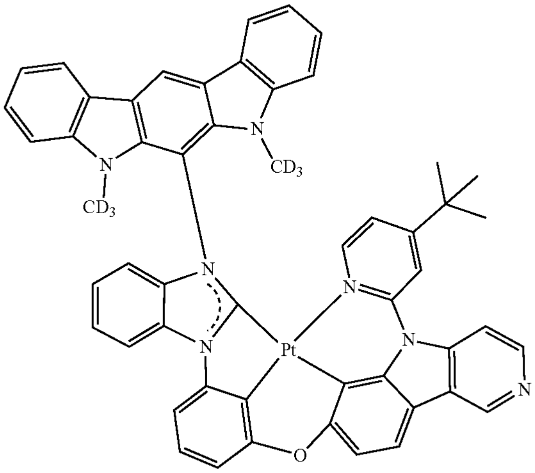
-continued
71
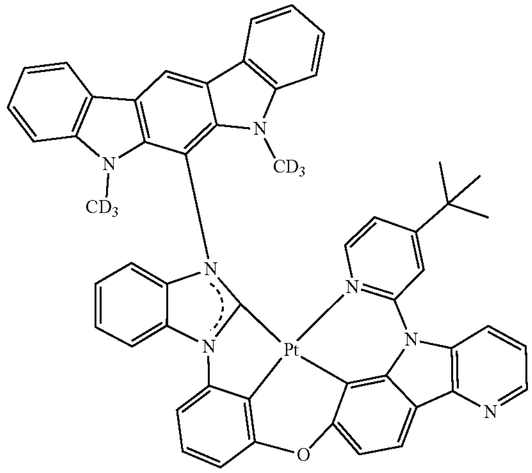
72
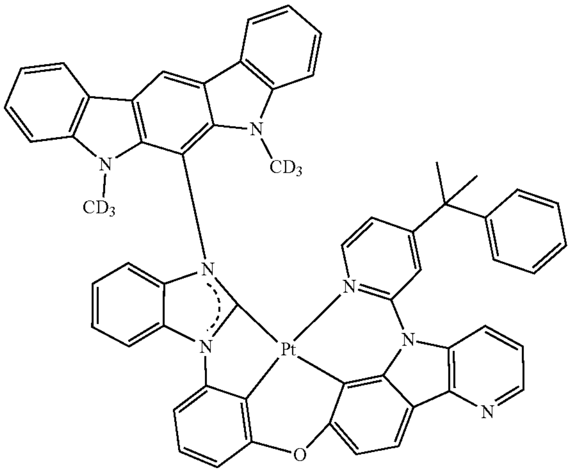
73
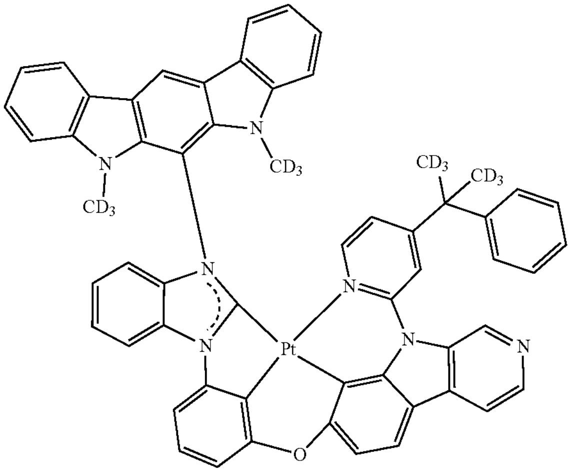

-continued
74
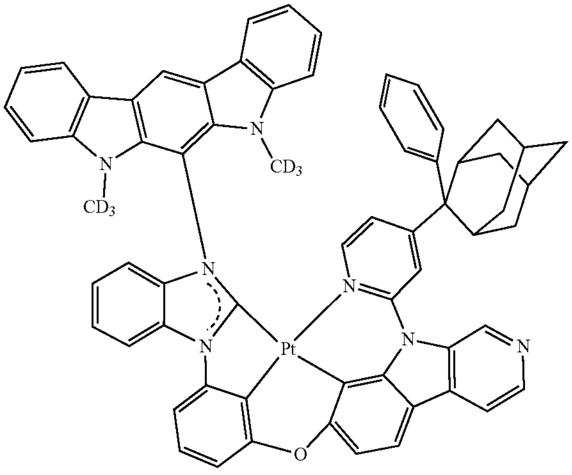
75
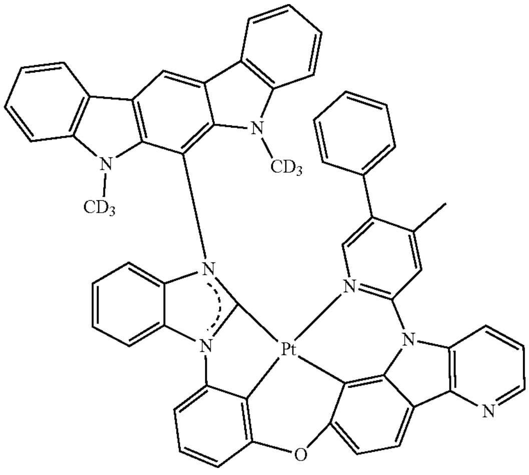
76
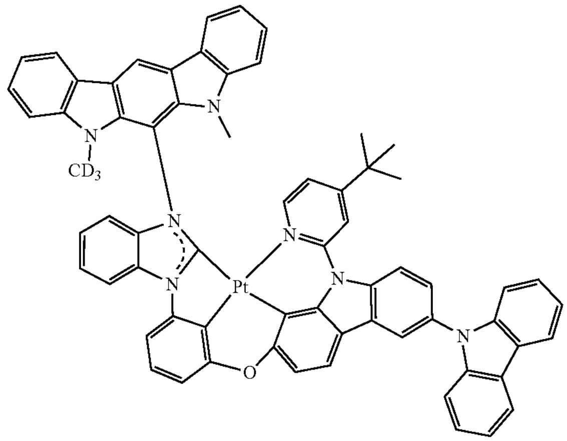
-continued
77
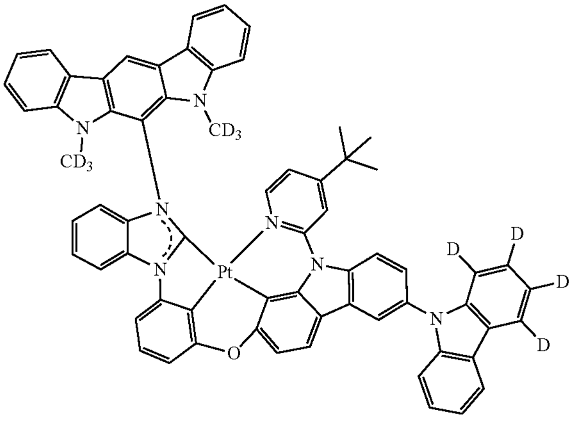
78
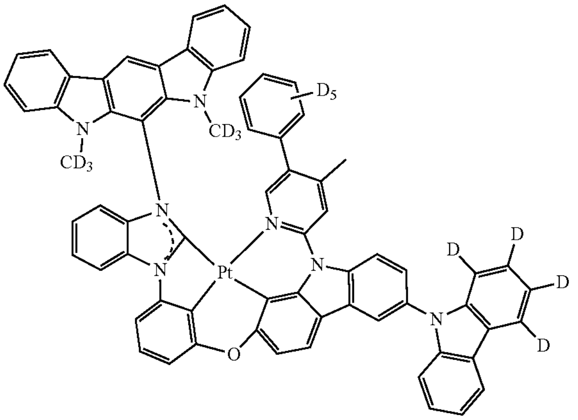
79
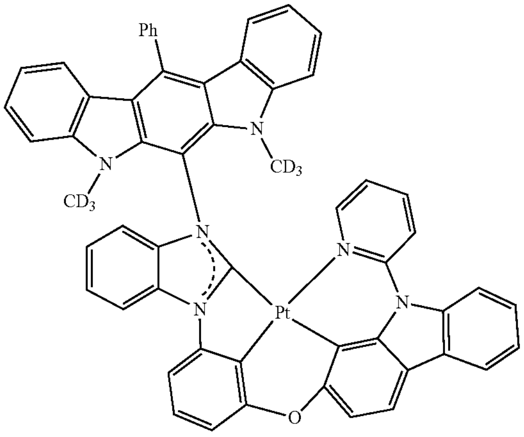

-continued
80
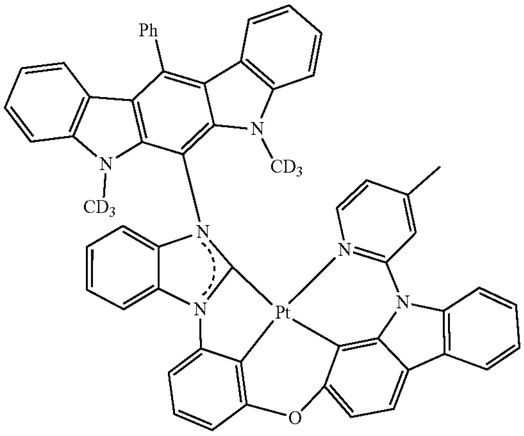
81
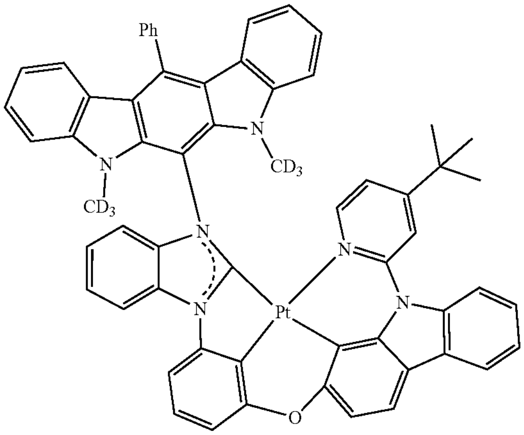
82
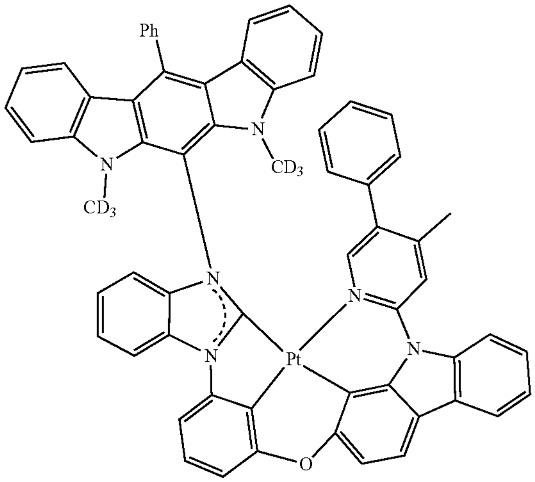
-continued
83
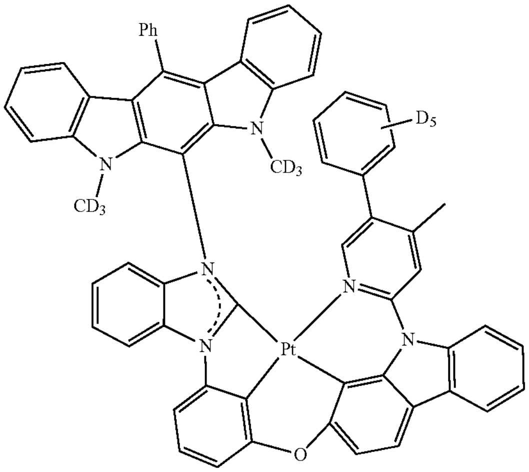
84
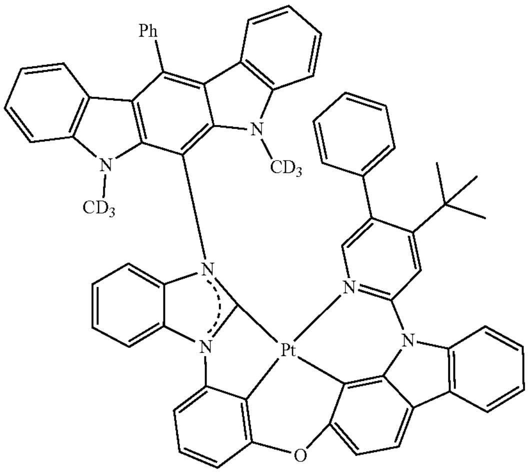
85
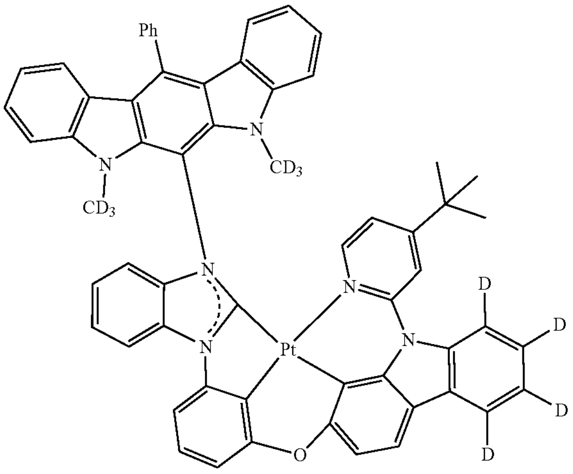

-continued
86
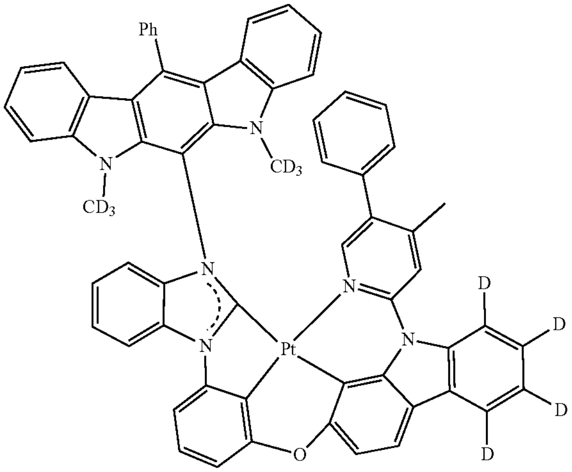
87
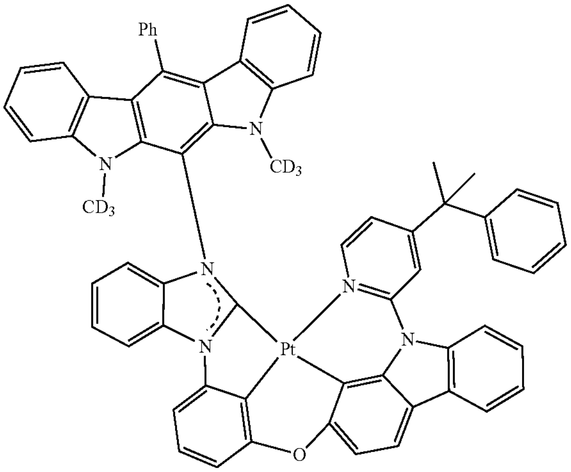
88
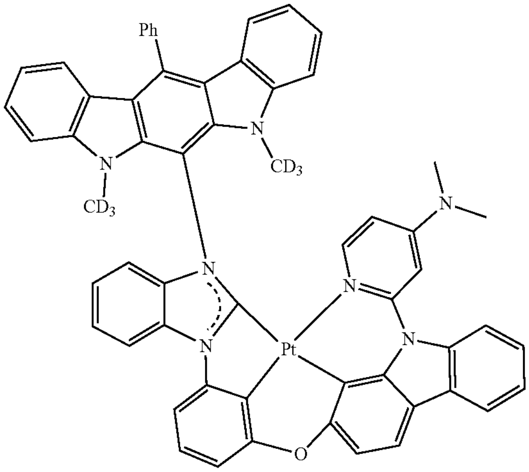
-continued
89
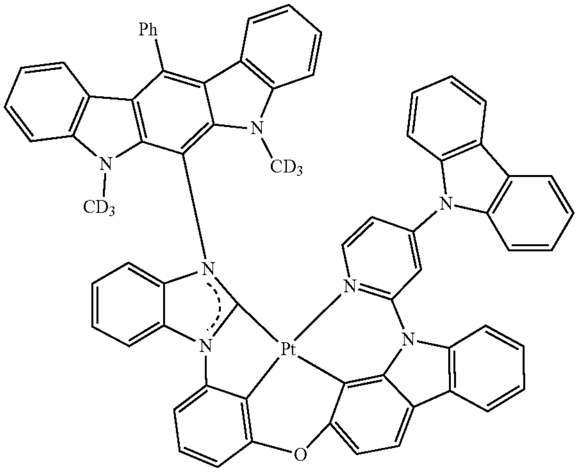
90
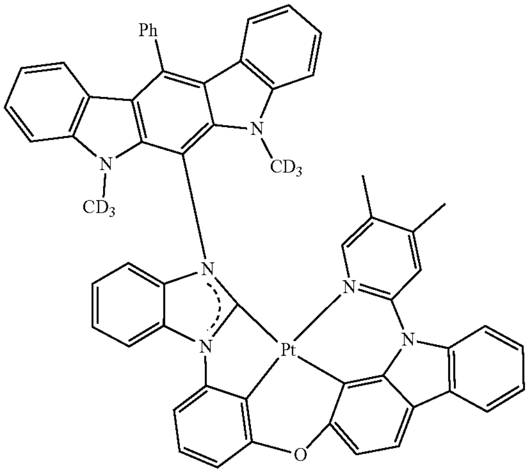
91
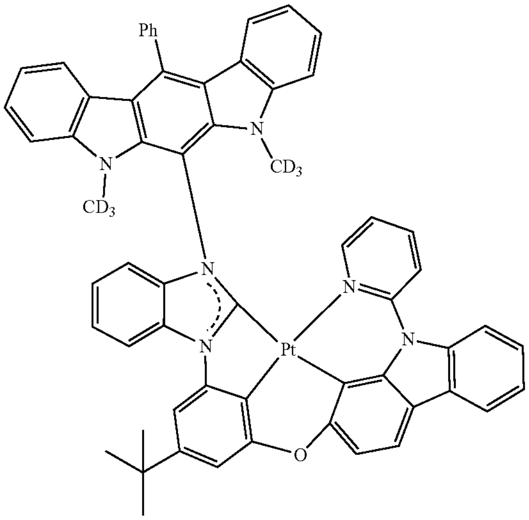

-continued
92
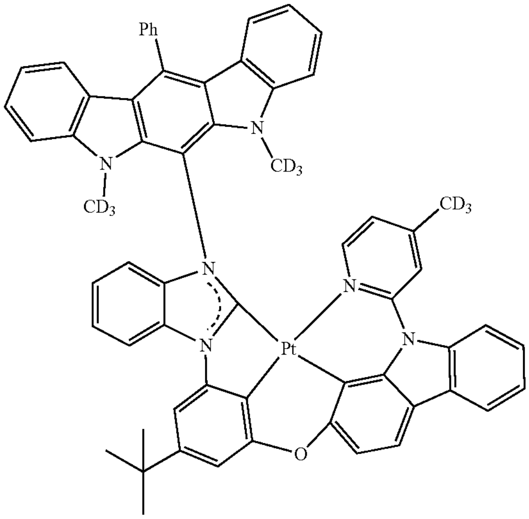
93
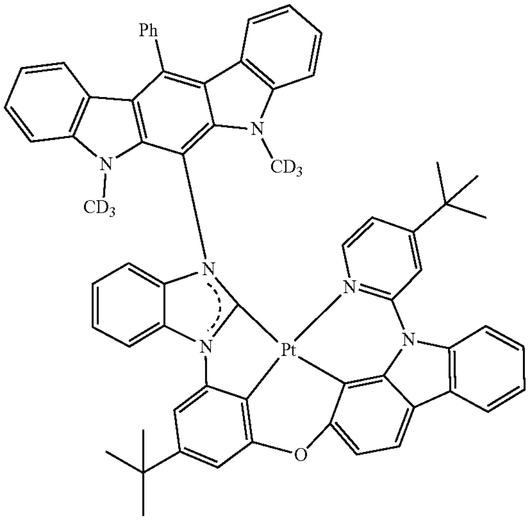
94
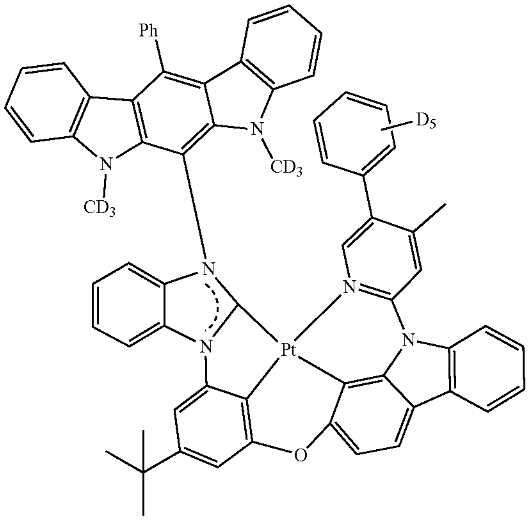
-continued
95
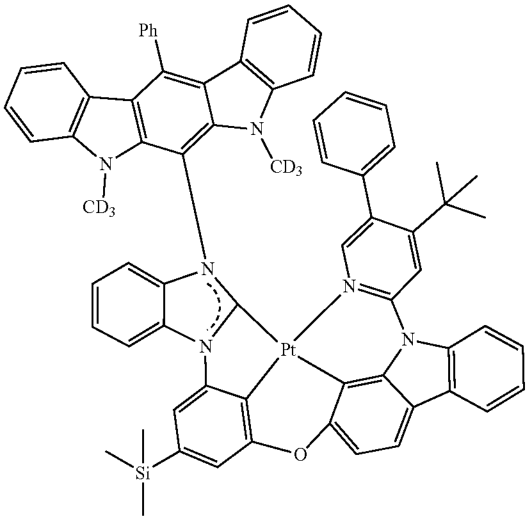
96
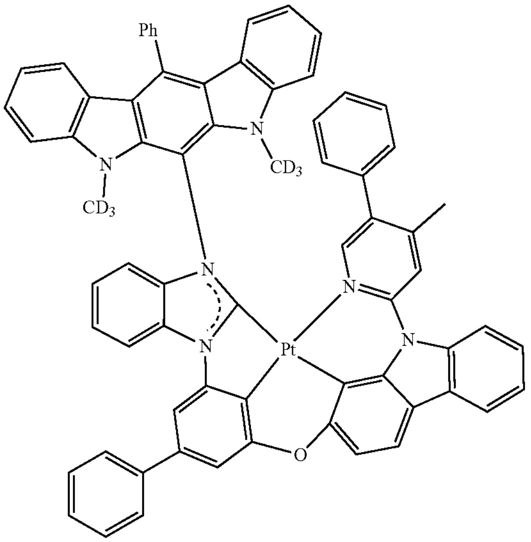
97
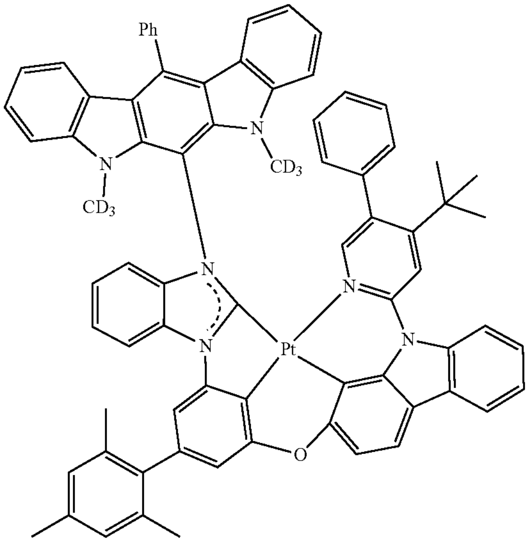

-continued
98
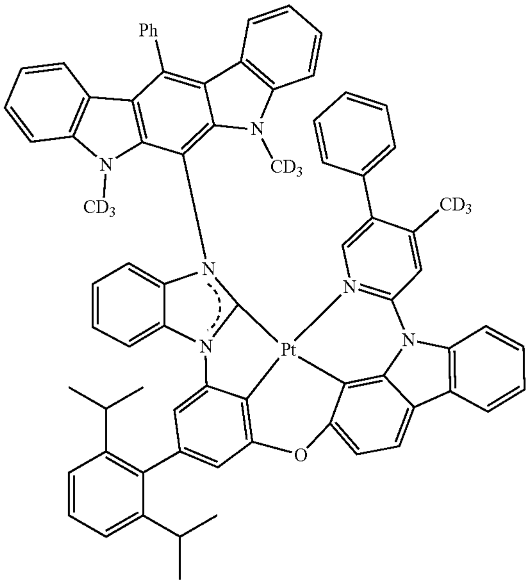
99
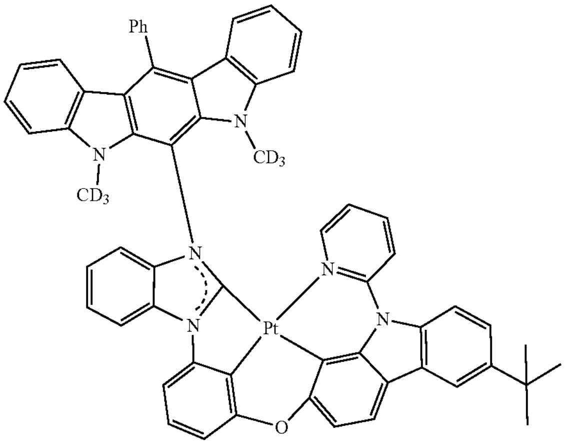
100
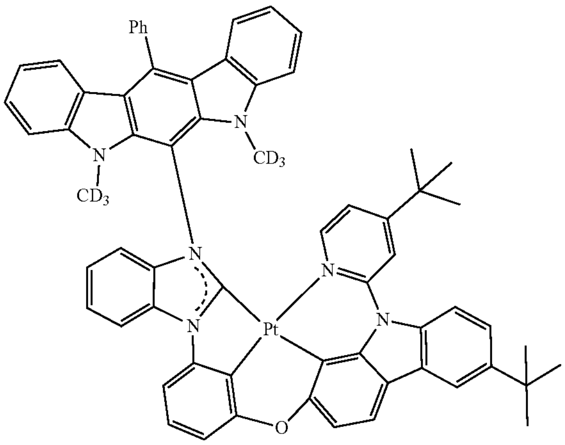
-continued
101
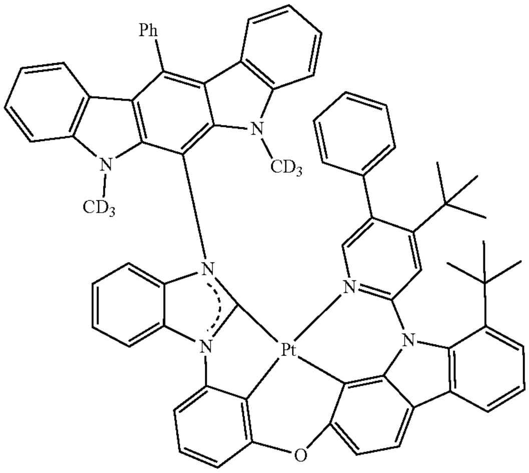
102
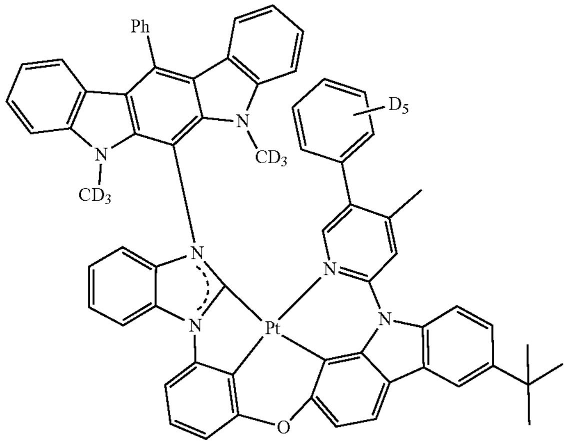
103
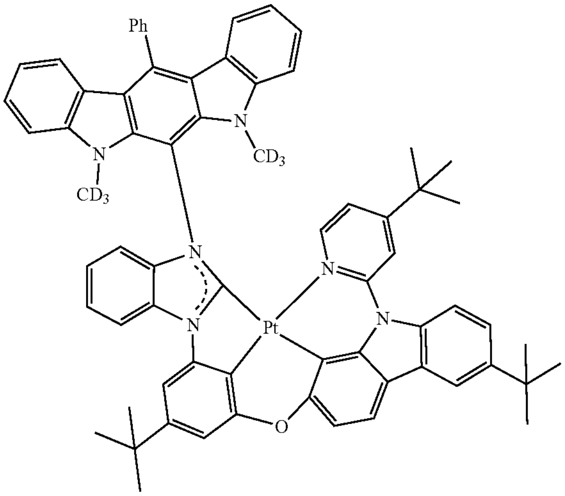

-continued
104
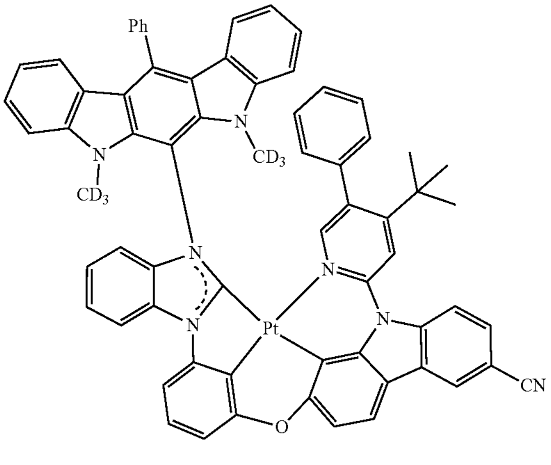
105
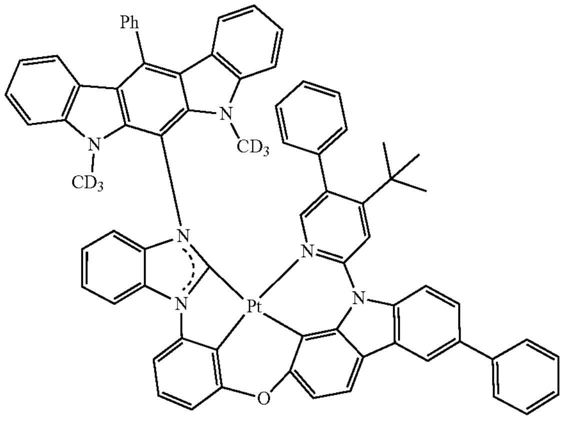
106
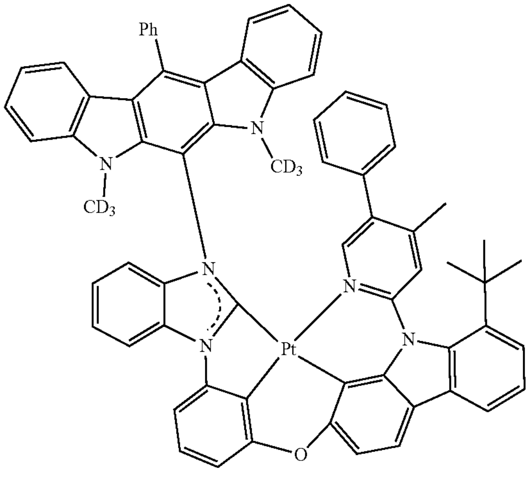
-continued
107
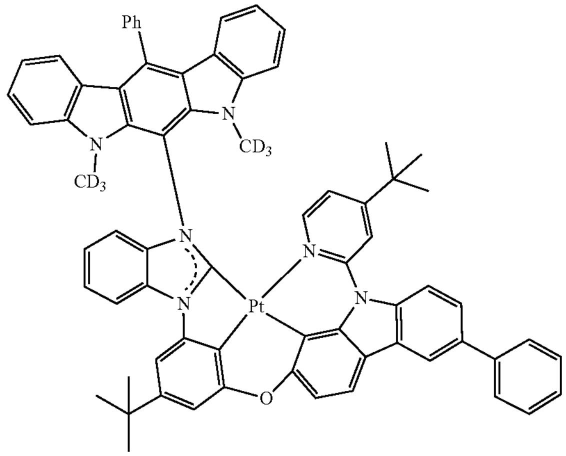
108
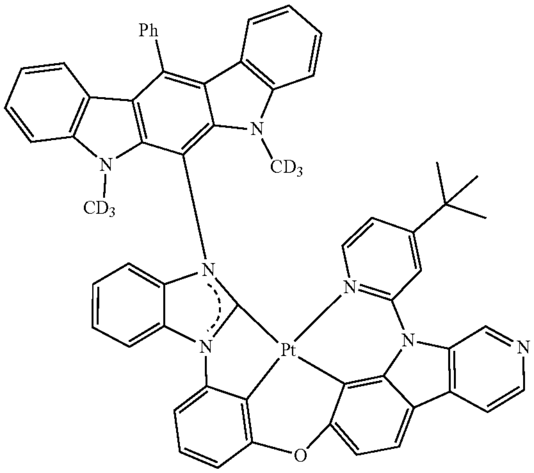
109
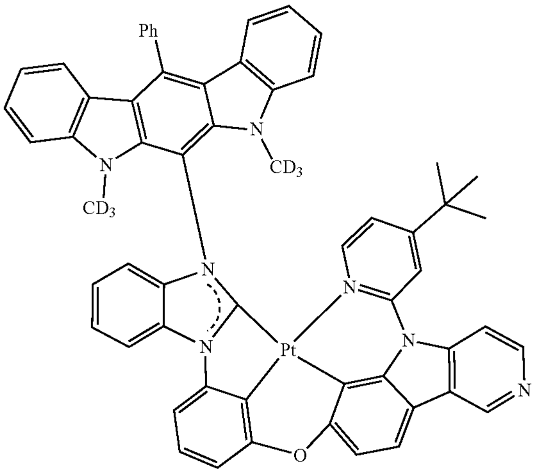

-continued
110
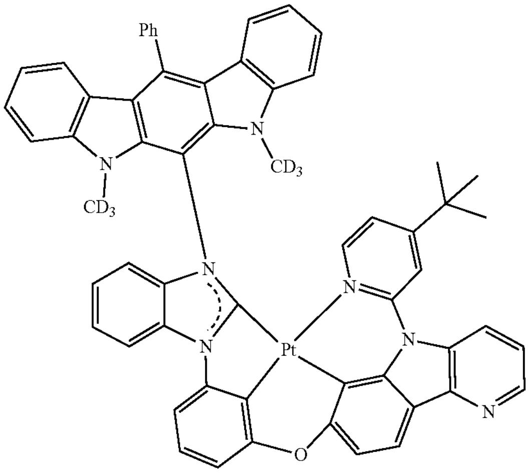
111
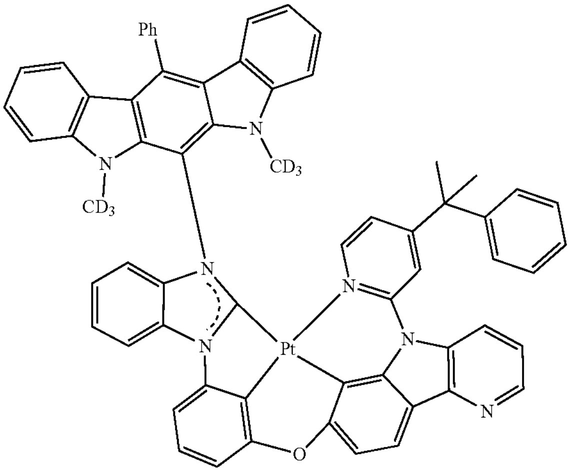
112
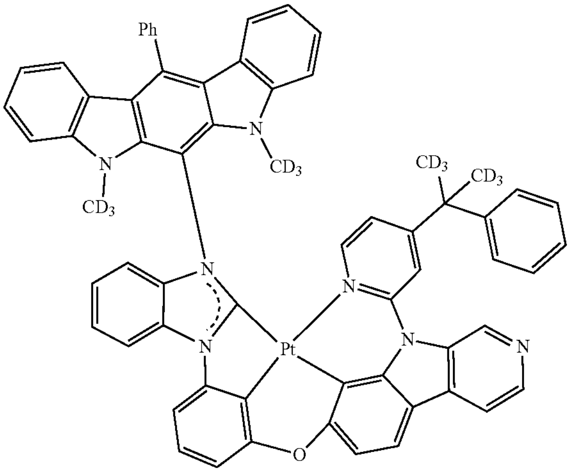
-continued
113
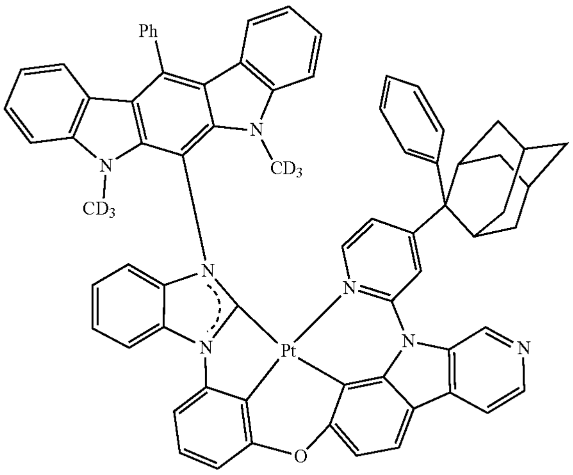
114
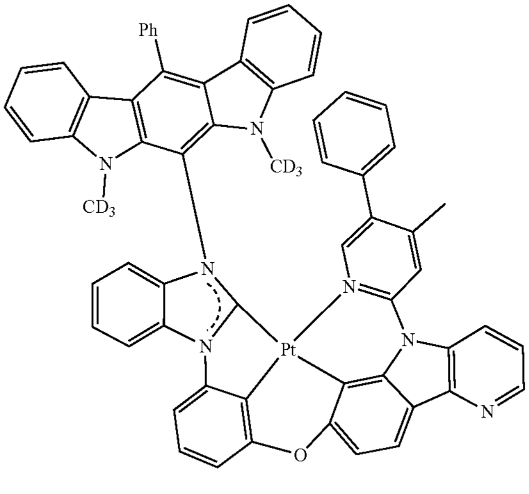
115
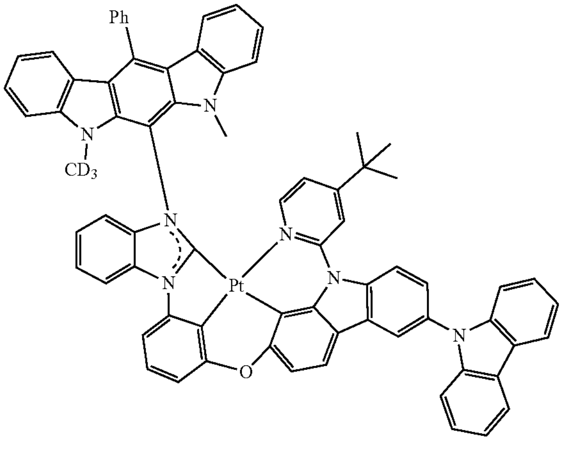

116
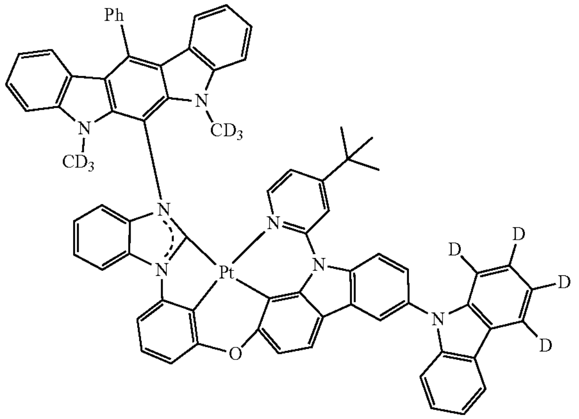
117
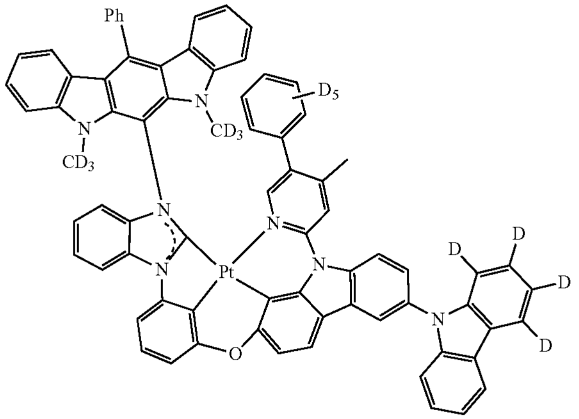
118
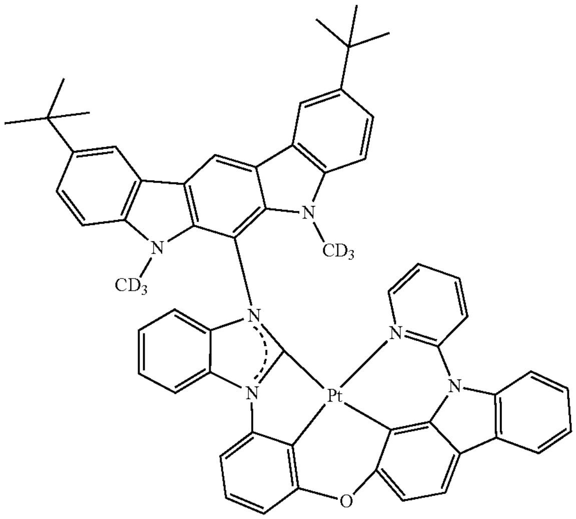
119
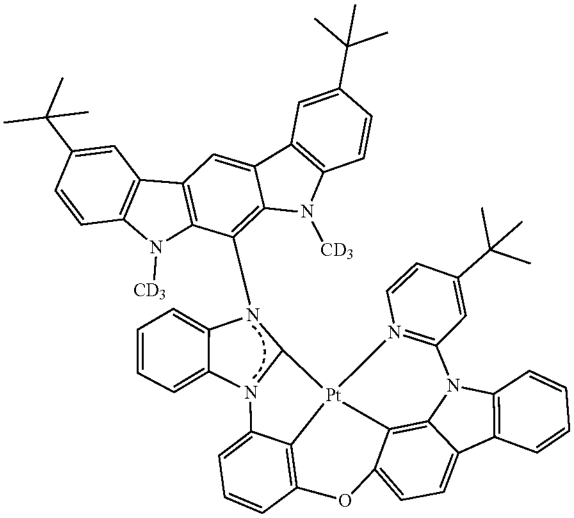
120
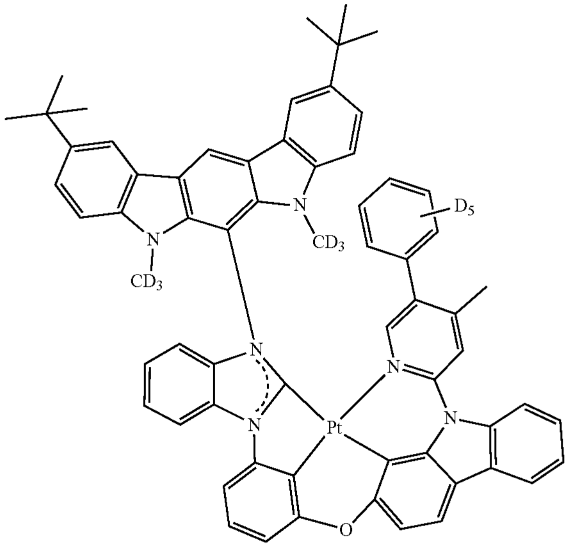
121
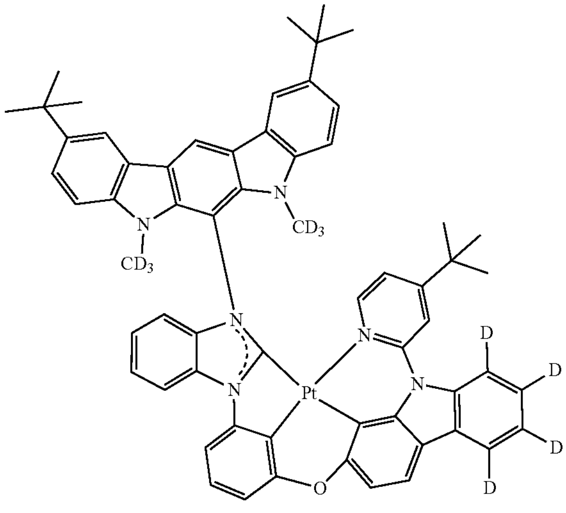

122
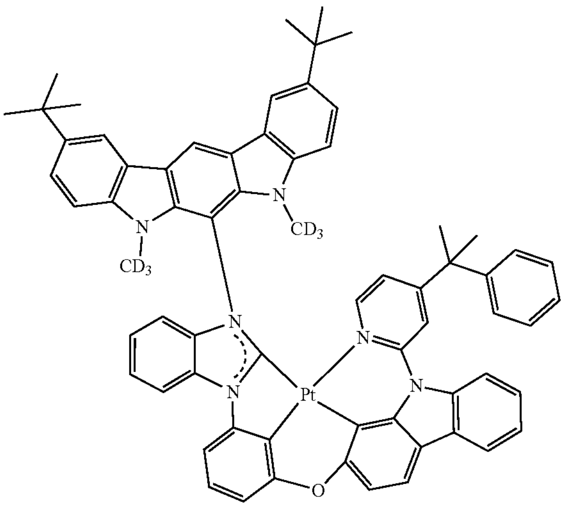
123
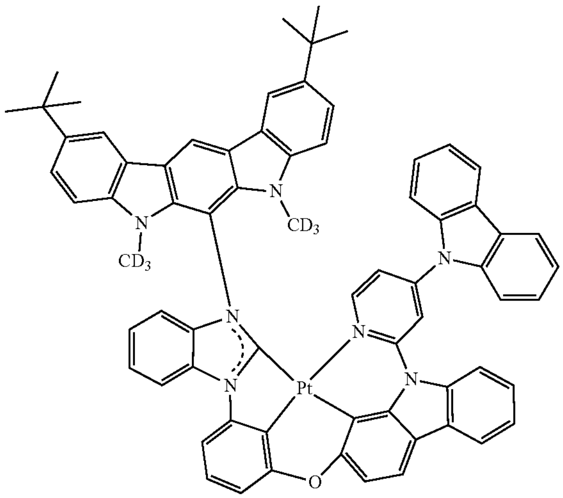
124
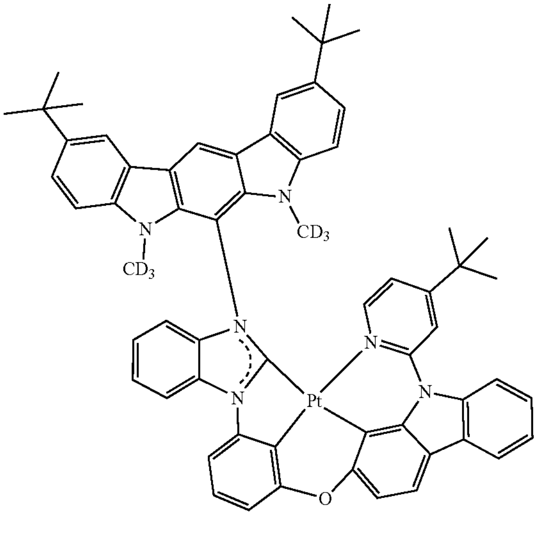
125
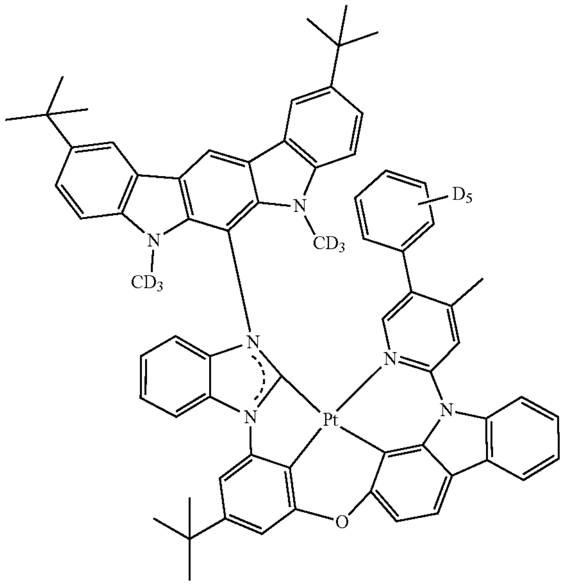
126
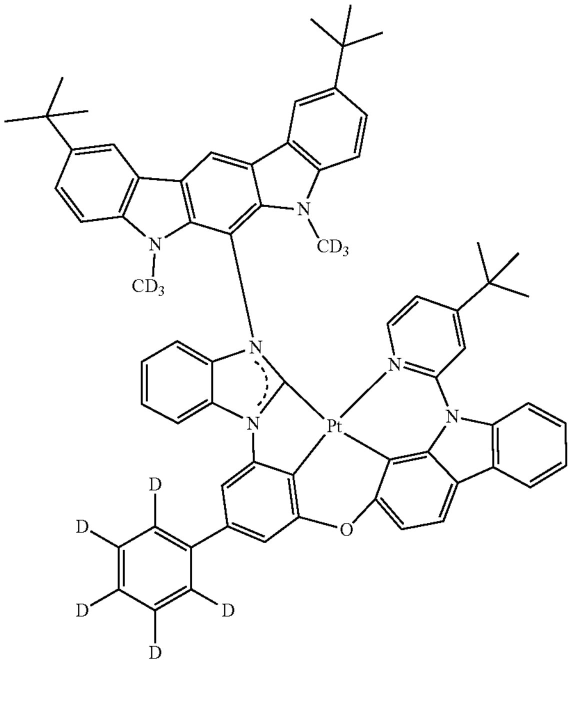

-continued
127
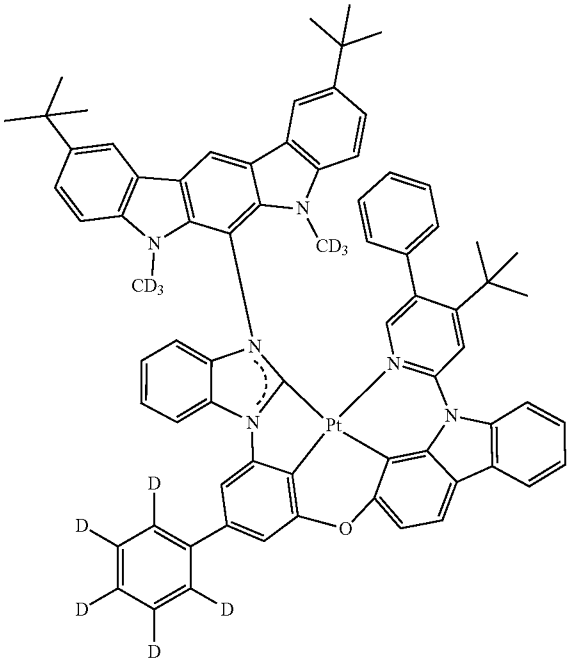
-continued
128
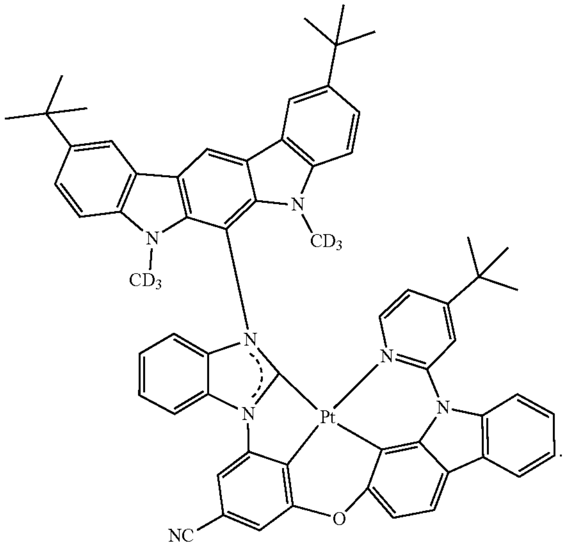
20. The organometallic compound of claim 10, wherein the organometallic compound is to emit blue light having a maximum emission wavelength of 430 nm or more and 480 nm or less.
* * * * *